(12) United States Patent
Rogers et al.

(10) Patent No.: US 10,424,572 B2
(45) Date of Patent: Sep. 24, 2019

(54) OPTICAL SYSTEMS FABRICATED BY PRINTING-BASED ASSEMBLY

(71) Applicants: The Board of Trustees of the University of Illinois, Urbana, IL (US); Semprius, Inc., Durham, NC (US)

(72) Inventors: John Rogers, Champaign, IL (US); Ralph Nuzzo, Champaign, IL (US); Matthew Meitl, Durham, NC (US); Etienne Menard, Durham, NC (US); Alfred Baca, Urbana, IL (US); Michael Motala, Champaign, IL (US); Jong-Hyun Ahn, Suwon (KR); Sang-Il Park, Savoy, IL (US); Chang-Jae Yu, Urbana, IL (US); Heung Cho Ko, Gwangju (KR); Mark Stoykovich, Dover, NH (US); Jongseung Yoon, Urbana, IL (US)

(73) Assignees: The Board of Trustees of the University of Illinois, Urbana, IL (US); X-Celeprint Limited, Cork (IE)

( * ) Notice: Subject to any disclaimer, the term of this patent is extended or adjusted under 35 U.S.C. 154(b) by 0 days.

(21) Appl. No.: 15/402,684

(22) Filed: Jan. 10, 2017

(65) Prior Publication Data
US 2017/0179100 A1 Jun. 22, 2017

Related U.S. Application Data

(63) Continuation of application No. 14/800,363, filed on Jul. 15, 2015, now Pat. No. 9,601,671, which is a (Continued)

(51) Int. Cl.
*H01L 25/00* (2006.01)
*H01L 27/12* (2006.01)
(Continued)

(52) U.S. Cl.
CPC .............. *H01L 25/50* (2013.01); *H01L 21/00* (2013.01); *H01L 25/042* (2013.01);
(Continued)

(58) Field of Classification Search
CPC combination set(s) only.
See application file for complete search history.

(56) References Cited

U.S. PATENT DOCUMENTS

| 4,058,418 A | 11/1977 | Lindmayer |
| 4,392,451 A | 7/1983 | Mickelsen et al. |

(Continued)

FOREIGN PATENT DOCUMENTS

| CN | 1222758 | 7/1999 |
| CN | 1454045 | 11/2003 |

(Continued)

OTHER PUBLICATIONS

Abbaschian et al. (Dec. 2005) "High Pressure-High Temperature Growth of Diamond Crystals Using Split Sphere Apparatus," *Diamond Relat. Mater.* 14(11-12):1916-1919.
(Continued)

*Primary Examiner* — Matthew L Reames
(74) *Attorney, Agent, or Firm* — Leydig, Voit & Mayer, Ltd.

(57) ABSTRACT

Provided are optical devices and systems fabricated, at least in part, via printing-based assembly and integration of device components. In specific embodiments the present invention provides light emitting systems, light collecting systems, light sensing systems and photovoltaic systems comprising printable semiconductor elements, including large area, high performance macroelectronic devices. Optical systems of the present invention comprise semiconductor elements assembled, organized and/or integrated with other device components via printing techniques that exhibit per-
(Continued)

formance characteristics and functionality comparable to single crystalline semiconductor based devices fabricated using conventional high temperature processing methods. Optical systems of the present invention have device geometries and configurations, such as form factors, component densities, and component positions, accessed by printing that provide a range of useful device functionalities. Optical systems of the present invention include devices and device arrays exhibiting a range of useful physical and mechanical properties including flexibility, shapeability, conformability and stretchablity.

22 Claims, 86 Drawing Sheets

Related U.S. Application Data continuation of application No. 14/209,481, filed on Mar. 13, 2014, now Pat. No. 9,117,940, which is a continuation of application No. 13/100,774, filed on May 4, 2011, now Pat. No. 8,722,458, which is a continuation of application No. 11/981,380, filed on Oct. 31, 2007, now Pat. No. 7,972,875.

(60) Provisional application No. 60/944,611, filed on Jun. 18, 2007, provisional application No. 60/885,306, filed on Jan. 17, 2007.

(51) Int. Cl.
| | |
|---|---|
| *H01L 21/00* | (2006.01) |
| *H01L 31/0725* | (2012.01) |
| *H01L 31/18* | (2006.01) |
| *H01L 33/00* | (2010.01) |
| *H01L 31/054* | (2014.01) |
| *H01S 5/42* | (2006.01) |
| *H01L 31/0525* | (2014.01) |
| *H01L 25/075* | (2006.01) |
| *H01L 33/58* | (2010.01) |
| *H01L 25/16* | (2006.01) |
| *H01L 33/54* | (2010.01) |
| *H01L 33/56* | (2010.01) |
| *H01L 25/04* | (2014.01) |
| *H01L 31/043* | (2014.01) |
| *H01L 31/0216* | (2014.01) |
| *H01L 31/0232* | (2014.01) |
| *H01L 31/0288* | (2006.01) |
| *H01L 31/0693* | (2012.01) |
| *H01L 31/167* | (2006.01) |
| *H01L 33/06* | (2010.01) |
| *H01L 33/30* | (2010.01) |
| *H01L 33/48* | (2010.01) |
| *H01L 33/62* | (2010.01) |
| *H01S 5/02* | (2006.01) |
| *H01S 5/343* | (2006.01) |
| *H01L 27/146* | (2006.01) |
| *H01L 31/02* | (2006.01) |
| *H01L 31/0304* | (2006.01) |
| *H01L 33/52* | (2010.01) |
| *H01S 5/022* | (2006.01) |
| *H01S 5/183* | (2006.01) |
| *H01S 5/30* | (2006.01) |
| *B82Y 10/00* | (2011.01) |
| *H01L 29/786* | (2006.01) |

(52) U.S. Cl.
CPC ........ *H01L 25/0753* (2013.01); *H01L 25/167* (2013.01); *H01L 27/124* (2013.01); *H01L 27/1214* (2013.01); *H01L 27/1285* (2013.01); *H01L 27/1292* (2013.01); *H01L 27/14627* (2013.01); *H01L 27/14636* (2013.01); *H01L 27/14643* (2013.01); *H01L 31/02005* (2013.01); *H01L 31/02008* (2013.01); *H01L 31/0288* (2013.01); *H01L 31/02168* (2013.01); *H01L 31/02325* (2013.01); *H01L 31/02327* (2013.01); *H01L 31/03046* (2013.01); *H01L 31/043* (2014.12); *H01L 31/0525* (2013.01); *H01L 31/0543* (2014.12); *H01L 31/0547* (2014.12); *H01L 31/0693* (2013.01); *H01L 31/0725* (2013.01); *H01L 31/167* (2013.01); *H01L 31/1804* (2013.01); *H01L 31/1824* (2013.01); *H01L 31/1868* (2013.01); *H01L 31/1876* (2013.01); *H01L 31/1892* (2013.01); *H01L 33/005* (2013.01); *H01L 33/0079* (2013.01); *H01L 33/06* (2013.01); *H01L 33/30* (2013.01); *H01L 33/483* (2013.01); *H01L 33/52* (2013.01); *H01L 33/54* (2013.01); *H01L 33/56* (2013.01); *H01L 33/58* (2013.01); *H01L 33/62* (2013.01); *H01S 5/021* (2013.01); *H01S 5/02284* (2013.01); *H01S 5/183* (2013.01); *H01S 5/3013* (2013.01); *H01S 5/34326* (2013.01); *H01S 5/423* (2013.01); *B81C 2201/0185* (2013.01); *B82Y 10/00* (2013.01); *H01L 29/78603* (2013.01); *H01L 29/78681* (2013.01); *H01L 2924/0002* (2013.01); *H01L 2933/005* (2013.01); *H01L 2933/0058* (2013.01); *H01L 2933/0066* (2013.01); *H01L 2933/0091* (2013.01); *Y02E 10/52* (2013.01); *Y02E 10/547* (2013.01); *Y02P 70/521* (2015.11)

(56) References Cited

U.S. PATENT DOCUMENTS

| | | |
|---|---|---|
| 4,471,003 A | 9/1984 | Cann |
| 4,487,162 A | 12/1984 | Cann |
| 4,663,828 A | 5/1987 | Hanak |
| 4,761,335 A | 8/1988 | Aurichio et al. |
| 4,766,670 A | 8/1988 | Gazdik et al. |
| 4,784,720 A | 11/1988 | Douglas |
| 4,855,017 A | 8/1989 | Douglas |
| 5,118,361 A | 6/1992 | Fraas et al. |
| 5,204,144 A | 4/1993 | Cann et al. |
| 5,313,094 A | 5/1994 | Beyer et al. |
| 5,434,751 A | 7/1995 | Cole, Jr. et al. |
| 5,501,893 A | 3/1996 | Laermer et al. |
| 5,525,815 A | 6/1996 | Einset |
| 5,545,291 A | 8/1996 | Smith et al. |
| 5,648,148 A | 7/1997 | Simpson |
| 5,691,245 A | 11/1997 | Bakhit |
| 5,753,529 A | 5/1998 | Chang et al. |
| 5,757,081 A | 5/1998 | Chang et al. |
| 5,767,578 A | 6/1998 | Chang et al. |
| 5,772,905 A | 6/1998 | Chou |
| 5,783,856 A | 7/1998 | Smith et al. |
| 5,817,242 A | 10/1998 | Biebuyck et al. |
| 5,824,186 A | 10/1998 | Smith et al. |
| 5,904,545 A | 5/1999 | Smith et al. |
| 5,907,189 A | 5/1999 | Mertol |
| 5,915,180 A | 6/1999 | Hara et al. |
| 5,925,897 A | 7/1999 | Oberman |
| 5,928,001 A | 7/1999 | Gilette et al. |
| 5,955,781 A | 9/1999 | Joshi et al. |
| 5,976,683 A | 11/1999 | Liehrr et al. |
| 5,998,291 A | 12/1999 | Bakhit et al. |

(56) References Cited

U.S. PATENT DOCUMENTS

| | | |
|---|---|---|
| 6,080,608 A | 6/2000 | Nowak |
| 6,225,149 B1 | 5/2001 | Gan et al. |
| 6,265,326 B1 | 7/2001 | Ueno |
| 6,274,508 B1 | 8/2001 | Jacobsen et al. |
| 6,277,712 B1 | 8/2001 | Kang et al. |
| 6,281,038 B1 | 8/2001 | Jacobsen et al. |
| 6,291,896 B1 | 9/2001 | Smith |
| 6,316,278 B1 | 11/2001 | Jacobsen et al. |
| 6,316,283 B1 | 11/2001 | Saurer |
| 6,317,175 B1 | 11/2001 | Salerno et al. |
| 6,334,960 B1 | 1/2002 | Wilson et al. |
| 6,380,729 B1 | 4/2002 | Smith |
| 6,403,397 B1 | 6/2002 | Katz |
| 6,403,985 B1 * | 6/2002 | Fan .................. G02B 27/0093 257/88 |
| 6,413,790 B1 | 7/2002 | Duthaler et al. |
| 6,417,025 B1 | 7/2002 | Gengel |
| 6,420,266 B1 | 7/2002 | Smith et al. |
| 6,459,418 B1 | 10/2002 | Comiskey et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,613,610 B2 | 9/2003 | Iwafuchi et al. |
| 6,623,579 B1 | 9/2003 | Smith et al. |
| 6,639,578 B1 | 10/2003 | Comiskey et al. |
| 6,655,286 B2 | 12/2003 | Rogers |
| 6,657,289 B1 | 12/2003 | Craig et al. |
| 6,661,037 B2 | 12/2003 | Pan et al. |
| 6,665,044 B1 | 12/2003 | Jacobsen et al. |
| 6,683,663 B1 | 1/2004 | Hadley et al. |
| 6,693,384 B1 | 2/2004 | Vicentini et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 | 6/2004 | Biegelsen et al. |
| 6,780,696 B1 | 8/2004 | Schatz |
| 6,784,450 B2 | 8/2004 | Pan et al. |
| 6,787,052 B1 | 9/2004 | Vaganov |
| 6,814,898 B1 | 11/2004 | Deeman et al. |
| 6,816,380 B2 | 11/2004 | Credelle et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,887,450 B2 | 5/2005 | Chen et al. |
| 6,900,094 B2 | 5/2005 | Hammond et al. |
| 6,917,061 B2 | 7/2005 | Pan et al. |
| 6,949,199 B1 | 9/2005 | Gauzner et al. |
| 6,949,206 B2 | 9/2005 | Whiteford |
| 6,950,220 B2 | 9/2005 | Abramson et al. |
| 6,961,993 B2 | 11/2005 | Oohata |
| 6,984,934 B2 | 1/2006 | Moller et al. |
| 6,989,285 B2 | 1/2006 | Ball |
| 7,029,951 B2 | 4/2006 | Chen et al. |
| 7,033,961 B1 | 4/2006 | Smart et al. |
| 7,052,924 B2 | 5/2006 | Daniels et al. |
| 7,067,903 B2 | 6/2006 | Tachibana et al. |
| 7,116,318 B2 | 10/2006 | Amundson et al. |
| 7,132,313 B2 | 11/2006 | O'Connor et al. |
| 7,148,512 B2 | 12/2006 | Leu et al. |
| 7,169,546 B2 | 1/2007 | Suzuki et al. |
| 7,169,669 B2 | 1/2007 | Blakers et al. |
| 7,170,164 B2 | 1/2007 | Chen et al. |
| 7,186,624 B2 | 3/2007 | Welser et al. |
| 7,195,733 B2 | 3/2007 | Rogers et al. |
| 7,253,442 B2 | 8/2007 | Huang et al. |
| 7,255,919 B2 | 8/2007 | Sakata et al. |
| 7,374,968 B2 | 5/2008 | Kornlivich et al. |
| 7,425,523 B2 | 9/2008 | Ikemizu et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,700,402 B2 | 4/2010 | Wild et al. |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,079,305 B2 | 12/2011 | Kron et al. |
| 8,198,621 B2 | 6/2012 | Rogers et al. |
| 8,217,381 B2 | 7/2012 | Rogers et al. |
| 8,367,035 B2 | 2/2013 | Rogers et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,552,299 B2 | 10/2013 | Rogers et al. |
| 8,562,095 B2 | 10/2013 | Alleyne et al. |
| 8,664,699 B2 | 3/2014 | Nuzzo et al. |
| 8,666,471 B2 | 3/2014 | Rogers et al. |
| 8,679,888 B2 | 3/2014 | Rogers et al. |
| 8,722,458 B2 | 5/2014 | Rogers et al. |
| 8,729,524 B2 | 5/2014 | Rogers et al. |
| 8,754,396 B2 | 6/2014 | Rogers et al. |
| 8,865,489 B2 | 10/2014 | Rogers et al. |
| 8,895,406 B2 | 11/2014 | Rogers et al. |
| 8,934,965 B2 | 1/2015 | Rogers et al. |
| 8,946,683 B2 | 2/2015 | Rogers et al. |
| 9,057,994 B2 | 6/2015 | Rogers et al. |
| 9,061,494 B2 | 6/2015 | Rogers et al. |
| 9,105,555 B2 | 8/2015 | Rogers et al. |
| 9,105,782 B2 | 8/2015 | Rogers et al. |
| 9,117,940 B2 | 8/2015 | Rogers et al. |
| 2003/0006527 A1 | 1/2003 | Rabolt et al. |
| 2003/0082889 A1 | 5/2003 | Maruyama et al. |
| 2003/0178316 A1 | 9/2003 | Jacobs et al. |
| 2003/0179978 A1 * | 9/2003 | Iwasaki ............... G02B 6/0036 385/14 |
| 2003/0227116 A1 | 12/2003 | Halik et al. |
| 2004/0005723 A1 | 1/2004 | Empedocles et al. |
| 2004/0026684 A1 | 2/2004 | Empedocles et al. |
| 2004/0079464 A1 | 4/2004 | Kumakura |
| 2004/0095658 A1 | 5/2004 | Buretea et al. |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0178390 A1 | 9/2004 | Whiteford |
| 2004/0192082 A1 | 9/2004 | Wagner et al. |
| 2004/0206448 A1 | 10/2004 | Dubrow |
| 2004/0211458 A1 | 10/2004 | Gui et al. |
| 2004/0211459 A1 | 10/2004 | Suenaga et al. |
| 2004/0250950 A1 | 12/2004 | Dubrow |
| 2005/0020094 A1 | 1/2005 | Forbes et al. |
| 2005/0038498 A1 | 2/2005 | Dubrow et al. |
| 2005/0194037 A1 | 9/2005 | Asai |
| 2005/0214962 A1 * | 9/2005 | Daniels ............. H01L 27/14625 438/22 |
| 2005/0227389 A1 | 10/2005 | Bhattacharya et al. |
| 2005/0233546 A1 | 10/2005 | Oohata et al. |
| 2005/0238967 A1 | 10/2005 | Rogers et al. |
| 2005/0255686 A1 | 11/2005 | Yamano et al. |
| 2006/0038182 A1 | 2/2006 | Rogers et al. |
| 2006/0049485 A1 | 3/2006 | Pan et al. |
| 2006/0061708 A1 | 3/2006 | Umebayashi et al. |
| 2006/0127817 A1 | 6/2006 | Ramanujan et al. |
| 2006/0132025 A1 | 6/2006 | Gao et al. |
| 2006/0134893 A1 | 6/2006 | Savage et al. |
| 2006/0214173 A1 | 9/2006 | Beeson et al. |
| 2006/0244105 A1 | 11/2006 | Forbes et al. |
| 2006/0279191 A1 | 12/2006 | Gehegan et al. |

(56) References Cited

U.S. PATENT DOCUMENTS

| | | |
|---|---|---|
| 2006/0286488 A1 | 12/2006 | Rogers et al. |
| 2006/0286785 A1 | 12/2006 | Rogers et al. |
| 2007/0032089 A1 | 2/2007 | Nuzzo et al. |
| 2007/0215273 A1* | 9/2007 | Jacobs .................. H01L 24/31 156/297 |
| 2007/0227586 A1 | 10/2007 | Zapalac |
| 2008/0000871 A1 | 1/2008 | Suh et al. |
| 2008/0055581 A1 | 3/2008 | Rogers et al. |
| 2008/0108171 A1 | 5/2008 | Rogers et al. |
| 2008/0157235 A1 | 7/2008 | Rogers et al. |
| 2008/0212102 A1 | 9/2008 | Nuzzo et al. |
| 2009/0199960 A1 | 8/2009 | Nuzzo et al. |
| 2009/0289246 A1 | 11/2009 | Schneider et al. |
| 2009/0294803 A1 | 12/2009 | Nuzzo et al. |
| 2010/0052112 A1 | 3/2010 | Rogers et al. |
| 2010/0059863 A1 | 3/2010 | Rogers et al. |
| 2010/0283069 A1 | 11/2010 | Rogers et al. |
| 2011/0316120 A1 | 12/2011 | Rogers et al. |
| 2012/0157804 A1 | 6/2012 | Rogers et al. |
| 2012/0165759 A1 | 6/2012 | Rogers et al. |
| 2012/0261551 A1 | 10/2012 | Rogers et al. |
| 2012/0320581 A1 | 12/2012 | Rogers et al. |
| 2013/0036928 A1 | 2/2013 | Rogers et al. |
| 2013/0041235 A1 | 2/2013 | Rogers et al. |
| 2013/0100618 A1 | 4/2013 | Rogers et al. |
| 2013/0140649 A1 | 6/2013 | Rogers et al. |
| 2013/0333094 A1 | 12/2013 | Rogers et al. |
| 2014/0163390 A1 | 6/2014 | Rogers et al. |
| 2014/0191236 A1 | 7/2014 | Nuzzo et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |
| 2014/0361409 A1 | 12/2014 | Rogers et al. |
| 2014/0374872 A1 | 12/2014 | Rogers et al. |
| 2015/0132873 A1 | 5/2015 | Rogers et al. |
| 2015/0181700 A1 | 6/2015 | Rogers et al. |
| 2017/0179085 A1 | 6/2017 | Rogers et al. |
| 2017/0179100 A1 | 6/2017 | Rogers et al. |
| 2017/0179356 A1 | 6/2017 | Rogers et al. |

FOREIGN PATENT DOCUMENTS

| | | |
|---|---|---|
| CN | 1606175 | 4/2005 |
| DE | 4241045 C1 | 5/1994 |
| EP | 0929097 | 7/1999 |
| EP | 1357773 | 10/2003 |
| GB | 1499509 | 2/1978 |
| JP | 57-052143 | 3/1982 |
| JP | H06-118441 | 4/1994 |
| JP | 08-102552 | 4/1996 |
| JP | 11-338385 | 12/1999 |
| JP | 2001-332383 | 11/2001 |
| JP | 2002-092984 | 3/2002 |
| JP | 2002-118124 | 4/2002 |
| JP | 2002-289912 | 10/2002 |
| JP | 2003-289136 | 10/2003 |
| JP | 2003-297974 | 10/2003 |
| JP | 2004-214478 | 7/2004 |
| JP | 2004-281630 | 10/2004 |
| JP | 2005-311333 | 11/2005 |
| JP | 2006-147876 | 6/2006 |
| KR | 10-2006-0051369 | 5/2006 |
| KR | 10-2006-0052545 | 5/2006 |
| TW | 221525 | 3/1994 |
| TW | 367570 | 8/1999 |
| TW | 494257 | 7/2002 |
| TW | 200836353 | 9/2008 |
| WO | WO 2000/046854 | 8/2000 |
| WO | WO 2000/049421 | 8/2000 |
| WO | WO 2000/049658 | 8/2000 |
| WO | WO 2000/055915 | 9/2000 |
| WO | WO 2000/055916 | 9/2000 |
| WO | WO 2001/031082 | 5/2001 |
| WO | WO 2001/033621 | 5/2001 |
| WO | WO 2002/027701 | 4/2002 |
| WO | WO 2002/043032 | 5/2002 |
| WO | WO 2002/092778 | 11/2002 |
| WO | WO 2002/097724 | 12/2002 |
| WO | WO 2002/099068 | 12/2002 |
| WO | WO 2003/032240 | 4/2003 |
| WO | WO 2003/049201 | 6/2003 |
| WO | WO 2003/063211 | 7/2003 |
| WO | WO 2003/085700 | 10/2003 |
| WO | WO 2003/085701 | 10/2003 |
| WO | WO 2003/092073 | 11/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/086289 | 10/2004 |
| WO | WO 2004/094303 | 11/2004 |
| WO | WO 2004/100252 | 11/2004 |
| WO | WO 2004/105456 | 12/2004 |
| WO | WO 2005/005679 | 1/2005 |
| WO | WO 2005/015480 | 2/2005 |
| WO | WO 2005/017962 | 2/2005 |
| WO | WO 2005/022120 | 3/2005 |
| WO | WO 2005/029578 | 3/2005 |
| WO | WO 2005/054119 | 6/2005 |
| WO | WO 2005/099310 | 10/2005 |
| WO | WO 2005/104756 | 11/2005 |
| WO | WO 2002/097708 | 12/2005 |
| WO | WO 2005/122285 | 12/2005 |
| WO | WO 2006/130721 | 12/2006 |
| WO | WO 2007/000037 | 1/2007 |
| WO | WO 2007/126412 | 11/2007 |
| WO | WO 2008/030666 | 3/2008 |
| WO | WO 2008/030960 | 3/2008 |
| WO | WO 2008/036837 | 3/2008 |
| WO | WO 2008/055054 | 5/2008 |
| WO | WO 2008/143635 | 11/2008 |
| WO | WO 2009/011709 | 1/2009 |
| WO | WO 2009/111641 | 9/2009 |
| WO | WO 2010/005707 | 1/2010 |
| WO | WO 2010/036807 | 4/2010 |
| WO | WO 2010/132552 | 11/2010 |
| WO | WO 2011/084450 | 7/2011 |
| WO | WO 2011/115643 | 9/2011 |

OTHER PUBLICATIONS

Adachi et al (1982) "Chemical Etching of InGaAsP/InP DH Wafer," *J. Electrochem. Soc.* 129:1053-1062.

Adachi et al. (1983) "Chemical Etching Characteristics of (001)GaAs," *J. Electrochem. Soc.* 130:2427-2435.

Ago et al. (2005) "Aligned Growth of Isolated Single-Walled Carbon Nanotubes Programmed vby Atomic Arrangement of Substrate Surface," *Chem. Phys. Lett.* 408:433-438.

Ago et al. (2006) "Synthesis of Horizontally-Aligned Single-Walled Carbon Nanotubes with Controllable Density on Sapphire Surface and Polarized Raman Spectroscopy," *Chem. Phys. Lett.* 421:399-403.

Ahmed et al. (Web Release Oct. 11, 2005) "Extending the 3ω-Method to the MHz Range for Thermal Conductivity Measurements of Diamond Thin Films," *Diamond Relat. Mater.* 15(2-3):389-393.

Ahn et al. (2007) "Bendable Integrated Circuits on Plastic Substrates by Use of Printed Ribbons of Single-Crystalline Silicon," *Appl. Phys. Lett.* 90:213501.

Ahn et al. (Dec. 15, 2006) "Heterogeneous Three-Dimensional Electronics by Use of Printed Semiconductor Nanomaterials," *Science* 314:1754-1757.

Ahn et al. (Jun. 2006) "High-Speed Mechanically Flexible Single-Crystal Silicon Thin-Film Transistors on Plastic Substrates," *IEEE Electron Dev. Lett.* 27(6):460-462.

(56) References Cited

OTHER PUBLICATIONS

Alivisatos et al. (1996) "Semiconductor Clusters, Nanocrystals, and Quantum Dots," *Science* 271:933-937.
Alivisatos et al. (1998) "From Molecules to Materials: Current Trends and Future Directions," *Adv. Mater.* 10:1297-1336.
Allen et al. (Feb. 20, 2006) "Nanomaterial Transfer Using Hot Embossing for Flexible Electronic Devices," *Appl. Phys. Lett.* 88:083112.
Al-Sarawi et al. (Feb. 1998) "A Review of 3-D Packaging Technology," *IEEE Trans. Comp. Packag. Manufac. Technol. B* 21(1):2-14.
Amano et al. (Feb. 3, 1986) "Metalorganic Vapor Phase Epitaxial Growth of a High Quality GaN Film Using an AlN Buffer Layer," *Appl. Phys. Lett.* 48(5):353-355.
Ambrosy et al. (1996) "Silicon Motherboards for Multichannel Optical Modules," *IEEE Trans. Compon. Pack. A* 19:34-40.
Andersson et al. (Oct. 16, 2002) "Active Matrix Displays Based on All-Organic Electrochemical Smart Pixels Printed on Paper," *Adv. Mater.* 14:1460-1464.
Ando et al. (2004) "Self-Aligned Self-Assembly Process for Fabricating Organic Thin-Film Transistors," *Appl. Phys. Lett.* 85:1849-1851.
Angadi et al. (Web Release Jun. 1, 2006) "Thermal Transport and Grain Boundary Conductance in Ultrananocrystalline Diamond Thin Films," *J. Appl. Phys.* 99:114301.
Aoki et al. (2003) "Microassembly of Semiconductor Three Dimensional Photonic Crystals," *Nat. Mater.* 2:117-121.
Arnold et al. (2003) "Field-Effect Transistors Based on Single Semiconducting Oxide Nanobelts," *J. Phys. Chem. B* 107(3):659-663.
Ayón et al. (Jan. 1999) "Characterization of a Time Multiplexed Inductively Coupled Plasma Etcher," *J. Electrochem. Soc.* 146(1):339-349.
Baca et al. (2008) "Semiconductor Wires and Ribbons for High-Performance Flexible Electronics," *Angew. Chem. Int. Ed.* 47:5524-5542.
Bachtold et al. (Nov. 9, 2001) "Logic Circuits with Carbon Nanotube Transistors," *Science* 294:1317-1320.
Bae et al. (Jul. 1, 2002) "Single-Crystalline Gallium Nitride Nanobelts," *Appl. Phys. Lett.* 81(1):126-128.
Balmer et al. (2005) "Diffusion of Alkanethiols in PDMS and its Implications on Microcontact Printing (μCP)," *Langmuir* 21(2):622-632.
Banerjee et al. (May 2001) "3-D ICs: A Novel Chip Design for Improving Deep-Submicrometerinterconnect Performance and Systems-on-Chip Integration," *Proc. IEEE* 89(5):602-633.
Bao et al. (1997) "High-Performance Plastic Transistors Fabricated by Printing Techniques," *Chem. Mater.* 9:1299-1301.
Bao et al. (1999) "Printable Organic and Polymeric Semiconducting Materials and Devices," *J. Mater. Chem.* 9:1895-1904.
Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," *Angew. Chem. Int. Ed.* 442:5035-5039.
Bauer et al. (2004) "Biological Applications of High Aspect Ratio Nanoparticles," *J. Mater. Chem.* 14:517-526.
Berg et al. (2003) "Tailored Micropatters Through Weak Polyelectrolyte Stamping," *Langmuir* 19:2231-2237.
Bernard et al. (1998) "Printing Patterns of Proteins," *Langmuir* 14(9):2225-2229.
Bett et al. (Aug. 1999) "III-V Compounds for Solar Cell Applications," *Appl. Phys. A. Mater. Sci.* 69(2):119-129.
Bhunia et al. (2004) "Free-Standing and Vertically Aligned InP Nanowires Grown by Metalorganic Vapor Phase Epitaxy," *Physica E* 21:583-587.
Bhushan et al. (Nov. 2004) "Multiwalled Carbon Nanotube AFM Probes for Surface Characterization of Micro/Nanostructures," *Microsyst. Technol.* 10(8-9):633-639.

Bietsch et al. (Oct. 1, 2000) "Conformal Contact and Pattern Stability of Stamps Used for Soft Lithography," *J. Appl. Phys.* 88(7):4310-4318.
Bishay et al. (2000) "Temperature Coefficient of the Surface Resistivity of Two-Dimensional Island Gold Films," *J. Phys. D. Appl. Phys.* 33(18):2218-2222.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.
Blazdell et al. (Nov. 1999) "Preparation of Ceramic Inks for Solid Freeforming Using a Continuous Jet Printer," *J. Mat. Syn. Process.* 7(6):349-356.
Boltau et al. (1998) "Surface-Induced Structure Formation of Polymer Blends on Patterned Substrates," *Nature* 391:877-879.
Boncheva et al. (Mar. 15, 2005) "Magnetic Self-Assembly of Three-Dimensional Surfaces from Planar Sheets," *Proc. Natl. Acad. Sci. USA* 102(11):3924-3929.
Boncheva et al. (Mar. 8, 2005) "Templated Self-Assembly: Formation of Folded Structures by Relaxation of Pre-Stressed, Planar Tapes. The Path to Ubiquitous and Low-cost Organic Electronic Appliances on Plastic," *Adv. Mater.* 17(5):553-557.
Bowden et al. (1997) "Self Assembly of Mesoscale Objects into Ordered Two-Dimensional Arrays," *Science* 276:233-235.
Bowden et al. (1998) "Spontaneous Formation of Ordered Structures in Thin Films of Metals Supported on an Elastomeric Polymer," *Nature* 393:146-149.
Bowden et al. (2001) "Molecule-Mimetic Chemistry and Mesoscale Self-Assembly," *Acc. Chem. Res.* 34:231-238.
Bracher et al. (2009) "Shaped Films of Ionotropic Hydrogels Fabricated Using Templates of Patterns Paper," *Adv. Mater.* 21:445-450.
Bradley et al. (2003) "Flexible Nanotube Electronics," *Nano Lett.*, vol. 3, No. 10, pp. 1353-1355.
Braun et al. (1999) "Electrochemically Grown Photonic Crystals," *Nature* 402:603-604.
Britton et al. (Web Release Oct. 25, 2005) "Microstructural Defect Characterization of a Si:H Deposited by Low Temperature HW-CVD on Paper Substrates," *Thin Solid Films* 501(1-2):79-83.
Brown et al. (Dec. 19, 2001) "Heterogeneous Materials Integration: Compliant Substrates to Active Device and Materials Packaging," *Mater. Sci. Eng. B* 87(3):317-322.
Brown, H.R. (1991) "The Adhesion Between Polymers," *Ann. Rev. Mater. Sci.* 21:463-489.
Bruschi et al. (2001) "Micromachined Silicon Suspended Wires With Submicrometric Dimensions," *Microelectron. Eng.* 57-58:959-965.
Buma et al. (2001) "High-Frequency Ultrasound Array Element Using Thermoelastic Expansion in an Elastomeric Film," *Appl. Phys. Lett.* 79:548-550.
Burdinski et al. (2005) "Single Etch Patterning of Stacked Silver and Molybdenum Alloy Layers on Glass Using Microcontat Wave Printing," *J. Am. Chem. Soc.* 127(31):10786-10787.
Burdinski, D. (non-dated) "Soft Lithography and Microcontact Wave Printing," http://www.research.philips.com/technologies/light_dev_microsys/softlitho/index.html, Downloaded May 23, 2007.
Burgin et al. (2000) "Large Area Submicrometer Contact Printing Using a Contact Aligner," *Langmuir* 16:5371-5375.
Burns et al. (2003) "Printing of Polymer Thin-Film Transistors for Active-Matrix-Display Applications," *J. Soc. Inf. Display* 11:599-604.
Campbell et al. (2000) "Fabrication of Photonic Crystals for the Visible Spectrum by Holographic Lithography," *Nature* 404:53-56.
Cao et al. (2006) "Highly Bendable, Transparent Thin-Film Transistors That Use Carbon-Nanotube-Based Conductors and Semiconductors with Elastomeric Delectrics," *Adv. Mater.* 18(3):304-309.
Cao et al. (2006) "Transparent flexible organic thin-film transistors that use printed single-walled carbon nanotube electrodes," *Applied Physics Letters* 88:113511.

(56) References Cited

OTHER PUBLICATIONS

Cao et al. (Jul. 24, 2008) "Medium-Scale Carbon Nanotube Thin-Film Integrated Circuits on Flexible Plastic Substrates," *Nature* 454:495-500.
Carr et al. (1998) "Measurement of Nanomechanical Resonant Structures in Single-Crystal Silicon," *J. Vac. Sci. Technol. B* 16:3821-3824.
Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.
Chang et al. (1994) "Process Techniques," "Lithography," and "Device-Related Physics and Principles," In; *GaAs High-Speed Devices: Physics, Technology and Circuit Application*, John Wiley and Sons, New York, pp. 115-278.
Chen et al. (2003) "Characterization of Pd-GaAs Schottly Diodes Prepared by the Electrodes Plating Technique," *Semiconductor. Sci. Technol.* 18:620-626.
Chen et al. (2003) "Electronic Paper: Flexible Active-Matrix Electronics Ink Display," *Nature* 423:136.
Chen et al. (2005) "InGaN Nanorings and Nanodots by Selective Area Epitaxy," *Appl. Phys. Lett.* 87:143111.
Chen et al. (2005) "The Role of Metal-Nanotube Caontact in the Performance of Carbon Nanotube Field-Effect Transistors," *Nano Lett.* 5(7)1497-1502.
Chen et al. (Feb. 27, 2006) "Complementary Carbon Nanotube-Gated Carbon Nanotube Thin-Fim Transistor," *Appl. Phys. Lett.* 88:093502.
Chen et al. (Jun. 2002) Effect of Process Parameters on the Surface Morphology and Mechanical Performance of Silicon Structures After Deep Reactive Ion Etching (DRIE) *J. Microelectromech. Syst.* 11(3):264-275.
Chen et al. (Mar. 2004) "A Family of Herringbone Patterns in Thin Films," *Scr. Mater.* 50(6):797-801.
Chen et al. (Mar. 24, 2006) "An Integrated Logic Crcuit Assembled on a Single Carbon Nanotube," *Science* 311:1735.
Chen et al. (Sep. 2004) "Herringbone Buckling Patterns of Compressed Thin Films on Compliant Substrates," *J. Appl. Mech.* 71:597-603.
Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.
Childs et al. (2002) "Decal Transfer Microlithography: A New Soft-Lithographic Patterning Method," *J. Am. Chem. Soc.* 124:13583-13596.
Childs et al. (2005) "Masterless Soft-Lithography: Patterning UV/Ozone-Induced Adhesion on Poly(dimethylsiloxane) Surfaces," *Langmuir* 21:10096-10105.
Childs et al. (Aug. 14, 2004) "Patterning of Thin-Film Microstructures on Non-Planar Substrate Surfaces Using Decal Transfer Lithography," *Adv. Mater.* 16(15):1323-1327.
Choi et al. (2007) "Biaxially Stretchable 'Wavy' Silicon Nanomembranes," *Nano Lett.* 7(6):1655-1663.
Choi et al. (Web Release Jan. 25, 2005) "Simple Detachment Patterning of Organic Layers and its Applications to Organic Light-Emitting Diodes," *Adv. Mater.* 17(2):166-171.
Chou et al. (2004) "An Orientation-Controlled Pentacene Film Aligned by Photoaligned Polyimide for Organic Thin-Film Transistor Applications," *Adv. Func. Mater.* 14:811-815.
Chou et al. (Jun. 8, 1999) "Micromachining on (111)-Oriented Silicon," *Sens. Actuators A* 75(3):271-277.
Chu et al. (2005) "High-Performance Organic Thin-Film Transistors with Metal Oxide/Metal Bilayer Electrode," *Appl. Phys. Lett.* 87:193508.
Chung et al. (2000) Silicon Nanowire Devices *Appl. Phys. Lett.* 76(15):2068-2070.
Chung et al. (Jul. 1, 2003) "A Study on Formation of Al and $Al_2O_3$ on the Porous Paper by DC Magnetron Sputtering," *Surf. Coat. Technol.* 171(1-3):65-70.
Collins et al. (Apr. 27, 2001) "Engineering Carbon Nanotubes and Nanotube Circuits Using Electrical Breakdown," *Science* 292:706-709.
Creagh et al. (2003) "Design and Performance of Inkjet Print Heads for Non-Graphic-Arts Applications," *MRS Bull.* 28:807-811.
Crone et al. (Feb. 3, 2000) "Large-Scale Complementary Integrated Circuits Based on Organic Transistors," *Nature* 403:521-523.
Crowder et al. (1998) "Low-Temperature Single-Crystal Si TFTs Fabricated on Si Films Processed via Sequential Lateral Solidification," *IEEE Electron. Dev. Lett.* 19:306-308.
Cui et al. (2001) "Nanowire Nanosensors for Highly Sensitive and Selective Detection of Biological and Chemical Species," *Science* 293:1289-1292.
Dai et al. (2002) "Gallium Oxide Nanoribbons and Nanosheets," *J. Phys. Chem. B* 106(5):902-904.
Dai et al. (2003) "Novel Nanostructures of Functional Oxides Synthesized by Thermal Evaporation," *Adv. Funct. Mater.* 13:9-24.
Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.
de Gans (2004) "Inkjet Printing of Polymers: State of the Art and Future Developments," *Adv. Mater.* 16(3):203-213.
De Sio et al. (Web Release May 18, 2005) "Electro-Optical Response of a Single-Crystal Diamond Ultraviolet Photoconductor in Transverse Configuration," *Appl. Phys. Lett.* 86:213504.
DeBoer et al. (2004) "Organic Single-Crystal Field-Effect Transistors," *Phys. Stat. Sol.* 201:1302-1331.
Decision of Refusal corresponding to Japanese Patent Application No. P2007-515549, Dispatched Sep. 4, 2012—English translation only.
Decision of Rejection corresponding to Korean Patent Application No. 10-2007-7000216, dated Sep. 19, 2012—includes English Translation.
Deen et al. (2004) "Electrical Characterization of Polymer-Based FETs Fabricated by Spin-Coating Poly(3-alkylthiophene)s," *IEEE Trans. Electron Devices* 51:1892-1901.
Delmerche et al. (1997) "Stability of Molded Polydimethylsiloxane Microstructures," *Adv. Mat.* 9:741-746.
Deruelle et al. (1995) "Adhesion at the Solid-Elastomer Interface: Influence of Interfacial Chains," *Macromol.* 28:7419-7428.
Derycke et al. (Sep. 2001) "Carbon Nanotube Inter- and Intramolecular Logic Gates," *Nano Lett.* 1(9):453-456.
Desai et al. (Feb. 1999) "Nanopore Technology for Biomedical Applications," *Biomed. Microdevices* 2(1):11-40.
Dick et al. (Jun. 2004) "Synthesis of Branched 'Nanotrees' by Controlled Seeding of Multiples Branching Events," *Nat. Mater.* 3:380-384.
Dimroth et al. (Mar. 2007) "High Efficiency Multijunction Solar Cells," *MRS Bull.* 32:230-235.
Ding et al. (Oct. 4, 2004) "Self Catalysis and Phase Transformation in the Formation of CdSe Nanosaws," *Adv. Mater.* 16(19):1740-1743.
Dinsmore et al. (2002) "Colloidosomes: Selectively Permeable Capsules Composed of Colloidal Particles," *Science* 298:1006-1009.
Divliansky et al. (2003) "Fabrication of Three-Dimensional Polymer Photonic Crystal Structures Using Single Diffraction Element Interference Lithography," *Appl. Phys. Lett.* 82(11):1667-1669.
Dodabalapur A. (Apr. 2006) "Organic and Polymer Transistors for Electronics," *Mater Today* 9(4):24-30.
Dodabalapur et al. (1995) "Organic Transistors: Two-Dimensional Transport and Improved Electrical Characteristics," *Science* 268:270-271.
Duan et al. (2000) "General Synthesis of Compound Semiconductor Nanowires," *Adv. Mater.* 12:298-302.
Duan et al. (2003) "High-performance Thin-Film Transistors Using Semiconductor Nanowires and Nanoribbons," *Nature* 425:274-278.
Duan X, (2003) "Semiconductor Nanowires: From Nanoelectronics to Macroelectronics," Abstract from a presentation given at the 11th Foresight Conference on Molecular Nanotechnology, Oct. 10-20, Burlingame, CA.

(56) References Cited

OTHER PUBLICATIONS

Duboz et al. (1998) "Transistors and Detectors Based on GaN-Related Materials," In; *Group III Nitride Semiconductor Compounds*, Gill, B. ed., Clarendon, Oxford, pp. 343-387.
Duesberg et al. (2000) "Polarized Raman Spectroscopy on Isolated Single-Wall Carbon Nanotubes," *Phys. Rev. Lett.*, vol. 85, No. 25, pp. 5436-5439.
Duffy et al. (1998) "Rapid Prototyping of Microfluidic Systems in Poly(dimethylsiloxane)," *Anal. Chem.* 70:4974-4984.
Durkop et al. (2004) "Extraordinary Mobility in Semiconducting Carbon Nanotube," *Nano Lett.* 4(1):35-39.
Eder et al. (Apr. 5, 2004) "Organic Electronics on Paper," *Appl. Phys. Lett.* 84(14):2673-2675.
Edrington et al. (2001) "Polymer-Based Photonic Crystals," *Adv. Mater.* 13:421-425.
Efimenko et al. (Oct. 15, 2002) "Surface Modification of Sylgard-184 Poly(dimethyl Siloxane) Networks by Ultraviolet and Ultraviolet/Ozone Treatment," *J. Colloid Interface Sci.* 254(2):306-315.
Eftekhari, G. (1993) "Variation in the Effective Richardson Constant of Metal—GaAs and Metal—InP Contacta Due to the Effect of Processing Parameters," *Phys. Status Solid A—Appl. Res.* 140:189-194.
Ensell, G. (1995) "Free Standing Single-Crystal Silicon Microstructures," *J. Micromech. Microeng.* 5:1-4.
Examination Report and Response, Corresponding to Malaysian Patent Application No. PI 20062672, dated Aug. 28, 2009.
Examination Report, Corresponding to European Application No. EP 05 756 327.2, dated Jan. 20, 2010.
Examination Report, Corresponding to Malaysian Patent Application No. PI 20092343, dated Jun. 15, 2010.
Examination Report, Corresponding to Malaysian Patent Publication No. PI 20052553, dated Mar. 13, 2009.
Examination Report, Corresponding to Singapore Patent Application No. 200608359- 6, dated Aug. 27, 2008.
Examination Report, Response and Search Report, Corresponding to Malaysian Patent Application No. PI 20062537, dated Nov. 20, 2009.
Examination Report, Written Opinion and Response, Corresponding to Singapore Patent Application No. 2007/18082-1, dated Feb. 26, 2009.
Faez et al. (1999) "An Elastomeric Conductor Based on Poluaniline Prepared by Mechanical Mixing," *Polymer* 40:5497-5503.
Felgner et al. (1996) "Flexural Rigidity of Microtubules Measured with the Use of Optical Tweezers," *J. Cell Sci.* 109:509-516.
Fink et al. (1999) "*Block Copolymers as Photonic Bandgap Materials,*" *J. Lightwave Tech.* 17:1963-1969.
Flewitt et al. (2005) "Low-Temperature Deposition of Hydrogenated Amorphous Silicon in an Electron Cyclotron Resonance Reactor for Flexible Displays," *Proc. IEEE* 93:1364-1373.
Folch et al. (1999) "Wafer-Level In-Registry Microstamping," *J. Microelectromech. Syst.* 8:85-89.
Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.
Forrest et al. (2004) "The Path to Ubiquitous and Low-Cost Organic Electronic Appliances on Plastic," *Nature* 428:911-918.
Fortunato et al. (2005) "Flexible a-Si: H Position-Sensitive Detectors," *Proc. IEEE* 93:1281-1286.
Fortunato et al. (Sep. 2008) "High-Performance Flexible Hybrid Field-Effect Transistors Based on Cellulose Fiber Paper," *IEEE Electron. Dev. Lett.* 29(9):988-990.
Freire et al. (1999) "Thermal Stability of Polyethylene Terephthalate (PET): Oligomer Distribution and Formation of Volatiles," *Packag. Technol. Sci.* 12:29-36.
Freund, L.B. (2000) "The Mechanics of Electronic Materials," *Int. J. Solids Struct.* 37:185-196.
Friedman et al. (2005) "High-Speed Integrated Nanowire Circuits," *Nature* 434:1085-.

Fu et al. (Jan. 10, 2003) "Patterning of Diamond Microstructures on Si Substrate by Bulk and Surface Micromachining," *J. Mater. Process. Technol.* 132(1-3):73-81.
Furneaux et al. (1989) "The Formation of Controlled-Porosity Membranes from Anodically Oxidized Aluminum," *Nature* 337:147-149.
Gan et al. (2002) "Preparation of Thin-Film Transostros With Chemical Bath Deposited CdSe and CdS Thin Films," *IEEE Trans. Electron. Dev.* 49:15-18.
Gao et al. (Sep. 9, 2005) "Conversion of Zinc Oxide Nanobelts into Superlattice-Structures Nanohelices," *Science* 309:1700-1704.
Garcia et al. (2004) "Etchant Anisotropy Controls the Step Bunching Instability in KOH Etching of Silicon," *Phys. Rev. Lett.* 93(16):166102.
Garnier et al. (1994) "All-Polymer Field-Effect Transistor Realized by Printing Techniques," *Science* 265:1684-1686.
Geim et al. (Mar. 2007) "The Rise of Graphene," *Nature Mater.* 6:183-191.
Geissler et al. (2003) "Fabrication of Metal Nanowires Using Microcontact Printing," *Langmuir* 19(15):6301-6311.
Geissler et al. (Jun. 2003) "Selective Wet-Etching of Microcontact-Printed Cu Substrates with Control Over the Etch Profile," *Microelec. Eng.* 67-68:326-332.
Gelinck et al. (2000) "High-Performance All-Polymer Integrated Circuits," *Appl. Phys. Lett.* 77:1487-1489.
Gelinck et al. (2004) "Fleible Active-Matrix Displays and Shift Registers Based on Solution-Processed Organic Transistors," *Nat. Mater.* 3:106-110.
Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.
Givargizov, E.I. (1991) "Applications," In; *Oriented Crystallization on Amorphous Substrates*, Plenum Press, New York, pp. 341-363.
Goetting et al. (1999) "Microcontact Printing of Alkanephosphonic Acids on Aluminum: Pattern Transfer by Wet Chemical Etching," *Langmuir* 15:1182-1191.
Goldman et al. (1996) "Correlation of Buffer Strain Relaxation Modes with Transport Properties of Two-Dimensional Electron Gases," *J. Apple. Phys.* 80:6849-6854.
Goldmann et al. (2004) "Hole Mobility in Organic Single Crystals Measured by a "Flip-Crystal" Field-Effect Technique," *J. Appl. Phys.* 96:2080-2086.
Goldsmith, T.H. (Sep. 1990) "Optimization, Constraint, and History in the Evolution of Eyes," *Quart. Rev. Biol.* 65(3):281-322.
Gratz et al. (1991) "Atomic Force Microscopy of Atomic-Scale Ledges and Etch Pits Formed During Dissolution of Quartz," *Science*, 251:1343-1346.
Gray et al. (Dec. 2001) "Screen Printed Organic Thin Film Transistors (OTFTs) on a Flexible Substrate," *Proc. SPIE* 4466:89-94.
Gray et al. (Mar. 5, 2004) "High-Conductivity Elastomeric Electronics," *Adv. Mater.* 16(5):393-397.
Grayson, T. (2002) "Curved Focal Plane Wide Field of View Telescope Design," *Proc. SPIE* 4849:269-274.
Gruen et al. (Mar. 21, 1994) "Fullerenes as Precursors for Diamond Film Growth Without Hydrogen or Oxygen Additions," *Appl. Phys. Lett.* 65(12):1502-1504.
Gudiksen et al. (Web Release Apr. 18, 2001) "Synthetic Control of the Diameter and Length of Single Crystal Semiconductor Nanowires," *J. Phys. Chem. B* 105:4062-4064.
Guo et al. (Aug. 19, 2002) "Metal-Insulator-Semiconductor Electrostatics of Carbon Nanotubes," *Appl. Phys. Lett.* 81(8):1486-1488.
Gur et al. (2005) "Air-Stable All-Inorganic Nanocrystal Solar Cells Processed from Solution," *Science* 310:462-465.
Gurbuz et al. (Jul. 2005) "Diamond Semiconductor Technology for RF Device Applications." *Solid State Electron.* 49(7):1055-1070.
Haisma et al. (2002) "Contact Bonding, Including Direct-Bonding in a Historical and Recent Context of Materials Science and Technology, Physics and Chemistry," *Mater. Sci Eng.* 37:1-60.
Halik et al. (2004) "Low-Voltage Organic Transistors with an Amorphous Molecular Gate Dielectric," *Nature* 431:963-966.
Hamedi et al. (May 2007) "Towards Woven Logic from Organic Electronic Fibres," *Nat. Mater.* 6:357-362.

(56) References Cited

OTHER PUBLICATIONS

Hamilton et al. (2004) "Field-Effect Mobility of Organic Polymer Thin-Film Transistors," *Chem. Mater.* 16:4699-4704.
Han et al. (2005) "Template-Free Directional Growth of Single-Walled Carbon Nanotues on a- and r-Plane Sapphire," *J. Am. Chem. Soc.* 127:5294-5295.
Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.
Harkonen et al. (Jun. 8, 2006) "4 W Single-Transverse Mode VECSEL Utilizing Intra-Cavity Diamond Heat Spreader," *Electron Lett.* 42(12):693-694.
He et al. (2005) "Si Nanowire Bridges in Microtrenches: Integration of Growth into Device Fabrication," *Adv. Mater.* 17:2098-2102.
Heffelfinger et al. (1997) "Steps and the structure of the (0001) α-alumina surface," *Surf. Sci.*, 370:L168-L172.
Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," *Langmuir* 20(3):785-794.
Hines et al. (2005) "Nanotransfer Printing of Organic and Carbon Nanotube Thin-Film Transistors on Plastic Substrates," *Appl. Phys. Lett.* 86:163101.
Holmes et al. (Feb. 25, 2000) "Control of Thickness and Orientation of Solution-Grown Silicon Nanowires," *Science* 287:1471-1473.
Horn et al. (1992) "Contact Electrification and Adhesion Between Dissimilar Materials," *Science* 256:362-364.
Hoyer, P. (1996) "Semiconductor Nanotube Formation by a Two-Step Template Process," *Adv. Mater.* 8:857-859.
Hsia et al. (2005) "Collapse of Stamps for Soft Lithography Due to Interfacial Adhesion," *Appl. Phys. Lett.* 86:154106.
Hsu et al. (2002) "Amorphous Si TFTs on Plastically Deformed Spherical Domes," *J. Non-Crystalline Solids* 299-302:1355-1359.
Hsu et al. (2003) "Nature of Electrical Contacts in a Metal-Molecule-Semiconductor System," *J. Vac. Sci. Technol. B* 21(4):1928-1935.
Hsu et al. (Jan. 15, 2004) "Spherical Deformation of Compliant Substrates with Semiconductor Device Islands," *J. Appl. Phys.* 95(2):705-712.
Hsu et al. (Mar. 2004) "Effects of Mechanical Strain on TFT's on Spherical Domes," *IEEE Trans. Electron Dev.* 51(3):371-377.
Hu et al. (1997) "Using Soft Lithography to Fabricate GaAs/AlGaAs Heterostructure Field Effect Transistors," *Appl. Phys. Lett.* 71:2020-2022.
Hu et al. (1999) Chemistry and Physics in One Dimension: Synthesis and Properties of Nanowires and Nanotubes, *Acc. Chem. Res.* 32:435-445.
Hu et al. (2004) "Percolation in Transparent and Conducting Carbon Nanotube Networks," *Nano Lett.*, vol. 4, No. 12, pp. 2513-2517.
Huang et al. (2001) "Directed Assembly of One-Dimensional Nanostructures into Functional Networks," *Science* 291:630-633.
Huang et al. (2001) "Room-Temperature Ultraviolet Nanowire Nanolasers," *Science* 292:1897-1899.
Huang et al. (2003) "Growth of Millimeter-Long and Horizontally Aligned Single-Walled Carbon Nanotubes on Flat Substrates," *J. Am. Chem. Soc.*, 125:5636-5637.
Huang et al. (2004) "Long and Oriented Single-Walled Carbon Nanotubes Grown by Ethanol Chemical Vapor Deposition," *J. Phys. Chem. B.* 108:16451-16456.
Huang et al. (2004) "Self-Organizing High-Density Single-Walled Carbon Nanotube Arrays from Surfactant Suspensions," *Nanotechnol.* 15:1450-1454.
Huang et al. (2005) "Nanomechanical Architecture of Strained Bilayer Thin Films: From Design Principles to Experimental Fabrication," *Adv. Mater.* 17(23):2860-2864.
Huang et al. (2005) "Nanowires for Integrated Multicolor Nanophotonics," *Small* 1(1):142-147.
Huang et al. (2005) "Nonlinear Analyses of Wrinkles in a Film Bonded to a Compliant Substrate," *J. Mech. Phys. Solids* 53:2101-2118.
Huang et al. (2005) "Stamp Collapse in Soft Lithography," *Langmuir* 21:8058-8068.
Huang et al. (Jan. 16, 2001) "Catalytic Growth of Zinc Oxide Nanowires by Vapor Transport," *Adv. Mater.* 13(2):113-116.
Huck et al. (2000) "Ordering of Spontaneously Formed Buckles on Planar Surfaces," *Langmuir* 16:3497-3501.
Huie, J.C. (2003) "Guided Molecular Self Assembly: A review of Recent Efforts," *Smart Mater. Struct.* 12:264-271.
Huitema et al. (2001) "Plastic Transistors in Active-Matrix Displays," *Nature* 414:599.
Hur et al. (2005) "Printed thin-film transistors and complementary logic gates that use polymer-coated single-walled carbon nanotube networks," *J. Appl. Phys.*, 98, 114302.
Hur et al. (205) "Organic Nanodelectrics for Low Voltage Carbon Nanotube Thin Film Transistors and Complementary Logc Gates," *J. Am. Chem. Soc.* 127:13808-13809.
Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-5732.
Hur etal. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.
Hutchinson et al. (1992) "Mixed Mode Cracking in Layered Materials," *Adv. Appl. Mech.* 29:63-191.
Imparato et al. (2005) "Excimer Laser Induced Crystallization of Amorphous Silicon on Flexible Polymer Substrates," *Thin Solid Films* 487:58-62.
International Search Report and Written Opinion, Corresponding to International Application No. PCT/US2006/032125, dated Mar. 21, 2008.
International Search Report and Written Opinion, Corresponding to International Application No. PCT/US2009/058231, dated Nov. 17, 2009.
International Search Report and Written Opinion, Corresponding to International Application No. PCT/2005/014449, dated Jul. 3. 2008.
International Search Report and Written Opinion, Corresponding to International PCT Application No. PCT/US05/19354, dated Apr. 18, 2007.
International Search Report and Written Opinion, Corresponding to International PCT Application No. PCT/US2007/079070, dated Apr. 23, 2008.
International Search Report and Written Opinion, Corresponding to International PCT Application No. PCT/US2007/077759, dated Apr. 11, 2008.
International Search Report and Written Opinion, Corresponding to International PCT Application No. PCT/US2007/022959, dated Oct. 14, 2008.
International Search Report and Written Opinion, Corresponding to International PCT Application No. PCT/US2006/021161, dated Feb. 28, 2008.
International Search Report and Written Opinion, Corresponding to International Application No. PCT/US2009/036192, dated Jul. 6, 2009.
Isberg et al. (Sep. 6, 2002) "High Carrier Mobility in Single-Crystal Plasma-Deposited Diamond," *Science* 297:1670-1672.
Islam et al. (Jan. 16, 2003) "High Weight Fraction Surfactant Solubilization of Single-Wall Carbon Nanotubes in Water," *Nano Lett.* 3(2):269-273.
Ismach et al. (2004) "Atomic-Step-Templated Formation of Single Wall Carbon Nanotube Patters," *Angew. Chem. Int. Ed.* 43:6140-6143.
Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30:1604-1608.
Jabbour et al. (2001) "Screen Printing for the Fabrication of Organic Light-Emitting Devices," *IEEE J. Select. Top. Quantum. Electron.* 7:769-773.
Jackman et al. (Aug. 4, 1995) "Fabrication of Submicrometer Features on Curved Substrates by Microcontact Printing," *Science* 269:664-666.

(56) References Cited

OTHER PUBLICATIONS

Jacobs et al. (2002) "Fabrication of a Cylindrical Display by Patterned Assembly," *Science* 296:323-325.
Jain et al. (2000) "III-Nitrides: Growth, Characterization, and Properties," *J. Appl. Phys.* 87:965-1006.
Jain et al. (2005) "Flexible Electronics and Displays: High-Resolution, Roll-to-Roll, Projection Lithography and Photoblation processing Technologies for Hiogh-Throughput Production," *Proc. IEEE* 93:1500-1510.
James et al. (1998) "Patterned Protein Layers on Solid Substrates by This Stamp Microcontact Printing," *Langmuir* 14:742-744.
Jang et al. (2003) "Lateral Growth of Aligned Multiwalled Carbon Nanotubes Under Electric Fiels," *Solid State Commun.* 126:305-308.
Jang et al. (2006) "Low-Voltage and High-Field-Effect Mobility Organic Transistors with a Polymer Insulator," *Appl. Phys. Lett.* 88:072101.
Javey et al. (2002) "High-κ Dielectrics for Advanced Carbon-Nanotube Transistors and Logic Gates," *Nature Mater.* 1:241-246.
Javey et al. (2005) "High Performance n-Type Carbon Nanotube Field-Effect Transistors with Chemically Doped Contacts," *Nano Lett.*, vol. 5, No. 2, pp. 345-348.
Javey et al. (Aug. 7, 2003) "Ballistic Carbon Nanotube Field-Effect Transistors," *Nature* 424:654-657.
Jenkins et al. (1994) "Gallium Arsenide Transistors: Realization Through a Molecularly Designs Insulator," *Science* 263:1751-1753.
Jeon et al. (1995) "Patterning of Dielectric Oxide Thin Layers by Microcontact Printing of Self-Assembled Monolayers," *J. Mater. Res.* 10:2996-2999.
Jeon et al. (2004) "Fabricating Complex Three-Dimensional Nanostructures with High Resolution Conformable Phase Masks," *Proc. Natl. Acad. Sci. USA* 101:12428-12433.
Jeon et al. (2004) "Three Dimensional Nanofabrication with Arubber Stamps and Conformable Photomasks," *Adv. Mater.* 16:593-600.
Jeon et al. (Aug. 4, 2004) "Three Dimensional Nanofabrication with Rubber Stamps and Conformable Photomasks," *Adv. Mater.* 16(15):1369-1375.
Jiang et a. (Oct. 2, 2007) "Finite Deformation Mechanics in Buckled Thin Films on Compliant Supports," *Proc. Natl. Acad. Sci. USA* 104(40):15607-15612.
Jiang et al. (1999) "Preparation of Macroporous Metal Films from Colloidal Crystals," *J. Am. Chem. Soc.* 121:7957-7958.
Jiang et al. (2002) "Polymer-on-Polymer Stamping: Universal Approaches to Chemically Patterned Surfaces," *Langmuir* 18:2607-2615.
Jin et al. (2004) "Scalable Interconnection and Integration of Nanowire Devices Without Registration," *Nano Lett.* 4:915-919.
Jin et al. (2004) "Soft Lithographic Fabrication of an Image Sensor Array on a Curved Substrate," *J. Vac. Sci. Technol. B* 22(5):2548-2551.
Jiyun, C.H. (2003) "Guided Molecular Self-Assembly: A Review of Recent Efforts," *Smart Mater. Struct.* 12:264-271.
Joachim et al. (Nov. 30, 2000) "Electronics Using Hybrid-Molecular and Mono-Molecular Devices," *Nature* 408:541-548.
Johnson et al. (1999) "Ordered Mesoporous Polymers of Tunable Pore Size from Colloidal Silica Templates," *Science* 283:963-965.
Jones et al. (Jul./Aug. 2004) "Stretchable Wavy Metal Interconnects," *J. Vac. Sci. Technol. A* 22(4):1723-1725.
Joo et al. (2006) "Low-Temperature Solution-Phase Synthesis of Quantum Well Structures CdSe Nanoribbons," *J. Am. Chem. Soc.* 128(17):5632-5633.
Jortner et al. (2002) "Nanostructured Advanced Materials Perspectives and Directions," *Pure Appl. Chem.* 74(9):1491-1506.
Joselevich (2002) "Vectorial Growth of Metallic and Semiconducting Single-Wall Carbon Nanotubes," *Nano Lett.*, vol. 2, No. 10, pp. 1137-1141.
Kagan (1999) "Organic-Inorganic Hybrid Materials as Semiconducting Channels in Thin-Film Field-Effect Transistors," *Science* 286:945-947.
Kagan et al. (2001) "Patterning Organic-Inorganic Thin-Film Transistors Using Microcontact Printed Templates," *Appl. Phys Lett.* 79(21):3536-3538.
Kagan et al. (2003) *Thin Film Transistors*, Dekker, New York, pp. 1-34.
Kane et al. (2000) "Analog and Digital Circuits Using Organic Thin-Film Transistors on Polyester Substrates," *IEEE Electron. Dev. Lett.* 21:534-536.
Kang et al. (Apr. 2007) "High-Performance Electronics Using Dnese, Perfectly aligned Arrays of Single-Walled Carbon Nanotubes," *Nat. Nanotechnol.* 2(4):230-236.
Kar et al. (2005) "Controlled Synthesis and Photoluminescence Properties of ZnS Nanowires and Nanoribbons," *J. Phys. Chem. B* 109(8):3298-3302.
Kar et al. (2005) "Synthesis and Optical Properties of CdS Nanoribbons," *J. Phys. Chem B.* 109(41):19134-19138.
Kar et al. (2006) "Shape Selective Growth of CdS One-Dimensional Nanostructures by a Thermal Evaporation Process,". *Phys. Chem. B.* 110(10):4542-4547.
Karnik et al. (2003) "Lateral Polysilicon $p^+$-p-$n^+$and $p^+$-n-$n^+$ Diodes," *Solid-State Electronics* 47:653-659.
Karnik et al. (2003) "Multiple Lateral Polysilicon Diodes as Temperature Sensors for Chemical Microreaction Systems," *Jpn. J. Appl. Phys.* 42:1200-1205.
Kato et al. (2004) The Characteristic Improvement of Si(111) Metal-Oxide-Semiconductor Field-Effect Transistor by Long-Time Hydrogen Annealing, *Jpn. J. Appl. Phys.* 43(10):6848-6853.
Katz et al. (2001) "Synthetic Chemistry for Ultrapure, Processable, and High-Mobility Organic Transistor Semiconductors," *Acc. Chem. Res.* 34:359-369.
Katz, H.E. (2004) "Recent Advances in Semiconductor Performance and Printing Processes for Organic Transistor-Based Electronics," *Chem. Mater.* 16:4748-4756.
Kawata et al. (2001) "Finer Features for Functional Microdevices," *Nature* 412:697-698.
Kendall, D.L. (1979) "Vertical Etching of Silicon at Very High Apect Ratios," *Ann. Rev. Mater. Sci.* 9:373-403.
Khakani et al. (2006) "Lateral Growth of Single Wall Carbon Nanotubes on Various Substrates by Means of an 'All-Laser' Synthesis Approach," *Diamond Relat. Mater.* 15:1064-1069.
Khan et al. (1993) "High Electron Mobility Transistor Based on a GaN-$Al_xGa_{1-x}$N Heterojunction," *Appl. Phys. Lett.* 63:1214-1215.
Khang et al. (2006) "A Stretchable Form of Single-Crystal Silicon for High-Performance Electronics on Rubber Substraights," *Science* 311:208-212.
Kilby, J.S. (1976) "Invention of the Integrated Circuit," *IEEE Trans. Electron. Dev.* 23:648-654.
Kim et al. (2000) "Field Emission from Carbon Nanotubes for Displays," *Diamond and Related Mater.* 9(3-6):1184-1189.
Kim et al. (2002) "Nanolithography Based on Patterned Metal Transfer and its Application to Organic Electronic Devices," *Appl. Phys. Lett.* 80:4051-4053.
Kim et al. (2003) "Epitaxial Self-Assembly of Block Copolymers on Lithographically Defined Nanopatterned Substrates," *Nature* 424:411-414.
Kim et al. (2009) "Optimized Structural Designs for Stretchable Silicon Integrated Circuits," *Small* 5(24):2841-2847.
Kim et al. (Apr. 25, 2008) "Stretchable and Foldable Silicon Integrated Circuits," *Science* 320:507-511.
Kim et al. (Dec. 2, 2008) "Materials and Noncoplanar Mesh Designs for Integrated Circuits with Linear Elastic Responses to Extreme Mechanical Deformations," *Proc. Natl. Acad. Sci. USA* 105(48):18675-18680.
Kim et al. (Jan. 2008) "Complementary Logic Gates and Ring Oscillators Plastic Substrates by Use of Printed Ribbons Single-Crystalline Silicon," *IEEE Electron. Dev. Lett.* 29(1):73-76.
Kim et al. (Nov. 15, 1999) "Direct Observation of Electron Emission Site on Boron-Doped Polycrystalline Diamond Thin Films Using an Ultra-High-Vacuum Scanning Tunneling Microscope," *Appl. Phys. Lett.* 75(20):3219-3221.
Kim et al. (Oct. 2004) "Organic TFT Array on a Paper Substrate," *IEEE Electron. Dev. Lett.* 25(10):702-704.

(56) References Cited

OTHER PUBLICATIONS

Kim et al. (Web Release Feb. 29, 2008) "Highly Emissive Self-Assembled Organic Nanoparticles Having Dual Color Capacity for Targeted Immunofluorescence Labeling," *Adv. Mater.* 20(6):1117-1121.
Kim et al. (Web Release Jul. 6, 2009) "Ultrathin Silicon Circuits with Strain-Isolation Layers and Mesh Layouts for High-Performance Electronics on Fabric, Vinyl, Leather and Paper," *Adv. Mater.* 21(36):3703-3707.
Kim, Y.S. (Web Release Aug. 9, 2005) "Microheater-Integrated Single Gas Sensor Array Chip Fabricated on Flexible Polyimide Substrate," *Sens. Actuators B* 114(1):410-417.
Klauk et al. (2002) "High-Mobility Polymer Gate Dielectric Pentacene Thin Film Transistors," *J. Appl. Phys.* 92:5259-5263.
Klein-Wiele et al. (2003) "Fabrication of Periodic Nanostructures by Phase-Controlled Multiple-Beam Interference," *Appl. Phys. Lett.* 83(23):4707-4709.
Knipp et al. (2003) "Pentacine Thin Film Transistors on Inorganic Dielectrics: Morphology, Structural Properties, and Electronic Transport," *Appl. Phys. Lett.* 93:347-355.
Ko et al. (2006) "Bulk Quantities of Single-Crystal Silicon Micro-/Nanoribbons Generated from Bulk Wafers," *Nano Lett.* 6(10):2318-2324.
Ko et al. (Aug. 7, 2008) "A Hemispherical Electronic Eye Camera Based on Compressible Silicon Optoelectronics," *Nature* 454:748-753.
Ko et al. (Web Release Oct. 28, 2009) "Curvilinear Electronics Formed Using Silicon Membrane Circuits and Elastomeric Transfer Elements," *Small* 5(23):2703-2709.
Kocabas et al. (2004) "Aligned Arrays of Single-Walled Carbon Nanotubes Generated from Random Networks by Orientationally Selective Laser Ablation," *Nano Lett.*, vol. 4, No. 12, pp. 2421-2426.
Kocabas et al. (2005) "Guided Growth of Large-Scale, Horizontally Aligned Arrays of Single-Walled Carbon Nanotubes and Their Use in Thin-Film Transstors," *Small* 1(11):1110-1116.
Kocabas et al. (2006) "Large Area Aligned Arrays of SWNTs for High Performance Thin Film Transistors," American Physical Society, APS March Meeting, Mar. 13-17, Abstract # W31.004.
Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.
Kocabas et al. (Feb. 5, 2008) "Radio Frequency Analog Electronics Based on Carbon Nanotube Transistors," *Proc. Natl. Acad. Sci. USA* 105(5):1405-1409.
Kodambaka et al. (2006) "Control of Si Nanowire Growth by Oxygen," *Nano Lett.* 6(6):1292-1296.
Koide et al. (2000) "Patterned Luminescence of Organic Light-Emitting Diodes by Hot Microcontact Printing (H$^\mu$CP) of Self-Assembled Monolayers," *J. Am. Chem. Soc.* 122:11266-11267.
Konagai et al. (1978) "High Efficiency GaAs Thin Film Solar Cells by Peeled Film Technology," *J. Cryst. Growth* 45:277-280.
Kong et al. (2004) "Single-Crystal Nanorings Formed by Epitaxial Self-Coating of Polar Nanobelts," *Science* 303:1348-1351.
Kong et al. (Jan. 28, 2000) "Nanotube Molecular Wires as Chemical Sensors," *Science* 287:622-625.
Kong et al. (Oct. 2003) "Structure of Indium Oxide Nanobelts," *Solid State Commun.* 128(1):1-4.
Kong et al. (Oct. 29, 1998) "Synthesis of Individual Single-Walled Carbon Nonotubes on Patterned Silicon Wafers," *Nature* 395:878-881.
Kudo et al. (Web Release Jun. 13, 2006) "A Flexible and Wearable Glucose Sensor Based on Functional Polymers with Soft-MEMS Techniques," *Biosens. Bioelectron.* 22:558-562.
Kulkarni et al. (2002) "Mesoscale Organization of Metal Nanocrystals," *Pure Appl. Chem* 74(9):1581-1591.
Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(4):2002-2004.
Kumar et al. (1994) "Patterning Self-Assembled Monolayers: Applications in Materials Science," *Langmuir* 10:1498-1511.
Kumar et al. (2002) "Thermally-Stable Low-Resistance Ti/Al/Mo/Au Multilayer Ohmic Contacts on n-GaN," *J. Appl. Phys.* 92:1712-1714.
Kumar et al. (2005) "Percolating in Finite Nanotube Networks," *Phys. Rev. Lett.*, 95, 066802.
Kuo et al. (1985) "Effect of Mismatch Strain on Band Gap in III-V Semiconductors," *J. Appl. Phys.* 57:5428-5432.
Kuykendall et al. (Aug. 2004) "Crystallographic Alignment of High Density Gallium Nitride Nanowire Arrays," *Nat. Mater.* 3:524-528.
Lacour et al. (2005) "Stretchable Interconnects for Elastic Electronic Surfaces," *Proc. IEEE* 93:1459-1467.
Lacour et al. (Apr. 14, 2003) "Stretchable Gold Conductors on Elastomeric Substrates," *Appl. Phys. Lett.* 82(15):2404-.
Lacour et al. (Apr. 2004) "Design and Performance of Thin Metal Film Interconnects for Skin-Like Electronic Circuits," *IEEE Electron. Dev. Lett.* 25(4):179-181.
Lacour et al. (Dec. 2004) "An Elastically Stretchable TFT Circuit," *IEEE Electron Dev. Lett.* 25(12):792-794.
Lacour et al. (Web Release Jul. 14, 2006) "Stiff Subcircuit Islands of Diamondlike Carbon for Stretchable Electronics," *J. Appl. Phys.* 100:014913.
Lacour et al. (Web Release May 16, 2006) "Mechanisms of Reversible Stretchability of Thin Metal Films on Elastomeric Substrates," *Appl. Phys. Lett.* 88:204103.
Laimer et al. (Mar. 1997) "Diamond Growth in a Direct-Current Low-Pressure Supersonic Plasmajet," *Diamond Relat. Mater.* 6:406-410.
Lambacher et al. (2004) "Electrical Imaging of Neuronal Activity by Multi-Transistor-Array (MTA) Recording at 7.8 µm Resolution," *Appl. Phys. A* 79:1607-1611.
Landes et al. (2002) "Some Properties of Spherical and Rod-Shaped Semiconductor and Metal Nanocrystals," *Pure Appl. Chem.* 74(9):1675-1692.
Law et al. (2004) "Semiconductor Nanowires and Nanotubes," *Ann. Rev. Mater. Res.* 34:83-122.
Law et al. (Aug. 27, 2004) "Nanoribbon Waveguides for Subwavelength Photonics Integration," *Science* 305:1269-1273.
Lay et al. (2004) "Simple Route to Large-Scale Ordered Arrays of Liquid-Deposited Carbon Nanotubes," *Nano Lett.*, vol. 4, No. 4, pp. 603-606.
Leclercq et al. (1998) "III-V Micromachined Devices for Microsystems," *Microelectronics J.* 29:613-619.
Lecomte et al. (Apr. 2006) "Degradation Mechanism of Diethylene Glycol Units in a Terephthalate Polymer," *Polym. Degrade. Stab.* 91(4):681-689.
Lee et al. (2000) "Thin Film Transistors for Displays on Plastic Substrates," *Solid State Electron.* 44:1431-1434.
Lee et al. (2003) "High-Performance Poly-Si TFTs on Plastic Substrates Using a Nano-Structured Separation Layer Approach," *IEEE Elec. Dev. Lett.* 24:19-21.
Lee et al. (2004) "Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexable Optoelectronic Systems," *Small* 1:1164-1168.
Lee et al. (2005) "Large-Area, Selective Transfer of Microstructured Silicon (µs-Si): A Printing-Based Approach to High-Performance Thin0Film Transistors Supported on Flexible Substraights," *Adv. Mater.* 17:2332-2336.
Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," *Appl. Phys. Lett.* 100:084907/1-7.
Lee et al. (Apr. 2005) "Fabrication of Stable Metallic Patterns Embedded in Poly(dimethylsiloxane) and Model Applications in Non-Planar Electronic and Lab-on-a-Chip Device Patterning," *Adv. Funct. Mater.* 15(4):557-566.

(56) References Cited

OTHER PUBLICATIONS

Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.
Lee et al. (Feb. 2001) "Application of Carbon Nanotubes to Field Emission Displays," *Diamond and Related Mater.* 10(2):265-270.
Lee et al. (Feb. 2005) "Weave Patterned Organic Transistors on Fiber for E-Textiles," *IEEE Trans. Electron. Dev.* 52(2):269-275.
Létant et al. (Jun. 2003) "Functionalized Silicon Membranes for Selective Bio-Organisms Capture," *Nat. Mater.* 2:391-395.
Li et al. (2002) "High-Resolution Contact Printing with Dendrimers," *Nano Lett.* 2(4):347-349.
Li et al. (2003) "Ultrathin Single-Crystalline-Silicon Cantilever Resonators: Fabrication Technology and Significant Specimen Size effect on Young's Modulus," *Appl. Phys. Lett.* 83:3081-3083.
Li et al. (2004) "Electrospinning of Nanofibers: Reinventing the Wheel," *Adv. Mater.* 16(14):1151-1170.
Li et al. (2006) "Catalyst-Assisted Formation of Nanocantilever Arrays on ZnS Nanoribbons by Post-Annealing Treatment," *J. Phys. Chem. B* 110(13):6759-6762.
Li et al. (Dec. 2005) "Compliant Thin Film Patterns of Stiff Materials as Platforms for Stretchable Electronics," *J. Mater. Res.* 20(12):3274-3277.
Li et al. (Jul. 1, 2002) "ZnO Nanobelts Grown on Si Substrate," *Appl. Phys. Lett.* 81:144-146.
Lieber, C. (2001) "The Incredible Shrinking Circuit," *Sci. Am.* 285(3):58-64.
Lieber, C.M. (2003) "Nanoscale Science and Technology: Building a Bog Future from Small Things," *MRS. Bull.* 28:486-.
Lieber, C.M. (2003) "Nanoscale Science and Technology: Building a Bog Future from Small Things," *MRS. Bull.* 28:486-491.
Lim et al. (2005) "Flexible Membrane Pressure Sensor," *Sens. Act. A* 119:332-335.
Lima et al. (2007) "Creating Micro- and Nanostructures on Tubular and Spherical Surfaces," *J. Vac. Sci. Technol. B* 25(6):2412-2418.
Lin et al. (Sep. 2005) "High-Performance Carbon Nanotube Field-Effect Transistor With Tunable Polarities," *IEEE Trans. Nano* 4(5):481-489.
Linder et al. (1994) "Fabrication Technology for Wafer Through-Hole Interconnections and Three-Dimensional Stacks of Chips and Wafers," *Proc. IEEE Micro. Electro Mech. Syst.* 349-354.
Ling et al. (2004) "Thin Film Deposition, Patterning, and Printing in Organic Thin Film Transistors," *Chem. Mater.* 16:4824-4840.
Liu et al. (1999) "Controlled deposition of individual single-walled carbon nanotubes on chemically functionalized templates," *Chem. Phys. Lett.*, 303:125-129.
Long et al. (1990) "Heterostructure FETs and Bipolar Transistors," In; *Gallium Arsenide Digital Integrated Circuit Design*, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics," *Appl. Phys. Lett.* 81:562-564.
Loo et al. (2002) "High-Resolution Transfer Printing on GaAs Surfaces Using Alkane Dithiol Monolayers," *J. Vac. Sci. Technol. B* 20(6):2853-2856.
Loo et al. (2002) "Interfacial Chemistries for Nanoscale Transfer Printing," *J. Am. Chem. Soc.* 124:7654-7655.
Loo et al. (2002) "Soft, Conformable Electrical Contacts for Organic Semiconductors: High-Resolution Plastic Circuits by Lamination," *Proc. Natl. Acad. Sci. USA* 99(16):10252-10256.
Loo et al. (2003) "Electrical Contacts to Molecular Layers by Nanotransfer Printing," *Nano Lett.* 3(7):913-917.
Lopes et al. (Sep. 2004) "Thermal Conductivity of PET/(LDPE/Al) Composites Determined by MDSC," *Polym. Test.*23(6):637-643.
Lu et al. (Dec. 2006) "Electronic Materials-Buckling Down for Flexible Electronics," *Nat. Nanotechnol.* 1:163-164.
Lu et al. (Jul. 19, 2005) "One Dimensional Hole Gas in Germanium/Silicon Nanowire Heterostructures," *Proc. Nat. Acad. Sci. USA* 102(29):10046-10051.
Lu et al. (Nov. 2008) "Nanowire Transistor Performance Limits and Applications," *IEEE Trans Electron Dev.* 55(11):2859-2876.
Luan et al. (1992) "An Experimental Study of the Source/Drain Parasitic Resistance Effects in Amorphous Silicon Thin Film Transistors," *J. Appl. Phys.* 72:766-772.
Ma et al. (2004) "Single-Crystal CdSe Nanosaws," *J. Am. Chem. Soc.* 126(3):708-709.
Mack et al. (2006) "Mechanically Flexible Thin-Film Transistors that Use Ultrathin Ribbons of Silicon Derived from Bulk Wafers," *Appl. Phys. Lett.* 88:213101.
Madou, M. (1997) "Etch-Stop Techniques," In; *Fundamentals of Microfabrication*, CRC Press, New York, pp. 193-199.
Maikap et al. (2004) "Mechanically Strained-Si NMOSFETs," *IEEE Electron. Dev. Lett.* 25:40-42.
Maldovan et al. (2004) "Diamond-Structured Photonic Crystals," *Nature Materials* 3:593-600.
Mandlik et al. (Aug. 2006) "Fully Elastic Interconnects on Nanopatterned Elastomeric Substrates," *IEEE Electron Dev. Lett.* 27(8):650-652.
Manna et al. (Web Release May 25, 2003) "Controlled Growth of Tetrapod-Branched Inorganic Nanocrystals," *Nat. Mater.* 2:382-385.
Markovich et al. (1999) "Architectonic Quantum Dot Solids," *Acc. Chem. Res.* 32:415-423.
Marquette et al. (2004) "Conducting Elastomer Surface Texturing: A Path to Electrode Spotting Application to the Biochip Production," *Biosens. Bioelectron.* 20:197-203.
Martensson et al. (2004) "Nanowire Arrays Defined by Nanoimprint Lithography," *Nano Lett.* 4:699-702.
Martin, C.R. (1995) "Template Synthesis of Electronically Conductive Polymer Nanostructures," *Acc. Chem. Res.* 28:61-68.
Mas-Torrent et al. (2006) "Large Photoresponsivity in High-Mobility Single-Crystal Organic Field-Effect Phototransistors," *ChemPhysChem* 7:86-88.
Masuda et al. (2000) "Fabrication of Ordered Diamonds/Metal Nanocomposite Structures," *Chem. Lett.* 10:1112-1113.
Matsunaga et al. (2003) "An Improved GaAs Device Model for the Simulation of Analog Integrated Circuit," *IEEE Trans. Elect. Dev.* 50:1194-1199.
McAlpine et al. (2003) "High-Performance Nanowire Electronics and Photonics on Glass and Plastic Substrates," *Nano Lett.* 3:1531-1535.
McAlpine et al. (2005) "High-Performance Nanowire Electronics and Photonics and Nanoscale Patterning on Flexible Plastic Substrates," *Proc. IEEE* 93:1357-1363.
McCaldin et al. (1971) "Diffusivity and Solubility of Si in the Al Metallization of Integrated Circuits," *Appl. Phys. Lett.* 19:524-517.
Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.
Meitl et al. (2004) "Solution Casting and Transfer Printing Single-Walled Carbon Nanotube Films," *Nano Lett.* 4:1643-1947.
Meitl et al. (2006) "Transfer Printing by Kinetic Control of Adhesion to an Elastomeric Stamp," *Nat. Mater.* 5:33-38.
Meitl et al. (Web Release Feb. 22, 2007) "Stress Focusing for Controlled Fracture in Microelectromechanical Systems," *Appl. Phys. Lett.* 90:083110.
Melosh et al. (2003) "Ultrahigh-Density Nanowire Lattices and Circuits," *Science* 300:112-115.
Menard et al. (2004) "A Printable Form of Silicon for High Performance Thin Film Transistors on Plastic Substrates," *Appl. Phys. Lett.* 84:5398-5400.
Menard et al. (2004) "Improved Surface Chemistries, Thin Film Deposition Techniques, and Stamp Designs for Nanotransfer Printing," *Langmuir* 20:6871-6878.
Menard et al. (2004) "High-Performance n- and p-Type Single-Crystal Organic Transistors with Free-Space Gate Dielectrics," *Adv. Mat.* 16:2097-2101.
Menard et al. (2005) "Bendable Single Crystal Silicon Thin Film Transistors Formed by Printing on Plastic Substrates," *Appl. Phys. Lett.* 86(093507):1-3.

(56) References Cited

OTHER PUBLICATIONS

Miao et al. (2003) "Micromachining of Three-Dimensional GaAs Membrane Structures Using High-Energy Nitrogen Implantation," *J. Micromech. Microeng.* 13:35-39.
Michel et al. (2001) Printing Meets Lithography: Soft Approaches to High-Resolution Patterning, *IBM J. Res. Dev.* 45:697-719.
Miller et al. (2002) "Direct Printing of Polymer Microstructures on Flat and Spherical Surfaces Using a Letterpress Technique," *J. Vac. Sci. Technol. B* 20(6):2320-2327.
Milliron et al. (2004) "Colloidal Nanocrystal Heterostructures with Linear and Branched Topology," *Nature* 430:190-195.
Min, G. (Apr. 4, 2003) "Plastic Electronics and Their Packaging Technologies," *Syn. Metals.* 135:141-143.
Mirkin et al. (2001) "Emerging Methods for Micro- and Nanofabrication," *MRS Bulletin* 26(7):506-507.
Misewich et al. (May 2, 2003) "Electronically Induced Optical Emission from a Carbon Nanotube FET," *Science* 300:783-786.
Mishra et al. (2002) "AlGaN/GaN HEMTs—an Overview of Device Operation and Applications," *Proc. IEEE* 90:1022-1031.
Mitzi et al. (2004) "High-Mobility Ulltrathin Semiconducting Films Prepared by Spin Coating," *Nature* 428:299-303.
Moon et al. (2002) "Ink-Jet Printing of Binders for Ceramic Components," *J. Am. Ceram. Soc.* 85:755-762.
Moore et al. (Sep. 9, 2003) "Individually Suspended Single-Walled Carbon Nanotubes in Various Surfactants," *Nano Lett.* 3(10):1379-1382.
Morales et al. (Jan. 9, 1998) "A Laser Ablation Method for the Synthesis of Crystalline Semiconductor Nanowires," *Science* 279:208-211.
Morent et al. (2007) "Adhesion Enhancement by a Dielectric Barrier Discharge of PDMS used for Flexible and Stretchable Electronics," *J. Phys. D. Appl. Phys.* 40:7392-7401.
Mori et al. (1978) "A New Etching Solution System, $H_3PO_4$—$H_2O_2$—$H_2O$, for GaAs and its Kinetics," *J. Electrochem. Soc.* 125:1510-1514.
Morkoc et al. (1995) "High-Luminosity Blue and Blue-Green Gallium Nitride Light-Emitting Diodes," *Science* 267:51-55.
Morkved et al. (1994) "Mesoscopic Self-Assembly of Gold Islands on Diblock-Copolymer Films," *Appl. Phys. Lett.* 64:422-424.
Morra et al. (1990) "On the Aging of Oxygen Plasma-Treated Polydimthylsiloxane Surfaces," *J. Colloid Interface Sci.* 137:11-24.
Murakami et al. (2005) "Polarization Dependence of the Optical Absorption of Single-Walled Carbon Nanotubes," *Phys. Rev. Lett.*, 94, 087402.
Namazu et al. (2000) "Evaluation of Size Effect on Mechanical Properties of Single Crystal Silicon by Nanoscale Bending Test Using AFM," *J. MEMS* 9:450-459.
Nath et al. (2002) "Nanotubes of the Disulfides of Groups 4 and 5 Metals," *Pure Appl. Chem.* 74(9):1545-1552.
Nathan et al. (2000) "Amorphous Silicon Detector and Thin Film Transistor Technology for Large-Area Imaging of X-Rays,." *Microelectron J.* 31:883-891.
Nathan et al. (2002) "Amorphous Silicon Technology for Large Area Digital X-Ray and Optical Imaging," *Microelectronics Reliability* 42:735-746.
Newman et al. (2004) "Introduction to Organic Thin Film Transistors and Design of n-Channel Organic Semiconductors," *Chem. Mater.* 16:4436-4451.
Nirmal et al. (1999) "Luminescence Photophysics in Semiconductor Nanocrystals," *Acc. Chem. Res.* 32:407-414.
Noda et al. (1996) "New Realization Method for Three-Dimensional Photonic Crystal in Optical Wavelength Region," *Jpn. J. Appl. Phys.* 35:L909-L912.
Nomura et al. (2004) "Room-Temperature Fabrication of Transparent Flexible Thin-Film Transistors Using Oxide Semiconductors," *Nature* 432:488-492.
Notice of Allowance corresponding to Korean Patent Application No. 10-2009-7007923, dated May 19, 2014—includes English translation.
Notice of Allowance corresponding to Taiwanese Patent Application No. 096135244 with Search Report dated Nov. 24, 2013—English translation of Search Report results only.
Notice of Reasons for Rejection corresponding to Japanese Patent Application No. P2008-514820, dated May 8, 2012—includes English translation.
Notice of Reasons for Rejection corresponding to Japanese Patent Application No. P2006-165159, dated Apr. 24, 2012—includes English translation.
Notice of Reasons for Rejection corresponding to Japanese Patent Application No. P2009-546361, dated Jul. 3, 2012—includes English translation.
Notice of Reasons for Rejection corresponding to Japanese Patent Application No. 2013-144886, dated Jul. 8, 2014—includes English translation.
Novoselov et al. (Oct. 22, 2004) "Electric Field Effect in Atomically Thin Carbon Films," *Science* 306:666-669.
O'Connell et al. (Jul. 26, 2002) "Bang Gap Fluorescence from Individual Single-Walled Caarbon Nanotubes," *Science* 297:593-596.
O'Riordan et al. (2004) "Field Configured Assembly: Programmed Manipulation and Self-Assembly at the Mesoscale," *Nano Lett.* 4:761-765.
Odom et al. (2002) "Improved Pattern Transfer in Soft Lithography Using Composite Stamps," *Langmuir* 18(13):5314-5320.
Office Action and Response, Corresponding to Malaysian Patent Publication No. PI 20052553, dated Mar. 13, 2009 and Dec. 8, 2009.
Office Action and Response, Corresponding to U.S. Appl. No. 11/423,287, dated Feb. 13, 2008.
Office Action and Response, Corresponding to U.S. Appl. No. 11/421,654, dated Sep. 29, 2009.
Office Action Corresponding to Chinese Patent Application No. 200780049982.1, dated May 12, 2010.
Office Action corresponding to Chinese Patent Application No. 201110076041.5, dated Jan. 23, 2014—English translation only—9 pages.
Office Action corresponding to Korean Patent Application No. 10-2014-7005142, dated Mar. 18, 2015—with English translation.
Office Action corresponding to Korean Patent Application No. 10-2014-7033798, dated Mar. 18, 2015—with English translation.
Office Action corresponding to Taiwanese Patent Application No. 103134300, dated Mar. 23, 2015—with English translation.
Office Action Corresponding to U.S. Appl. No. 11/851,182, dated Apr. 1, 2010.
Office Action, Corresponding to Chinese Patent Application No. 200580013574.1, dated May 11, 2010.
Office Action, Corresponding to Taiwan Patent Application No. 095121212, dated May 7, 2010.
Office Action, Corresponding to U.S. Appl. No. 11/981,380, dated Sep. 23, 2010.
Office Actions and Responses, Corresponding to U.S. Appl. No. 11/145,542, dated Apr. 5, 2007 and Dec. 23, 2008.
Office Actions, Corresponding to Chinese Patent Application No. 200580018159.5, dated Jan. 23, 2009 and Feb. 12, 2010.
Ohzono et al. (2004) "Ordering of Microwrinkle Patterns by Compressive Strain," *Phys. Rev. B* 69(13)132202.
Ohzono et al. (Web Release Jul. 7, 2005) "Geometry-Dependent Stripe Rearrangement Processes Induced by Strain on Preordered Microwrinkle Patterns," *Langmuir* 21(16):7230-7237.
Ong et al. (2004) "High-Performance Semiconducting Poolythiophenes for Organic Thin-Film Transistors," *J. Am. Chem. Soc.* 126:3378-3379.
Ong et al. (2005) "Design of High-Performance Regioreular Polythiophenes for Organic Thin-Film Transistors," *Proc. IEEE* 93:1412-1419.
Origin Energy (May 2004) "Fact Sheet—Sliver Cells," www.orginenergy.com.au/sliver.
Ouyang et al. (2002) "High-Performance, Flexible Polymer Light-Emitting Diodes Fabricated by a Continuous Polymer Coating Process," *Adv. Mat.* 14:915-918.
Ouyang et al. (2008) "High Frequency Properties of Electro-Textiles for Wearable Antenna Applications," *IEEE Trans. Antennas Propag.* 56(2):381-389.

(56) References Cited

OTHER PUBLICATIONS

Ouyang et al. (Web Release Mar. 20, 2000) "Conversion of Some Siloxane Polymers to Silicon Oxide by UV/Ozone Photochemical Processes," *Chem. Mater.* 12(6):1591-1596.
Pan et al. (2001) "Nanobelts of Semiconducting Oxides," *Science* 291:1947-1949.
Panev et al. (2003) "Sharp Excitation from Single InAs Quantum Dots in GaAs Nanowires," *Appl. Phys. Lett.* 83:2238-2240.
Pardo et al. (2000) "Application of Screen Printing in the Fabrication of Organic Ligh-Emitting Devices," *Adv. Mater.* 12(17):1249-1252.
Park et al. (1997) "Block Copolymer Lithography: Periodic Arrays of ~$10^{11}$ Holes in 1 Square Centimeter," *Science* 276:1401-1404.
Park et al. (1998) "Fabrication of Three-Dimensional Macroporous Membranes with Assemblies of Microspheres as templates," *Chem. Mater.* 10:1745-1747.
Patton et al. (Mar. 1998) "Effect of Diamond like Carbon Coating and Surface Topography on the Performance of Metal Evaporated Magnetic Tapes," *IEEE Trans Magn.* 34(2):575-587.
Paul et al. (Apr. 2003) "Patterning Spherical Surfaces at the Two Hundred Nanometer Scale Using Soft Lithography," *Adv. Func. Mater.* 13(4):259-263.
Pearton et al. (1999) "GaN: Processing, Defects, and Devices," *J. Appl. Phys.* 86:1-78.
Peng et al. (Mar. 2, 2000) "Shape Control of CdSe Nanocrystals," *Nature* 404:59-61.
Piazza et al. (2005) "Protective Diamond-Like Carbon Coatings for Future Optical Storage Disks," *Diamond Relat. Mater.* 14:994-999.
Podzorov et al. (2005) "Hall Effect in the Accumulation Layers on the Surface of Orgaic Semiconductors," *Phys. Rev. lett.* 95:226601.
Pushpa et al. (2002) "Stars and Stripes. Nanoscale Misfit Dislocation Patterns on Surfaces," *Pure Appl. Chem.* 74(9):1663-1671.
Quake et al (2000) "From Micro- to Nanofabrication with Soft Materials," *Science* 290:1536-1540.
Radtke et al. (Feb. 5, 2007) "Laser-Lithography on Non-Planar Surfaces," *Opt. Exp.* 15(3):1167-1174.
Raman et al. (1989) "Study of Mesa Undercuts Produced in GaAs with $H_3PO_4$-Based Etchants," *J. Electrochem. Soc.* 136:2405-2410.
Rao et al. (2003) "Large-scale assembly of carbon nanotubes," *Nature*, 425:36-37.
Razeghi et al. (1994) "High-Power Laser Diode Based on In GaAsP Alloys," *Nature* 369:631-633.
Razouk et al. (Sep. 1979) "Dependence of Interface State Density on Silicon Thermal Oxidation Process Variables," *J. Electrochem. Soc.* 126(9):1573-1581.
Reuss et al. (Jul. 2005) "Macroelectronics: Perspectives on Technology and Applications," *Proc. IEEE* 93(7):1239-1256.
Reuss et al. (Jun. 2006) "Macroelectronics," *MRS Bull.* 31:447-454.
Ribas et al. (1998) "Bulk Micromachining Characterization of 1.2 μm HEMT MMIC Technology for GaAs MEMS Design," *Mater. Sci. Eng. B* 51:267-273.
Ridley et al. (1999) "All-Inorganic Field Effect Transistors Fabricated by Printing," *Science* 286:746-749.
Roberts et al. (1979) "Looking at Rubber Adhesion," *Rubber Chem. Technol.* 52:23-42.
Roberts et al. (Mar. 2006) "Elastically Relaxed Free-Standing Strained-Silicon Nanomembranes," *Nat. Mater.* 5:388-393.
Robinson et al. (1983) "GaAs Readied for High-Speed Microcircuits," *Science* 219:275-277.
Roelkens et al. (Dec. 2005) "Integration of InP/InGaAsP Photodetectors onto Silicon-on-Insulator Waveguide Circuits," *Optics Express* 13(25):10102-10108.
Rogers et al. (1997) "Using an Elastomeric Phase Mask for Sub-100 nm Photolithography in the Optical Near Field," *Appl. Phys. Lett.* 70:2658-2660.
Rogers et al. (1998) "Generating ~90 Nanometer Features Using Near Field Contact Mode Photolithography with an Elastomeric Phase Mask," *J. Vac. Sci. Technol.* 16(1):59-68.
Rogers et al. (1998) "Quantifying Distortions in Soft Lithography," *J. Vac. Sci. Technol.* 16:88-97.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers et al. (1999) "Printing Process Sutable for Reel-to-Reel Production of High-Performance Organic Transistors and Circuits, *Adv. Mater.* 11(9):741-745.
Rogers et al. (2002) "Paper-Like Electronic Displays: Large-Area Rubber-Stamped Plastic Sheets of Electronics and Microencazpsulated Electrophoretic Inks," *Proc. Nat. Acad. Sci. USA* 98:4835-4840.
Rogers et al. (2002) "Printed Plastic Electronics and Paperlike Displays," *J. Polym. Sci. Part A. Polym. Chem.* 40:3327-3334.
Rogers et al. (Mar. 2000) "Organic Smart Pixels and Complementary Inverter Circuits Formed on Plastic Substrates by Casting and Rubber Stamping," *IEEE Electron Dev. Lett.* 21(3)100-103.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Rosenblatt et al. (2002) "High Performance Electrolyte Gated Carbon Nanotube Transistors," *Nano Lett.* 2(8):869-872.
Rotkin et al. (2003) "Universal Description of Channel Conductivity for Nanotube and Nanowire Transistors," *Appl. Phys. Lett.* 83:1623-1625.
Roundy et al. (2003) "Photonic Crystal Structure with Square Symetry within Each Layer and a Three-Dimensional Band Gap," *Appl. Phys Lett.* 82:3835-3837.
Ruchehoeft et al. (2000) "Optimal Strategy for Controlling Linewidth on Spherical Focal Surface Arrays," *J. Vac. Sci. Technol. B* 18(6):3185-3189.
Samuelson et al. (2004) "Semiconductor Nanowires for Novel One-Dimensional Devices," *Physica E* 21:560-567.
Sangwal et al. (1997) "Nature of multilayer steps on the {100} cleavage planes of MgO single crystals," *Surf. Sci.*, 383:78-87.
Sanyal et al. (2002) "Morphology of Nanostructures Materials," *Pure Appl. Chem.* 74(9):1553-1570.
Sazonov et al. (2005) "Low-Temperature Materials and Thin-Film Transistors for Flexible Electronics," *Proc. IEEE* 93:1420-1428.
Schermer et al. (Web Release Apr. 28, 2005) "Thin-Film GaAs Epitaxial Lift-Off Solar Cells for Space Applications," *Prog. Photovoltaics: Res. Applic.* 13:587-596.
Schermer et al. (Web Release Jan. 19, 2006) "Photon Confinement in High-Efficiency, Thin-Film III-V Solar Cells Obtained by Epitaxial Lift-Off," *Thin Solid Films* 511-512:645-653.
Schlegel et al. (2002) "Structures of quartz (1010)- and (1011)-water interfaces determined by X-ray reflectivity and atomic force microscopy of natural growth surfaces," *Geochim. Cosmochim. Acta*, vol. 66, No. 17, pp. 3037-3054.
Schmid et al. (2003) "Preparation of metallic Films on Elastomeric Stamps and Their Application on Contact Processing and Contact Printing," *Adv. Funct. Mater.* 13:145-153.
Schmid et al. (Mar. 25, 2000) "Siloxane Polymers for High-Resolution, High-Accuracy Soft Lithography," *Macromolecules* 33(8):3042-3049.
Schmidt et al. (Mar. 8, 2001) "Thin Solid Films Roll up into Nanotubes," *Nature* 410:168.
Schneider et al. (2008) "Mechanical Properties of Silicones for MEMS," *J. Micromech. Microeng.* 18:065008.
Schon et al. (1995) "Ambipolar Pentacene Field-Effect Transistors and Inverters," *Science* 287:1022-1023.
Schrieber et al. (1998) "The Effectiveness of Silane Adhesion Promotors in the Performance of Polyurethane Adhesives," *J. Adhesion* 68:31-44.
Scnable et al. (1969) "Aluminum Metallization; Advantages and Limitations for Integrated Circuit Applications," *IEEE* 57:1570-1580.
Scorzoni et al. (Oct. 4, 2004) "On the Relationship Between the Temperature coefficient of Resistance and the Thermal Conductance of Intearated Metal Resistors," *Sens Actuators A* 116(1):137-144.
Search and Examination Report, Corresponding to Singapore Application No. 200904208-6, dated Dec. 17, 2010.
Search Report and Examination Report Corresponding to Singapore Patent Application No. 200901178-4, dated Mar. 13, 2010.

(56) References Cited

OTHER PUBLICATIONS

Search Report Corresponding to Singapore Patent Application No. SG 200607372-0, dated Oct. 17, 2007.
Search Report Corresponding to Taiwanese Patent Application No. 095121212, dated Oct. 8, 2010.
Search Report, Corresponding to Republic of China (Taiwan) Patent Application No. 094118507, dated Feb. 24, 2007.
Second Office Action corresponding to Chinese Patent Application No. 201110076041.5, dated Nov. 5, 2012—includes English Translation.
Seidel et al. (2004) "High-Current Nanotube Transistors," *Nano Lett.*, vol. 4, No. 5, pp. 831-834.
Sekitani et al. (2005) "Bending Experiment on Pentacene Fiield-Effect Transistors on Plastic Films," *Appl. Phys. Lett.* 86:073511.
Sekitani et al. (Sep. 12, 2008) "A Rubberlike Stretchable Active Matrix Using Elastic Conductors," *Science* 321:1468-1472.
Sen et al. (2002) "Nonequilibrium Processes for Generating Silicon Nanostructures in Single-Crystalline Silicon," *Pure Appl. Chem.* 74(9):1631-1641.
Serikawa et al. (May 1, 2000) "High-Mobility Poly-Si Thin Film Transistors Fabricated on Stainless-Steel Foils by Low-Temperature Processes Using Sputter-Depositions," *Jpn. J. Appl. Phys.* 39:L393-L395.
Servanti et al. (2005) "Functional Pixel Circuits for Elastic AMOLED displays," *Proc. IEEE* 93:1257-1264.
Service, R.F. (Aug. 15, 2003) "Electronic Textiles Charge Ahead," *Science* 301:909-911.
Shan et al. (2004) "From Si Source Gas Directly to Positioned, Electrically Contained Si Nanowires: The Self-Assembling 'Grow-in-Place' Approach," *Nano Lett.* 4(11):2085-2089.
Sharp et al. (2003) "Holographic Photonic Crystals with Diamond Symmetry," *Phys. Rev. B* 68:205102/1-205102/6.
Sheraw et al. (2002) "Organic Thin-Film Transistor-Driven Polymer-Dispersed Liquid Crystal Displays on Flexible Polymeric Substrates," *Appl. Phys. Lett.* 80:1088-1090.
Shetty et al. (2005) "Formation and Characterization of Silicon Films on Flexible Polymer Substrates," *Mater. Lett.* 59:872-875.
Shi et al. (2001) "Free-Standing Single Crystal Silicon Nanoribbons," *J. Am. Chem. Soc.* 123(44):11095-11096.
Shi et al. (Sep. 2000) "Synthesis of Large Areas of Highly Oriented, Very Long Silicon Nanowires," *Adv. Mater.* 12(18):1343-1345.
Shtein et al. (Oct. 15, 2004) "Direct Mask-Free Patterning of Molecular Organic Semiconductors Using Organic Vapor Jet Printing," *J. Appl. Phys.* 96(8):4500-4507.
Shull et al. (1998) "Axisymmetric Adhesion Tests of Soft Materials," *Macromol. Chem. Phys.* 199:489-511.
Siegel et al. (Web Release Feb. 7, 2007) "Microsolidics: Fabrication of Three-Dimensional Metallic Microstructures in Poly(dimethylsiloxane)," *Adv. Mater.* 19(5):727-733.
Sim et al. (1993) "An Analytical Back-Gate Bias Effect Model for Ultrathin SOI CMOS Devices," *IEEE Trans. Elec. Dev.* 40:755-765.
Sirringhaus et al. (2003) "Inkjet Printing of Functional Materials," *MRS Bull.* 28:802-806.
Sirringhaus et al. (Dec. 15, 2000) "High-Resolution Inkjet Printing of All-Polymer Transistor Circuits," *Science* 290:2123-2126.
Sirringhaus, H. (2005) "Device Physics of Solution-Processed Organic Field-Effect Transistors," *Adv. Mater.* 17:2411-2425.
Smay et al. (2002) "Colloidal Inks for Directed Assembly of 3-D Periodic Structures," *Langmuir* 18:5429-5437.
Smith et al. (2000) "Electric-Field Assisted Assembly and Alignment of Metallic Nanowires," *Appl. Phys. Lett.* 77(9):1399-1401.
Snow et al. (2003) "Random networks of carbon nanotubes as an electronic material," *Appl. Phys. Lett.*, vol. 82, No. 13, pp. 2145-2147.
Snow et al. (2005) "High-mobility carbon-nanotube transistors on a polymeric substrate," *Appl. Phys. Lett.*, 86, 033105.
Someya et al. (2005) "Conformable, Flexible, Large-Area Networks of Pressure and Thermal Sensors with Organic Transistor Active Matrixes," *Proc. Nat. Acad. Sci. USA* 102:12321-12325.
Someya et al. (2005) "Integration of Organic FETs with Organic Photodiodes for a Large Area, Flexible, and Lightweight Sheet Image Scanners," *IEEE Trans. Electron Devices* 52:2502-2511.
Someya et al. (Jul. 6, 2004) "A Large-Area, Flexible, Pressure Sensor Matric with Organic Field-Effect Transistors for Artificial Skin Applications," *Proc. Nat. Acad. Sci. USA* 101(27):9966-9970.
Soole et al. (Mar. 1991) "InGaAs Metal-Semiconductor-Metal Photodetectors for Long Wavelength Optical Communications," *IEEE J. Quantum Electron.* 27(3):737-752.
Srinivasan et al. (Web Release Mar. 26, 2007) "Piezoelectric/Ultrananocrystalline Diamond Heterostructures for High-Performance Multifunctional Micro/Nanoelectromechanical Systems," *Appl. Phys. Lett.* 90:134101.
Stafford et al. (Aug. 2004) "A Buckling-Based Metrology for Measureing the Elastic Moduli of Polymeric Thin Films," *Nature Mater.* 3:545-550.
Star et al. (2004) "Nanotube Optoelectric Memory Devices," *Nano Lett.*, vol. 4, No. 9, pp. 1587-1591.
Storm et al. (Aug. 2003) "Fabrication of Solid-State Nanopores with Single-Nanometre Precision," *Nat. Mater.* 2:537-540.
Streetman et al. (2000) "Intrinsic Material," In; Solid State Electronic Devices, 5th Ed., Prentice Hall; Upper Saddle River, NJ; pp. 74-75.
Strukov et al. (2005) "CMOL FPGA: A Reconfigurable Architecture for Hybrid Digital Circuits with Two-Terminal Nanodevices," *Nanotechnology* 16:888-900.
Su et al. (2000) "Lattice-Oriented Growth of Single-Walled Carbon Nanotubes," *J. Phys. Chem. B* 104(28):6505-6508.
Sumant et al. (Apr. 2005) "Toward the Ultimate Tribological Interface: Surface Chemistry and Nanotribology of Ultrananocrystalline Diamond," *Adv. Mater.* 17(8):1039-1045.
Sun et al. (2004) "Fabricating Semiconductor Nano/Microwires and Transfer Printing Ordered Arrays of Them onto Plastic Substrates," *Nano Lett.* 4:1953-1959.
Sun et al. (2005) "Advances in Organic Field-Effect Transistors," *J. Mater. Chem.* 15:53-65.
Sun et al. (2005) "Bendable GaAs Metal-Semiconductor Field-Effect Transistors Formed with a Printed GaAs Wire Arrays on Plastic Substrates," *Appl. Phys. Lett.* 87:083501.
Sun et al. (2005) "Photolithographic Route to the Fabrication of Micro/Nanowires of III-V Semiconductors," *Adv. Fuct. Mater.* 15:30-40.
Sun et al. (2007) "Controlled Buckling of Semiconductor Nanoribbons for Stretchable Electronics," *Nat. Nanotechnol.* 1:201-207.
Sun et al. (2007) "Inorganic Semiconductors for Flexible Electronics," *Adv. Mater.* 19:1897-1916.
Sun et al. (2007) "Structural Forms of Single Crystal Semiconductor Nanoribbons for High-Performance Stretchable Electronics," *J. Mater Chem.* 17:832-840.
Sun et al. (Nov. 2006) "Buckled and Wavy Ribbons of GaAs for High-Performance Electronics on Elastomeric Substrates," *Adv. Mater.* 18(21):2857-2862.
Sundar et al. (2004) "Elastomeric Transistor Stamps: Reversible Probing of CHaarge Transport in Organic Crystals," *Science* 303:1644-1646.
Suo et al. (Feb. 22, 1999) "Mechanics of Rollable and Foldable Film-on-Foil Electronics," *Appl. Phys. Lett.* 74(8):1177-1179.
Supplementary European Search Report, Corresponding to European Application No. 05 75 6327, dated Sep. 25, 2009.
Swain et al. (2004) "Curved CCD Detector Devices and Arrays for Multi-Spectral Astrophysical Application and Terrestrial Stereo Panoramic Cameras," *Proc. SPIE* 5499:281-301.
Sze et al. (1985) Semiconductor Devices, Physics and Technology, 2nd ed., Wiley, New York, pp. 190-192.
Sze, S. (1985) *Semiconductor Devices: Physics and Technology*, New York: Wiley, pp. 428-467.
Sze, S. (1988) *VLSI Technology*, Mcgraw-Hill, 327-374, 566-611.
Sze, S. (1994) *Semiconductor Sensors*, John Wiley and Sons: New York, pp. 17-95.
Takamoto et al. (Jan. 20, 1997) "Over 30% Efficient InGaP/GaAs Tandem Solar Cells," *Appl. Phys. Lett.* 70(3):381-383.
Talapin et al. (Oct. 7, 2005) "PbSe Nanocrystal Solids for n- and p-Channel Thin Film Field-Effect Transistors," *Science* 310:86-89.

(56) References Cited

OTHER PUBLICATIONS

Tan et al. (Apr. 12, 2004) "Performance Enhancement of InGaN Light Emitting Diodes by Laser-Lift-off and Transfer from Sapphire to Copper Substrate," *Appl. Phys. Lett.* 84(15):2757-2759.
Tanase et al. (2002) "Magnetic Trapping and Self-Assembly of Multicomponent Nanowires," *J. Appl. Phys.* 91:8549-8551.
Tang et al. (2005) "One-Dimensional Assemblies of Nanoparticles: Preparation, Properties, and Promise," *Adv. Mater.* 17:951-962.
Tao et al. (2003) "Langmuir-Blodgett Silver Nanowire Monolayers for Molecular Sensing Using Surface-Enhanced Raman Spectroscopy," *Nano Lett.* 3:1229-1233.
Tate et al. (2000) "Anodization and Microcontact Printing on Electroless Silver: Solution-Based Fabrication Procedures for Low-Voltage Electronic Systems with Organic Active Components," *Langmuir* 16:6054-6060.
Teshima et al. (2001) "Room-Temperature Deposition of High-Purity Silicon Oxide Films by RF Plasma-Enhanced CVD," *Surf. Coat. Technol.* 146-147:451-456.
Theiss et al. (1998) "PolySilicon Thin Film Transistors Fabricated at 100° C. on a Flexible Plastic Substrate," *IEDM* 98:257-260.
Toader et al. (2004) "Photonic Band Gap Architectures for Holographic Lithography," *Phy. Rev. Lett.* 043905/1-043905/4.
Toader et al. (2004) "Photonic Band Gaps Based on Tetragonal Lattices of Slanted Pores," *Phys. Rev. Lett.* 90:233901/1-233901/4.
Tong (1999) *Semiconductor Wafer Bonding: Science and Technology*, John Wiley; New York, pp. 187-221.
Trau et al. (1997) "Microscopic Patterning of Orientated Mesoscopic Silica Through Guided Growth," *Nature* 390:674-676.
Trentler et al. (1995) "Solution-Liquid-Solid Growth of Crytalline III-V Semiconductors: An Analogy to Vapor-Liquid-Solid Growth," *Science* 270:1791-1794.
Tseng et al. (Web Release Dec. 19, 2003) "Monolithic Integration of Carbon Nanotube Devices with Silicon MOS Technology" *Nano Lett.* 4(1):123-127.
Ucjikoga, S. (2002) "Low-Temperature Polycrystalline Silicon Thin-Film Transistor Technologies ofr System-on-Glass Displays," *MRS Bull.* 27:881-.
Urruchi et al. (2000) "Etching of DLC Films Using a Low Intensity Oxygen Plasma Jet," *Diamond Relat. Mater.* 9:685-688.
Vanhollenbeke et al. (2000) "Compliant Substrate Technology: Integration of Mismatched Materials for Opto-Electronic Applications," *Prog. Cryst. Growth Charact. Mater.* 41(1-4):1-55.
Velev et al. (1997) "Porous silica via colloidal crystallization," *Nature* 389:447-448.
Vilan et al. (2000) "Molecular Control Over Au/GaAs Diodes," *Nature* 404:166-168.
Vlasov et al. (2001) "On-Chip Natural Assembly of Silicon Photonic Bandgap Crystals," *Nature* 414:289-293.
Voss, D. (2000) "Cheap and Cheerful Circuits," *Nature* 407:442-444.
Wagner et al. (2003) "Silicon for Thin-Film Transistors," *Thin Solid Films* 430:15-19.
Wagner et al. (2005) "Electronic Skin: Architecture and Components," *Physica E* 25:326-334.
Wagner et al. (Mar. 1, 1964) "Vapor-Liquid-Solid Mechanism of Single Crystal Growth," *Appl. Phys. Lett.* 4(5):89-90.
Wang et al. (2003) "A Solution-Phase, Precursor Route to Polycrystalline $SnO_2$ Nanowores that can be Used for Gas Sensing under Ambient Conditions," *J. Am. Chem. Soc.* 125:16176-16177.
Wang et al. (2005) "Electronically Selective Chemical Functionalization of Carbon Nanotubes: Correlation between Raman Spectral and Electrical Responses," *J. Am. Chem. Soc.*, 127:11460-11468.
Wang et al. (2005) "Oxidation Resistant Germanium Nanowires: Bulk Synthesis, Long Chain Alkanethiol Functionalization, and Langmuir-Blodgett Assembly," *J. Am. Chem. Soc.* 127(33):11871-11875.
Wang et al. (2006) "Direct Synthesis and Characterization of CdS Nanobelts," *Appl. Phys. Lett.* 89:033102.

Weber et al. (Jan. 2004) "A Novel Low-Cost, High Efficiency Micromachined Silicon Solar Cell," *IEEE Electron Device Lett.* 25(1):37-39.
Wen et al. (Web Release Dec. 4, 2004) "Controlled Growth of Large-Area, Uniform, Vertically Aligned Arrays of $\alpha$-$Fe_{2O2}$ Nanobelts and Nanowires," *J. Phys. Chem. B* 109(1):215-220.
Whang et al. (2003) "Large-Scale Hierarchical Organization of Nanowire Arrays for Integrated Nanosystems," *Nano Lett.* 3(9):1255-1259.
Williams et al. (Oct. 2006) "Growth and Properties of Nanocrystalline Diamond Films," *Phys. Stat. Sol. A* 203(13):3375-3386.
Williams et al. (Web Release Jan. 23, 2006) "Comparison of the Growth and Properties of Ultranocrystalline Diamond and Nanocrystalline Diamond," *Diamond Relat. Mater.* 15:654-658.
Willner et al. (2002) "Functional Nanoparticle Architectures for Senoric, Optoelectronic, and Bioelectronic Applications," *Pure Appl. Chem.* 74(9):1773-1783.
Wind et al. (May 20, 2002) "Vertical Scaling of Carbon Nanotube-Field-Effect Transistors Using Top Gate Electrodes," *Appl. Phys. Lett.* 80(20):3871-3819.
Won et al. (2004) "Effect of Mechanical and Electrical Stresses on the Performance of an a-Si:H TFT on Plastic Substrate," *J. Electrochem. Soc.* 151:G167-G170.
Wu et al. (2001) "Amorphous Silicon Crystallization and Polysilicon Thin Film Transistors on $SiO_2$ Passivated Steel Foil Substrates," *Apple. Surf. Sci* 175-176:753-758.
Wu et al. (2001) "Direct Observation of Vapor-Liquid-Solid Nanowire Growth," *J. Am. Chem. Soc.* 123(13):3165-3166.
Wu et al. (2001) "Thermal Oxide of Polycrystalline Silicon on Steel Foil as a Thin-Film Transitor Gate Dielectric," *Appl. Phys. Lett.* 78:3729-2731.
Wu et al. (2002) "Block-by-Block Growth of Single-Crystalline Si/SiGe Superlattice Nanowires," *Nano Lett.* 2(2):83-86.
Wu et al. (2002) "Growth of Au-Catalyzed Ordered GaAs Nanowire Arrays by Molecular-Beam Epitaxy," *Appl. Phys. Lett.* 81:5177-5179.
Wu et al. (2002) "Inorganic Semiconductor Nanowires: Rational Growth, Assembly, and Novel Properties," *Chem. Eur. J.* 8(6):1261-1268.
Wu et al. (2003) "Growth, Branching, and Kinking of Molecular-Beam Epitaxial (110) GaAs Nanowires," *Appl. Phys. Lett.* 83:3368-3370.
Wu et al. (Jul. 1, 2004) "Single-Crystal Metallic Nanowires and Metal/Semiconductor Nanowire Heterostructures," *Nature* 430:61-65.
Wu et al. (Nov. 2002) "Complementary Metal-Oxide-Semiconductor Thin-Film Transistor Circuits from a High-Temperature Polycrystalline Silicon Process on Steel Foil Substrates," *IEEE Trans. Electr. Dev.* 49(11):1993-2000.
Xia (1998) "Soft Lithography" *Angew. Chem. Int. Ed.* 37:551-575.
Xia et al. (1996) "Shadowed Sputtering of Gold on V-Shaped Microtrenches Etched in Silicon and Applications in Microfabrication," *Adv. Mater.* 8(9):765-768.
Xia et al. (1998) "Soft Lithography," *Annu. Rev. Mater. Sci.* 28:153-184.
Xia et al. (1999) "Unconventional Methods for Fabricating and Patterning Nanostructures," *Chem. Rev.* 99:1823-1848.
Xia et al. (2003) "One-Dimensional Nanostructures: Synthesis, Characterization and Applications," *Adv. Mater.* 15:353-389.
Xia et al. (Jul. 19, 1996) "Complex Optical Surfaces Formed by Replica Molding Against Elastomeric Masters," *Science* 273:347-349.
Xiang et al. (Mar. 25, 2006) "Ge/Si Nanowire Heterostructures as High-Performance Field-Effect Transistors," *Nature* 441:489-493.
Xiao et al. (2003) "High-mobility thin-film transistors based on aligned carbon nanotubes," *Appl. Phys. Lett.*, vol. 83, No. 1, pp. 150-152.
Xie et al. (May 2003) "Polymer-Controlled Growth of $Sb_2Se_3$ Nanoribbons Via a Hydrothermal Process," *J. Cryst. Growth* 252(4):570-574.
Xin et al. (Jun. 2005) "Evaluation of Polydimethylsiloxane Scaffolds with Physiologically-Relevant Elastic Moduli: Interplay of

(56) References Cited

OTHER PUBLICATIONS

Substrate Mechanics and Surface Chemistry Effects on Vascular Smooth Muscle Cell Response," *Biomaterials* 26(16):3123-3129.
Yang et al. (1997) "Mesoporous Silica with Micrometer-Scale Desgns," *Adv. Mater.* 9:811-814.
Yang et al. (2000) "Stability of Low-Temperature Amorphous Silicon Thin Film Transistors Formed on Glass and Transparent Plastic Substrates," *J. Vac. Sci. Technol. B* 18:683-689.
Yang et al. (2002) "Creating Periodic Three-Dimensional Structures by Multibeam Interface of Visible Laser," *Chem. Mater.* 14:2831-2833.
Yang et al. (Dec. 2007) "RFID Tag and RF Structures on a Paper Substrate Using Inkjet-Printing Technology," *IEEE Trans. Microw. Theory Tech.* 55(12):2894-2901.
Yang, P. (2005) "The Chemistry and Physics of Semiconductor Nanowires," *MRS Bull.* 30:85-.
Yanina et al. (2002) "Terraces and ledges on (001) spinel surfaces," *Surf. Sci.*, 513:L402-L412.
Yao et al. (Mar. 2000) "High-Field Effect Electrical Transport in Single-Walled Carbon Nanotubes," *Phys. Rev. Lett.* 84(13):2941-2944.
Yeh et al. (1994) "Fluidic Self-Assembly for the Integration of GaAs Light Emitting Diodes on Si Substrates," *IEEE Photon. Techn. Lett.* 6:706-708.
Yin et al. (2000) "A Soft Lithography Approach to the Fabrication of Nanostructures of Single Crystalline Silicon with Well-Defined Dimensions and Shapes," *Adv. Mater.* 12:1426-1430.
Yin et al. (2005) "Colloidal Nanocrystal Synthesis and the Organic-Inorganic Interface," *Nature* 437:664-670.
Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.
Yu et al. (2000) "Silicon Nanowires: Preparation, Device Fabrication, and Transport Properties," *J. Phys. Chem. B* 104(50):11864-11870.
Yu et al. (2003) "Solution-Liquid-Solid Growth of Soluble GaAs Nanowires," *Adv. Mater.* 15:416-419.
Yu et al. (2003) "Two-Versus Three-Dimensional Quantum Confinement in Indium Phosphide Wires and Dots," *Nat. Mater.* 2:517-520.
Yuan et al. (2006) "High-Speed Strained-Single-Crystal-Silicon Thin-Film Transistors on Flexible Polymers," *J. Appl. Phys.* 100:013708.
Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.
Zakhidov et al. (1998) "Carbon Structure with Three-Dimensional Periodicity at Optical Wavelengths," *Science* 282:897-901.
Zaumseil et al. (2003) "Nanoscale Organic Transistors that use Source/Drain Electrodes Supported by High Resolution Rubber Stamps," *Appl. Phys. Lett.* 82(5):793-795.
Zaumseil et al. (2003) "Three-Dimensional and Multilayer Nanostructures Formed by Nanotransfer Printing," *Nano Lett.* 3(9):1223-1227.
Zhang et al. (2001) "Electric-field-directed growth of aligned single-walled carbon nanotubes," *Appl. Phys. Lett.*, vol. 79, No. 19. pp. 3155-3157.
Zhang et al. (2005) "Low-Temperature Growth and Photoluminescence Property of ZnS Nanoribbons," *J. Phys. Chem. B* 109(39):18352-18355.
Zhang et al. (2006) "Anomalous Coiling of SiGe/Si and SiGe/Si/Cr Helical Nanobelts," *Nano Lett.* 6(7):1311-1317.
Zhang et al. (Apr. 2003) "Oxide-Assisted Growth of Semiconducting Nanowires," *Adv. Mater.* 15(7-8):635-640.
Zhang et al. (Apr. 5, 2004) "Structure and Photoiluminescence of ZnSe Nanoribbons Grown by Metal Organic Chemical Vapor Deposition," *Appl. Phys. Lett.* 84(14):2641-2643.
Zhang et al. (Feb. 9, 2006) "Electronic Transport in Nanometre-Scale Silicon-on-Insulator Membranes," *Nature* 439:703-706.
Zhao et al. (Mar. 2007) "Improved Field Emission Properties from Metal-Coated Diamond Films," *Diamond Relat Mater.* 16(3):650-653.
Zheng et al. (2004) "Shape-and Solder-Directed Self-Assembly to Package Semiconductor Device Segments," *Appl. Phys. Lett.* 85:3635-3637.
Zheng et al. (Aug. 31, 2004) "Sequential Shape-and-Solder-Directed Self Assembly of Functional Microsystems," *Proc. Natl. Acad. Sci. USA* 101(35):12814-12817.
Zhou et al. (2002) "An Efficient Two-Photon-Generated Photoacid Applied to Positive-Tone 3D Microfabrication," *Science* 296:1106-1109.
Zhou et al. (2004) "p-Channel, n-Channel Thin Film Transistors and p-n Diodes Based on Single Wall Carbon Nanotube Networks," *Nano Lett.* 4:2031-2035.
Zhou et al. (2005) "Band Structure, Phonon Scattering, and the Performance Limit of Single-Walled Carbon Nanotube Transistors," *Phys. Rev. Lett.* 95:146805.
Zhou et al. (2005) "Mechanism for Stamp Collapse in Soft Lithography," *Appl. Phys. Lett.* 87:251925.
Zhu et al. (2005) "Spin on Dopants for High-Performance Single Crystal Silicon Transistors on Flexible Plastic Substrates," *Appl. Phys. Lett.* 86(133507)1-3.
Office Action corresponding to Taiwanese Patent Application No. 104137759, dated Jan. 20, 2017.
Notice of Allowance of Patent corresponding to Korean Patent Application No. 10-2014-7033798, dated Apr. 1, 2016—English translation only.
Notice of Reasons for Rejection corresponding to Japanese Patent Application No. P2015-169007, dated Jun. 28, 2016—English translation only.
First Office Action corresponding to Chinese Patent Application No. 2015100027757, dated Mar. 20, 2017—English translation only—8 pages.
European Search Opinion and Supplementary Search Report, Corresponding to European Application No. 07874095, dated Jan. 20, 2016, 11 pages.
Notice of Reasons for Rejection corresponding to Japanese Patent Application No. P2015-169007, dated Mar. 14, 2017—English translation only.
U.S. Appl. No. 11/001,689, filed Dec. 1, 2004, 2006/0286488, Dec. 21, 2006, U.S. Pat. No. 7,704,684, Apr. 27, 2010.
U.S. Appl. No. 11/115,954, filed Apr. 27, 2005, 2005/0238967, Oct. 27, 2005, U.S. Pat. No. 7,195,733, Mar. 27, 2007.
U.S. Appl. No. 11/145,574, filed Jun. 2, 2005, 2009/0294803, Dec. 3, 2009, U.S. Pat. No. 7,622,367, Nov. 24, 2009.
U.S. Appl. No. 11/145,542, filed Jun. 2, 2005, 2006/0038182, Feb. 23, 2006, U.S. Pat. No. 7,557,367, Jul. 7, 2009.
U.S. Appl. No. 11/421,654, filed Jun. 1, 2006, 2007/0032089, Feb. 8, 2007, U.S. Pat. No. 7,799,699, Sep. 21, 2010.
U.S. Appl. No. 11/423,287, filed Jun. 9, 2006, 2006/0286785, Dec. 21, 2006, U.S. Pat. No. 7,521,292, Apr. 21, 2009.
U.S. Appl. No. 11/423,192, filed Jun. 9, 2006, 2009/0199960, Aug. 13, 2009, U.S. Pat. No. 7,943,491, May 17, 2011.
U.S. Appl. No. 11/465,317, filed Aug. 17, 2006.
U.S. Appl. No. 11/675,659, filed Feb. 16, 2007, 2008/0055581, Mar. 6, 2008.
U.S. Appl. No. 11/782,799, filed Jul. 25, 2007, 2008/0212102, Sep. 4, 2008, U.S. Pat. No. 7,705,280, Apr. 27, 2010.
U.S. Appl. No. 11/851,182, filed Sep. 6, 2007, 2008/0157235, Jul. 3, 2008, U.S. Pat. No. 8,217,381, Jul. 10, 2012.
U.S. Appl. No. 11/858,788, filed Sep. 20, 2007, 2008/0108171, May 8, 2008, U.S. Pat. No. 7,932,123, Apr. 26, 2011.
U.S. Appl. No. 11/981,380, filed Oct. 31, 2007, 2010/0283069, Nov. 11, 2010, U.S. Pat. No. 7,972,875, Jul. 5, 2011.
U.S. Appl. No. 12/372,605, filed Feb. 17, 2009.
U.S. Appl. No. 12/398,811, filed Mar. 5, 2009, 2010/0002402, Jan. 7, 2010, U.S. Pat. No. 8,552,299, Oct. 8, 2013.
U.S. Appl. No. 12/405,475, filed Mar. 17, 2009, 2010/0059863, Mar. 11, 2010, U.S. Pat. No. 8,198,621, Jun. 12, 2012.
U.S. Appl. No. 12/418,071, filed Apr. 3, 2009, 2010/0052112, Mar. 4, 2010, U.S. Pat. No. 8,470,701, Jun. 25, 2013.

(56) References Cited

OTHER PUBLICATIONS

U.S. Appl. No. 12/564,566, filed Sep. 22, 2009, 2010/0072577, Mar. 25, 2010, U.S. Pat. No. 7,982,296, Jul. 19, 2011.
U.S. Appl. No. 12/669,287, filed Jan. 15, 2010, 2011/0187798, Aug. 4, 2011, U.S. Pat. No. 9,061,494, Jun. 23, 2015.
U.S. Appl. No. 12/778,588, filed May 12, 2010, 2010/0317132, Dec. 16, 2010, U.S. Pat. No. 8,865,489, Oct. 21, 2014.
U.S. Appl. No. 12/844,492, filed Jul. 27, 2010, 2010/0289124, Nov. 18, 2010, U.S. Pat. No. 8,039,847, Oct. 18, 2011.
U.S. Appl. No. 12/892,001, filed Sep. 28, 2010, 2011/0230747, Sep. 22, 2011, U.S. Pat. No. 8,666,471, Mar. 4, 2014.
U.S. Appl. No. 12/916,934, filed Nov. 1, 2010, 2012/0105528, May 3, 2012, U.S. Pat. No. 8,562,095, Oct. 22, 2013.
U.S. Appl. No. 12/947,120, filed Nov. 16, 2010, 2011/0170225, Jul. 14, 2011, U.S. Pat. No. 9,057,994, Jun. 16, 2015.
U.S. Appl. No. 12/996,924, filed Dec. 8, 2010, 2011/0147715, Jun. 23, 2011, U.S. Pat. No. 8,946,683, Feb. 3, 2015.
U.S. Appl. No. 12/968,637, filed Dec. 15, 2010, 2012/0157804, Jun. 21, 2012.
U.S. Appl. No. 13/046,191, filed Mar. 11, 2011, 2012/0165759, Jun. 28, 2012.
U.S. Appl. No. 13/071,027, filed Mar. 24, 2011, 2011/0171813, Jul. 14, 2011, U.S. Pat. No. 8,895,406, Nov. 25, 2014.
U.S. Appl. No. 13/095,502, filed Apr. 27, 2011.
U.S. Appl. No. 13/100,774, filed May 4, 2011, 2011/0266561, Nov. 3, 2011, U.S. Pat. No. 8,722,458, May 13, 2014.
U.S. Appl. No. 13/113,504, filed May 23, 2011, 2011/0220890, Sep. 15, 2011, U.S. Pat. No. 8,440,546, May 14, 2013.
U.S. Appl. No. 13/120,486, filed Aug. 4, 2011, 2011/0277813, Nov. 17, 2011, U.S. Pat. No. 8,679,888, Mar. 25, 2014.
U.S. Appl. No. 13/228,041, filed Sep. 8, 2011, 2011/0316120, Dec. 29, 2011.
U.S. Appl. No. 13/270,954, filed Oct. 11, 2011, 2012/0083099, Apr. 5, 2012, U.S. Pat. No. 8,394,706, Mar. 12, 2013.
U.S. Appl. No. 13/349,336, filed Jan. 12, 2012, 2012/0261551, Oct. 18, 2012.
U.S. Appl. No. 13/441,618, filed Apr. 6, 2012, 2013/0100618, Apr. 25, 2013, U.S. Pat. No. 8,754,396, Jun. 17, 2014.
U.S. Appl. No. 13/441,598, filed Apr. 6, 2012, 2012/0327608, Dec. 27, 2012, U.S. Pat. No. 8,729,524, May 20, 2014.
U.S. Appl. No. 13/472,165, filed May 15, 2012, 2012/0320581, Dec. 20, 2012.
U.S. Appl. No. 13/486,726, filed Jun. 1, 2012, 2013/0072775, Mar. 21, 2013, U.S. Pat. No. 8,934,965, Jan. 13, 2015.
U.S. Appl. No. 13/492,636, filed Jun. 8, 2012, 2013/0041235, Feb. 14, 2013.
U.S. Appl. No. 13/549,291, filed Jul. 13, 2012, 2013/0036928, Feb. 14, 2013.
U.S. Appl. No. 13/596,343, filed Aug. 28, 2012, 2012/0321785, Dec. 20, 2012, U.S. Pat. No. 8,367,035, Feb. 5, 2013.
U.S. Appl. No. 13/624,096, filed Sep. 21, 2012, 2013/0140649, Jun. 6, 2013.
U.S. Appl. No. 13/801,868, filed Mar. 13, 2013, 2013/0320503, Dec. 5, 2013, U.S. Pat. No. 8,664,699, Mar. 4, 2014.
U.S. Appl. No. 13/835,284, filed Mar. 15, 2013, 2014/0220422, Aug. 7, 2014.
U.S. Appl. No. 13/853,770, filed Mar. 29, 2013, 2013/0333094, Dec. 19, 2013.
U.S. Appl. No. 14/140,299, filed Dec. 24, 2013, 2014/0163390, Jun. 12, 2014.
U.S. Appl. No. 14/155,010, filed Jan. 14, 2014, 2014/0191236, Jul. 10, 2014.
U.S. Appl. No. 14/173,525, filed Feb. 5, 2014 2014/0216524, Aug. 7, 2014, U.S. Pat. No. 9,105,782, Aug. 11, 2015.
U.S. Appl. No. 14/209,481, filed Mar. 13, 2014, 2014/0373898, Dec. 25, 2014, U.S. Pat. No. 9,117,940, Aug. 25, 2015.
U.S. Appl. No. 14/220,910, filed Mar. 20, 2014, 2014/0374872, Dec. 25, 2014.
U.S. Appl. No. 14/220,923, filed Mar. 20, 2014, 2015/0001462, Jan. 1, 2015, U.S. Pat. No. 9,105,555, Aug. 11, 2015.
U.S. Appl. No. 14/246,962, filed Apr. 7, 2014, 2014/0361409, Dec. 11, 2014.
U.S. Appl. No. 14/251,259, filed Apr. 11, 2014, 2014/0323968, Oct. 30, 2014.
U.S. Appl. No. 14/250,671, filed Apr. 11, 2014, 2014/0305900, Oct. 16, 2014.
U.S. Appl. No. 12/778,588, filed Sep. 5, 2014, 2015/0132873, May 14, 2015, U.S. Pat. No. 9,647,171, May 9, 2017.
U.S. Appl. No. 14/521,319, filed Oct. 22, 2014, 2015/0181700, Jun. 25, 2015.
U.S. Appl. No. 14/800,363, filed Jul. 15, 2015, 2016/0072027, Mar. 10, 2016, U.S. Pat. No. 9,601,671, Mar. 21, 2017.
U.S. Appl. No. 15/402,684, filed Jan. 10, 2017, 2017/0179100, Jun. 22, 2017.
U.S. Appl. No. 15/402,718, filed Jan. 10, 2017, 2017/0179085, Jun. 22, 2017.
U.S. Appl. No. 15/402,723, filed Jan. 10, 2017, 2017/0179356, Jun. 22, 2017.

* cited by examiner

Diffusing optics

LED

Polymer or other low-cost substrate

Optical fiber

III-V VCSEL

Silicon IC chip

Collecting optics

Solar cell

Polymer or other low-cost substrate

Photodiode

Lens

1)
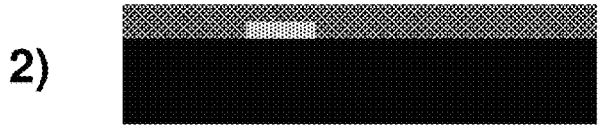
2)
3)
Fig. 3
4)
5)
6)
7)

Fig. 6A
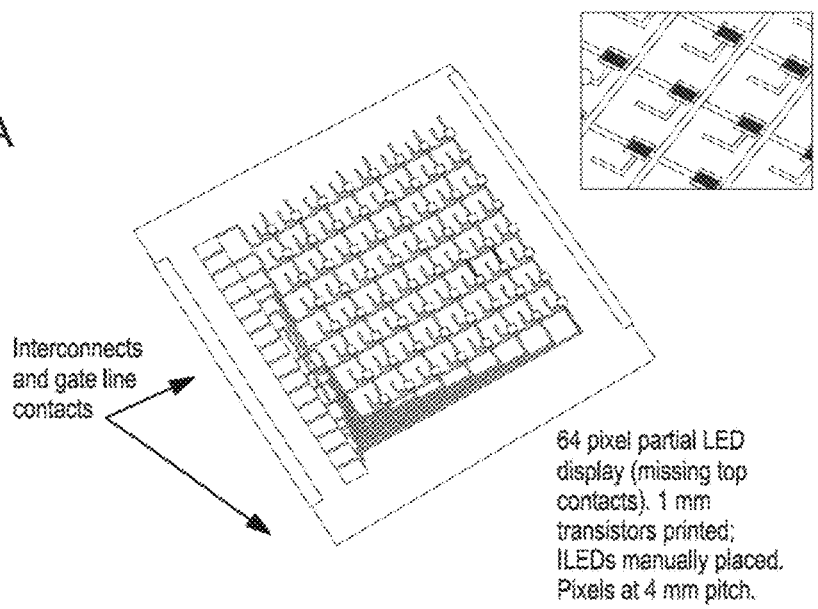
Fig. 6B
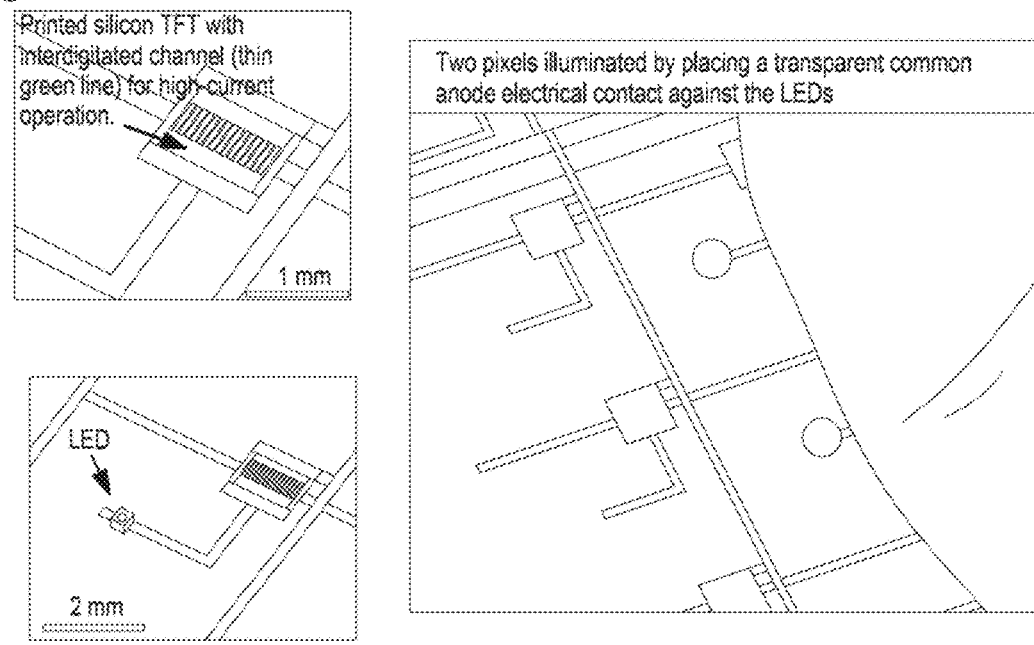
Fig. 6C

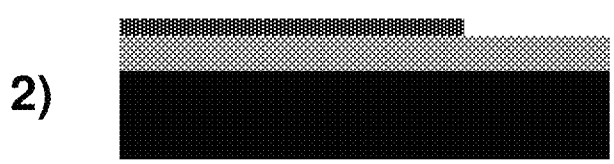
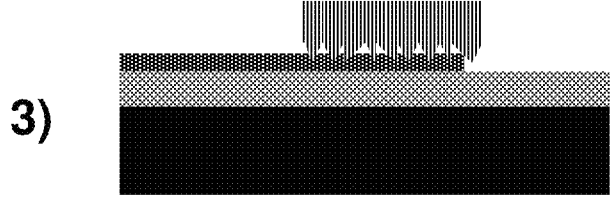
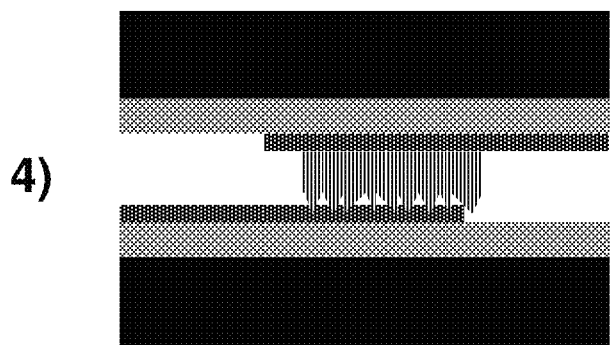
Fig. 7A

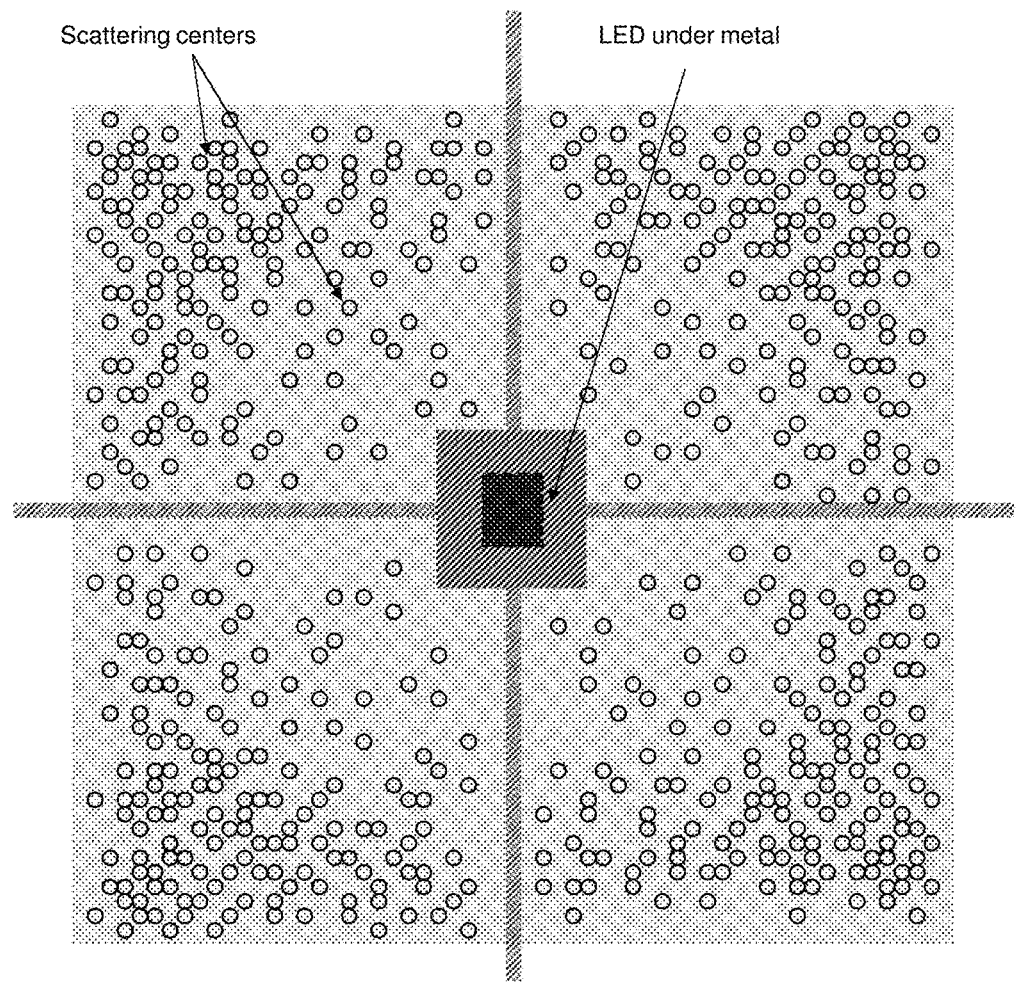
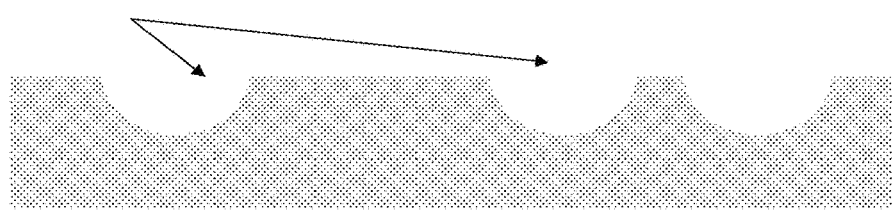
Fig. 13

| 1 | GaAs:C | 5 nm | $10^{19}$ | P-contact |
|---|---|---|---|---|
| 2 | $Al_{0.45}Ga_{0.55}As$:C | 800 nm | $10^{18}$ | P-spreader |
| 3 | $Al_{0.5}In_{0.5}P$:Zn | 200 nm | $3 \times 10^{17}$ | Cladding |
| 4 | $Al_{0.25}Ga_{0.25}In_{0.5}P$ | 6 nm | Undoped | Barrier |
| 5 | $Ga_{0.44}In_{0.56}P$ | 6 nm | Undoped | Q-well |
| 6 | $Al_{0.25}Ga_{0.25}In_{0.5}P$ | 6 nm | Undoped | Barrier |
| 7 | $Ga_{0.44}In_{0.56}P$ | 6 nm | Undoped | Q-well |
| 8 | $Al_{0.25}Ga_{0.25}In_{0.5}P$ | 6 nm | Undoped | Barrier |
| 9 | $Ga_{0.44}In_{0.56}P$ | 6 nm | Undoped | Q-well |
| 10 | $Al_{0.25}Ga_{0.25}In_{0.5}P$ | 6 nm | Undoped | Barrier |
| 11 | $Ga_{0.44}In_{0.56}P$ | 6 nm | Undoped | Q-well |
| 12 | $Al_{0.25}Ga_{0.25}In_{0.5}P$ | 6 nm | undoped | Barrier |
| 13 | $Al_{0.5}In_{0.5}P$ | 200 nm | $10^{18}$ | Cladding |
| 14 | $Al_{0.45}Ga_{0.55}As$:Si | 800 nm | $10^{18}$ | N-spreader |
| 15 | GaAs:Si | 500 nm | $4 \times 10^{18}$ | N-contact |
| 16 | $Al_{0.96}Ga_{0.04}As$ | 1500 nm | $10^{17}$ | N-doped |
| 17 | GaAs | 1500 nm | $10^{17}$ | N-doped |
| 18 | $Al_{0.96}Ga_{0.04}As$ | 500 nm | $10^{17}$ | N-doped |
| 19 | GaAs | Substr. | $>10^{18}$ | N-doped |

Fig. 14C

● Structure of *n-on-p* type GaAs solar cell

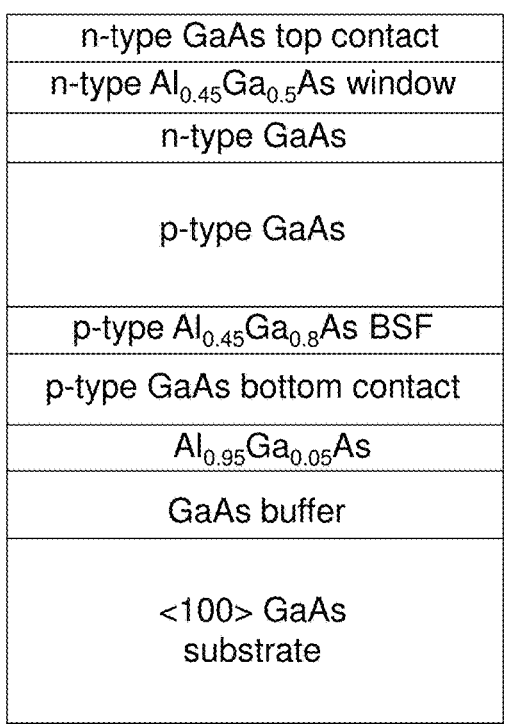

| n-type GaAs top contact |
| n-type Al₀.₄₅Ga₀.₅As window |
| n-type GaAs |
| p-type GaAs |
| p-type Al₀.₄₅Ga₀.₈As BSF |
| p-type GaAs bottom contact |
| Al₀.₉₅Ga₀.₀₅As |
| GaAs buffer |
| <100> GaAs substrate |

9. n-type GaAs top contact layer
   0.1 µm, Si-doped, $8 \times 10^{18}$ cm$^{-3}$ 8. n-type Al$_{0.45}$Ga$_{0.5}$As window layer
   0.050 µm, Si-doped, $3 \times 10^{17}$ cm$^{-3}$ 7. n-type GaAs layer
   0.1 µm, Si-doped, $2 \times 10^{18}$ cm$^{-3}$ 6. p-type GaAs layer
   2 µm, Zn-doped, $3 \times 10^{17}$ cm$^{-3}$ 5. p-type Al$_{0.45}$Ga$_{0.8}$As back-surface-field layer
   0.1 µm, C-doped, $\sim 1 \times 10^{19}$ cm$^{-3}$ 4. p-type GaAs bottom contact layer
   1.0 µm, C-doped, $2 \times 10^{18}$ cm$^{-3}$ 3. Al0.96GaAs sacrificial release layer
   0.5 µm 2. GaAs buffer layer
   0.2 µm 1. GaAs substrate

Fig. 14E

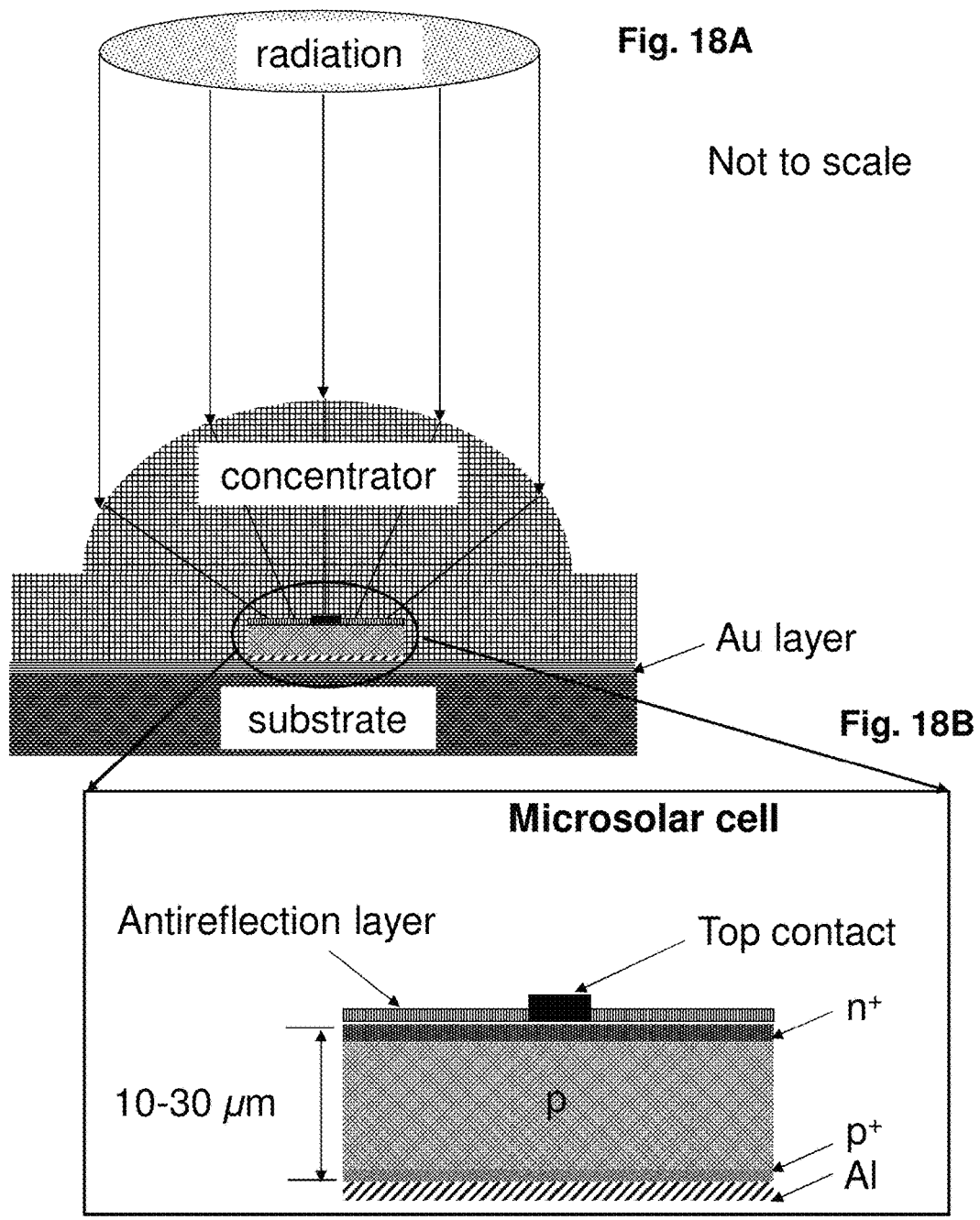

1 ft² of processed semiconductor wafer → ~400 ft² of light-harvesting area.

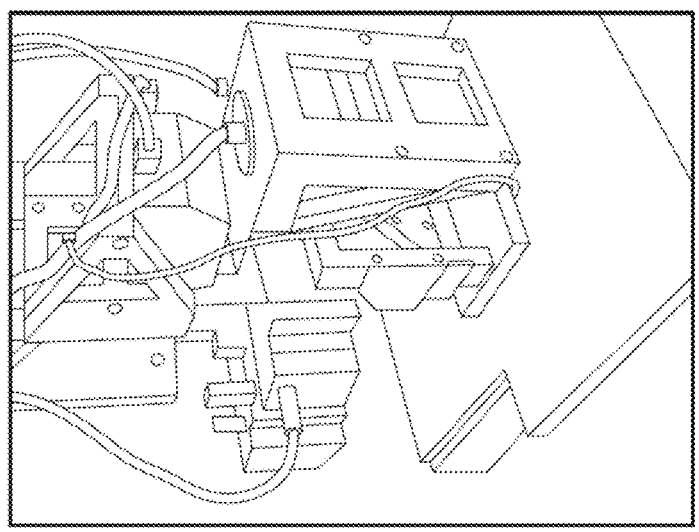
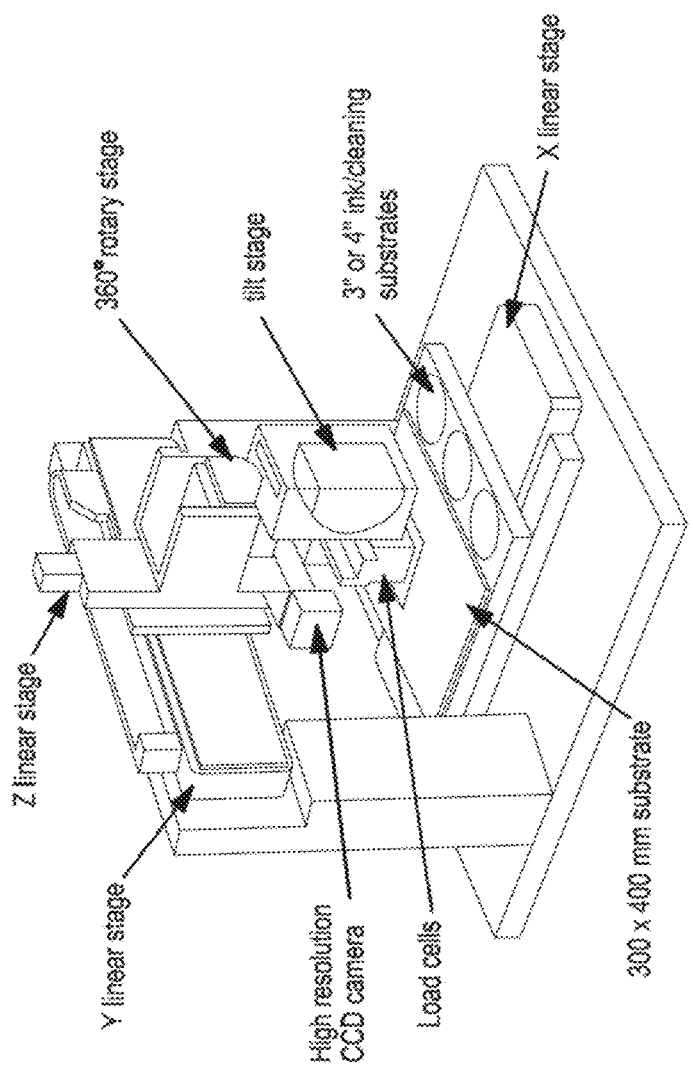
Fig. 36

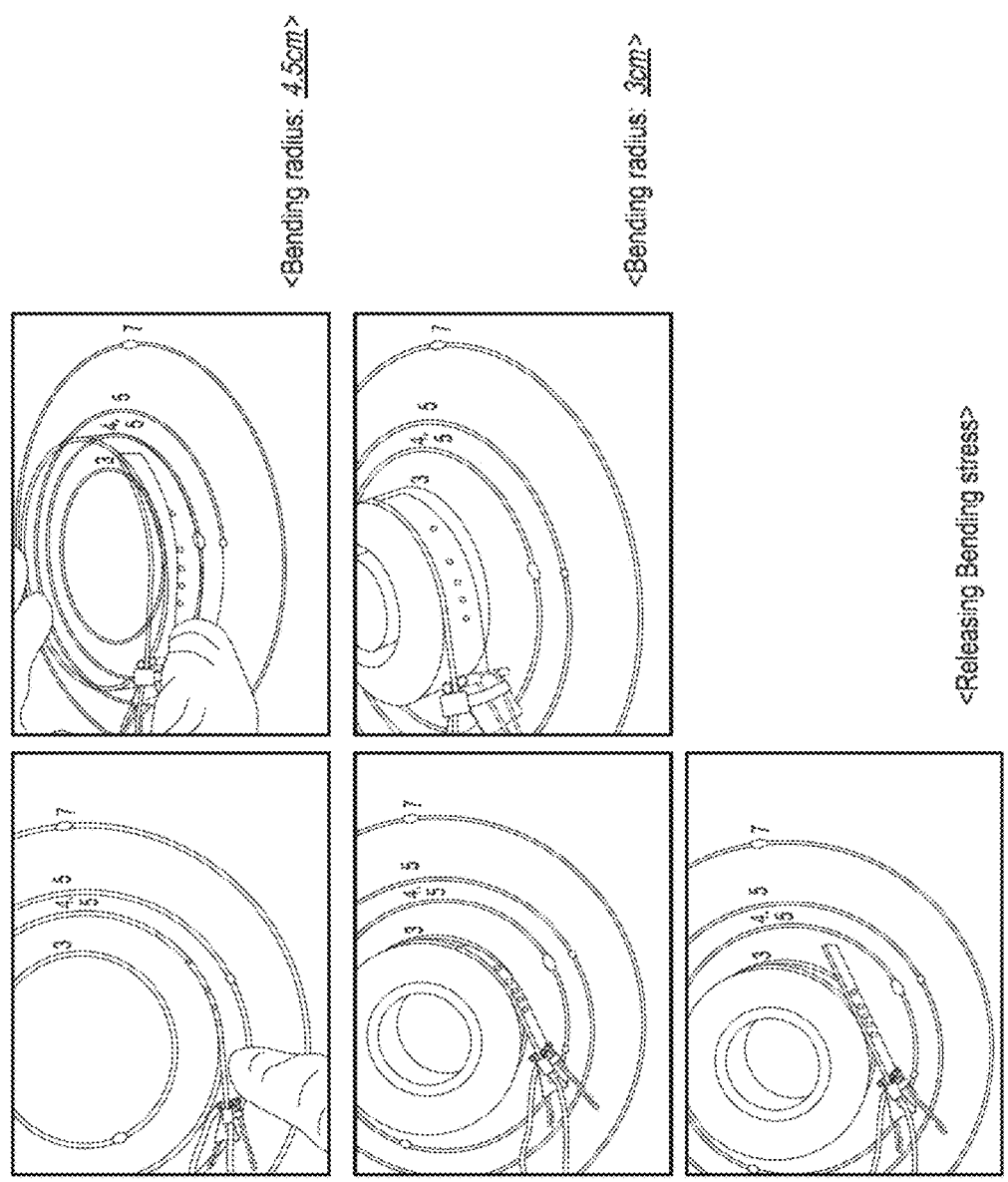

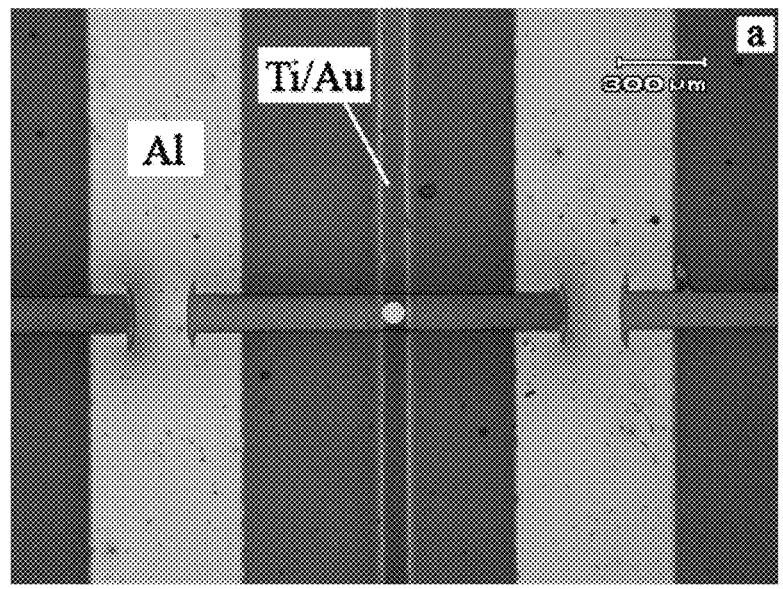
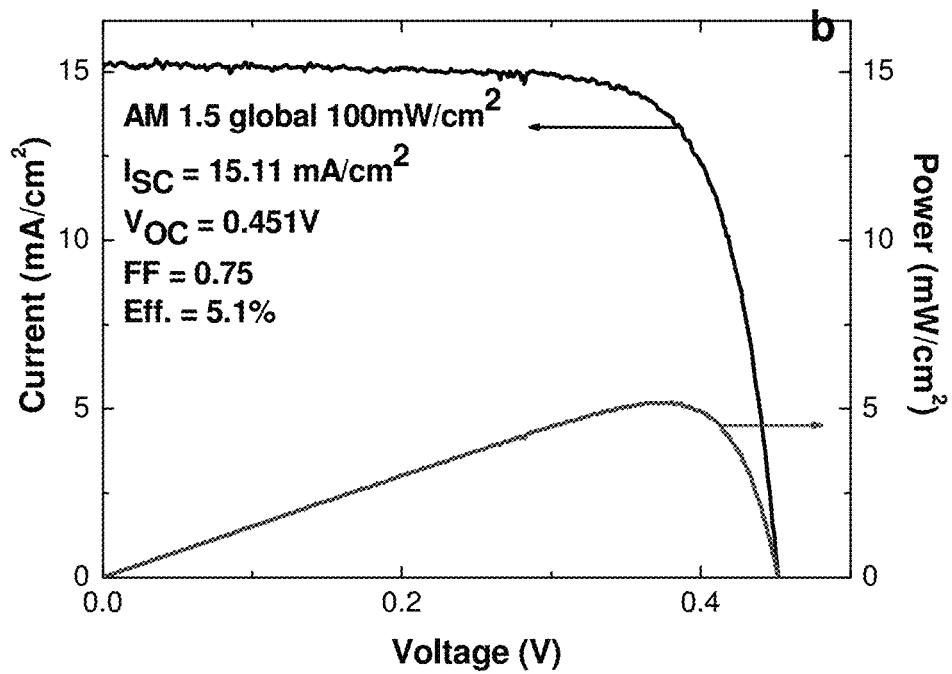
I-V for 1 cell (not fully integrated device)
Fig. 45

(a)
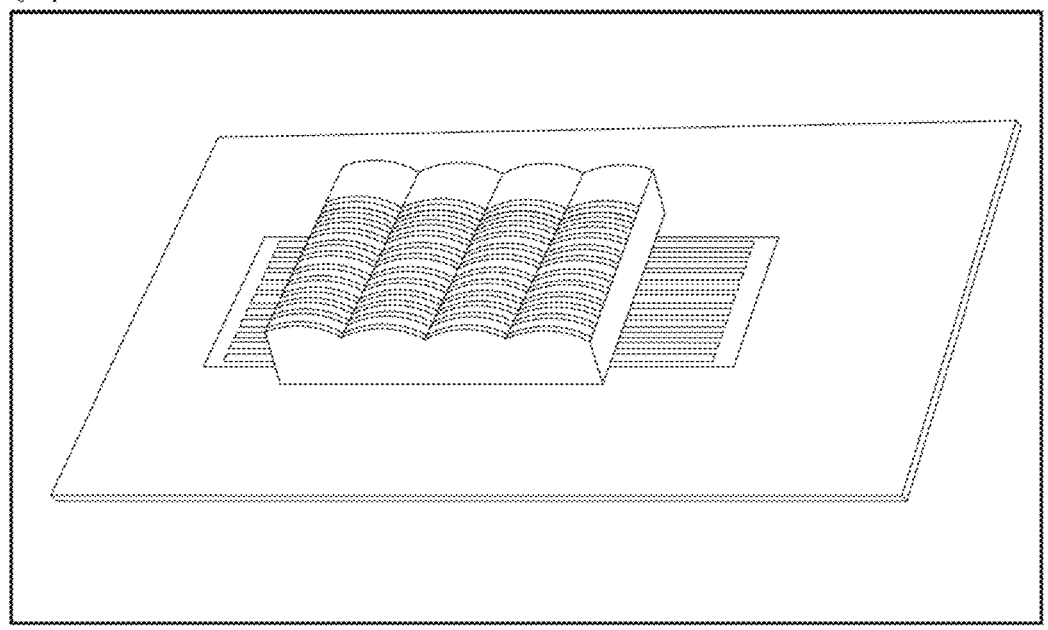
(b)
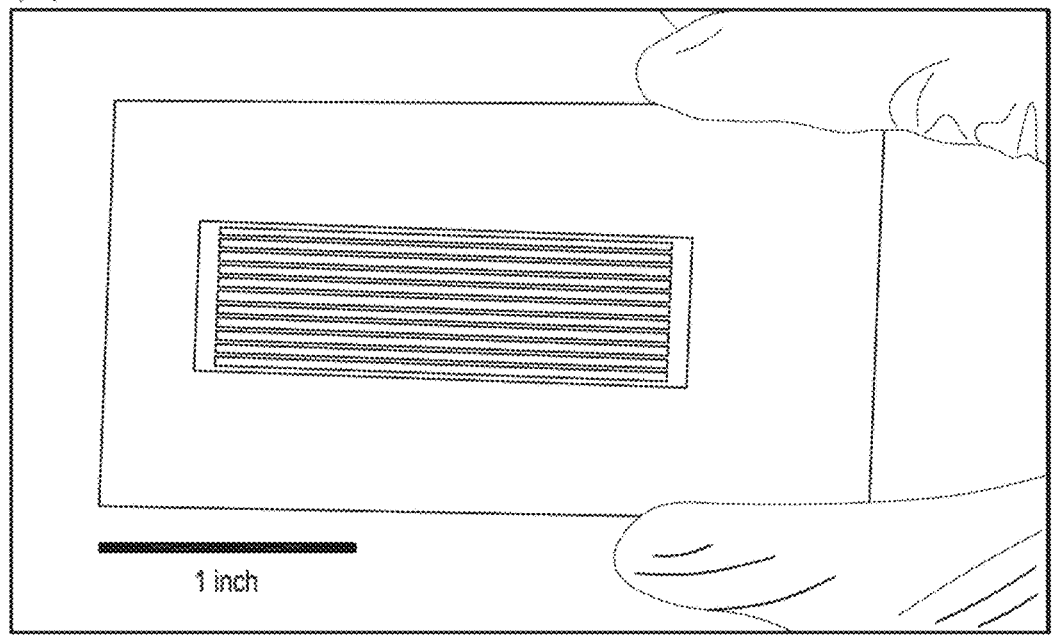
1 inch
Fig. 46

Process for making printable µS-Si solar cells from bulk wafers

- Emitter formation: Coat phosphorus spin on dopant (SOD) onto a Silicon <111> wafer.

- Silicon Ribbon formation (i.e. cell) : Pattern length and width of the cells via photolithography

- Define the cell thickness ( can vary from 5 µm- 60 µm) by deep reactive ion etching or wet anisotropic etching

- Passivate the sidewalls of the ribbons with SiN and then KOH undercut to release the ribbons from the mother substrate

- Retrieve silicon solar cells ( i.e. ribbons) with PDMS Deposit back metallization

- Print onto plastic or any substrate via a conductive adhesive (e.g. silver paint)

- Cast insulating/planarization layer

- Laminate PDMS concentrating optics and metal contact grid onto top of silicon ribbons

Fig. 48

Micromanipulation: Transfer printing
1. Retrieve micro-objects using rubber stamp
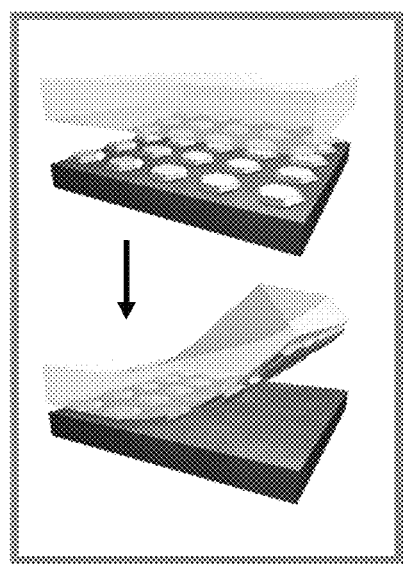
2. Print objects to target substrate
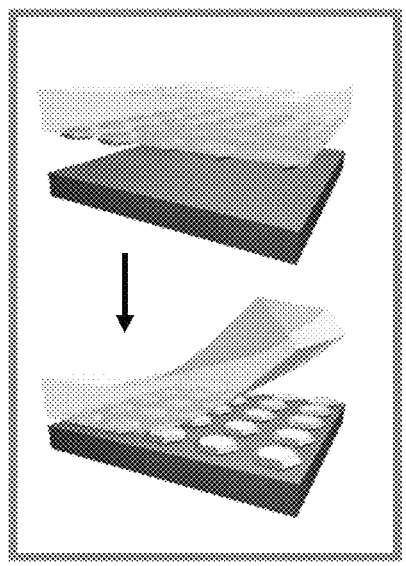
- Massively parallel assembly
- Control micro/nanoscale objects
Fig. 51

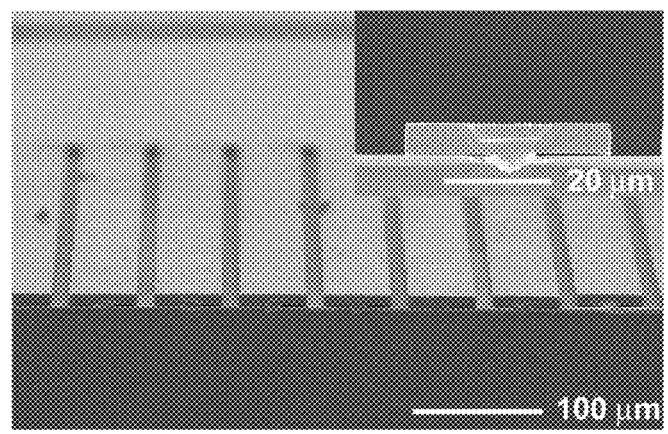
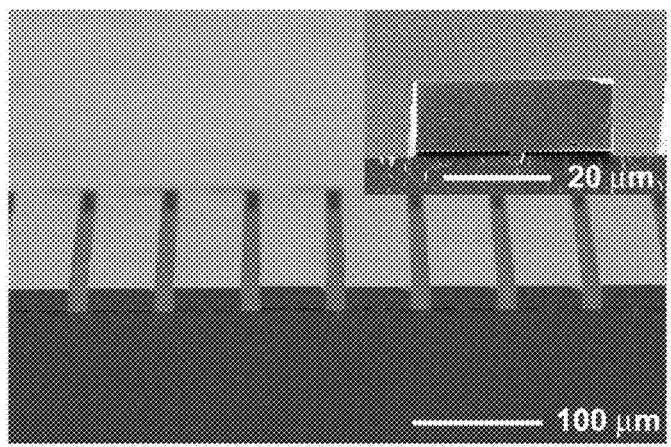
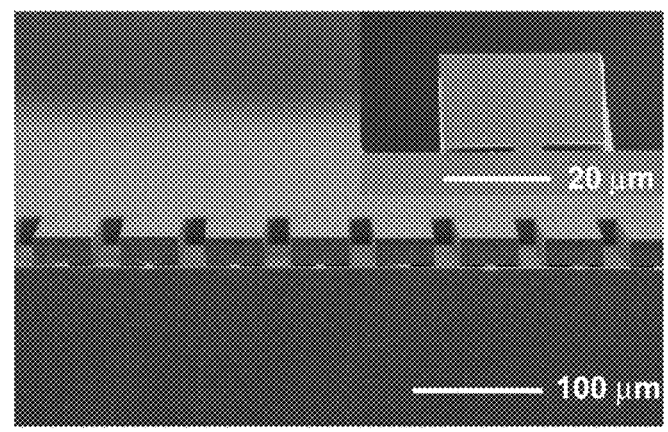
Fig. 58

```
Cell pattern formation
(photolithography and dry etching)
```
```
Boron doping
(window formation and diffusion)
```
```
Phosphorous doping
(window formation and diffusion)
```
```
Undercut
(top and sidewall passivation and KOH etching)
```
```
Bottom boron doping
```
Fig. 63

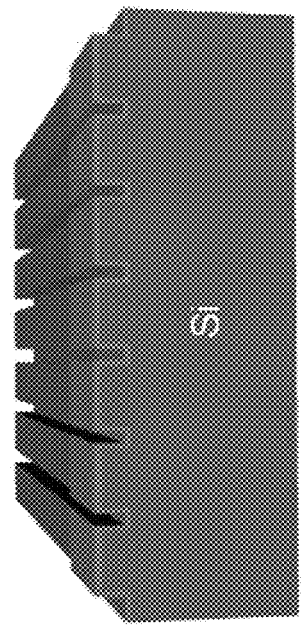
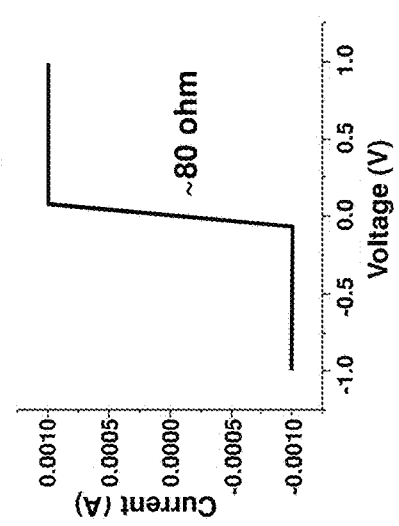
Fig. 67

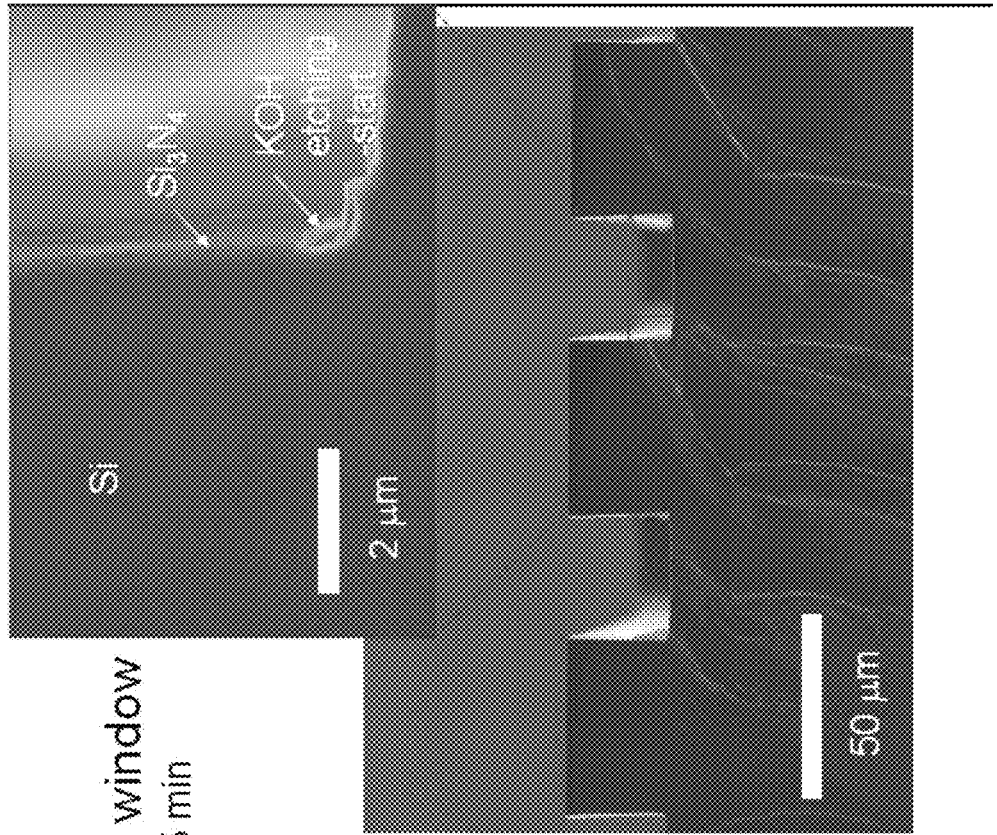
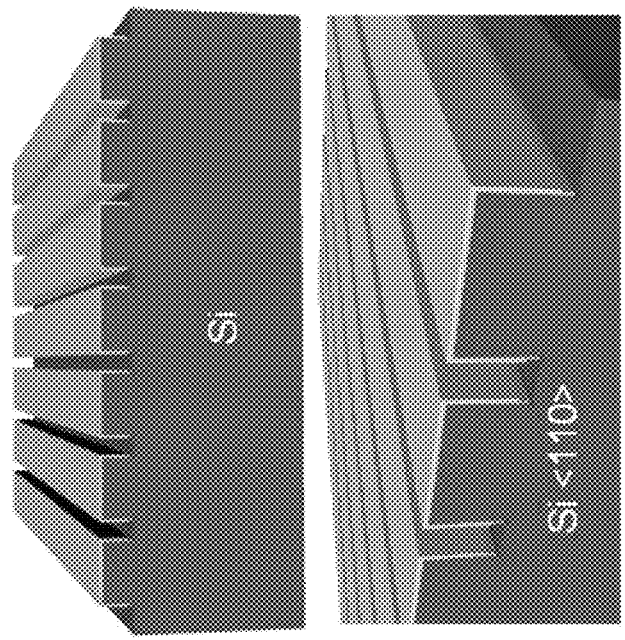
Fig. 69

Fig. 75A – Top Plan View
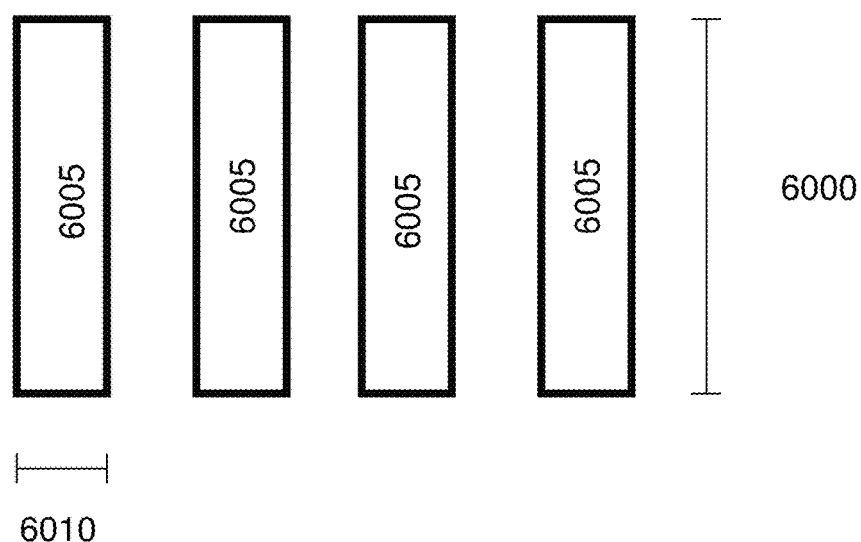
Fig. 75B – Cross Sectional View
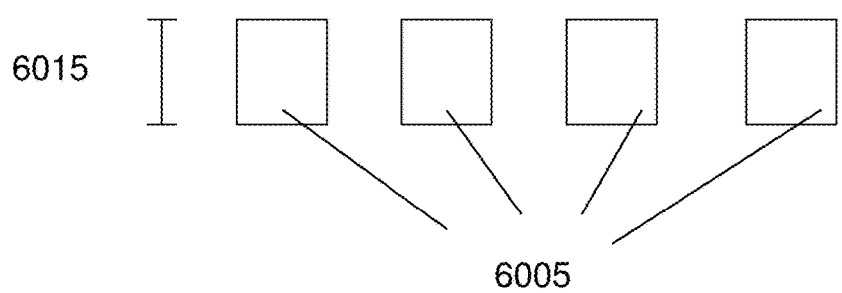

OPTICAL SYSTEMS FABRICATED BY PRINTING-BASED ASSEMBLY

CROSS-REFERENCE TO RELATED APPLICATIONS

This application is a continuation of U.S. patent application Ser. No. 14/800,363, filed Jul. 15, 2015, which is a continuation of U.S. patent application Ser. No. 14/209,481, filed Mar. 13, 2014 (now U.S. Pat. No. 9,117,940, Issued Aug. 25, 2015), which is a continuation of U.S. patent application Ser. No. 13/100,774, filed May 4, 2011 (now U.S. Pat. No. 8,722,458, Issued May 13, 2014), which is a continuation of U.S. patent application Ser. No. 11/981,380, filed Oct. 31, 2007 (now U.S. Pat. No. 7,972,875, Issued Jul. 5, 2011), which claims priority under 35 U.S.C. 119(e) to U.S. Provisional Patent Applications 60/885,306 filed Jan. 17, 2007 and 60/944,611 filed Jun. 18, 2007, each of which are hereby incorporated by reference in their entirety to the extent not inconsistent with the disclosure herein.

STATEMENT REGARDING FEDERALLY SPONSORED RESEARCH OR DEVELOPMENT

This invention was made, at least in part, with United States governmental support under DEFG02-91-ER45439 awarded by U.S. Department of Energy. The United States Government has certain rights in this invention.

BACKGROUND OF INVENTION

Since the first demonstration of a printed, all polymer transistor in 1994, a great deal of interest has been directed at development of a new class of electronic systems comprising flexible integrated electronic devices on plastic substrates. [Garnier, F., Hajlaoui, R., Yassar, A. and Srivastava, P., Science, Vol. 265, pgs 1684-1686] Substantial research has been directed over the last decade toward developing new solution processable materials for conductors, dielectrics and semiconductors elements for flexible polymer-based electronic devices. Progress in the field of flexible electronics is not only driven by the development of new solution processable materials but also by new device geometries, techniques for high resolution, dense patterning of large substrate areas, and high throughput processing strategies compatible with plastic substrates. It is expected that the continued development of new materials, device configurations and fabrication methods will play an essential role in the rapidly emerging new class of flexible integrated electronic devices, systems and circuits.

Interest in the field of flexible electronics arises out of several important advantages provided by this technology. First, the mechanical ruggedness of plastic substrates provides a platform for electronic devices less susceptible to damage and/or electronic performance degradation caused by mechanical stress. Second, the inherent flexibility and deformability of plastic substrate materials allows these materials to be integrated into useful shapes, form factors and configurations not possible with conventional brittle silicon based electronic devices. For example, device fabrication on flexible, shapeable and/or bendable plastic substrates has potential to enable a class of functional devices having revolutionary functional capabilities, such as electronic paper, wearable computers, large-area sensors and high resolution displays, that are not feasible using established silicon-based technologies. Finally, electronic device assembly on flexible plastic substrates has potential for low cost commercial implementation via high speed processing techniques, such as printing, capable of assembling electronic devices over large substrate areas.

Despite considerable motivation to develop a commercially feasible platform for flexible electronics, the design and fabrication of flexible electronic devices exhibiting good electronic performance continues to present a number of significant technical challenges. First, conventional well-developed methods of making single crystalline silicon based electronic devices are incompatible with most plastic materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most or all plastic substrates. In addition, many inorganic semiconductors are not intrinsically soluble in convenient solvents that would allow for solution based processing and delivery. Second, although amorphous silicon, organic or hybrid organic-inorganic semiconductors have been developed that are compatible with low temperature processing and integration into plastic substrates, these materials do not exhibit electronic properties comparable to conventional single crystalline semiconductor based systems. Accordingly, the performance of electronic devices made from these alternative semiconductor materials is less than current state of the art high performance semiconductor devices. As a result of these limitations, flexible electronic systems are presently limited to specific applications not requiring high performance, such as use in switching elements for active matrix flat panel displays with non-emissive pixels and in light emitting diodes.

Macroelectronics is a rapidly expanding area of technology which has generated considerable interest in developing commercially feasible flexible electronic systems and processing strategies. The field of macroelectronics relates to microelectronic systems wherein microelectronic devices and device arrays are distributed and integrated on large area substrates significantly exceeding the physical dimensions of conventional semiconductor wafers. A number of macroelectronic products have been successfully commercialized including large area macroelectronic flat panel display products. The majority of these display systems comprise amorphous or polycrystalline silicon thin film transistor arrays patterned onto rigid glass substrates. Macroelectronic display devices having substrate dimensions as large as 100's of meters squared have been achieved. Other macroelectronic products in development include photovoltaic device arrays, large area sensors and RFID technology.

Despite considerable progress in this field, there is continued motivation to integrate flexible substrates and device structures into macroelectronic systems so as to impart new device functionality, such as enhanced ruggedness, mechanical flexibility and bendability. To address this need, a number material strategies for flexible macroelectronic systems are currently being pursued including organic semiconductor thin film transistor technology, nano-wire and nanoparticle based flexible electronics and organic/inorganic semiconductor hybrid technology. In addition, substantial research is currently directed at developing new fabrication processes for accessing high throughput and low cost manufacturing of macroelectronic systems.

U.S. Pat. No. 7,622,367, application Ser. No. 11/145,574 and U.S. Pat. No. 7,557,367, application Ser. No. 11/145,542, both filed on Jun. 2, 2005, disclose a high yield fabrication platform using printable semiconductor elements for making electronic devices, optoelectronic devices and other functional electronic assemblies by versatile, low cost and high area printing techniques. The disclosed methods and compositions provide for the transfer, assembly and/or and integration of microsized and/or nanosized semiconductor elements using dry transfer contact printing and/or solution printing techniques providing good placement accuracy, registration and pattern fidelity over large substrate areas. The disclosed methods provide important processing advantages enabling the integration of high quality semiconductor materials fabricated using conventional high temperature processing methods onto substrates by printing techniques which may be independently carried out at relatively low temperatures (<about 400 degrees Celsius) compatible with a range of useful substrate materials, including flexible plastic substrates. Flexible thin film transistors fabricated using printable semiconductor materials exhibit good electronic performance characteristics, such as device field effect mobilities greater than 300 $cm^2$ $V^{-1}$ $s^{-1}$ and on/off ratios greater than $10^3$, when in flexed and non-flexed conformations.

It will be appreciated from the foregoing that a need exists for methods of making large area integrated electronics, including macroelectronic systems. In particularly, fabrication methods for these systems are needed that are capable of high-throughput and low cost implementation. Further, there is currently a need for macroelectronic systems combining good electronic device performance and enhanced mechanical functionality such as flexibility, shapeability, bendability and/or stretchability.

SUMMARY OF THE INVENTION

The present invention provides optical devices and systems fabricated, at least in part, via printing-based assembly and integration of printable functional materials and/or semiconductor-based devices and device components. In specific embodiments the present invention provides light emitting systems, light collecting systems, light sensing systems and photovoltaic systems comprising printable semiconductor elements, including large area, high performance macroelectronic devices. Optical systems of the present invention comprise printable semiconductor containing structures (e.g., printable semiconductor elements) assembled, organized and/or integrated with other device components via printing techniques that exhibit performance characteristics and functionality comparable to single crystalline semiconductor based devices fabricated using conventional high temperature processing methods. Optical systems of the present invention have device geometries and configurations, such as form factors, component densities, and component positions, accessed by printing that provide a range of useful device functionalities. Optical systems of the present invention include devices and device arrays exhibiting a range of useful physical and mechanical properties including flexibility, shapeability, conformability and/or stretchablity. Optical systems of the present invention include, however, devices and device arrays provided on conventional rigid or semi-rigid substrates, in addition to devices and device arrays provided on flexible, shapeable and/or stretchable substrates.

This invention also provides device fabrication and processing steps, methods and materials strategies for making optical systems at least in part via printing techniques, including contact printing, for example using a conformable transfer devices, such as an elastomeric transfer device (e.g., elastomer layer or stamp). In specific embodiments, methods of the present invention provide a high-throughput, low cost fabrication platform for making a range of high performance optical systems, including light emitting systems, light collecting systems, light sensing systems and photovoltaic systems. Processing provided by the present methods is compatible with large area substrates, such as device substrates for microelectronic devices, arrays and systems, and is useful for fabrication applications requiring patterning of layered materials, such as patterning printable structures and/or thin film layers for electronic and electro-optic devices. Methods of the present invention are complementary to conventional microfabrication and nanofabrication platforms, and can be effectively integrated into existing photolithographic, etching and thin film deposition device patterning strategies, systems and infrastructure. The present device fabrication methods provide a number of advantages over conventional fabrication platforms including the ability to integrate very high quality semiconductor materials, such as single crystalline semiconductors and semiconductor-based electronic devices/device components, into optical systems provided on large area substrates, polymer device substrates, and substrates having contoured a conformation.

In an aspect, the present invention provides processing methods using high quality bulk semiconductor wafer starting materials that are processed to provide large yields of printable semiconductor elements with preselected physical dimensions and shapes that may be subsequently transferred, assembled and integrated into optical systems via printing. An advantage provided by the present printing-based device fabrication methods is that the printable semiconductor elements retain desirable electronic properties, optical properties and compositions of the high quality bulk wafer starting material (e.g., mobility, purity and doping etc.) while having different mechanical properties (e.g., flexibility, stretchability etc.) that are useful for target applications such as flexible electronics. In addition, use of printing-based assembly and integration, for example via contact printing or solution printing, is compatible with device fabrication over large areas, including areas greatly exceeding the dimensions of the bulk wafer starting material. This aspect of the present invention is particularly attractive for applications in macroelectronics. Further, the present semiconductor processing and device assembly methods provide for very efficient use of virtually the entire starting semiconductor material for making printable semiconductor elements that can be assembled and integrated into a large number of devices or device components. This aspect of the present invention is advantageous because very little of the high quality semiconductor wafer starting material is wasted or discarded during processing, thereby providing a processing platform capable of low cost fabrication of optical systems.

In one aspect, the present invention provides optical systems comprising printable semiconductor elements, including printable semiconductor-based electronic devices/device components, assembled, organized and/or integrated using contact printing. In an embodiment of this aspect, the invention provides a semiconductor-based optical system made by a method comprising the steps of: (i) providing a device substrate having a receiving surface; and (ii) assembling one or more plurality of printable semiconductor elements on the receiving surface of the substrate via contact printing. In an embodiment, the optical system of this aspect of the present invention comprises an array of semiconductor-based devices or device components assembled on the receiving surface of the substrate via contact printing. In specific embodiments, each of the printable semiconductor elements of the optical system comprises a semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters. In an embodiment of this aspect, printable semiconductor elements comprise on or more semiconductor devices selected from the group consisting of LED, solar cell, diode, p-n junctions, photovoltaic systems, semiconductor-based sensor, laser, transistor and photodiode, having a length selected from the range of 0.0001 millimeters to 1000 millimeters, a width selected from the range of 0.0001 millimeters to 1000 millimeters and a thickness selected from the range of 0.00001 millimeters to 3 millimeters. In an embodiment, the printable semiconductor element comprises a semiconductor structure having a length selected from the range of 0.02 millimeters to 30 millimeters, and a width selected from the range of 0.02 millimeters to 30 millimeters, preferably for some applications a length selected from the range of 0.1 millimeters to 1 millimeter, and a width selected from the range of 0.1 millimeters to 1 millimeter, preferably for some applications a length selected from the range of 1 millimeters to 10 millimeters, and a width selected from the range of 1 millimeter to 10 millimeters. In an embodiment, the printable semiconductor element comprises a semiconductor structure having a thickness selected from the range of 0.0003 millimeters to 0.3 millimeters, preferably for some applications a thickness selected from the range of 0.002 millimeters to 0.02 millimeters. In an embodiment, the printable semiconductor element comprises a semiconductor structure having a length selected from the range of 100 nanometers to 1000 microns, a width selected from the range of 100 nanometers to 1000 microns and a thickness selected from the range of 10 nanometers to 1000 microns.

In an embodiment, the printable semiconductor element(s) is/are an electronic device or a component of an electronic device. In an embodiment, the printable semiconductor element(s) is/are selected from the group consisting of: an LED, a laser, a solar cell, a sensor, a diode, a transistor, and a photodiode. In an embodiment, the printable semiconductor element(s) comprises the semiconductor structure integrated with at least one additional structure selected from the group consisting of: another semiconductor structure; a dielectric structure; conductive structure, and an optical structure. In an embodiment, the printable semiconductor element comprises the semiconductor structure integrated with at least one electronic device component selected from the group consisting of: an electrode, a dielectric layer, an optical coating, a metal contact pad and a semiconductor channel. In an embodiment, the system further comprises an electrically conducting grid or mesh provided in electrical contact with at least a portion of said printable semiconductor elements, wherein the electrically conducting grid or mesh providing at least one electrode for said system.

Useful contact printing methods for assembling, organizing and/or integrating printable semiconductor elements of this aspect include dry transfer contact printing, microcontact or nanocontact printing, microtransfer or nanotransfer printing and self assembly assisted printing. Use of contact printing is beneficial in the present optical systems because it allows assembly and integration of a plurality of printable semiconductor in selected orientations and positions relative to each other. Contact printing in the present invention also enables effective transfer, assembly and integration of diverse classes of materials and structures, including semiconductors (e.g., inorganic semiconductors, single crystalline semiconductors, organic semiconductors, carbon nanomaterials etc.), dielectrics, and conductors. Contact printing methods of the present invention optionally provide high precision registered transfer and assembly of printable semiconductor elements in preselected positions and spatial orientations relative to one or more device components prepatterned on a device substrate. Contact printing is also compatible with a wide range of substrate types, including conventional rigid or semi-rigid substrates such as glasses, ceramics and metals, and substrates having physical and mechanical properties attractive for specific applications, such as flexible substrates, bendable substrates, shapeable substrates, conformable substrates and/or stretchable substrates. Contact printing assembly of printable semiconductor structures is compatible, for example, with low temperature processing (e.g., less than or equal to 298K). This attribute allows the present optical systems to be implemented using a range of substrate materials including those that decompose or degrade at high temperatures, such as polymer and plastic substrates. Contact printing transfer, assembly and integration of device elements is also beneficial because it can be implemented via low cost and high-throughput printing techniques and systems, such as roll-to-roll printing and flexographic printing methods and systems. The present invention include methods wherein contact printing is carried out using a conformable transfer device, such as an elastomeric transfer device capable of establishing conformal contact with external surfaces of printable semiconductor elements. In embodiments useful for some device fabrication applications contact printing is carried out using an elastomeric stamp.

In an embodiment, the step of contact printing-based assembly of printable semiconductor comprises the steps of: (i) providing a conformable transfer device having one or more contact surfaces; (ii) establishing conformal contact between an external surface of the printable semiconductor element and the contact surface of the conformable transfer device, wherein the conformal contact bonds the printable semiconductor element to the contact surface; (iii) contacting the printable semiconductor element bonded to the contact surface and the receiving surface of the device substrate; and (iv) separating the printable semiconductor element and the contact surface of the conformable transfer device, thereby assembling the printable semiconductor element on the receiving surface of the device substrate. In some embodiments, the step of contacting the printable semiconductor element bonded to the contact surface and the receiving surface of the device substrate comprises establishing conformal contact between the contact surface of the transfer device having the printable semiconductor element(s) and the receiving surface. In some embodiments, the printable semiconductor element(s) on the contact surface are brought into contact with an adhesive and/or planarizing layer provided on the receiving surface to facilitate release and assembly on the device substrate. Use of elastomeric transfer devices, such as elastomer layers or stamps including PDMS stamps and layers, is useful in some methods given the ability of these devices to establish conformal contact with printable semiconductor elements, and the receiving surfaces, external surface and internal surfaces of device substrates and optical components.

Use of printable semiconductor materials and printable semiconductor-based electronic devices/device components in embodiments of this aspect provides the capable of integrating a range of high quality semiconductor materials for fabricating optical systems exhibiting excellent device performance and functionality. Useful printable semiconductor elements include, semiconductor elements derived from high quality semiconductor wafer sources, including single crystalline semiconductors, polycrystalline semiconductors, and doped semiconductors. In a system of the present invention, the printable semiconductor element comprises a unitary inorganic semiconductor structure. In a system of the present invention, the printable semiconductor element comprises a single crystalline semiconductor material. In addition, use of printable semiconductor structures provides the capability of integrating printable structures comprising semiconductor electronic, optical and opto-electronic devices, device components and/or semiconductor heterostructures, such as hybrid materials made via high temperature processing and subsequently assembled on a substrate via printing. In certain embodiment, printable semiconductor elements of the present invention comprise functional electronic devices or device components, such as p-n junctions, semiconductor diodes, light emitting diodes, semiconductor lasers (e.g., Vertical-Cavity Surface-Emitting Lasers (VCSEL)), and/or photovoltaic cells.

In an embodiment, the printable semiconductor elements are assembled on said device substrate such that they generate a multilayer structure on said receiving surface. In an embodiment, for example, the multilayer structure comprises mechanically-stacked solar cells. In an embodiment, for example, the printable semiconductor elements are solar cells having different band-gaps.

Optical systems of this aspect of the present invention may optionally comprise a variety of additional device elements including, but not limited to, optical components, dielectric structures, conductive structures, adhesive layers or structures, connecting structures, encapsulating structures, planarizing structures, electro-optic elements and/or thin film structures and arrays of these structures. In an embodiment, for example, an optical system of the present invention further comprises one or more passive or active optical components selected from the group consisting of: collecting optics, concentrating optics, diffusing optics, dispersive optics, optical fibers and arrays thereof, lenses and arrays thereof, diffusers, reflectors, Bragg reflectors, waveguides ("light-pipes"), and optical coatings (e.g., reflective coatings or antireflective coatings). In some embodiments, active and/or passive optical components are spatially aligned with respect to at least one of the printable semiconductor elements provided on the device substrate. Optical systems of this aspect of the present invention may optionally comprise a variety of additional device components including, but not limited to, electrical interconnects, electrodes, insulators and electro-optical elements. Printed-based assembly may be used to assembly and integrate additional device elements and additional device components, in addition to assembly and integration of these additional elements by variety of techniques well known in the field of microelectronics, including but not limited to, optical photolithography, deposition techniques (e.g., chemical vapor deposition, physical vapor deposition, atomic layer deposition, sputtering deposition etc.), soft lithography, spin coating and laser ablation patterning.

Printing-based assembly provides a very high degree of control over the physical dimensions, geometry, relative spatial orientation and organization, doping levels and materials purity of the printable semiconductor elements assembled and integrated into the present optical systems. In an embodiment, printable semiconductor elements of the optical system are provided on the receiving surface of the substrate with a density equal to or greater than 5 semiconductor elements mm$^{-1}$, preferably for some applications a density equal to or greater than 50 semiconductor elements mm$^{-1}$, and preferably for some applications a density equal to or greater than 100 semiconductor elements mm$^{-1}$. In another embodiment, the printable semiconductor elements of the optical system have at least one longitudinal physical dimension (e.g., length, width etc.), optionally two longitudinal physical dimensions, less than or equal to 2000 nanometers, and in some embodiments less than or equal to 500 nanometers. In another embodiment, each printable semiconductor element of the optical system has at least one cross-sectional physical dimension (e.g. thickness) less than or equal to 100 microns, preferably for some applications less than or equal to 10 microns, and preferably for some applications less than or equal to 1 microns. In another embodiment, the positions of the printable semiconductor elements in the optical system relative to each other are selected to within 10,000 nanometers.

Printable semiconductor elements may be assembled in selected orientations with respect to each other or other device elements of optical systems of the present invention. In an embodiment, printable semiconductor elements of the optical system are longitudinal aligned with respect to each other. The present invention includes, for example, optical systems wherein printable semiconductor elements extend lengths that are parallel to within 3 degrees of each other. In another embodiment, the optical system further comprising first and second electrodes provided on the receiving surface, wherein the printable semiconductor elements are in electrical contact with at least one of the electrodes, and wherein the printable semiconductor elements provide a fill factor between the first and second electrodes greater than or equal to 10%, preferably for some embodiments equal to or larger than 50%.

The present invention also includes optical systems comprising printable semiconductor elements arranged in a low density (or sparse) configuration. Use of a low density configuration has benefits for some applications, as the amount of semiconductor incorporated in the device is low, thus, accessing lower costs. In these configurations, semiconductor elements may be arrange on a substrate so that the density of semiconductor elements is low enough such that the system is optically transparent, preferably for some embodiments more than 50% optical transparent at selected wavelength. In an embodiment, printable semiconductor elements of the optical system are provided on the receiving surface of the substrate with a density equal to or less than 1000 semiconductor elements mm$^{-1}$, preferably for some embodiments a density equal to or less than 500 semiconductor elements mm$^{-1}$, and more preferably for some embodiments a density equal to or less than 50 semiconductor elements mm$^{-1}$. In an embodiment of the present methods and systems capable of accessing sparse configurations, the semiconductor elements cover less than or equal to 10% of the receiving surface of the target substrate; in another embodiment less than or equal to 1%; and in another embodiment less than or equal to 0.1%. In another embodiment, the optical system further comprising first and second electrodes provided on the receiving surface, wherein the printable semiconductor elements are in electrical contact with at least one of the electrodes, and wherein the printable semiconductor elements provide a fill factor between the first and second electrodes less than or equal to 10%, preferably for some embodiments less than or equal to 5%.

The present invention includes optical systems comprising printable semiconductor elements assembled and integrated onto a range of useful substrate materials, including glass substrates, polymer substrate, plastic substrates, metal substrates, ceramic substrates, wafer substrates, and composite substrates. Substrates useful in the present optical systems include those having useful mechanical and/or physical properties such as flexibility, shapeability, stretchability, mechanical ruggedness and optical transparency at selected wavelengths. In some embodiments, optical systems of the present invention comprise printable semiconductor elements assembled and integrated onto a device substrate prepatterned with device components. In some embodiment, optical systems of the present invention comprise printable semiconductor elements assembled and integrated onto a device substrate having a selected optically functionality, such as a device substrate comprising a lens, lens array, optical window, reflector, optical coating, series of optical coatings, or optically transparent substrate optionally having one or more optical coatings such as reflective coatings or anti reflective coatings. In some embodiments, optical systems of the present invention comprise printable semiconductor elements assembled and integrated onto a device substrate having a contoured receiving surface, such as a concave receiving surface, convex receiving surface, a spherical surface, an elliptical surface or receiving surface having a complex contour with both concave regions and convex regions.

Optical systems of the present invention may further comprise one or more encapsulating layers, planarizing layers, laminating layers, cover layers and/or bonding layers. Encapsulating layers, laminating layers, planarizing layers, covering layers or bonding layers may be provided on top of printable semiconductor elements or other device components to provide enhanced mechanical stability and ruggedness. Encapsulating layers, laminating layers, planarizing layers, covering layers or bonding layers may be provided in a configuration so as to mechanically, optically and/or electrically interconnect device components and structures of the present optical systems. Encapsulating layers, laminating layers, covering layers, planarizing layers, or bonding layers may comprise layers of deposited material, spin coated layers and/or molded layers. Encapsulating layers, laminating layers, covering layers, planarizing layers, or bonding layers are preferably at least partially optically transparent for some optical systems and applications of the present invention. Useful encapsulating layers, laminating layers, planarizing layers, covering layers and/or bonding layers may comprise one or more polymers, composite polymers, metals, dielectric materials, epoxy materials or prepolymer materials. In an embodiment, printable semiconductor elements are bonded or otherwise integrated to the receiving surface via one or more of the following: (i) cold welding the semiconductor elements to the receiving surface via a metal layer provided between the printable semiconductor elements and the receiving layer; (ii) provided via an adhesive layer provided between the printable semiconductor elements and the receiving layer; or (iii) provided by a lamination, encapsulation or planarizing layer provided on top of the printable semiconductor elements and the receiving layer. If the adhesive layer is metal, this layer can also serve to establish electrical contact to the printable semiconductor element during printing-based assembly and integration.

In some embodiments, the composition and thickness of an encapsulating, laminating or planarizing layer is selected such that the printable semiconductor elements, such as printed semiconductor devices and/or device components, assembled on a device substrate are placed near or on the neutral mechanical plane. In an embodiment, for example an encapsulating or laminating layer is provided on top of assembled printable semiconductor elements, wherein the encapsulating or laminating layer has a composition and thickness similar to that of the device substrate. In these embodiments, matching the encapsulating and/or laminating layer composition and thickness dimension with that of the device substrate results in the printable semiconductor elements residing near the neutral mechanical plane. Alternatively, the thickness and Young's modulus of the encapsulating and/or laminating layer may be selected to result in the printable semiconductor elements residing near the neutral mechanical plane. An advantage of processing methods and device geometries wherein printable semiconductor elements reside near the neutral mechanical plane of the device is that strain on these elements are minimized during bending or deformation. This strategy for managing strains generated during bending has benefits for minimizing delamination or other degradation of the device result from bending induced strain.

In some embodiments, optical systems of the present invention provide light emitting optical systems, including, but not limited to, advanced lighting systems, arrays of light emitting diodes, arrays of semiconductor lasers (e.g., VCSELs), passive matrix LED (light emitting diode) displays, active matrix LED displays, ILED (inorganic light emitting diode) displays, macroelectronic display devices, and flat panel displays. In some embodiments, optical systems of the present invention provide light sensing optical systems including, optical sensors and sensor arrays, flexible sensors, stretchable sensors, conformal sensors and sensor skins. In some embodiments, optical systems of the present invention provide optical systems providing both light emitting and light sensing functionality such as sheet scanners. Optical systems of the present invention include energy conversion and storage systems including photovoltaic devices, device arrays and systems including solar cell arrays. In some embodiments, optical systems of the present invention comprise a plurality of one or more LEDs, photovoltaic cells, semiconductor lasers, photodiodes, and electro-optical elements having at least two physical dimensions (e.g., length, width, diameter or thickness) less than 200 microns. In an embodiment, for example, the present invention provides an optical system comprising an array of solar cells, wherein each cell in the array has at least two physical dimensions (e.g., length, width, diameter or thickness) less than 200 microns. In another embodiment, for example, the present invention provides an optical system comprising an array of LEDs, wherein each LED in the array has a thickness less than 3 microns, and preferably for some applications less than 1 micron.

In another aspect, the present invention provides a method for making an optical system comprising the steps: (i) providing a device substrate having a receiving surface; and (ii) assembling one or more printable semiconductor elements on the receiving surface of the substrate via contact printing; wherein each of the printable semiconductor elements comprise a semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters. In an embodiment, the printable semiconductor element comprises a semiconductor structure having a length selected from the range of 0.02 millimeters to 30 millimeters, and a width selected from the range of 0.02 millimeters to 30 millimeters, preferably for some applications a length selected from the range of 0.1 millimeters to 1 millimeter, and a width selected from the range of 0.1 millimeters to 1 millimeter, preferably for some applications a length selected from the range of 1 millimeters to 10 millimeters, and a width selected from the range of 1 millimeter to 10 millimeters. In an embodiment, the printable semiconductor element comprises a semiconductor structure having a thickness selected from the range of 0.0003 millimeters to 0.3 millimeters, preferably for some applications a thickness selected from the range of 0.002 millimeters to 0.02 millimeters. In an embodiment, the printable semiconductor element comprises a semiconductor structure having a length selected from the range of 100 nanometers to 1000 microns, a width selected from the range of 100 nanometers to 1000 microns and a thickness selected from the range of 10 nanometers to 1000 microns.

Useful contact printing methods useful in this aspect of the present invention include dry transfer contact printing, microcontact or nanocontact printing, microtransfer or nanotransfer printing and self assembly assisted printing. Optionally, methods of the present invention employ contact printing as implemented using a conformable transfer device, such as an elastomeric transfer device (e.g., elastomeric stamp, composite stamp or layer). Optionally, a plurality of printable semiconductor elements are assembled on the receiving surface of the substrate, for example in a dense or spares configuration. Optionally, methods of this aspect of the present invention further comprise the step of prepatterning the device substrate with one or more device components. Optionally, methods of this aspect of the present invention further comprise the step of providing one or more optical components in optical communication or optical registration with the printable semiconductor elements. In a method of the present invention, the printable semiconductor element comprises a unitary inorganic semiconductor structure. In a method of the present invention, the printable semiconductor element comprises a single crystalline semiconductor material.

Optionally, methods of the present invention include the step of providing a laminating layer, such as a polymer or elastomer layer on top of at least a portion of the printable semiconductor elements assembled on the receiving surface of the substrate. Optionally, methods of the present invention include the step of planarizing at least a portion of the printable semiconductor elements assembled on the receiving surface of the substrate. Optionally, methods of the present invention include the steps of: (i) providing a planarizing layer to the receiving surface and (ii) embedding at least a portion of the printable semiconductor elements in the planarizing layer. Optionally, methods of the present invention include the step of patterning one or more electrical contacts, electrodes, contact pads or other electrical interconnect structures on at least a portion of the printable semiconductor elements.

Methods of this aspect of the present invention further comprise the step of assembling and/or integrating one or more additional device components onto the device substrate, such as optical components, electronic components and/or electro-optical components. Assembling and/or integrating additional device components in the present methods can be implemented in combination with a large number of other fabrication techniques, including, but not limited to, lithographic patterning (e.g., optical lithograph and soft lithography), deposition techniques (e.g., CVD, PVD, ALD, etc.), laser ablation patterning, molding techniques (e.g., replica molding), spin coating, self assembly, contact printing, and solution printing. In some embodiments, other processing techniques, such as plasma treatment, etching, metallization and cold welding are used to generate, assemble or integrate device components, including printable semiconductor elements.

In an embodiment, for example, a combination of optical lithography and deposition techniques are used to pattern the device substrate prior to or after printing-based assembly of the printable semiconductor elements. In another embodiment, for example, replica molding is used to generate optical components, such as a lens array or diffusers, which are subsequently patterned with printable semiconductor elements via contact printing. In another embodiment, for example, printable semiconductor elements provided on a device substrate are electrically connected to electrodes and electrical interconnects patterned on the device substrate using a combination of optical lithography and deposition techniques. In another embodiment, for example, an optical system comprising a multilayer structure is generated by repeated transfer and assembly steps of printable semiconductor elements, such as thin film transistors, LEDs, semiconductor lasers and/or photovoltaic devices, printed on the device substrate, optionally in combination with additional processing carried out via spin coating, deposition and encapsulation/planarizing steps for integrating additional device components, such as electrode, interconnects, adhesive layers, lamination layers, optical components and encapsulation or planarizing layers.

In an embodiment, the method of this aspect further comprises the step of providing one or more optical components in optical communication or optical registration with the printable semiconductor elements, for example optical components selected from the group consisting of: collecting optics, diffusing optics, dispersive optics, optical fibers and arrays thereof, lenses and arrays thereof, diffusers, reflectors, Bragg reflectors, and optical coatings (e.g., reflective coatings or antireflective coatings). For example, methods of the present invention may optionally include the step of providing an array of optical components in optical communication or optical registration with at least a portion of the printable semiconductor elements. In some embodiments, an optical component of the array is individually addressed to each of the printable semiconductor elements. In a specific embodiment, the array of optical components is fabricated via replica molding; wherein the printable semiconductor elements are assembled on a receiving surface of the array of optical components via contact printing.

In an embodiment, a method of the present invention further comprises providing one or more electrodes in electrical contact with the printable semiconductor elements provided on the device substrate. In an embodiment electrodes are defined and integrated into optical systems using a combination of optical lithographic patterning and deposition techniques (e.g., thermal deposition, chemical vapor deposition or physical vapor deposition). In another embodiment, electrodes are assemble and interconnected with devices elements using printing.

Methods of the present invention are useful for providing optical systems on large areas of a receiving surface of a substrate. In an embodiment useful for making large array optical systems, printable semiconductor elements are provided on an area of the receiving substrate selected over the range of 0.05 $m^2$ to 10 meters$^2$, and preferably for some applications selected over the range of 0.05 $m^2$ to 1 meters$^2$ In an embodiment, the present methods further comprise the step of providing an adhesive layer to the receiving surface prior to the assembling step. Adhesive layers are useful in the present invention for bonding or otherwise affixing printable semiconductor elements and other device elements to the receiving surface of the substrate. Useful adhesive layers include but are not limited to one or more metal layers or a polymer layers. In an embodiment, the present methods further comprise the step of providing a laminating, planarizing or encapsulating layer on the printable semiconductor elements. Laminating, planarizing or encapsulating layers are useful in the present methods for at least partially encapsulating or laminating printable semiconductor elements and other elements on the receiving surface.

Optionally, the method of the present invention further comprises the steps of: (i) providing an inorganic semiconductor wafer; (ii) generating the plurality of printable semiconductor elements from the semiconductor wafer; and (iii) transferring the plurality of printable semiconductor elements from the wafer to the receiving surface via contact printing, thereby assembling the plurality of printable semiconductor elements on the receiving surface of the substrate. In an embodiment, the plurality of printable semiconductor elements are assembled on the receiving surface of the substrate and on the receiving surfaces of one or more additional substrates, wherein the plurality of printable semiconductor elements assembled on the substrates comprises at least 5% to 50% by mass of the semiconductor wafer. This aspect of the present invention is beneficial because it provides for very efficient use of the semiconductor wafer starting material resulting in low cost fabrication of optical systems. In some embodiments, the "plurality of printable semiconductor elements assembled on the substrates" may comprise a very low fraction (<about 5% by mass or area) of the final, device substrate. In other words, the printed systems may exhibit a low fill-factor of the semiconductor. The advantage of a low-fill factor is that it requires a small amount of semiconductor material, which in these cases is expensive on a per-area basis, to populate large areas of final, device substrate(s).

In another embodiment, the present invention provides a method of making a semiconductor-based optical system comprising the steps of: (i) providing an optical component having an external surface and an internal surface; (ii) providing a electrically conducting grid or mesh on the internal surface of the optical component; (iii) providing a device substrate having a receiving surface; (iv) assembling a plurality of printable semiconductor elements on the receiving surface of the substrate via contact printing; wherein each of the printable semiconductor elements comprise a unitary inorganic semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters; and (v) transferring the optical component having the grid or mesh to the substrate, wherein the optical component is positioned on top of the semiconductor elements assembled on the on the receiving surface of the substrate, and wherein the grid or mesh is provided between the optical component and the semiconductor elements. In an embodiment, the printable semiconductor element comprises a semiconductor structure having a length selected from the range of 0.02 millimeters to 30 millimeters, and a width selected from the range of 0.02 millimeters to 30 millimeters, preferably for some applications a length selected from the range of 0.1 millimeters to 1 millimeter, and a width selected from the range of 0.1 millimeters to 1 millimeter, preferably for some applications a length selected from the range of 1 millimeters to 10 millimeters, and a width selected from the range of 1 millimeter to 10 millimeters. In an embodiment, the printable semiconductor element comprises a semiconductor structure having a thickness selected from the range of 0.0003 millimeters to 0.3 millimeters, preferably for some applications a thickness selected from the range of 0.002 millimeters to 0.02 millimeters. In an embodiment, the printable semiconductor element comprises a semiconductor structure having a length selected from the range of 100 nanometers to 1000 microns, a width selected from the range of 100 nanometers to 1000 microns and a thickness selected from the range of 10 nanometers to 1000 microns.

In a method of the present invention, the printable semiconductor element comprises a unitary inorganic semiconductor structure. In a method of the present invention, the printable semiconductor element comprises a single crystalline semiconductor material.

BRIEF DESCRIPTION OF THE DRAWINGS

As shown in FIG. 1, the present invention provides a number of classes of optical systems and related methods of making these systems, including systems for light generation and systems for light harvesting comprising printed inorganic optoelectronic systems with integrated optical components in registry.

FIG. 2 A-E provides schematic diagrams of optical systems of the present invention comprising printable semiconductor elements.

FIG. 3 provides a process flow schematic for the fabrication of a single pixel element of a printed inorganic active matrix LED display of the present invention.

FIG. 5 provides photographs (FIG. 5A) and operating current-voltage characteristics (FIG. 5B) of a single pixel of an active matrix LED display on a (transparent) glass substrate.

FIGS. 6A-6C provide photographs of a 64 pixel active matrix LED display on a (transparent) glass substrate. FIG. 6A provides a photograph of a 64 pixel partial LED display (Note: missing top contacts) comprising 1 mm transistors printed on to the device substrate and ILEDs manually placed on the substrate. In the device shown in FIG. 6A pixels are provided at a 4 mm pitch. FIG. 6B provides a photograph of a printed silicon TFT with interdigitated channel (thin green line) for high-current operation. FIG. 6C provides a photograph of two pixels illuminated by placing a transparent common anode electrical contact against the LEDs.

FIG. 7A provides a process flow schematic for the fabrication of a single pixel element of a printed inorganic passive matrix LED display.

As shown in FIG. 8 the display comprises a bottom substrate, electrode network, printed ILED, PDMS layer and top substrate.

FIG. 13 provides a schematic of diffusing optics comprising radial density gradient scattering centers useful for LED lighting systems of the present invention. As shown in this Figures a printed LED structure under metal is provided in optical communication with a plurality of optical scattering centers. The bottom panel in FIG. 13 shows a cross sectional view of scattering centers comprising relief features in a transparent substrate.

FIG. 14C provides a table indicating the composition, thickness, doping and functionality of each layer in the epilayer structure for the fabrication of printable micro-LEDs. FIG. 14E illustrates provides another example of a mother wafer from which printable n-on-p GaAs solar cells may be produced by photolithography and etching layers 9 through 4 and selectively removing layer 3 by a wet chemical etch.

FIG. 18A provides a schematic ray diagram (not to scale) showing operation of the integrated low-level collecting optics (lens) and solar-cell arrays of an optical system of the present invention. As shown in FIG. 18A radiation is collected by the concentrator and focused on printed microsolar cells. FIG. 18B shows an expanded view of a microcell of the present invention comprising an antireflection layer, top contact and p-n junction.

FIG. 20 also provides ray diagram of the incident light shown collection and focus functionality of a concentrator and individually addressed solar cells. Single crystal multilayer solar cells (i.e. third generation solar cells) are typically grown by MOCVD and are constrained by the necessity of crystal lattice mismatch between layers. In our system different absorbing layers can have arbitrary lattices and the materials selected for optimal spectrum absorption for each layer.

As shown in FIG. 21, solar cells printed onto a device substrate are provided in optical communication with the lens array so as to generate an optical system of the present invention.

FIG. 24 shows the solar cell multilayer structure comprising a $n^+$-Si (P/As) layer and p-Si(B) layer.

As shown in FIG. 28, conformal positioning of the planar sheet requires some degree of stretchability to avoid failure.

FIG. 36 provides an image and a schematic illustration of a printer useful in the present methods of fabricating conformable LED lighting systems.

FIG. 45 provides images of a silicon solar cell transferred to a glass substrate. (a) Optical image of a single cell on a glass substrate with both top and bottom electrical contacts.

(b) current voltage characteristics—Typical I-V response for a device shown in (a) under AM 1.5.

FIG. 46 provides images of a solar cell array joined to cylindrical collecting optics. (a) Picture of the final fully integrated device with cylindrical lens array. (b) Picture of the same device without the incorporation of the lens array.

Figure 47:
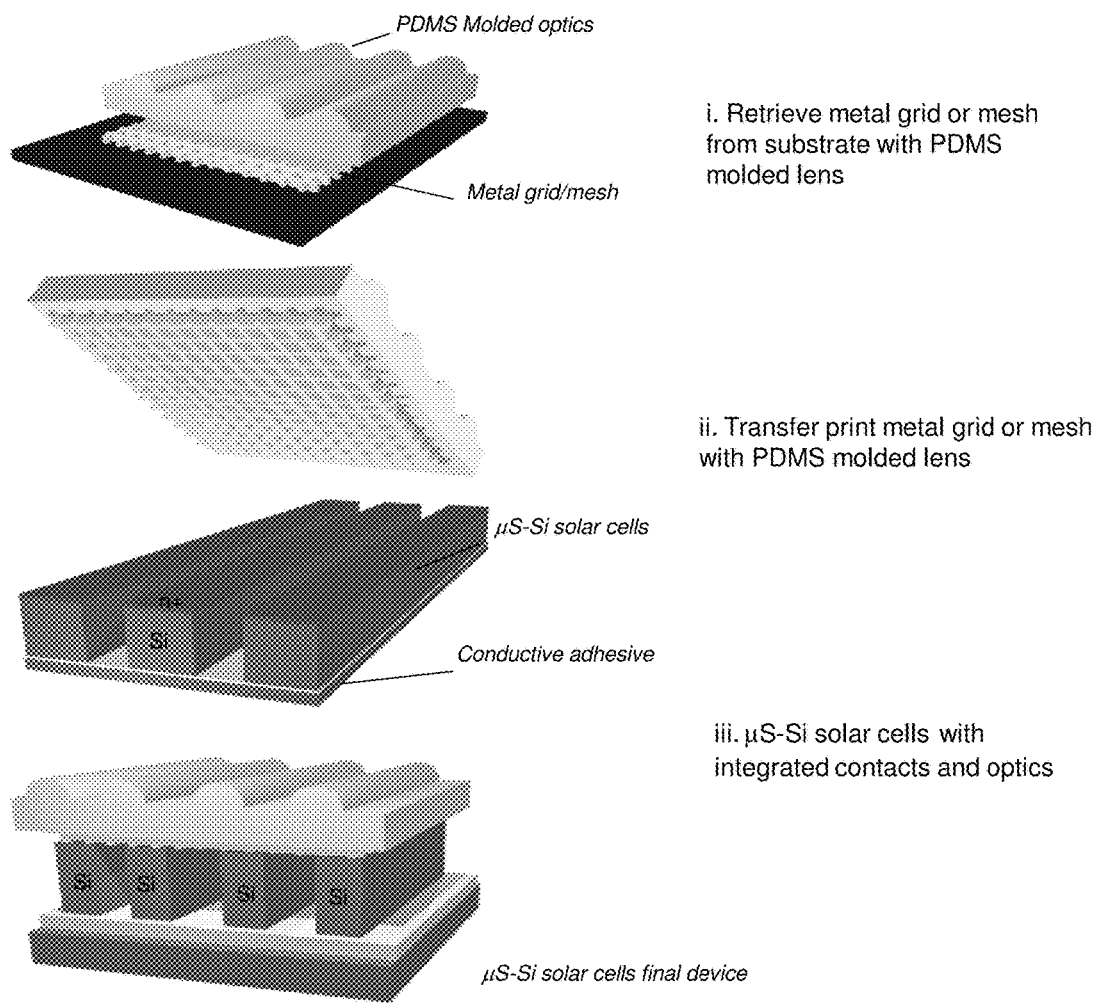

FIG. 47 provides a schematic diagram for generating optical concentrator arrays with integrated metal contacts onto mS-Silicon solar cells (micro-silicon solar cells). The process starts off with retrieval of a metal mesh pattern from a substrate (shown dark blue) via a PDMS molded lens array. The lens array/mesh pattern can then be laminated in registry onto an array of silicon solar cells.

FIG. 48 illustrates the process flow for generating solar cells and integrated concentrating optics.

Figure 49:
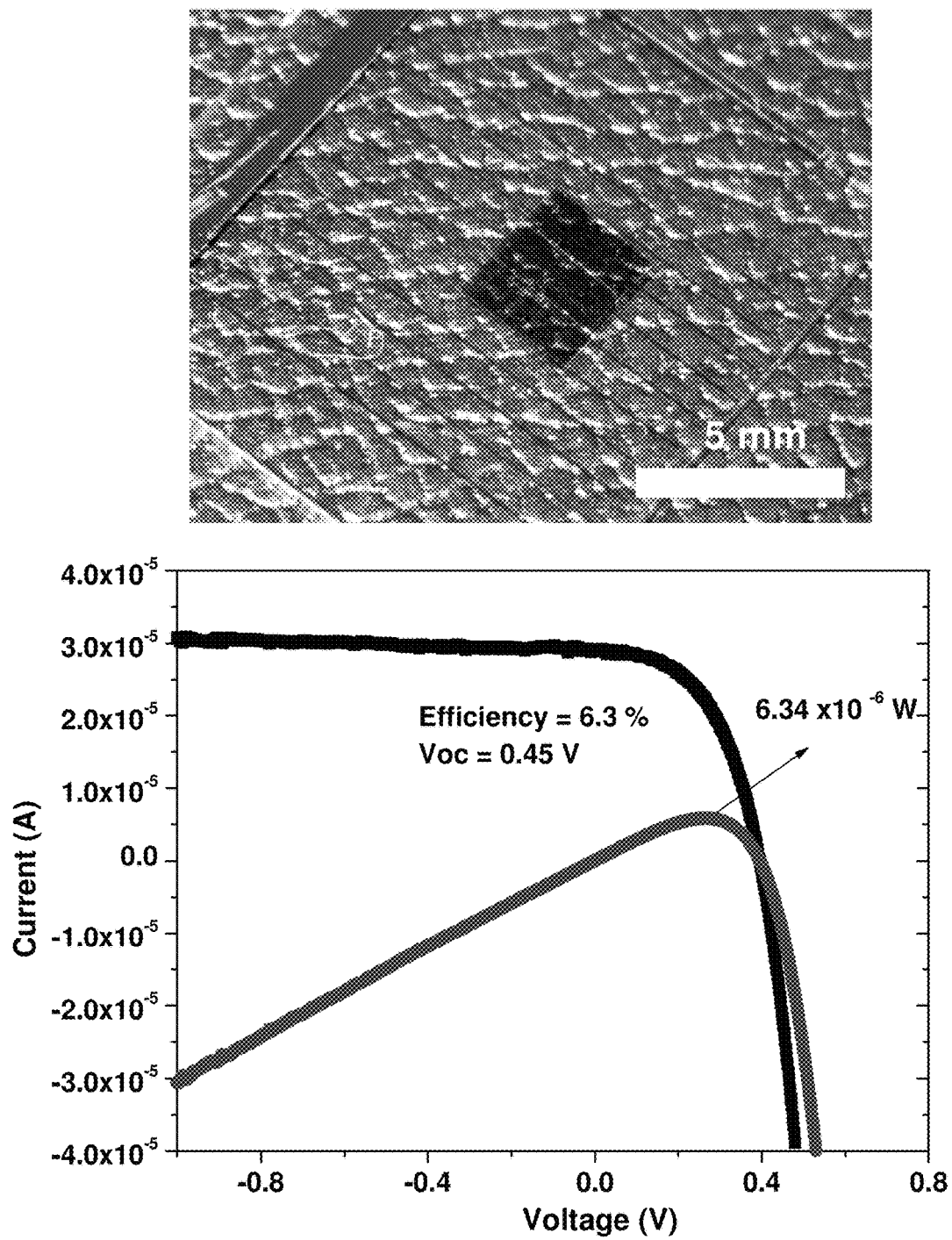

FIG. 49 provides images of a micro solar cell array printed onto gold bus lines on glass substrates via a thin PDMS adhesive layer. Also shown are current-voltage characteristics for the solar cell array.

Figure 50:
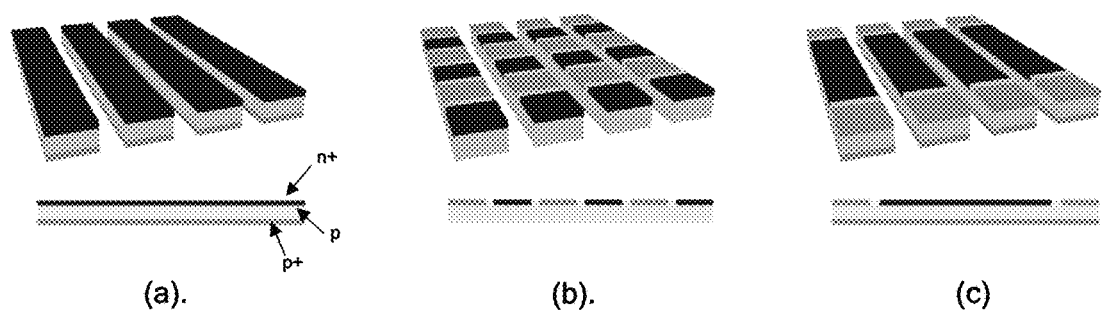

FIG. 50 provides a schematic illustration of microcells of (a) vertical-type, (b) transverse-type, (c) combination of both types.

FIG. 51 provides a schematic diagram illustrating a method of the present invention for making large area optical systems using micromanipulation via transfer printing. This techniques provides for massively parallel assembly of inorganic semiconductor elements and semiconductor devices having micro-sized and/or nanosized physical dimensions.

Figure 52:
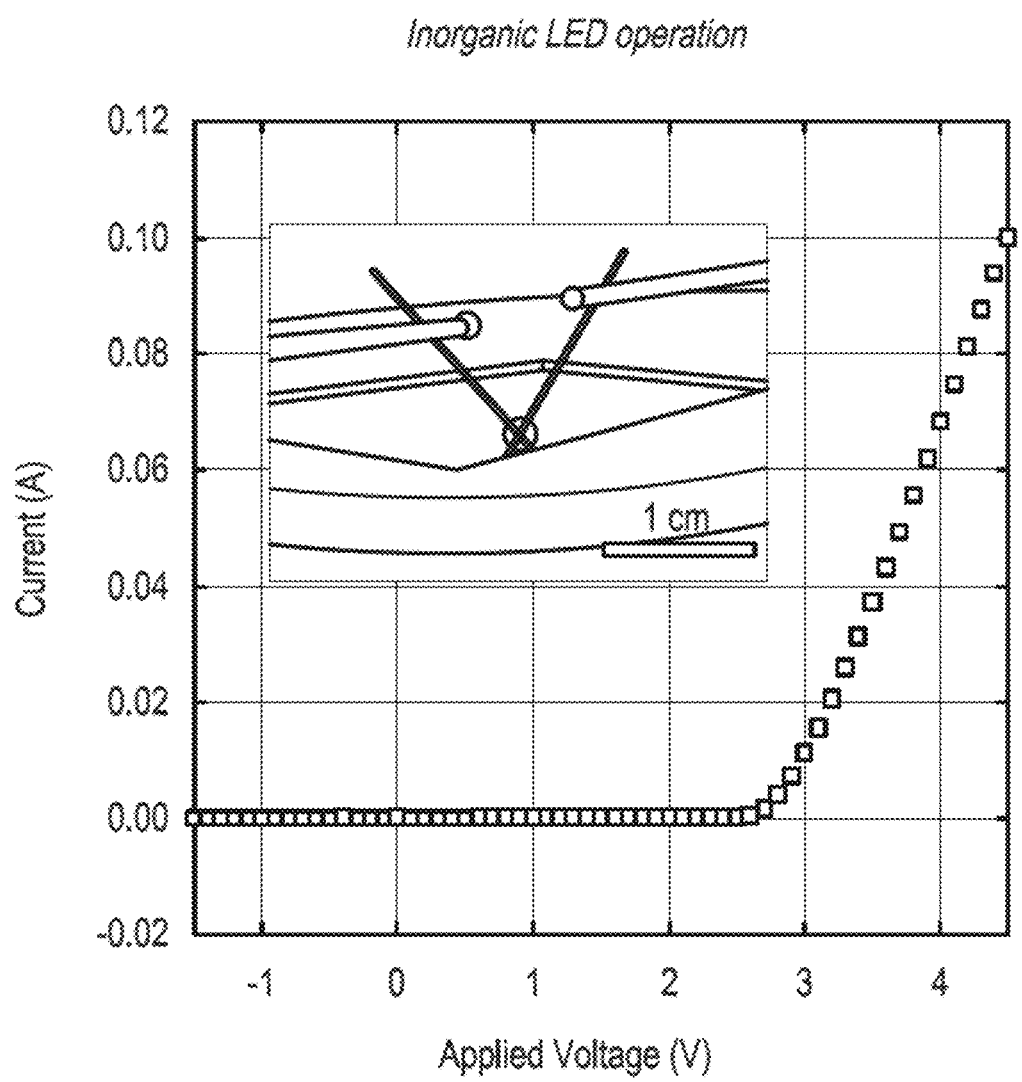

FIG. 52 provide a plot of current (A) versus applied voltage (V) for a inorganic LED device assembled via transfer printing.

Figure 53A:
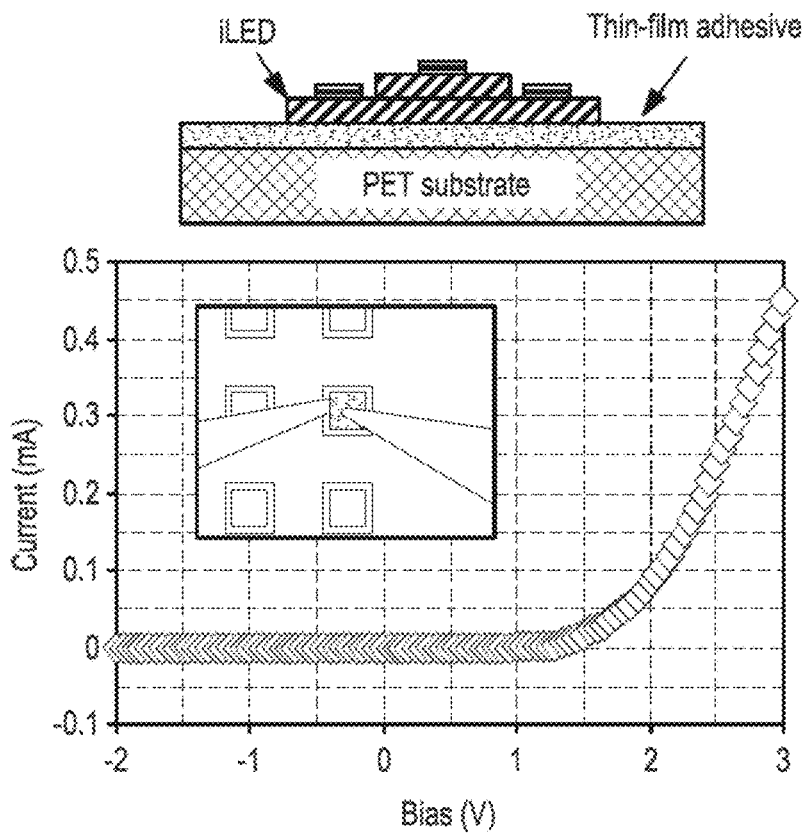
Figure 53B:
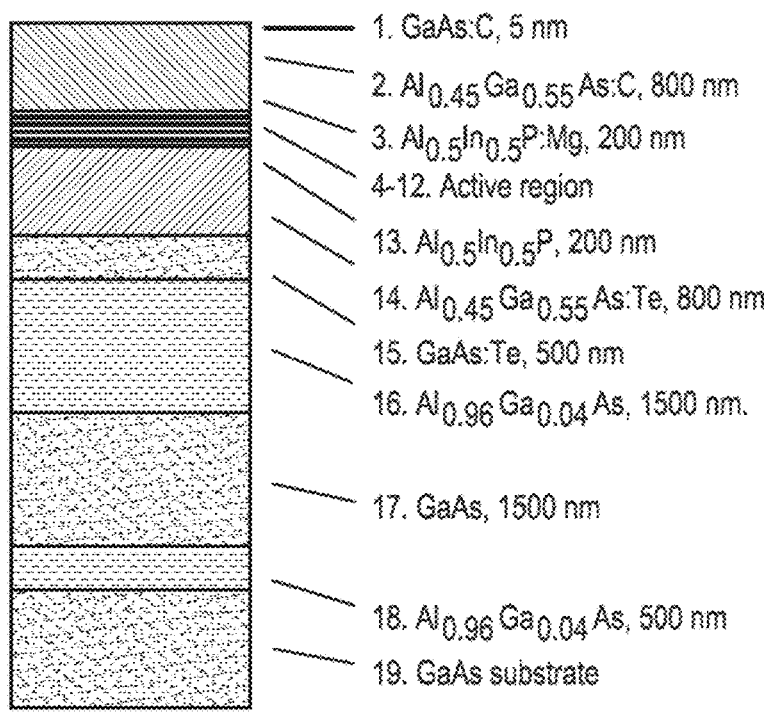

FIG. 53A provide a plot of current (A) versus applied voltage (V) for a printed thin-film inorganic LED device assembled on a plastic substrate via transfer printing. FIG. 53A also provide a schematic diagram of the assembled device. FIG. 53B provides a schematic diagram shown an exemplary ILED epilayer structure useful in the present invention.

Figure 54A:
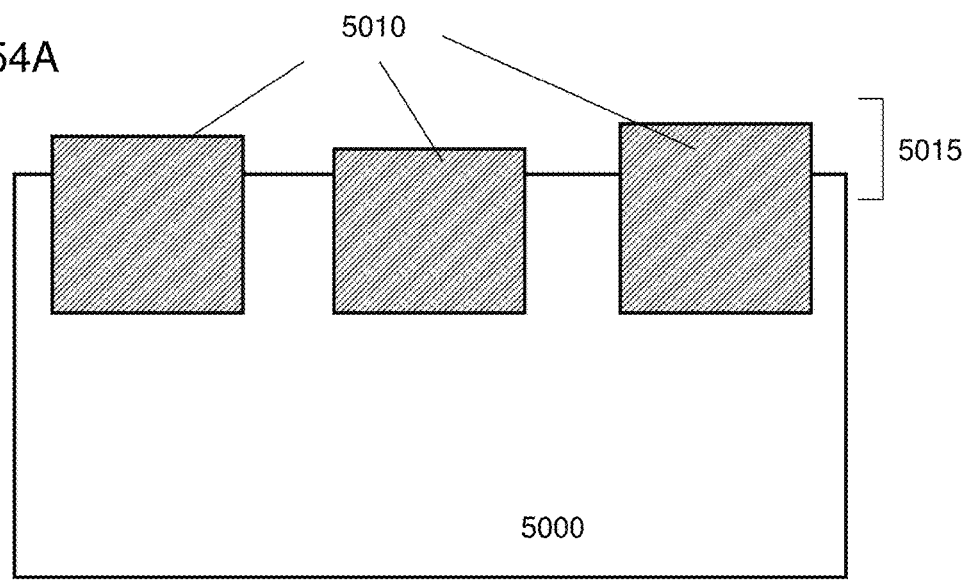
Figure 54B:
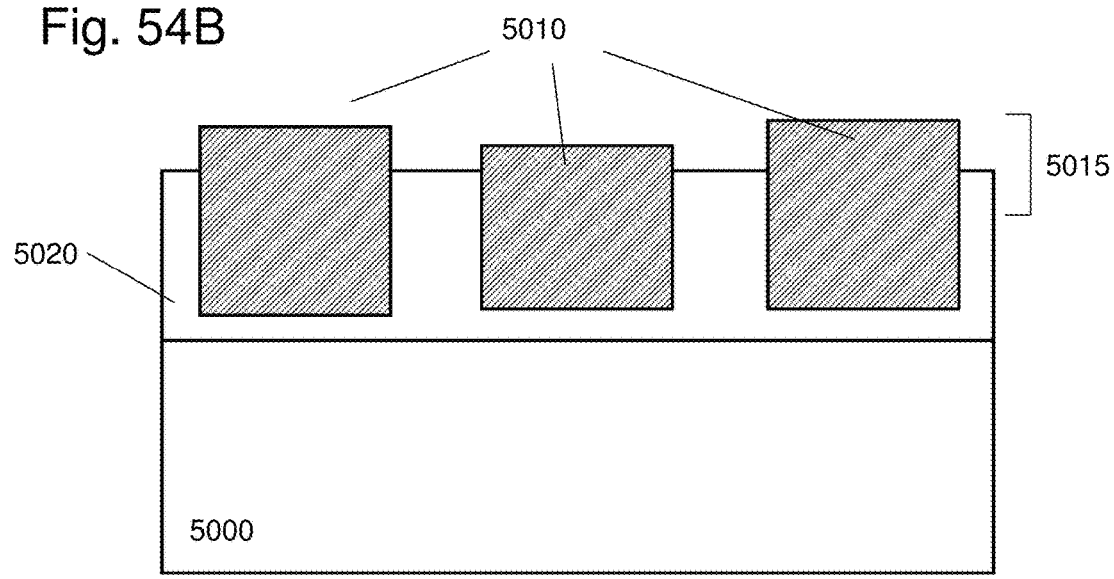

FIGS. 54A and 54B provides schematic diagrams of systems of the present invention comprising planarized printable semiconductor elements.

Figure 55:
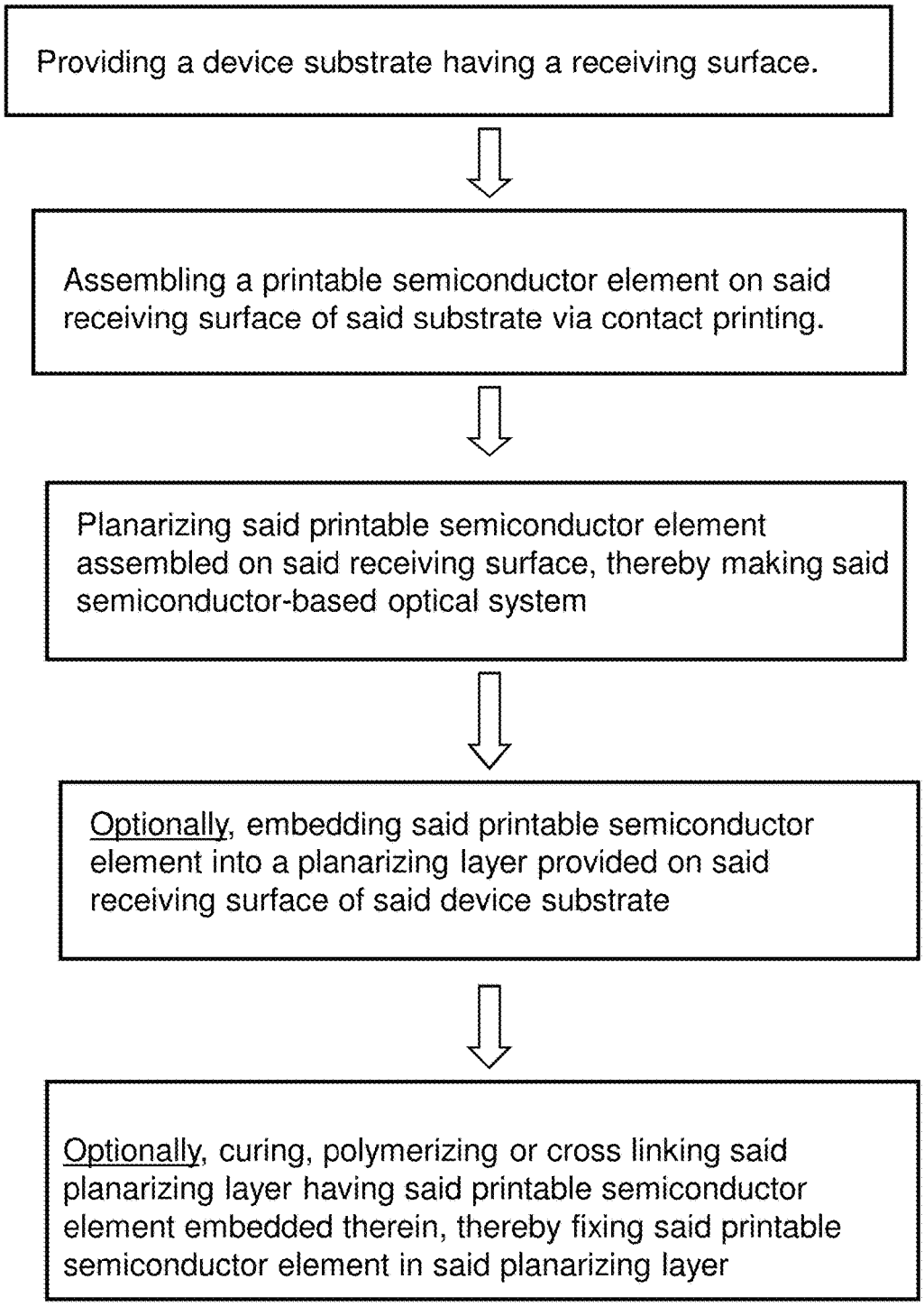

FIG. 55 provides a flow diagram illustrating processing steps in methods of the present invention for making semiconductor-based optical systems comprising planarized printable semiconductor elements, such as printable semiconductor-based electronic devices and device components.

Figure 56:
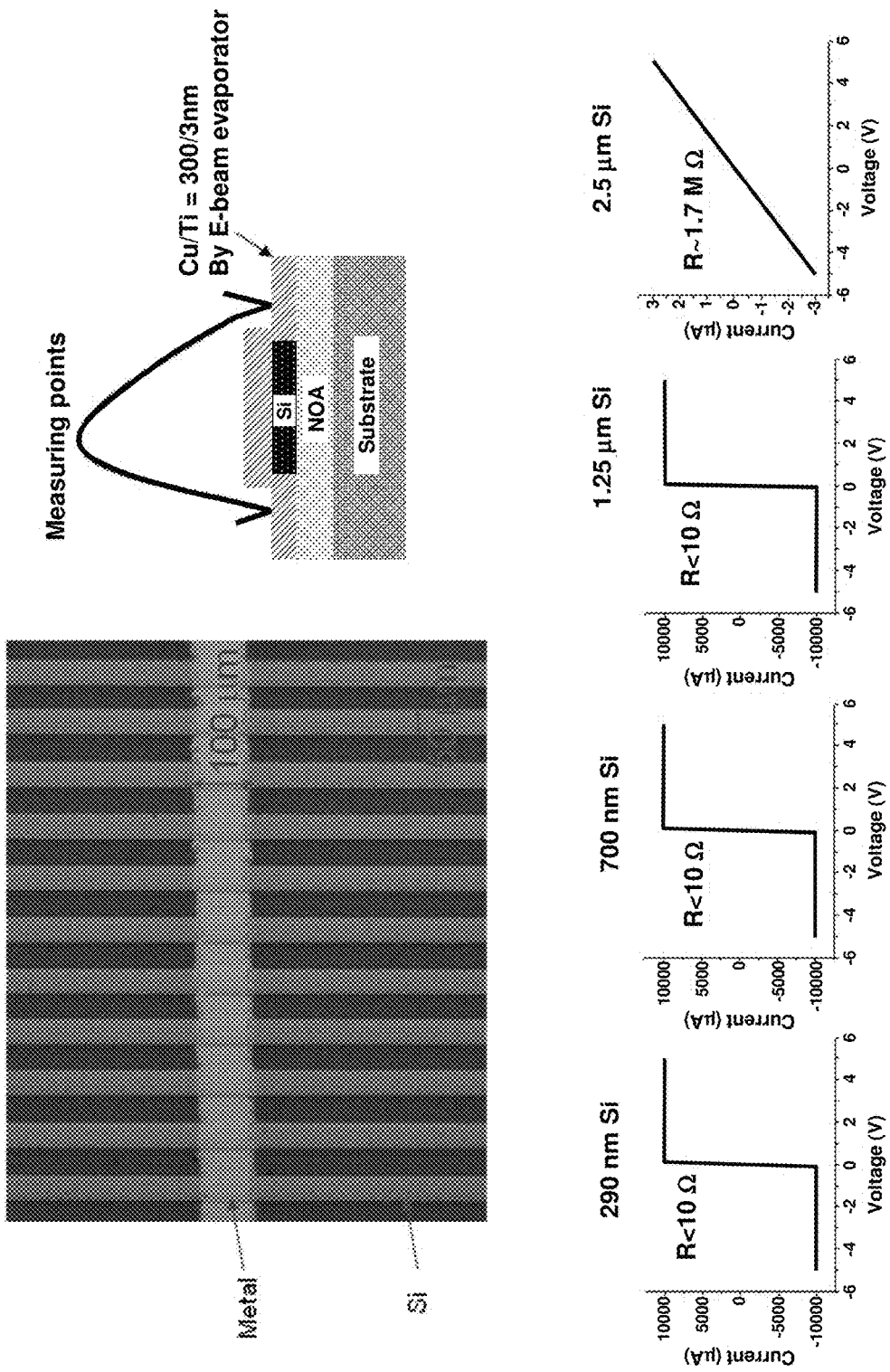

FIG. 56 provides experimental results characterizing the impact of step edges on establishing electrical contact to and/or between printable semiconductor elements.

Figure 57:
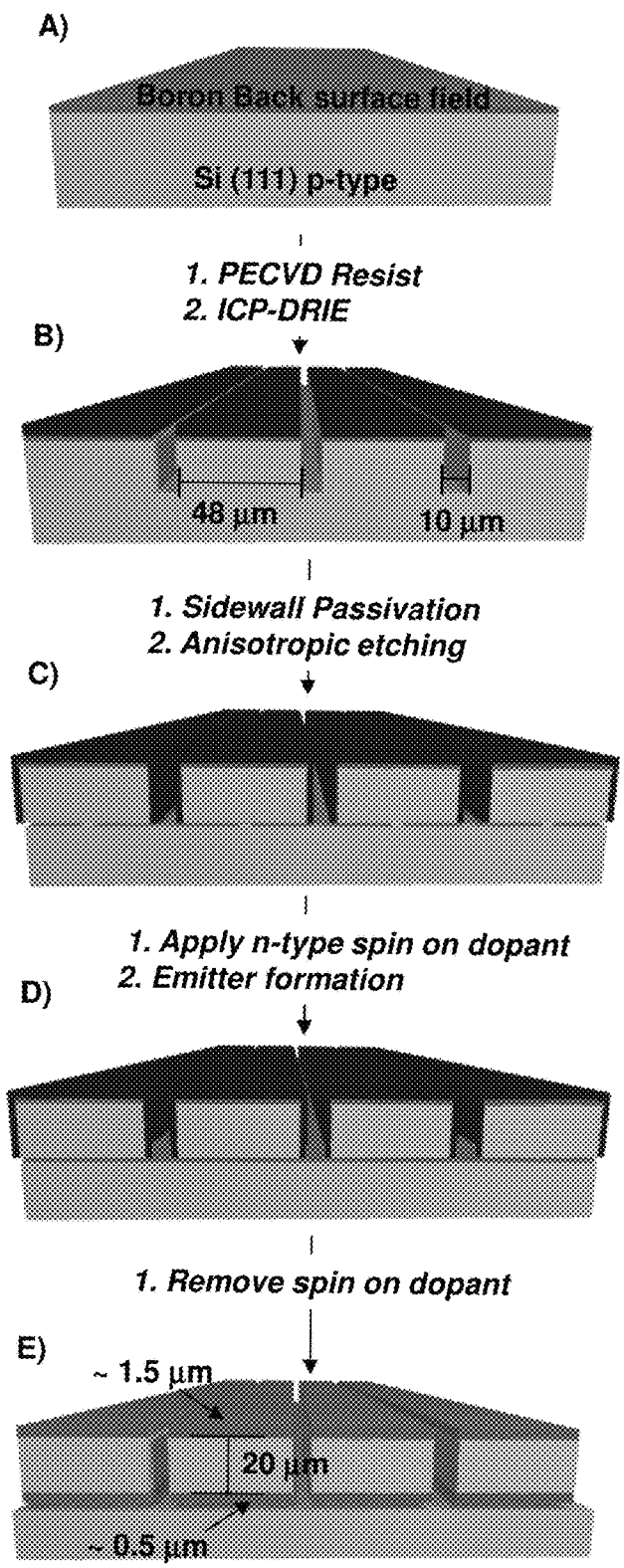

FIG. 57 provides a process flow diagram for making printable semiconductor elements comprising vertical solar cells that can be subsequently assembled and interconnected to fabricate a solar cell array.

FIG. 58 provides SEM images of microsolar cells of different thicknesses fabricated from bulk wafers. (Top to bottom: 8 microns, 16 microns, 22 microns thick).

Figure 59:
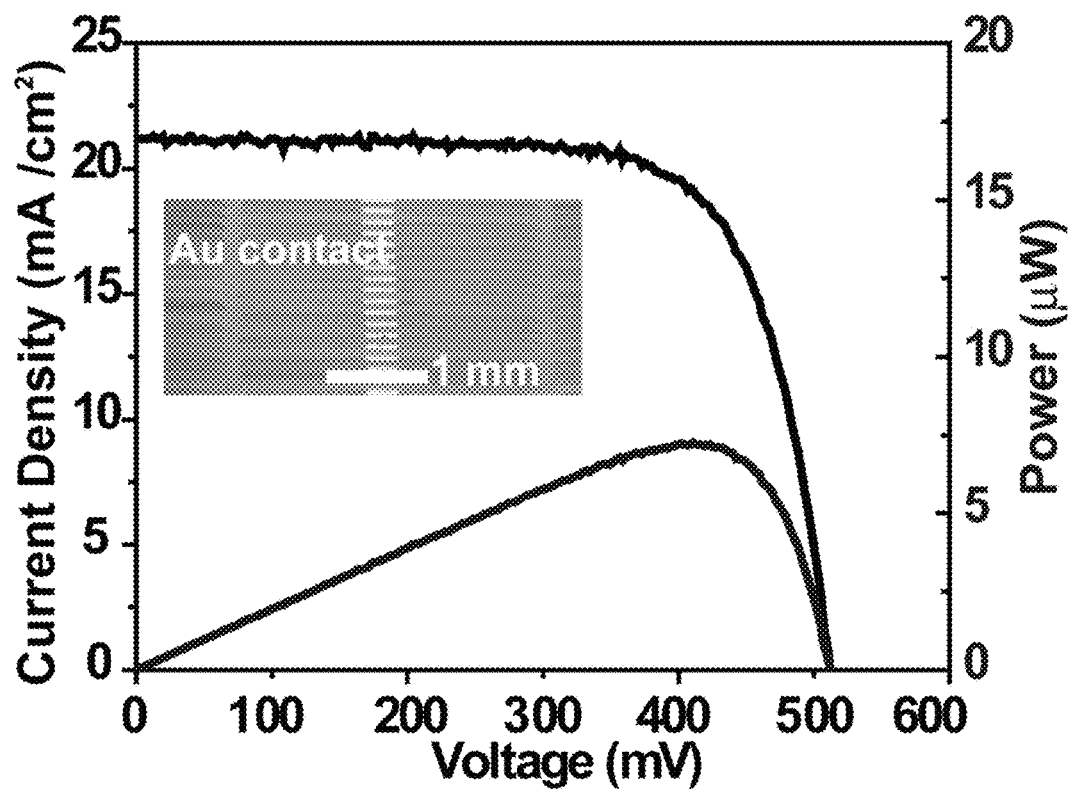

FIG. 59 provides a plot showing IV characteristics of an individual solar cell device fabricated using the present processing platform.

Figure 60:
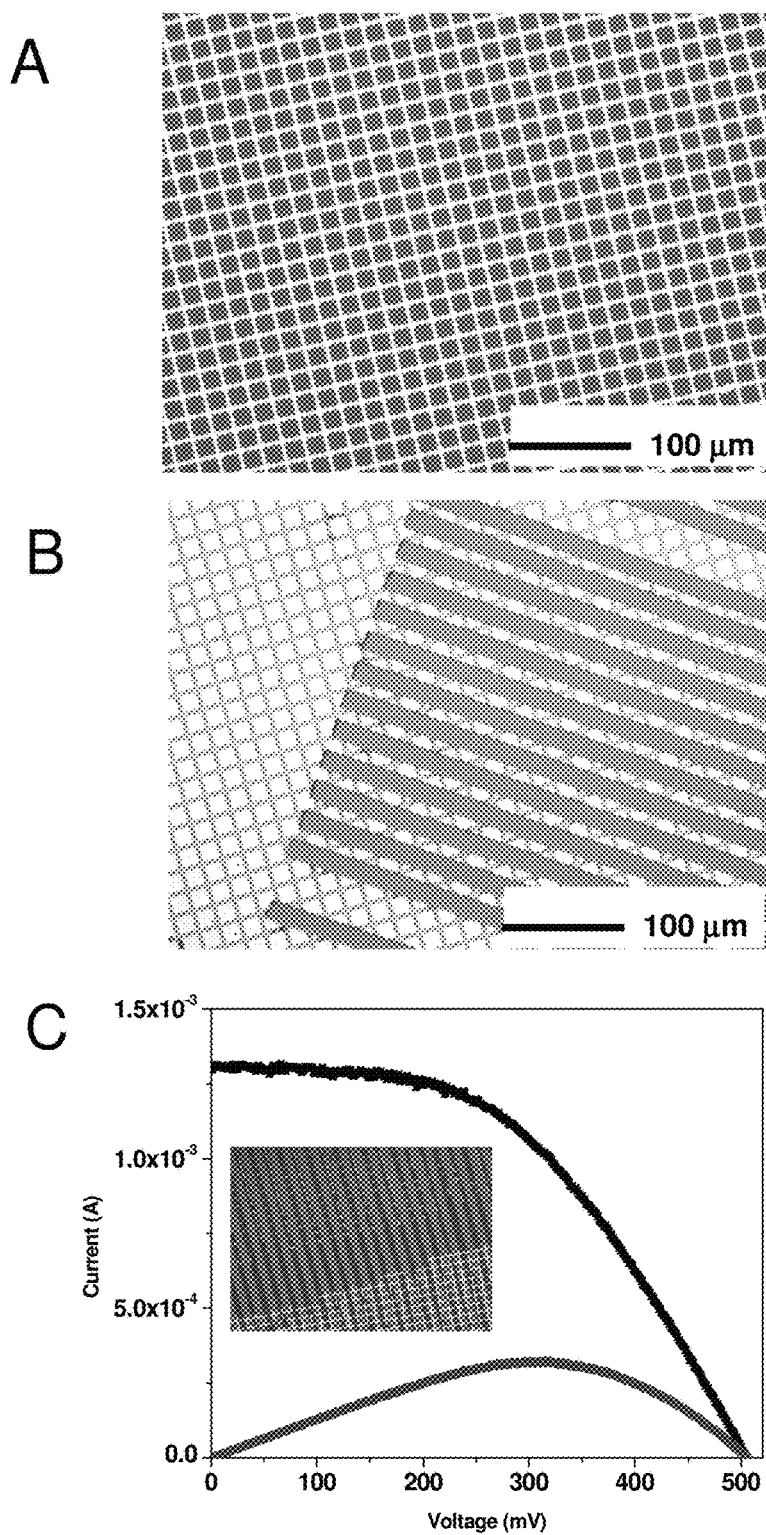

FIG. 60 shows processing for generating top contacts for the vertical solar cells and related electronic performance data.

Figure 61:
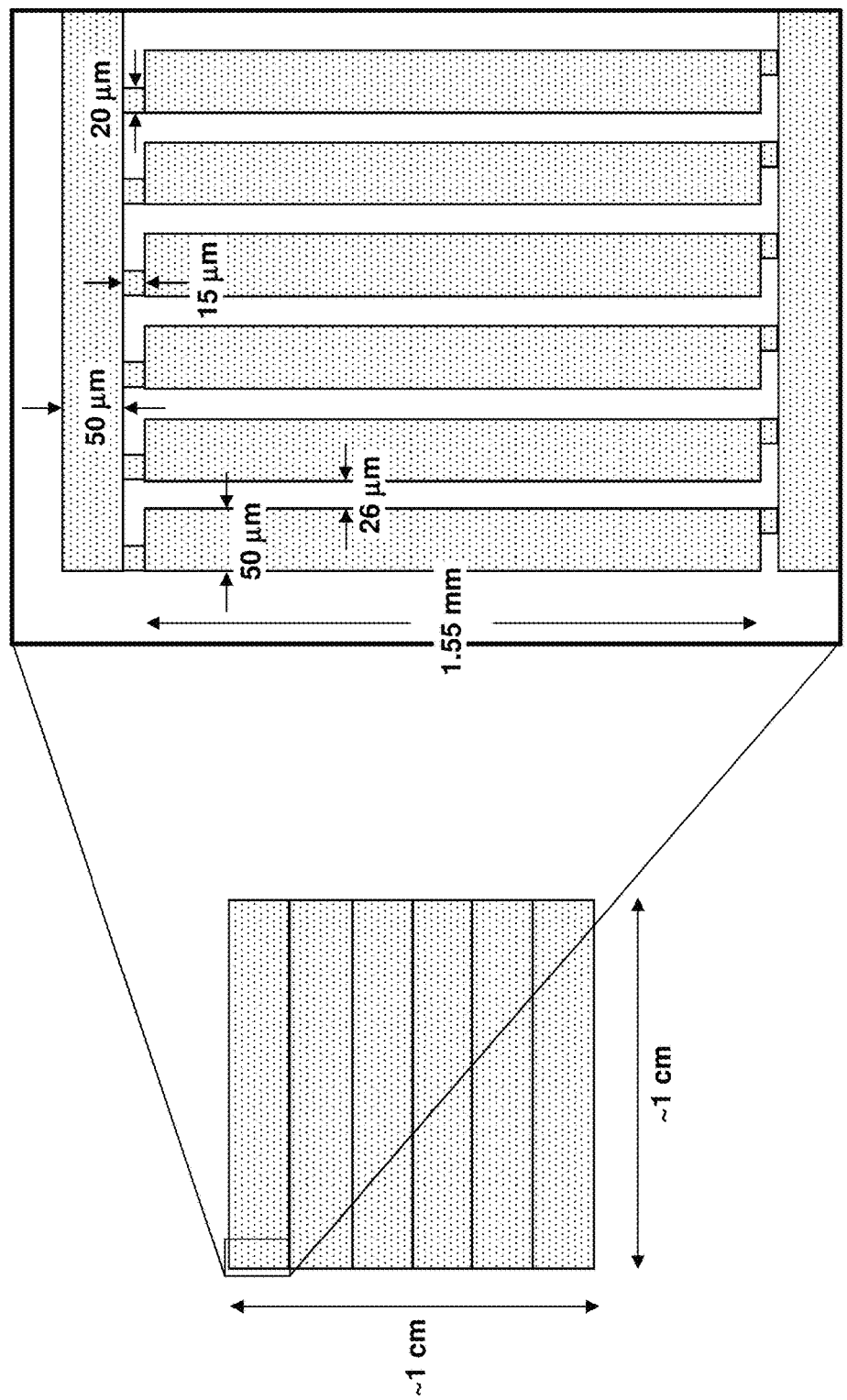

FIG. 61 provides a schematic showing a solar cell layout of transverse type solar cells to be patterned on a <111> p-type Si wafer and capable of subsequent assembly and integration via contact printing.

Figure 62:
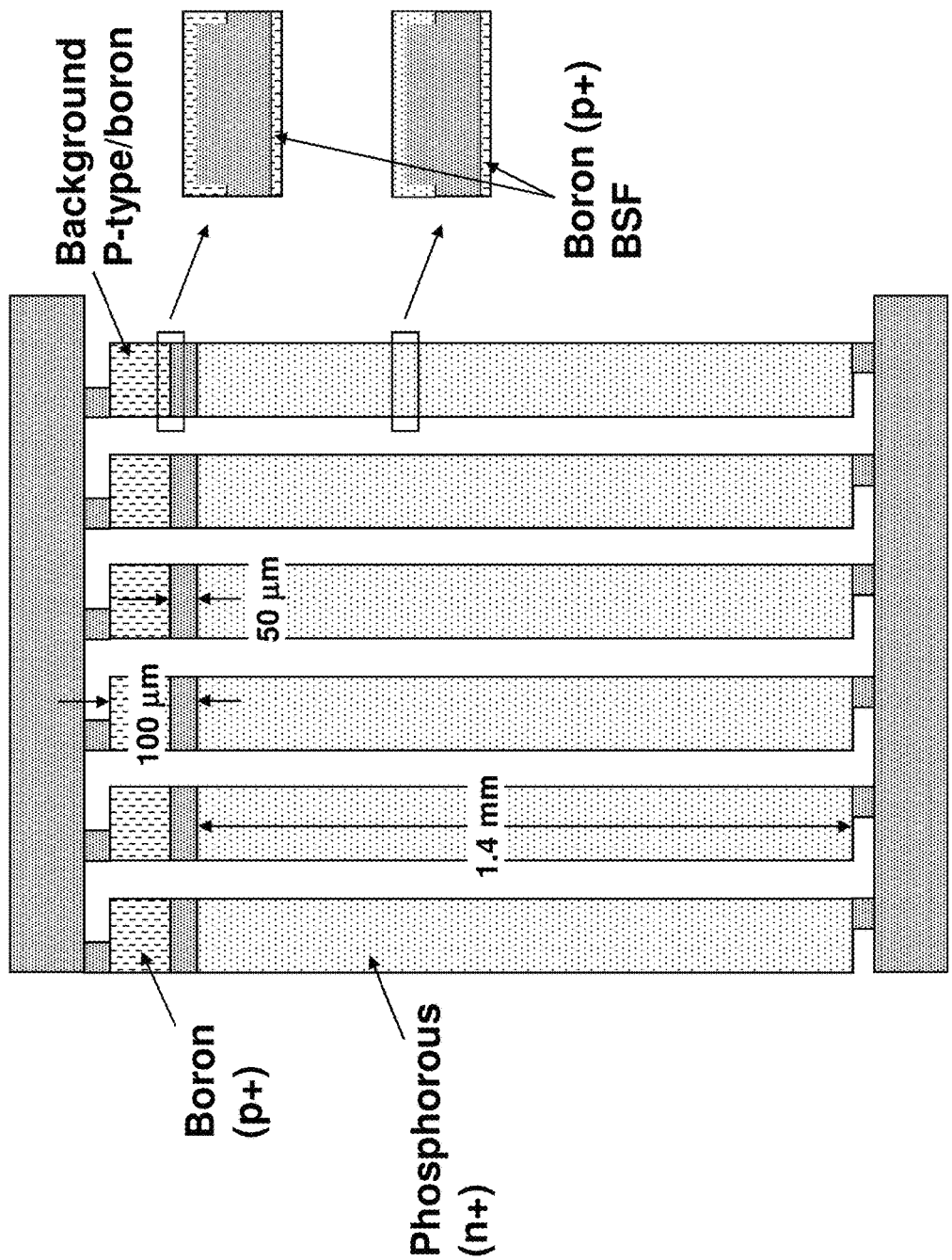

FIG. 62 provides a schematic showing the doping scheme wherein boron (P+) and phosphorous (n+) doped regions are patterned on the external surface of the patterned semiconductor ribbons.

FIG. 63 provides an overview schematic showing the process flow for cell patterning and doping steps.

Figure 64:
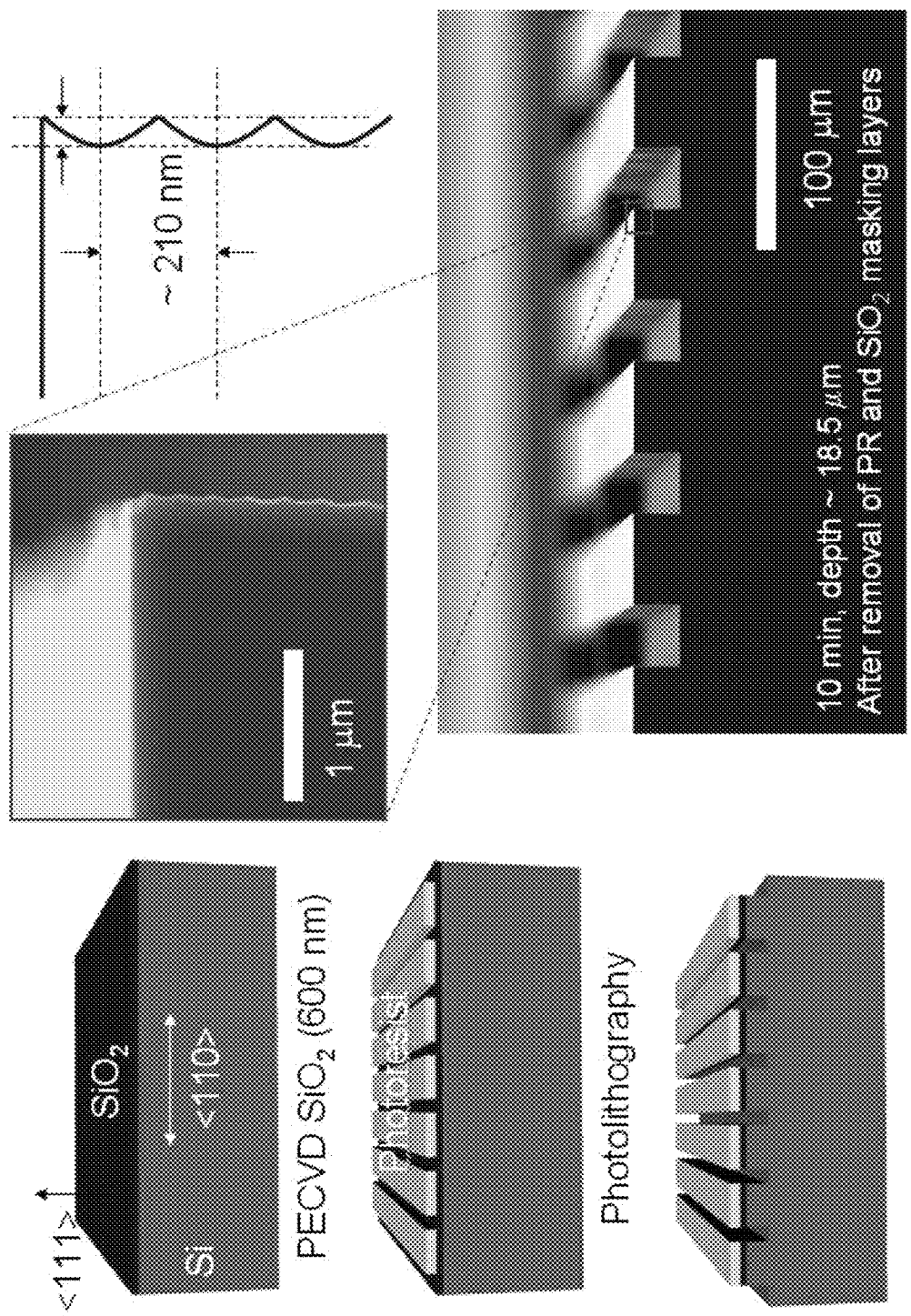

FIG. 64 provides a schematic diagram showing processing steps for patterning solar cell ribbons illustrating photolithography and STS deep RIE etching process steps.

Figure 65:
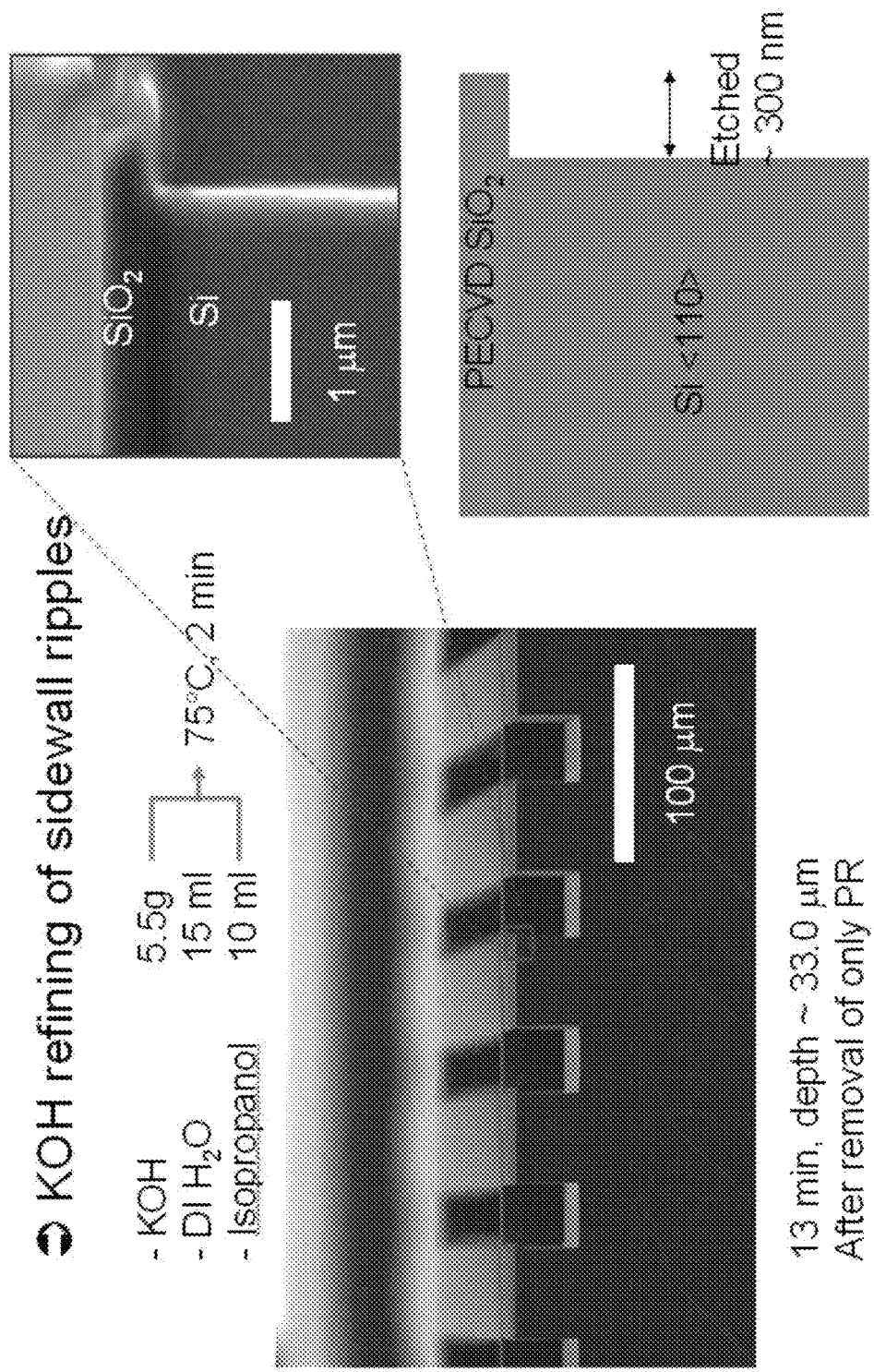

FIG. 65 shows results from KOH refining processing of the sidewalls of the patterned ribbons.

Figure 66:
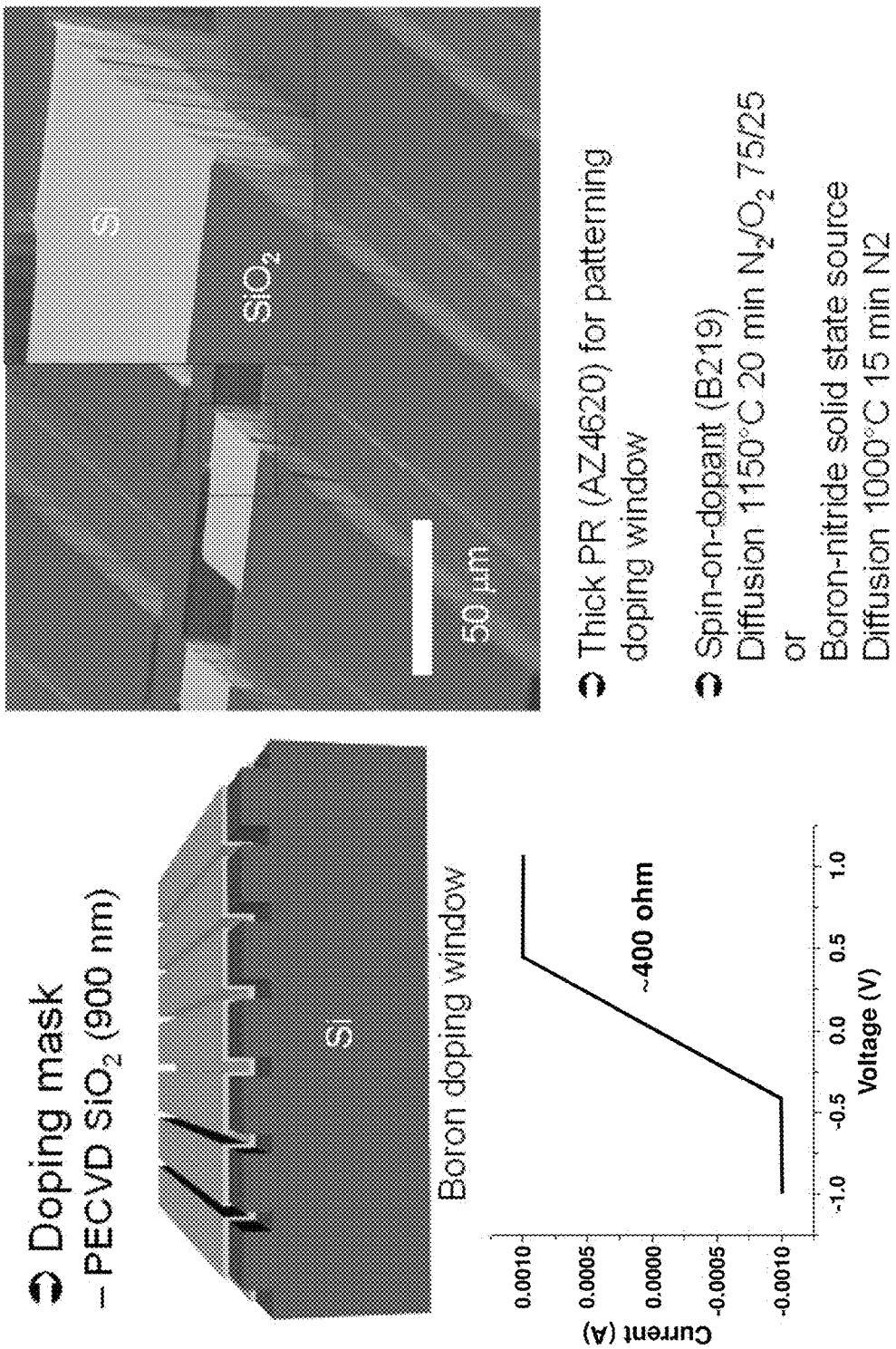

FIG. 66 provides a schematic diagram for boron doping processing. After the KOH refining step, boron doping for formation of top p+ contact is conducted.

FIG. 67 provides a schematic diagram for phosphorous doping processing

Figure 68:
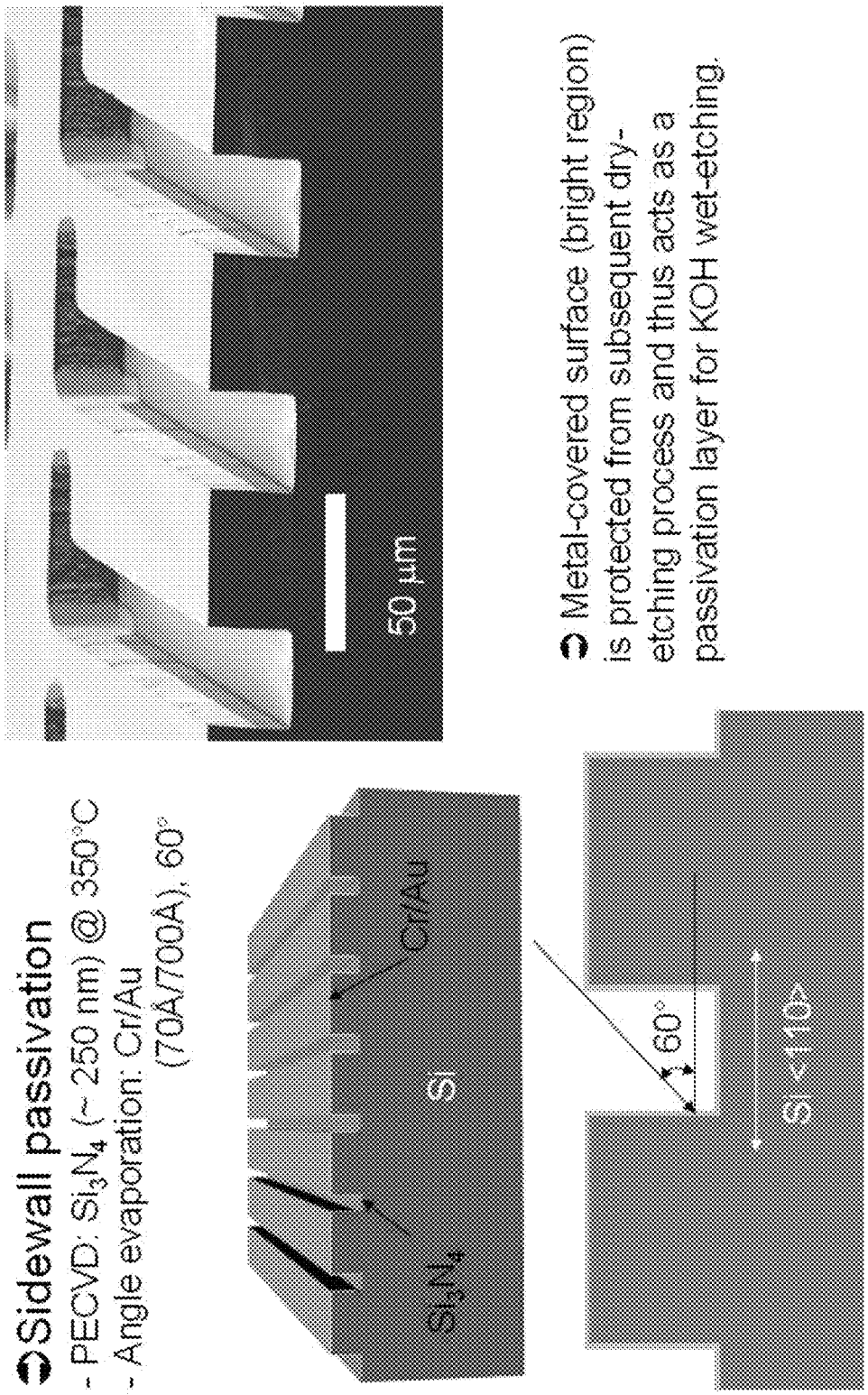

FIG. 68 provides a schematic diagram showing sidewall passivation processing.

FIG. 69 provides a schematic diagram showing processing for the formation of a KOH etching window.

Figure 70:
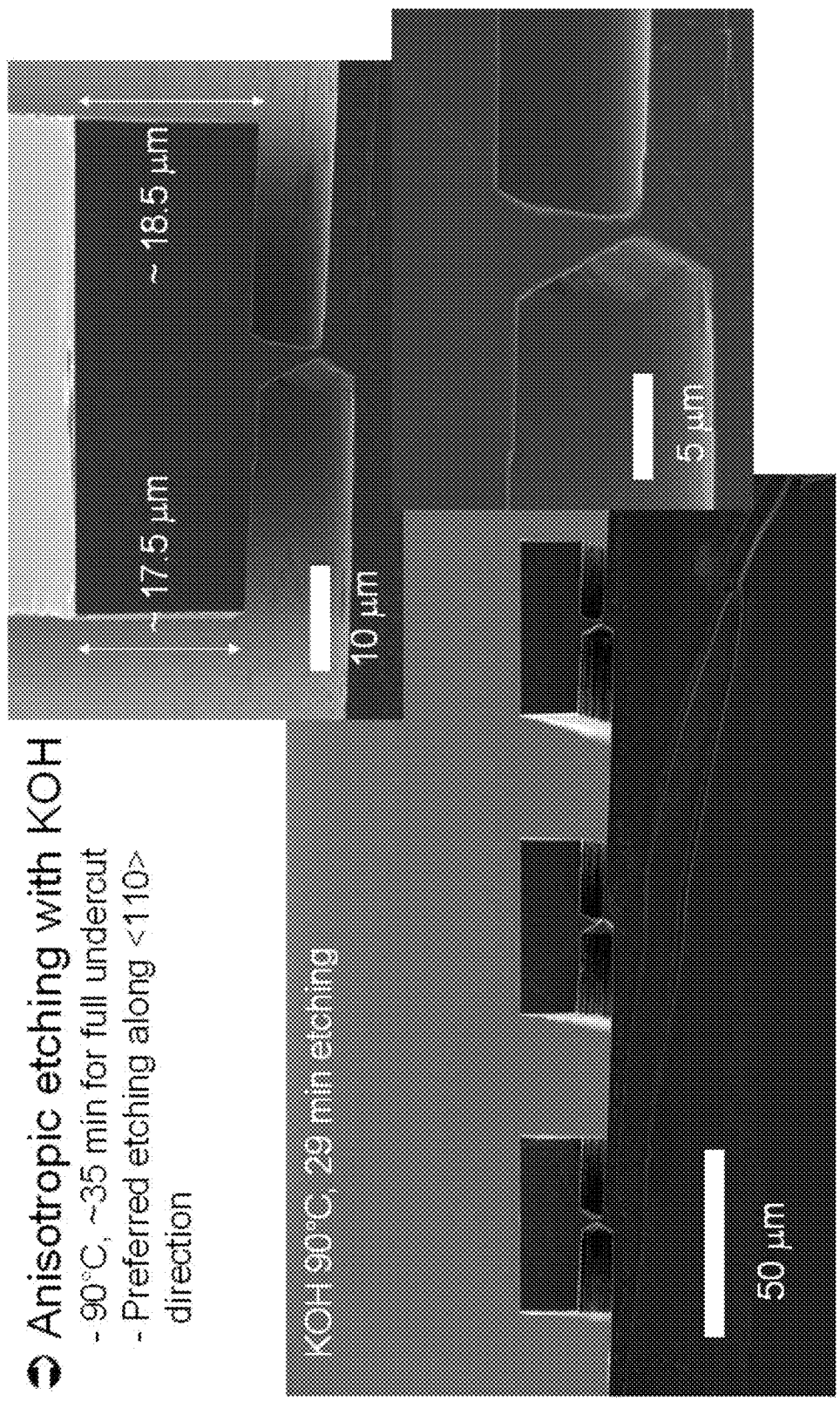

FIG. 70 provides micrographs showing KOH etching processing and bottom boron doping processing.

Figure 71:
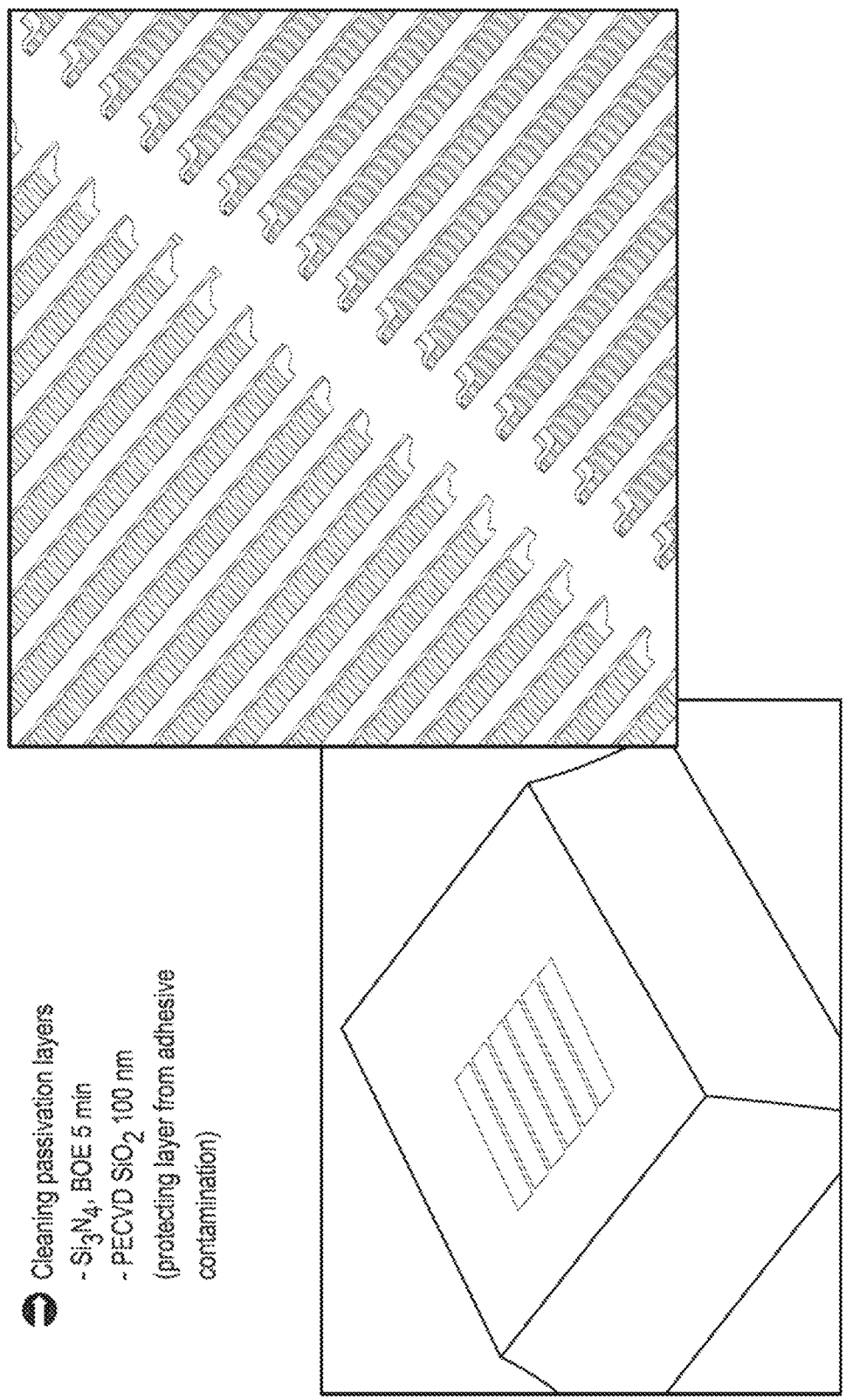

FIG. 71 provides images showing transfer of the solar cell ribbons from the source wafer using a PDMS transfer device.

Figure 72:
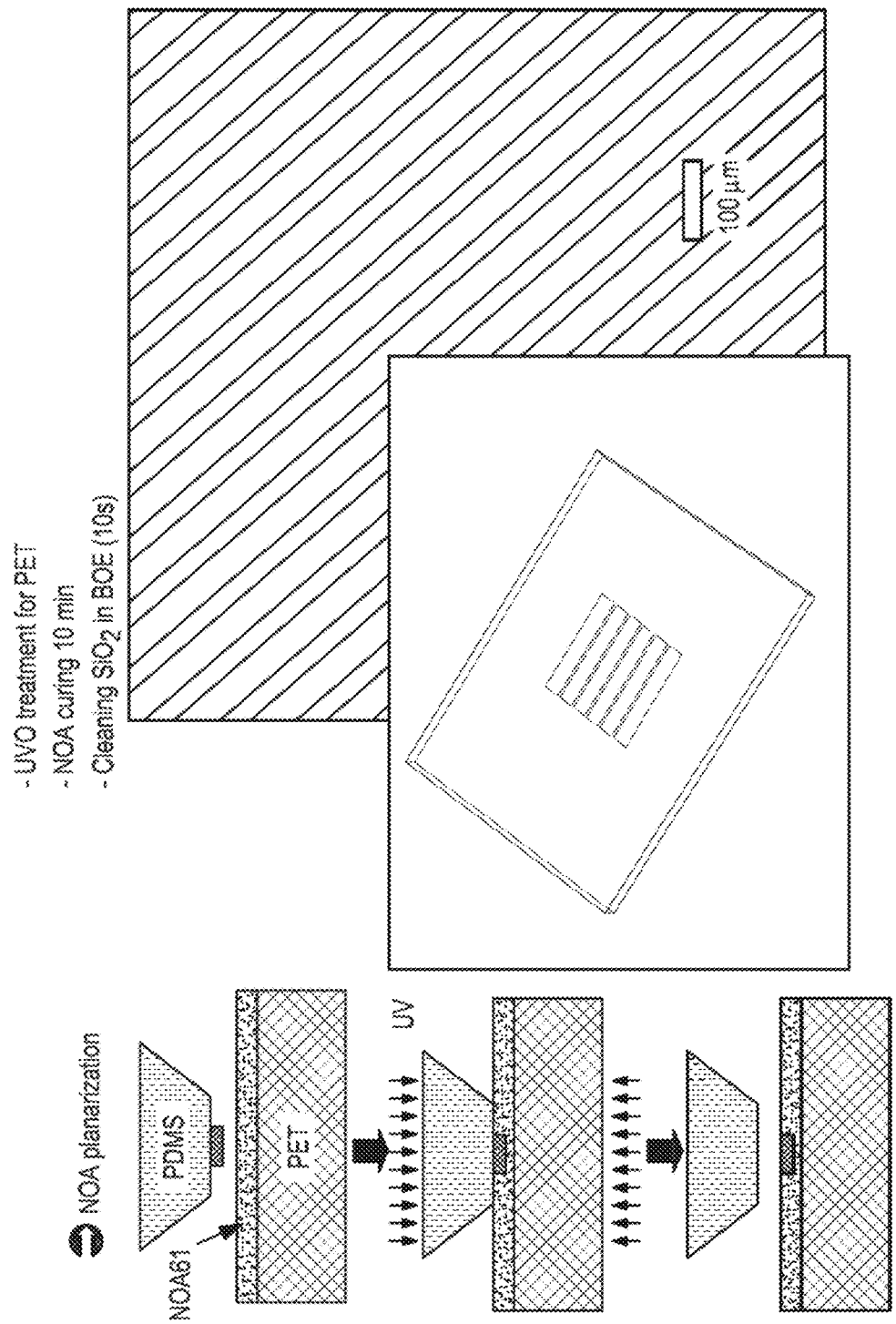

FIG. 72 provides a schematic diagram illustrating contact printing and planarization processing steps.

Figure 73:
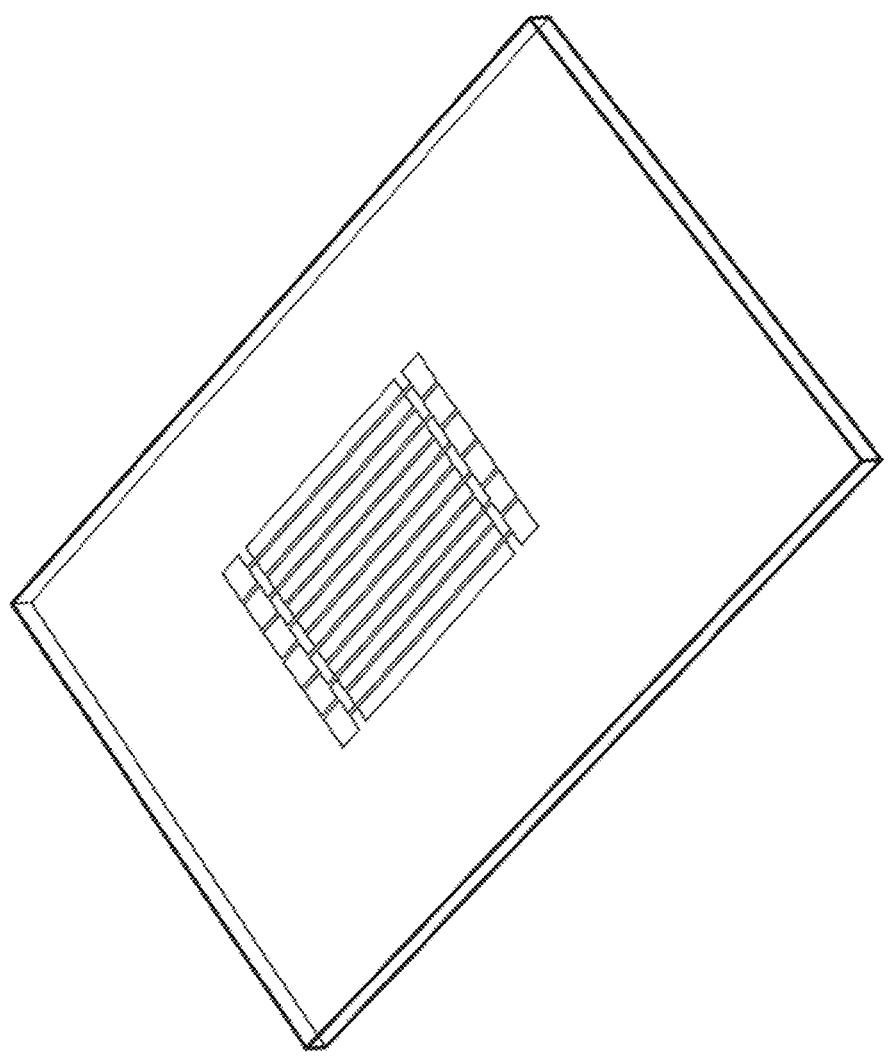

FIG. 73 provides an imaging showing the results of metallization processing.

Figure 74:
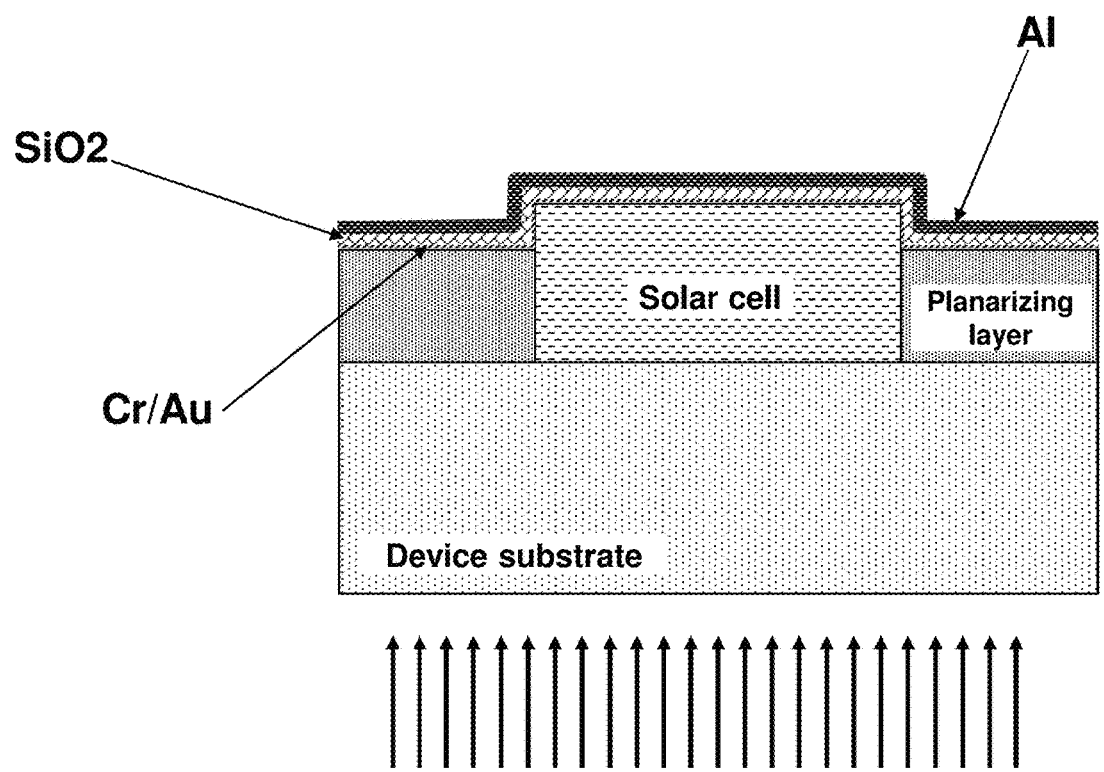

FIG. 74 provides a schematic diagram of the metallization process showing an Al metal layer, $SiO_2$ dielectric layer, Cr/Au layer, solar cell, planarizing layer and device substrate.

FIGS. 75A and 75B provide schematic diagrams exemplifying the expressions "lateral dimensions" and "cross sectional dimensions" as used in the present description. FIG. 75A provides a top plan view of printable semiconductor elements comprising 4 semiconductor ribbons 6005. In the context of this description the expression "lateral dimension" is exemplified by the length 6000 and width 6010 of the semiconductor ribbons 6005. FIG. 75B provides a cross sectional view of the printable semiconductor elements comprising 4 semiconductor ribbons 6005.

Figure 76:
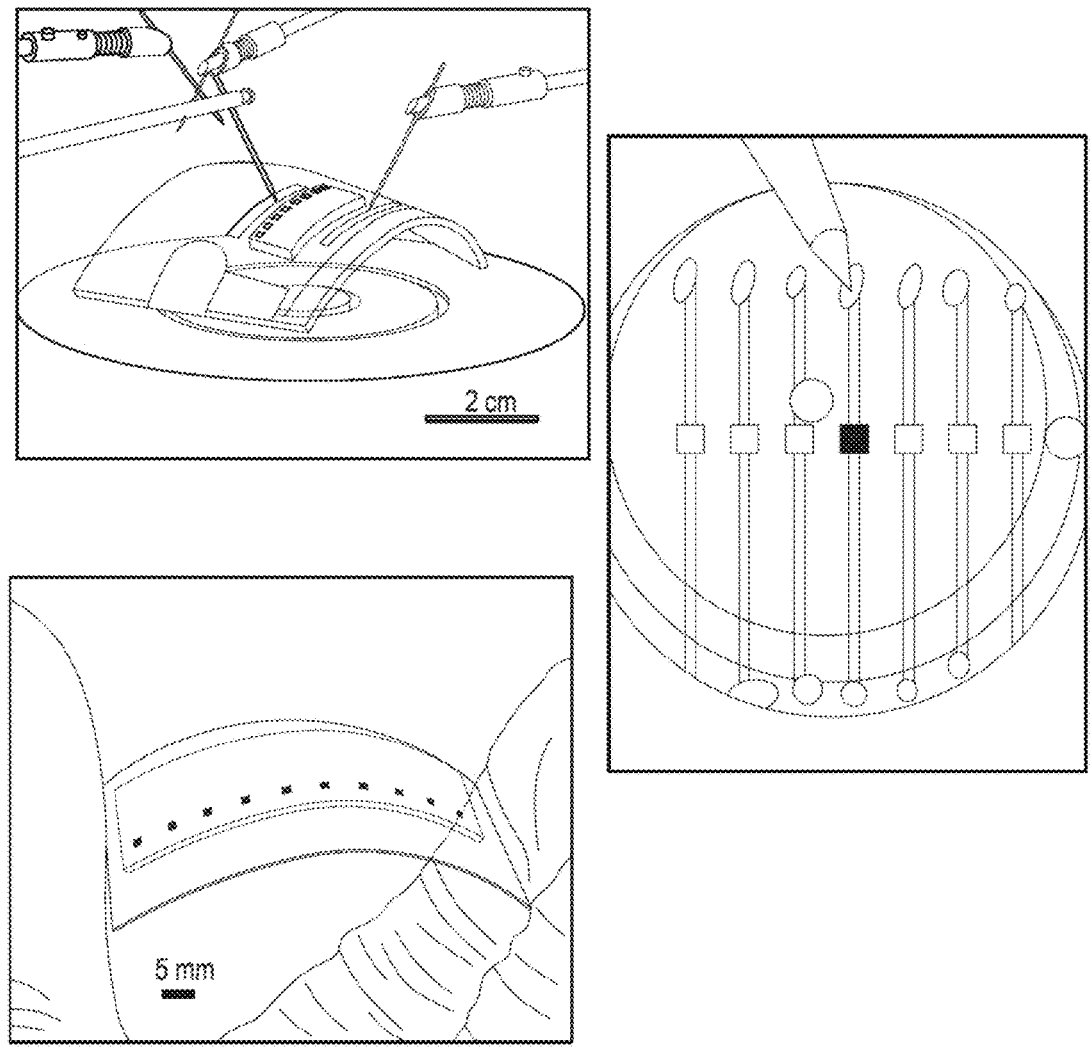

FIG. 76 shows an array of printable GaAs/InGaAlP red LEDs printed on PET substrates.

DETAILED DESCRIPTION OF THE INVENTION

Referring to the drawings, like numerals indicate like elements and the same number appearing in more than one drawing refers to the same element. In addition, hereinafter, the following definitions apply:

"Collecting" and "Concentrating", as applied to optics and optical components, refers to the characteristic of optical components and device components that they direct light from a relatively large area and direct that light to another area, in some cases a smaller area. In the context of some embodiments, collecting and concentration optical components and/or optical components are useful for light detection or power harvesting by printed inorganic solar cells or photodiodes.

"Printable" relates to materials, structures, device components and/or integrated functional devices that are capable of transfer, assembly, patterning, organizing and/or integrating onto or into substrates without exposure of the substrate to high temperatures (i.e. at temperatures less than or equal to about 400 degrees Celsius). In one embodiment of the present invention, printable materials, elements, device components and devices are capable of transfer, assembly, patterning, organizing and/or integrating onto or into substrates via solution printing or contact printing.

"Printable semiconductor elements" of the present invention comprise semiconductor structures that are able to be assembled and/or integrated onto substrate surfaces, for example using by dry transfer contact printing and/or solution printing methods. In one embodiment, printable semiconductor elements of the present invention are unitary single crystalline, polycrystalline or microcrystalline inorganic semiconductor structures. In one embodiment, printable semiconductor elements are connected to a substrate, such as a mother wafer, via one or more bridge elements. In this context of this description, a unitary structure is a monolithic element having features that are mechanically connected. Semiconductor elements of the present invention may be undoped or doped, may have a selected spatial distribution of dopants and may be doped with a plurality of different dopant materials, including P and N type dopants. Printable semiconductor elements and structures of the present invention may include holes or perforations through one dimension of the elements to facilitate their release from a wafer by the introduction of a chemical release agent. The present invention includes microstructured printable semiconductor elements having at least one cross sectional dimension (e.g., thickness) selected over the range of 1 micron to 1000 microns. The present invention includes nanostructured printable semiconductor elements having at least one cross sectional dimension (e.g., thickness) selected over the range of 1 to 1000 nanometers. In an embodiment, a printable semiconductor element of the present invention has a thickness dimensions less than of equal or 1000 microns, preferably for some applications a thickness dimensions less than or equal to 100 microns, preferably for some applications a thickness dimensions less than or equal to 10 microns and preferably for some applications a thickness dimensions less than or equal to 1 microns.

Printable semiconductor elements useful in many applications comprises elements derived from "top down" processing of high purity bulk materials, such as high purity crystalline semiconductor wafers generated using conventional high temperature processing techniques. In some methods and systems of the present invention, printable semiconductor elements of the present invention comprise composite heterogeneous structures having a semiconductor operational connected to or otherwise integrated with at least one additional device component or structure, such as a conducting layer, dielectric layer, electrode, additional semiconductor structure or any combination of these. In some methods and systems of the present invention, the printable semiconductor element(s) comprises a semiconductor structure integrated with at least one additional structure selected from the group consisting of: another semiconductor structure; a dielectric structure; conductive structure, and an optical structure (e.g., optical coatings, reflectors, windows, optical filter, collecting, diffusing or concentration optic etc.). In some methods and systems of the present invention the printable semiconductor element(s) comprises a semiconductor structure integrated with at least one electronic device component selected from the group consisting of: an electrode, a dielectric layer, an optical coating, a metal contact pad a semiconductor channel. In some methods and systems of the present invention, printable semiconductor elements of the present invention comprise stretchable semiconductor elements, bendable semiconductor elements and/or heterogeneous semiconductor elements (e.g., semiconductor structures integrated with one or more additional materials such as dielectrics, other semiconductors, conductors, ceramics etc.). Printable semiconductor elements include, printable semiconductor devices and components thereof, including but not limited to printable LEDs, lasers, solar cells, p-n junctions, photovoltaics, photodiodes, diodes, transistors, integrated circuits, and sensors.

"Cross sectional dimension" refers to the dimensions of a cross section of device, device component or material. Cross sectional dimensions include the thickness, radius, or diameter of a printable semiconductor element. For example, printable semiconductor elements having a ribbon shape are characterized by a thickness cross sectional dimension. For example, printable semiconductor elements having a cylindrical shape are characterized by a diameter (alternatively radius) cross sectional dimension.

"Longitudinally oriented in a substantially parallel configuration" refers to an orientation such that the longitudinal axes of a population of elements, such as printable semiconductor elements, are oriented substantially parallel to a selected alignment axis. In the context of this definition, substantially parallel to a selected axis refers to an orientation within 10 degrees of an absolutely parallel orientation, more preferably within 5 degrees of an absolutely parallel orientation.

The terms "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to 5%, preferably for some applications larger than or equal to 1%, and more preferably for some applications larger than or equal to 0.5%.

"Semiconductor" refers to any material that is a material that is an insulator at a very low temperature, but which has a appreciable electrical conductivity at a temperatures of about 300 Kelvin. In the present description, use of the term semiconductor is intended to be consistent with use of this term in the art of microelectronics and electrical devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electrical properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electrical properties of semiconductor materials, and include but are not limited to, oxygen, carbon, and metals including heavy metals. Heavy metal impurities include, but are not limited to, the group of elements between copper and lead on the periodic table, calcium, sodium, and all ions, compounds and/or complexes thereof.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which may provide desired chemical or physical properties.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. Elastomers provide elastomeric stamps useful in the present methods.

"Transfer device" refers to a device or device component capable of receiving, relocating, assembling and/or integrating an element or array of elements, such as one or more printable semiconductor elements. Transfer devices useful in the present invention include conformable transfer devices, having one or more contact surfaces capable of establishing conformal contact with elements undergoing transfer. The present methods and compositions are particularly well suited for implementation in connection with a transfer device comprising an elastomeric transfer device. Useful elastomeric transfer devices including an, elastomeric stamp, composite elastomeric stamp, an elastomeric layer, plurality of elastomeric layers and an elastomeric layer coupled to a substrate such as a glass, ceramic, metal or polymer substrate.

"Large area" refers to an area, such as the area of a receiving surface of a substrate used for device fabrication, greater than or equal to 36 square inches.

"Conformal contact" refers to contact established between surfaces, coated surfaces, and/or surfaces having materials deposited thereon which may be useful for transferring, assembling, organizing and integrating structures (such as printable semiconductor elements) on a substrate surface. In one aspect, conformal contact involves a macroscopic adaptation of one or more contact surfaces of a conformable transfer device to the overall shape of a substrate surface or the surface of an object such as a printable semiconductor element. In another aspect, conformal contact involves a microscopic adaptation of one or more contact surfaces of a conformable transfer device to a substrate surface leading to an intimate contact with out voids. The term conformal contact is intended to be consistent with use of this term in the art of soft lithography. Conformal contact may be established between one or more bare contact surfaces of a conformable transfer device and a substrate surface. Alternatively, conformal contact may be established between one or more coated contact surfaces, for example contact surfaces having a transfer material, printable semiconductor element, device component, and/or device deposited thereon, of a conformable transfer device and a substrate surface. Alternatively, conformal contact may be established between one or more bare or coated contact surfaces of a conformable transfer device and a substrate surface coated with a material such as a transfer material, solid photoresist layer, prepolymer layer, liquid, thin film or fluid.

"Placement accuracy" refers to the ability of a transfer method or device to transfer a printable element, such as a printable semiconductor element, to a selected position, either relative to the position of other device components, such as electrodes, or relative to a selected region of a receiving surface. "Good placement" accuracy refers to methods and devices capable of transferring a printable element to a selected position relative to another device or device component or relative to a selected region of a receiving surface with spatial deviations from the absolutely correct position less than or equal to 50 microns, more preferably less than or equal to 20 microns for some applications and even more preferably less than or equal to 5 microns for some applications. The present invention provides devices comprising at least one printable element transferred with good placement accuracy.

"Optical communication" refers to a configuration of two or more elements wherein one or more beams of electromagnetic radiation are capable of propagating from one element to the other element. Elements in optical communication may be in direct optical communication or indirect optical communication. "Direct optical communication" refers to a configuration of two or more elements wherein one or more beams of electromagnetic radiation propagate directly from a first device element to another without use of optical components for steering and/or combining the beams. "Indirect optical communication" on the other hand refers to a configuration of two or more elements wherein one or more beams of electromagnetic radiation propagate between two elements via one or more device components including, but not limited to, wave guides, fiber optic elements, reflectors, filters, prisms, lenses, gratings and any combination of these device components.

The present invention relates to the following fields: collecting optics, diffusing optics, displays, pick and place assembly, vertical cavity surface-emitting lasers (VCSELS) and arrays thereof, LEDs and arrays thereof, transparent electronics, photovoltaic arrays, solar cells and arrays thereof, flexible electronics, micromanipulation, plastic electronics, displays, transfer printing, LEDs, transparent electronics, stretchable electronics, and flexible electronics.

The present invention provides optical devices and device arrays, for example LED arrays, laser arrays, optical sensors and sensor arrays, and photovoltaic arrays, comprising printable, high quality inorganic semiconductor elements assembled and integrated via transfer printing techniques. Assembly and integration methods of the present invention include dry contact printing of printable semiconductor elements, replica molding for making device substrate such as device substrates having integrated optical components (e.g., lens arrays) and lamination processing steps.

In an embodiment, the invention provides a new type of display that generates images by the coordinated operation of assemblies of light-emitting diodes (LEDs) or other light emitting or collecting devices. The images may be high definition, as those on a computer monitor or television, or they may provide simple illumination in a way similar to fluorescent lights. The invention is formed by the assembly of small inorganic light emitting devices, transistors, and electrically conductive interconnects. Transfer printing and other novel fabrication processes may be used to perform the assembly of these components and to impart new functionality to them, e.g. stretchability.

The invention may be built on a range of substrates, including rigid materials (e.g. glass), flexible materials (e.g. thin plastic), and even stretchable materials (e.g. elastomers), imparting a number of benefits to these display and illumination products, including a high-degree of transparency, flexibility, and/or stretchability, as well as mechanical toughness and low weight. The invention is therefore useful for a number of applications, including architectural elements and devices that can dynamically conform to complex contours of objects, for example in the aerospace, transportation, medical, and fashion industries. The light emitters (LEDs) used are capable of high-speed operation and great brightness, enabling effective display of images even in full sunlight (e.g. for outdoor displays).

The novel transfer printing and other fabrication processes of the present invention, in addition to imparting functionality to the displays, enable the production of systems of the invention at costs lower than those required to produce other, less versatile types of displays (e.g. conventional LED displays). The novel transfer printing and other fabrication procedures also enables systems of the invention to achieve levels of brightness, large-area coverage, transparency, mechanical properties, operating lifetime, and/or resolution combinations that are not available to other display technologies (liquid crystal displays, organic LED displays, conventional LED displays, cathode ray tube displays, etc.).

Figure 1:
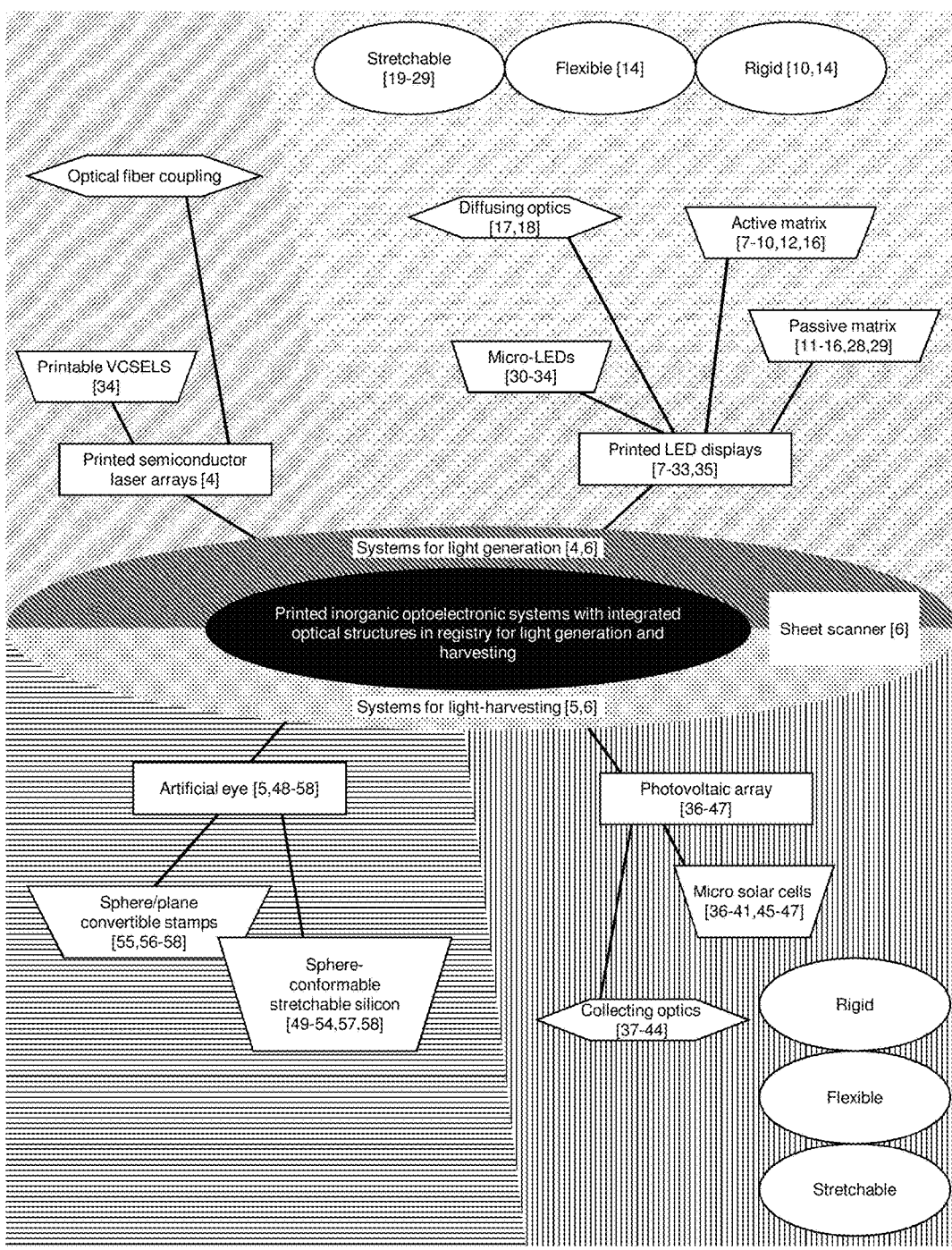
FIG. 1. provides a schematic showing optical systems provided by the present invention.
Figure 2A:
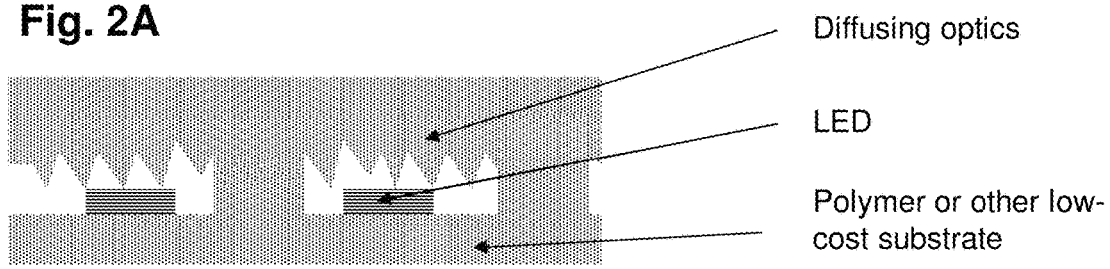
FIG. 2A shows a printed LED array with integrated optical diffuser.
Figure 2B:
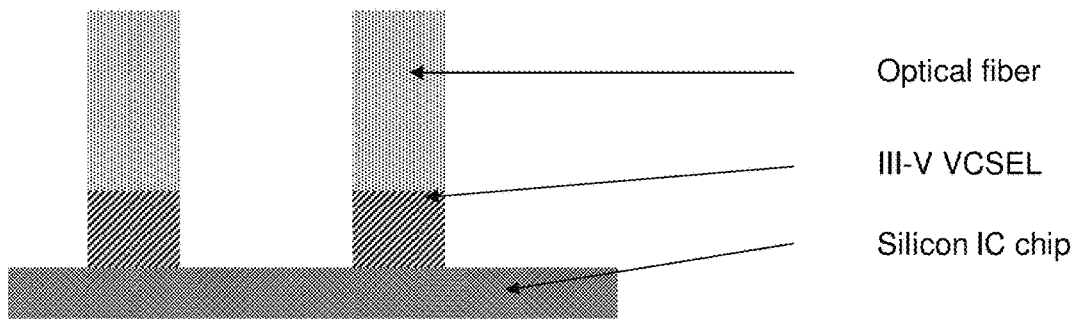
FIG. 2B shows a VCSEL array on a silicon chip with integrated optical fibers.
Figure 2C:
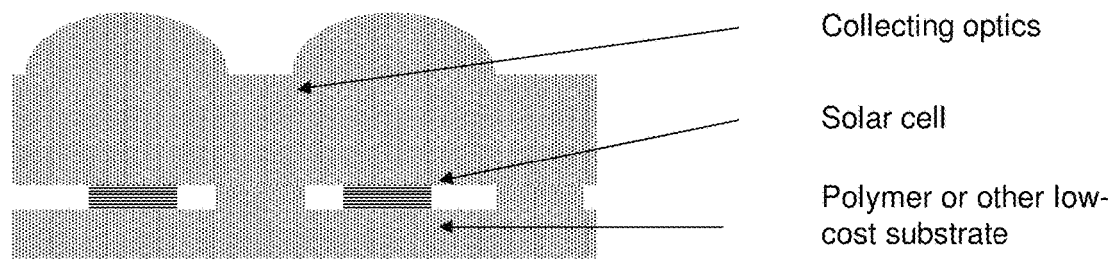
FIG. 2C shows a printed photovoltaic array with integrated optical collectors.
Figure 2D:
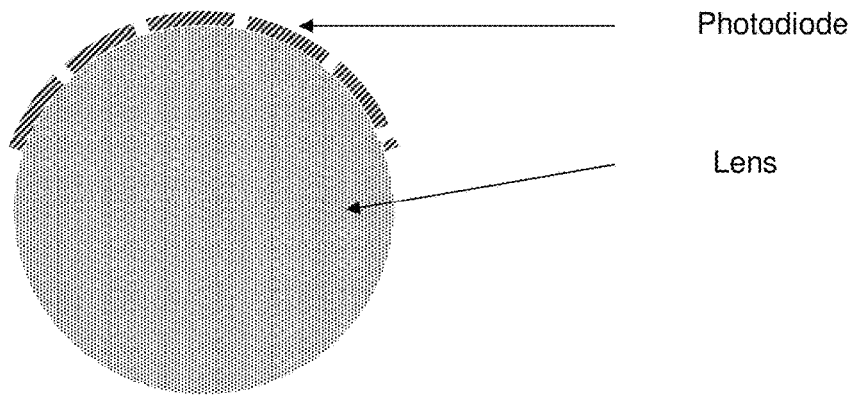
FIG. 2D shows an artificial eye sensor comprising a printed photodiode array on a collecting lens.
Figure 2E:
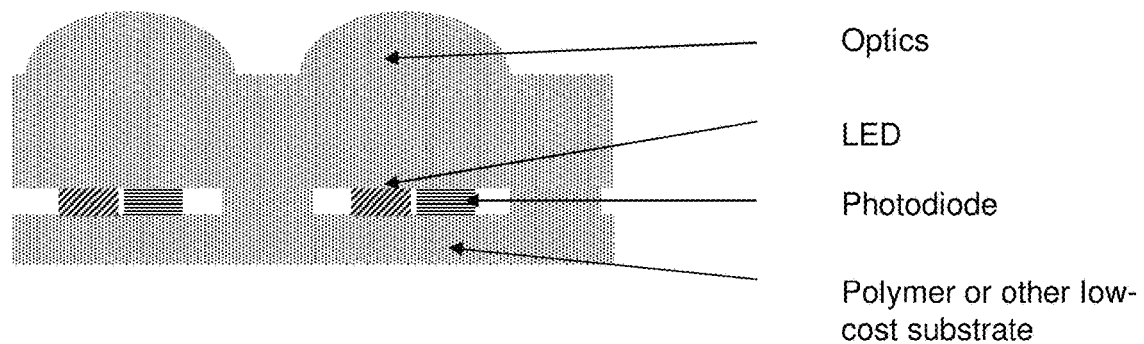
FIG. 2E shows a sheet scanner having both light sensing and light generation functionality and comprising a printed array LED and photodiode components and integrated collection optics provided on a polymer or other low cost substrate.

FIG. 1 provides a schematic showing optical systems provided by the present invention. As shown in FIG. 1, the present invention provides a number of classes of optical systems and related methods of making these systems, including systems for light generation and systems for light harvesting, comprising printed inorganic optical and optoelectronic systems with integrated optical components in registry. Light generation systems include printed LED displays, micro LED devices, passive matrix LED displays, active matrix LED displays, printed VCSEL systems and printed semiconductor laser arrays, optionally comprising light diffusing optics, light focusing optics and/or light filtering optics. Light harvesting systems include sensors, such as artificial eye sensors, sphere/plane convertible stamp sensors and sphere confirmable stretchable semiconductor based sensors, and photovoltaic systems, such as photovoltaic arrays, microsolar cells, optionally comprising collecting optics. Optical systems of the present invention include stretchable devices and systems, flexible devices and systems and rigid devices and systems.

FIG. 2 A-E provides schematic diagrams of optical systems of the present invention comprising printable semiconductor elements. FIG. 2A shows a printed LED array with integrated optical diffuser. FIG. 2B shows a VCSEL array on a silicon chip with integrated optical fibers. FIG. 2C shows a printed photovoltaic array with integrated optical collectors. FIG. 2D shows an artificial eye sensor comprising a printed photodiode array on a collecting lens. FIG. 2E shows a sheet scanner having both light sensing and light generation functionality and comprising a printed array LED and photodiode components and integrated collection optics provided on a polymer or other low cost substrate.

FIG. 3 provides a process flow schematic for the fabrication of a single pixel element of a printed inorganic active matrix LED display of the present invention. Panel 1 illustrates the step of preparing gate electrodes on substrate. Panel 2 illustrates the step of spin-coat thin-film adhesive on the patterned substrate. Panel 3 illustrates the step of printing a thin-film transistor structure on the adhesive layer, for example using contact printing. Panel 4 illustrates the step of depositing (or printing) electrode lines so as to interconnect the printed transistor structure. Panel 5 illustrates the step of printing an LED structure onto one or more electrodes. In some embodiments, bonding of these elements is achieved by cold-welding. Panel 6 illustrates the step of encapsulating or planarizing the device components, for example using a photocurable epoxy. Panel 7 illustrates the step of depositing or printing electrical contacts to top the LED electrode structure.

Figure 4:
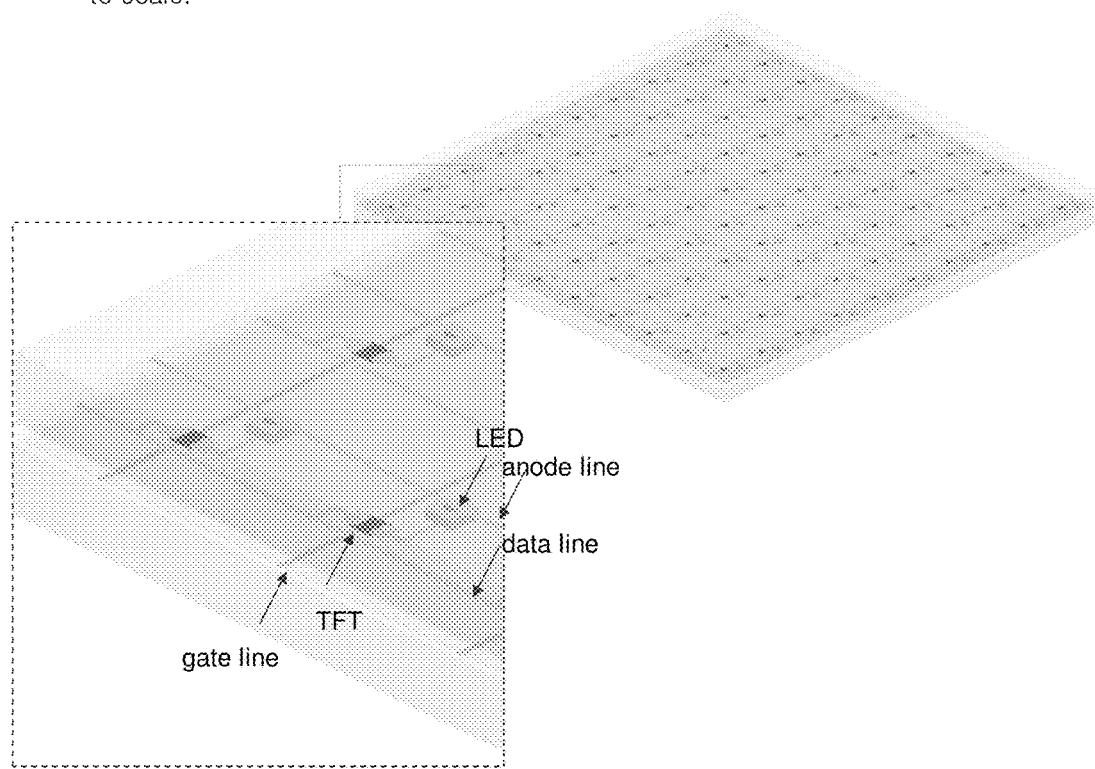
FIG. 4 provides a schematic illustration (not to scale) of a printed active matrix LED display on a glass substrate. The display shown comprises 100 pixels and is an approximately 11 inch display. Thin film transistor (TFT) elements, LED elements, gate lines, anode lines and data lines of the device are indicated in FIG. 4.

FIG. 4 provides a schematic illustration (not to scale) of a printed active matrix LED display on a glass substrate. The display shown comprises 100 pixels and is an approximately 11 inch display. Thin film transistor (TFT) elements, LED elements, gate lines, anode lines and data lines of the device are indicated in FIG. 4. TFT and LED structures are assembled via printing, for example using one or more elastomeric stamps. Metal lines are patterned with shadow masks. The bottom plate holds LED structures, data and gate lines, and TFT structures. The top plate holds the anode lines.

Figure 5A:
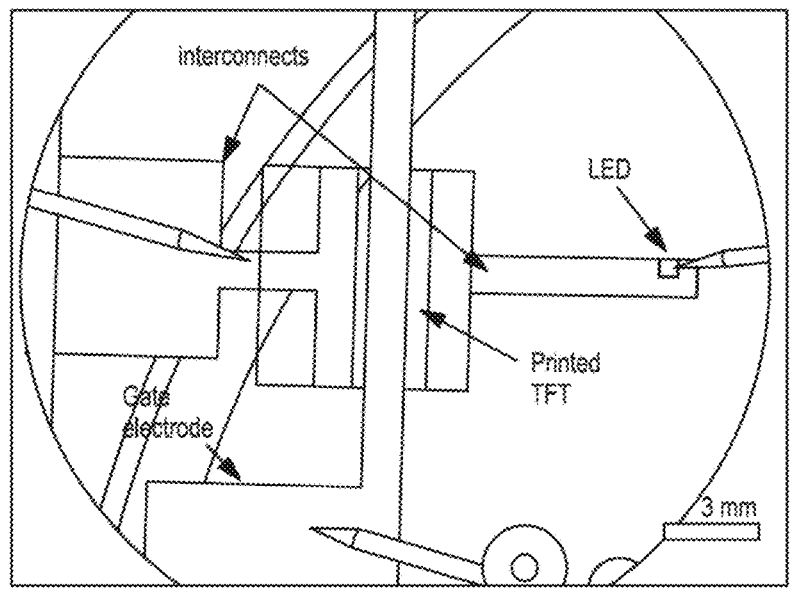
As shown in FIG. 5A the single pixel of an active matrix LED display comprises a printed TFT structure, a LED structure, gate electrode and electrical interconnects.
Figure 5B:
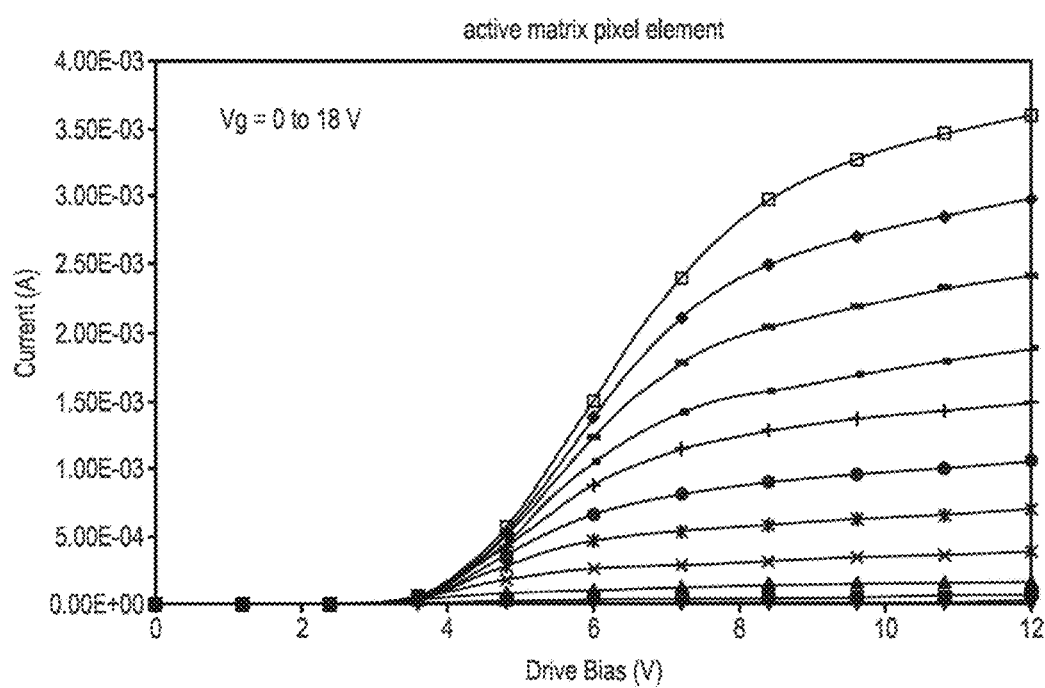
FIG. 5B provides a plot of current (A) verses drive bias (V) for the single pixel of an active matrix LED display.

FIG. 5 provides photographs (FIG. 5A) and operating current-voltage characteristics (FIG. 5B) of a single pixel of an active matrix LED display on a (transparent) glass substrate. As shown in FIG. 5A the single pixel of an active matrix LED display comprises a printed TFT structure, a LED structure, gate electrode and electrical interconnects. FIG. 5B provides a plot of current (A) verses drive bias (V) for the single pixel of an active matrix LED display.

FIGS. 6A-6C provide photographs of a 64 pixel active matrix LED display on a (transparent) glass substrate. FIG. 6A provides a photograph of a 64 pixel partial LED display (Note: missing top contacts) comprising 1 mm transistors printed on to the device substrate and ILEDs manually placed on the substrate. In the device shown in FIG. 6A, pixels are provided at a 4 mm pitch. FIG. 6B provides a photograph of a printed silicon TFT with interdigitated channel (thin green line) for high-current operation. FIG. 6C provides a photograph of two pixels illuminated by placing a transparent common anode electrical contact against the LEDs.

FIG. 7A provides a process flow schematic for the fabrication of a single pixel element of a printed inorganic passive matrix LED display. Panel 1 illustrates the step of spin coating a layer of elastomer precursor onto a receiving surface of the substrate. After spin casting the elastomer precursor layer is at least partially cured. Panel 2 illustrates the step of depositing an electrode. Panel 3 illustrates the step of printing an ILED structure onto the electrode, for example via contact printing. Panel 4 illustrates the step of laminating the top electrode, wherein the top electrode is housed on a second substrate. This processing steps achieves contacting of the printed LED structure.

Figure 7B:
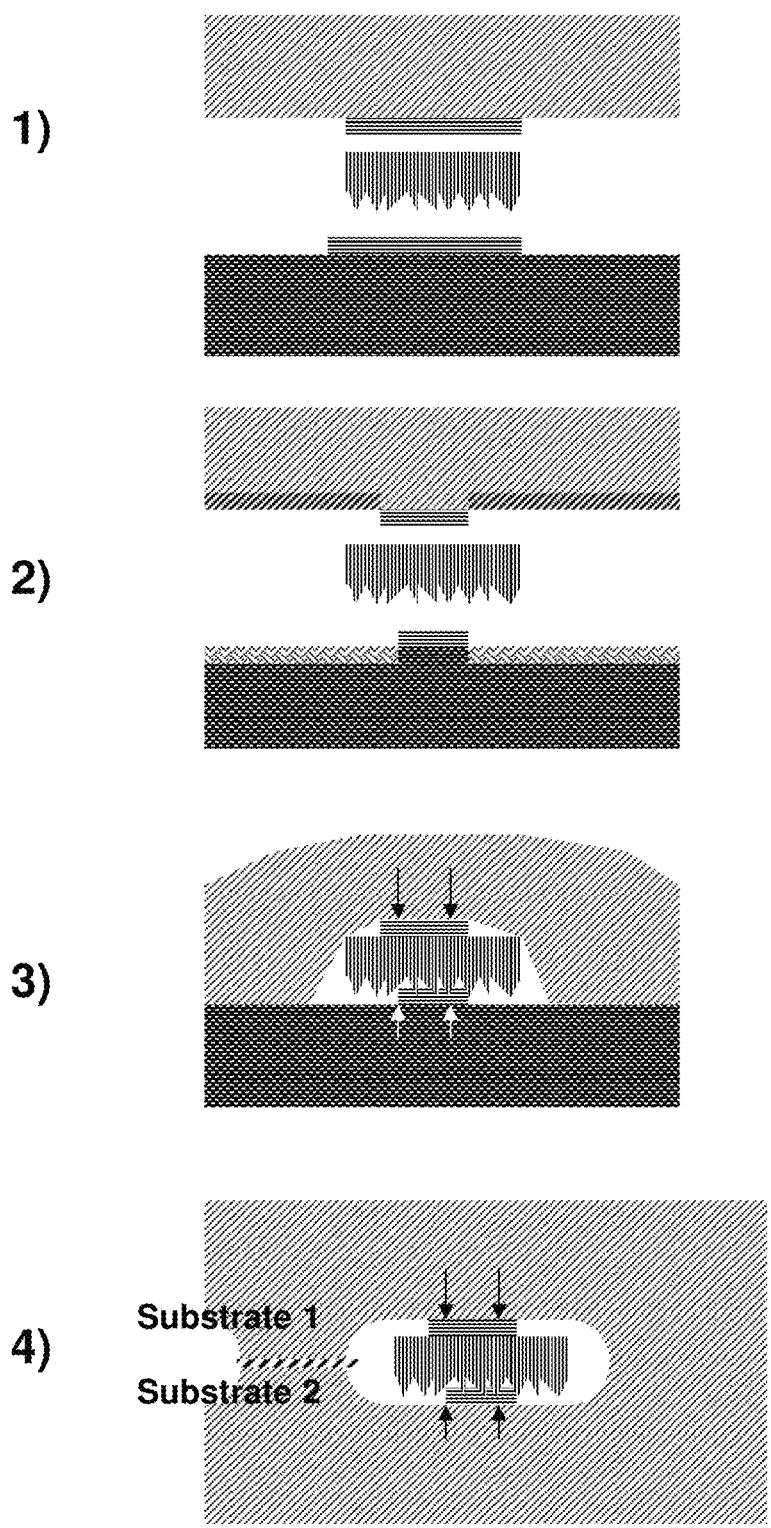
FIG. 7B provides a process flow schematic for establishing electrical contact by compression of a (soft) substrate/layer.

FIG. 7B provides a process flow schematic for establishing electrical contact by compression of a (soft) substrate/layer. Panel 1 illustrates the step of placing a component between 2 substrates (at least one soft—e.g., elastomer) prepatterned with integrated electrodes. Panel 2 illustrates the step of activating the substrate surfaces for strong bonding upon contact, for example via oxygen plasma treatment for bonding PDMS to PDMS or PDMS to glass. Panel 3 illustrates the step of pressing the two substrates together, for example by "sandwiching" the component. In this processing step sufficient pressure is applied to deform the soft layer and bring the two surfaces into contact. After bonding, the electrical contact is maintained by residual pressure. Panel 4 illustrates a similar process as shown in Panel 3, using optional relief features to facilitate contact and engineer a stronger bonding interface, for example via reduction of stress concentration points.

Figure 8:
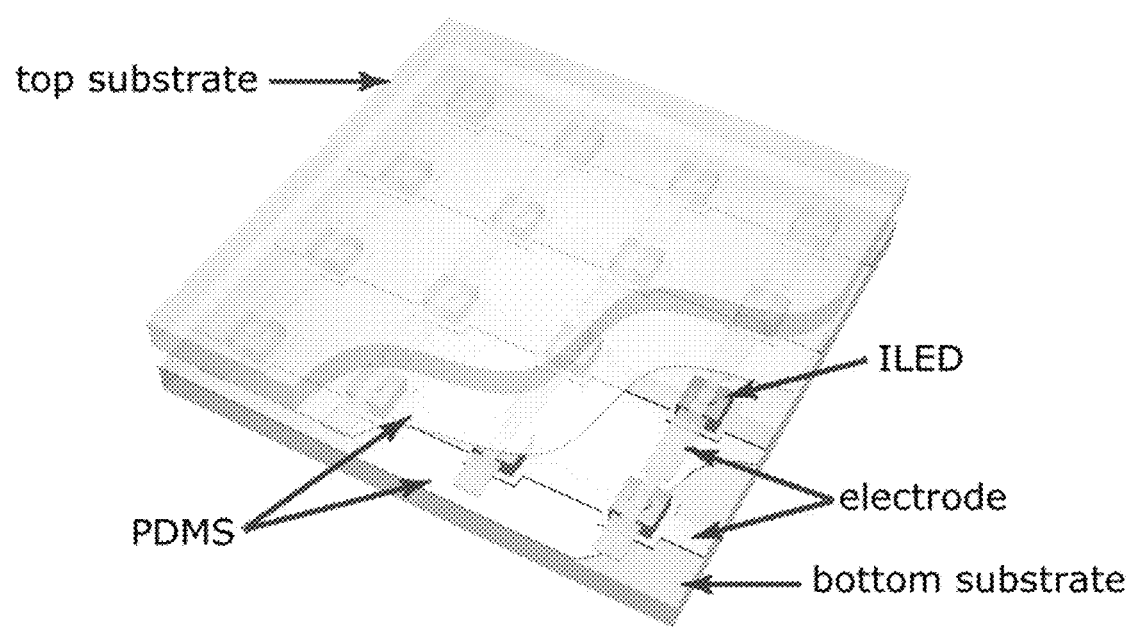
FIG. 8 provides a schematic illustration (not to scale) of a printed passive matrix printed inorganic LED display.

FIG. 8 provides a schematic illustration (not to scale) of a printed passive matrix printed inorganic LED display. As shown in FIG. 8, the display comprises a bottom substrate, electrode network, printed ILED, PDMS layer and top substrate.

Figure 9:
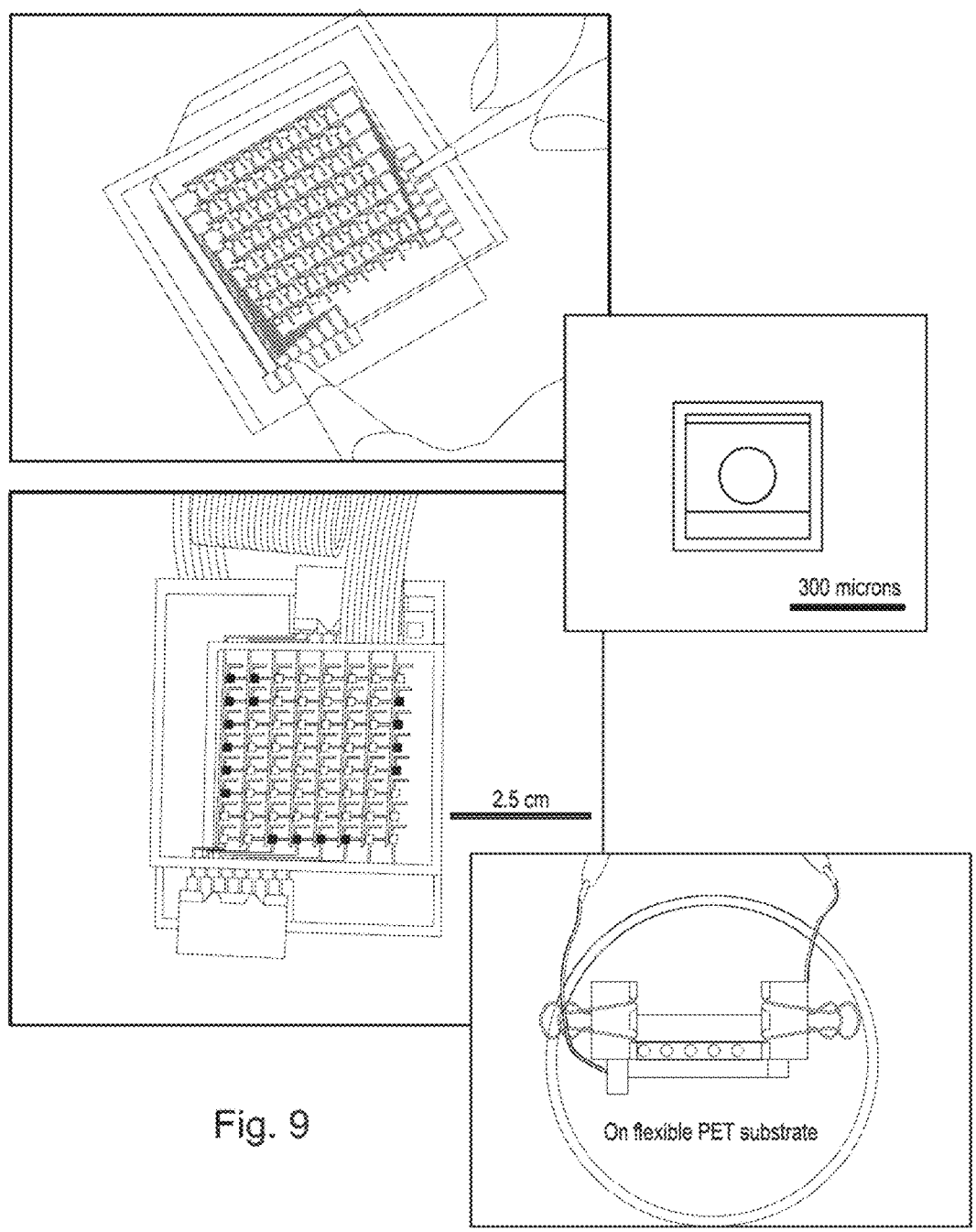
FIG. 9 provides photographs of passively addressed printed inorganic LED displays/arrays on glass and flexible PET substrates.

FIG. 9 provides photographs of passively addressed printed inorganic LED displays/arrays on glass and flexible PET substrates.

Figure 10:
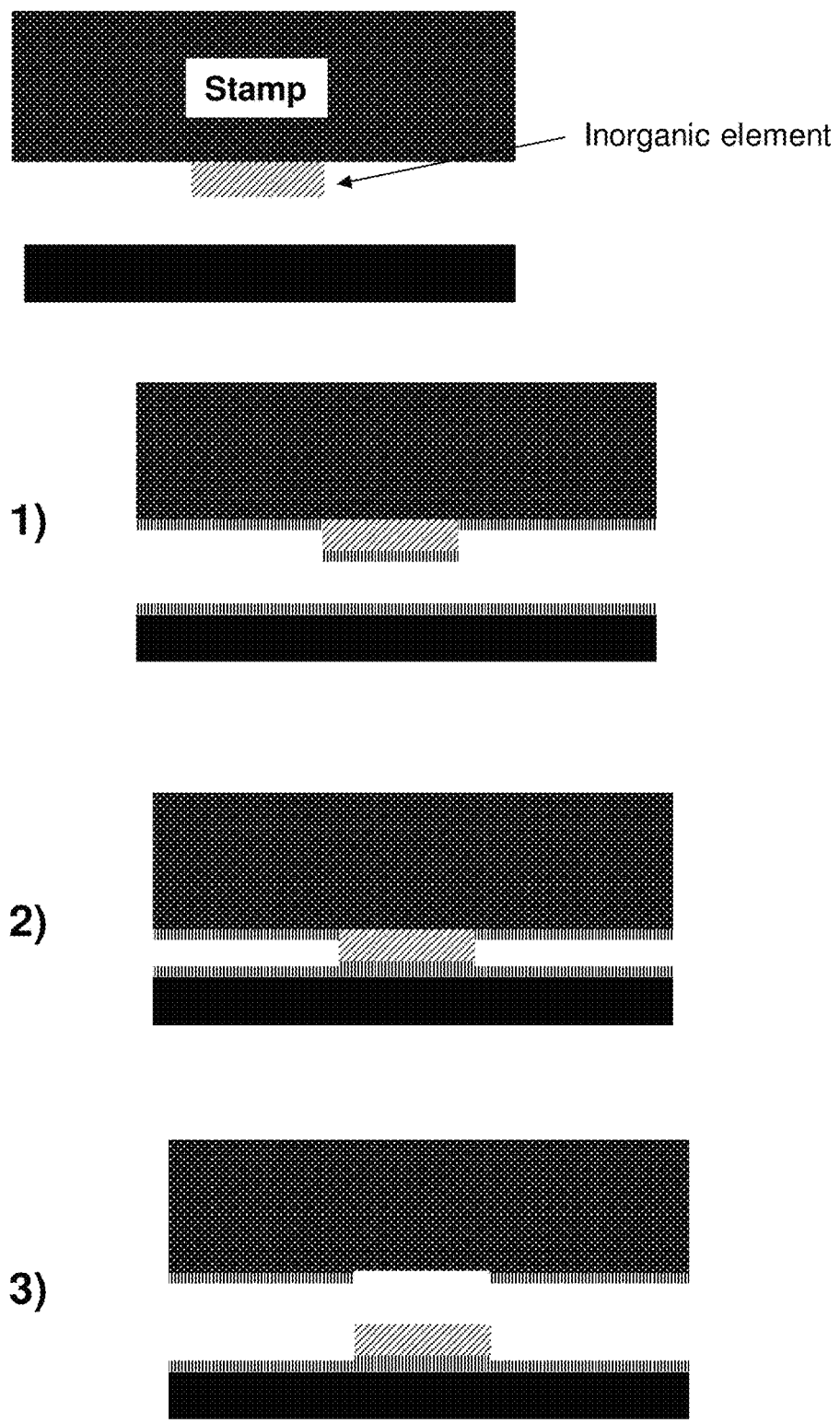
FIG. 10 provides a process flow schematic for printing inorganic light emitters and collectors via cold-weld bonding techniques.

FIG. 10 provides a process flow schematic for printing inorganic light emitters and collectors via cold-weld bonding techniques. Panel 1 illustrates the step of evaporating metal (e.g. gold, indium, silver, etc.) onto an inorganic element disposed on a transfer device (e.g., an elastomeric stamp). As shown in panel 1 metal is also evaporated on the receiving surface of a substrate. Panel 2 illustrates the step of contacting the stamp and inorganic element to receiving surface, and optionally applying heat or pressure to induce cold-welding of metal films. Panel 3 illustrates the step of removing the stamp, thereby resulting in transfer and assembly of the inorganic elements via contact printing.

Figure 11:
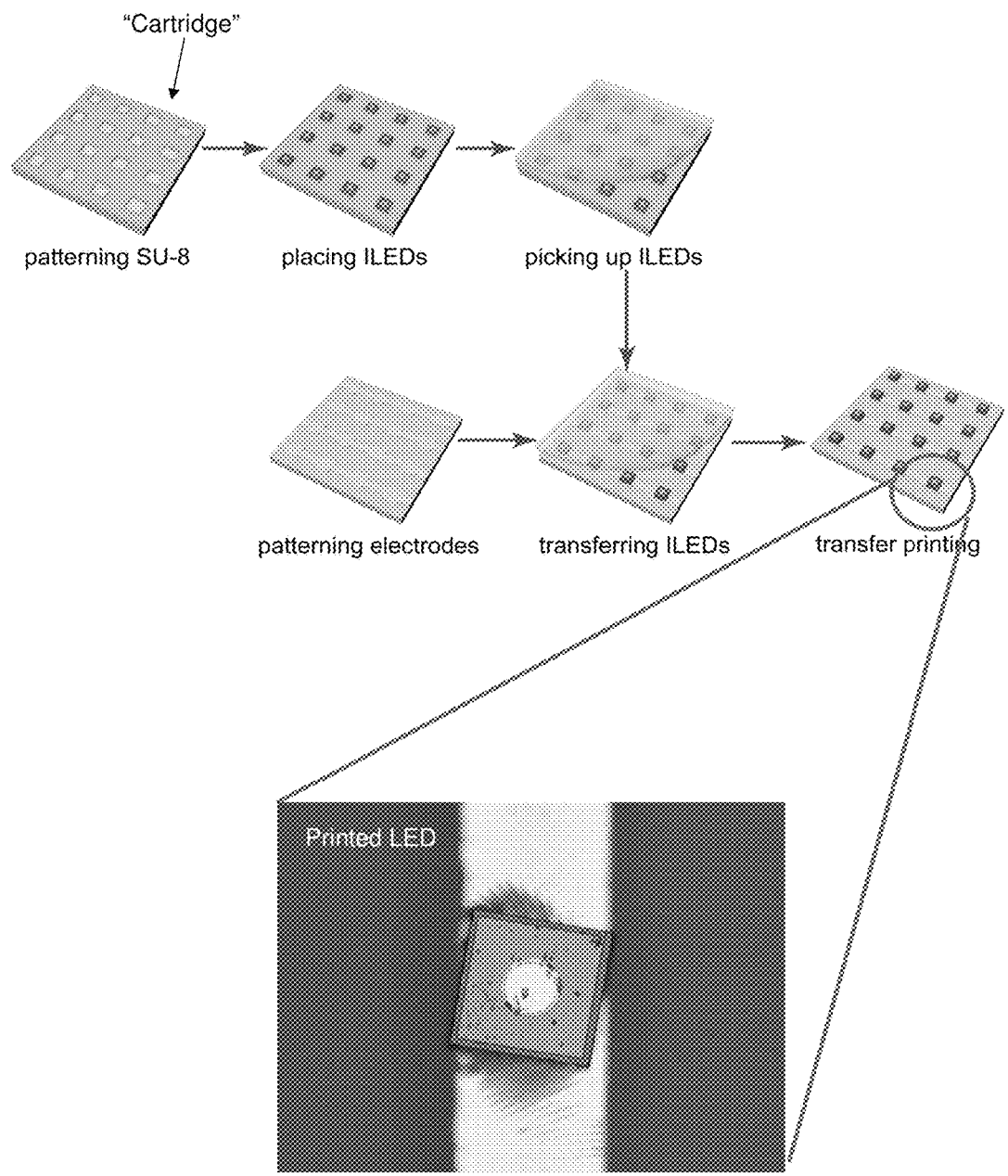
FIG. 11 provides a process flow schematic for printing using a donor cartridge and cold-weld bonding technique. In this method a cartridge is patterned with SU-8. ILED structures are placed on the patterned surface of the cartridge. A stamp is used to take up the ILED structures and subsequently print the ILED structures on a substrate pre-patterned with electrodes via transfer printing. The bottom panel of FIG. 11 shows an example of a LED structure printed using this method.

FIG. 11 provides a process flow schematic for printing techniques of the present invention using a donor cartridge and cold-weld bonding technique. In this method a cartridge is patterned with SU-8. ILED structures are placed on the patterned surface of the cartridge. A stamp is used to take up the ILED structures and subsequently print the ILED structures on a substrate prepatterned with electrodes via transfer printing. The bottom panel of FIG. 11 shows an example of a LED structure printed and assembled using this method.

Figure 12:
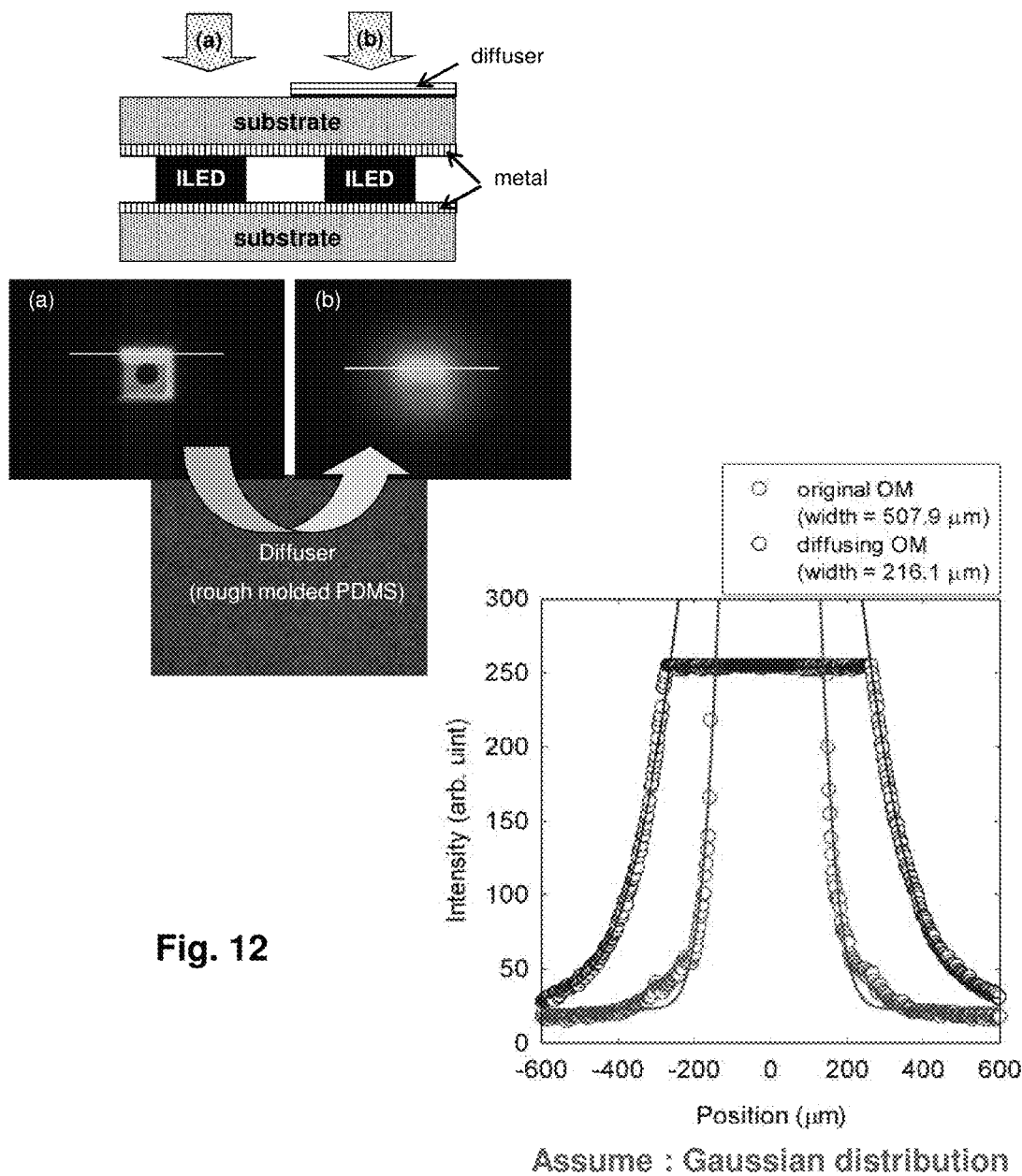
FIG. 12 provides a schematic of an optical system of the present invention wherein diffusing optics are integrated with printable LED structures. In this embodiment, PDMS is molded on rough polystyrene. A comparison of panels (a) and (b) show the affect of incorporation of a diffuser in this optical system. The diffuser can be a rough molded PDMS structure. This figure demonstrates that diffusers can effectively increase the size of the luminous region.

FIG. 12 provides a schematic of an optical system of the present invention wherein diffusing optics are integrated with printable LED structures. In this embodiment, PDMS is molded on rough polystyrene. A comparison of panels (a) and (b) show the affect of incorporation of a diffuser in this optical system. The diffuser can be a rough molded PDMS structure. This figure demonstrates that diffusers can effectively increase the size of the luminous region.

FIG. 13 provides a schematic of diffusing optics comprising a plurality of radial density gradient scattering centers useful for LED lighting systems of the present invention. As shown in this figure a printed LED structure under metal is provided in optical communication with a plurality of optical scattering centers. The bottom panel in FIG. 13 shows a cross sectional view of scattering centers comprising relief features in a transparent substrate.

Figure 14A:
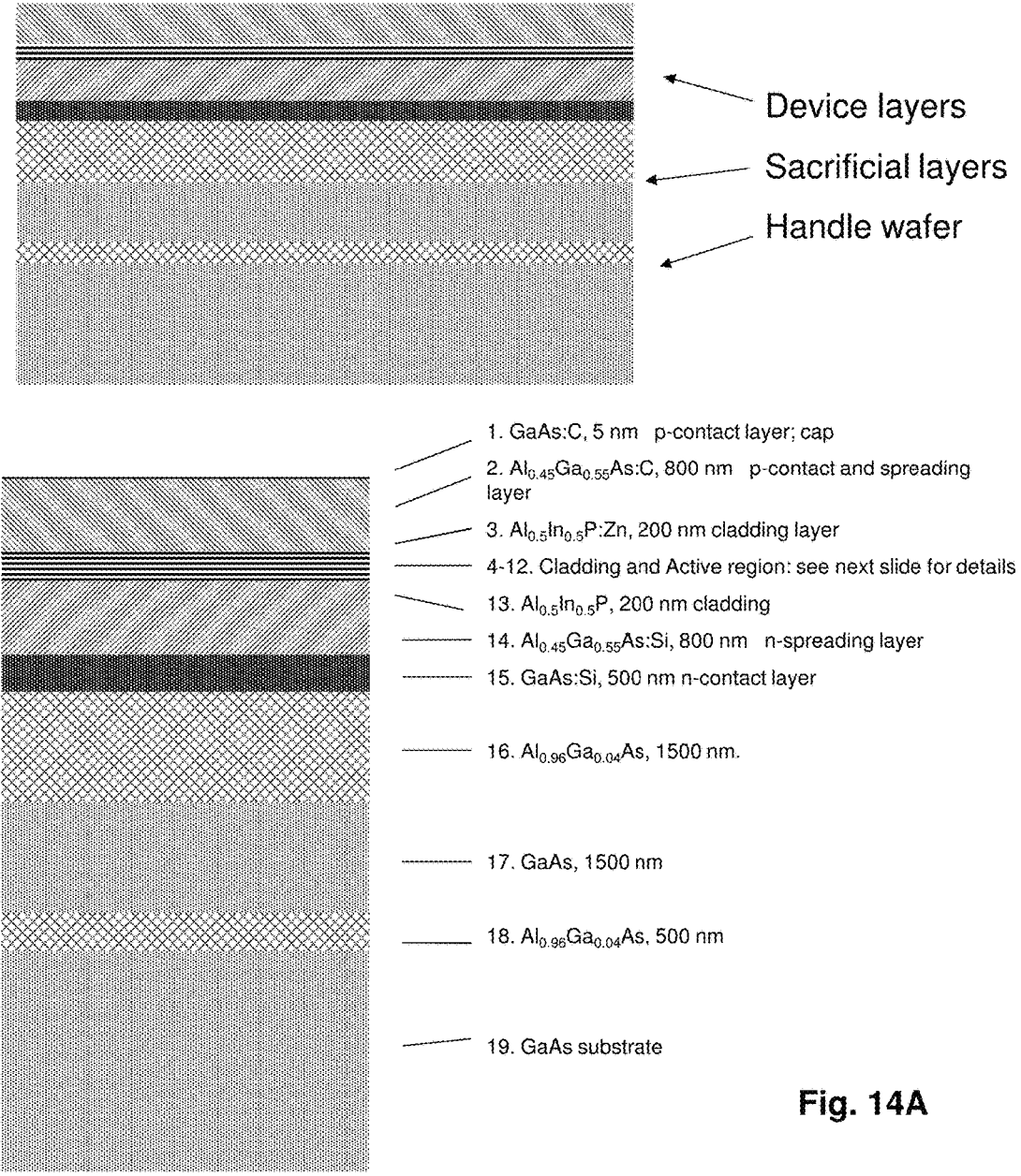
FIG. 14A provides an exemplary epilayer structure for the fabrication of printable micro-LEDs. As shown in this figure, the epilayer structure comprises a series of device layers, sacrificial layers and a handle wafer. Individual layers in the epilayer structure are shown in the bottom panel of FIG. 14A.
Figure 14B:
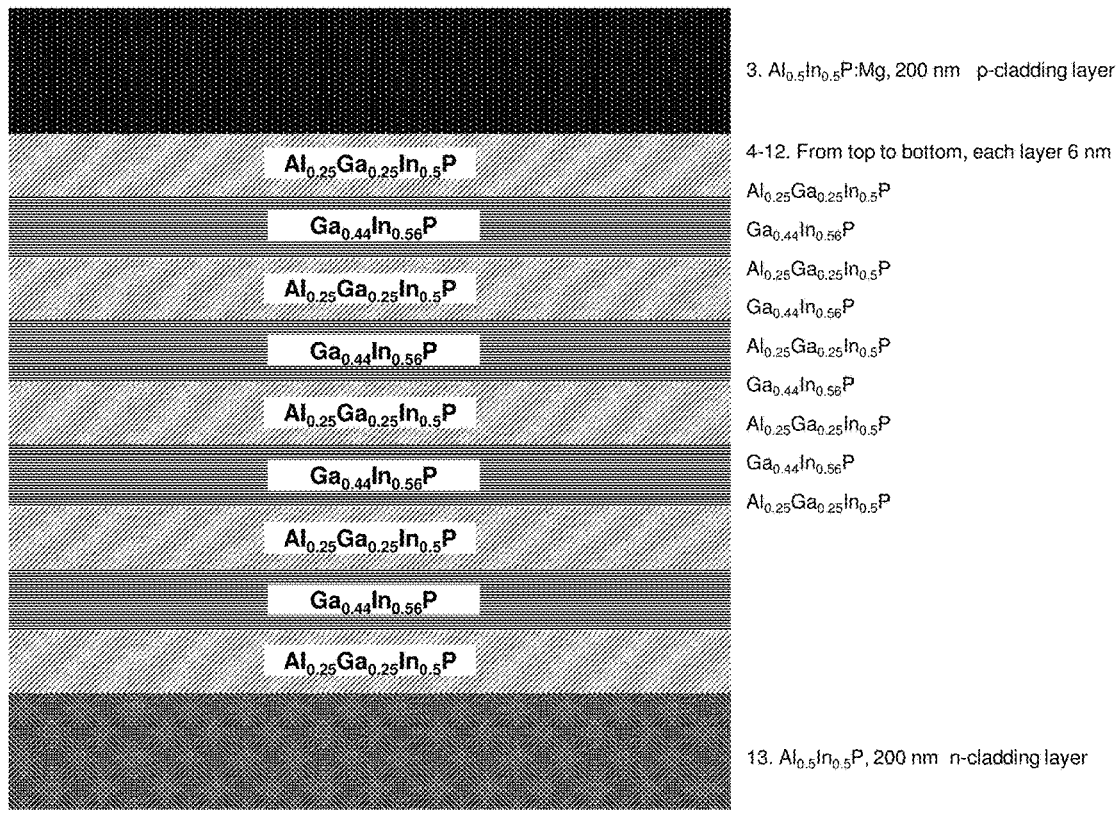
FIG. 14B provides an exemplary epilayer structure for the fabrication of printable micro-LEDs comprising quantum well emissive layers. The epilayer structure comprises a series of semiconductor layers provided between p-cladding and n-cladding layers. Specific compositions of each layer in the epilayer structure are provided.

FIG. 14A provides an exemplary epilayer structure for the fabrication of printable micro-LEDs. As shown in this figure, the epilayer structure comprises a series of device layers, sacrificial layers and a handle wafer. Individual layers in the epilayer structure are shown in the bottom panel of FIG. 14A. FIG. 14B provides an exemplary epilayer structure for the fabrication of printable micro-LEDs comprising quantum well emissive layers. The epilayer structure comprises a series of semiconductor layers provided between p-cladding and n-cladding layers. Specific compositions of each layer in the epilayer structure are provided. FIG. 14C provides a table indicating the composition, thickness, doping and functionality of each layer in the epilayer structure for the fabrication of printable micro-LEDs.

Figure 14D:
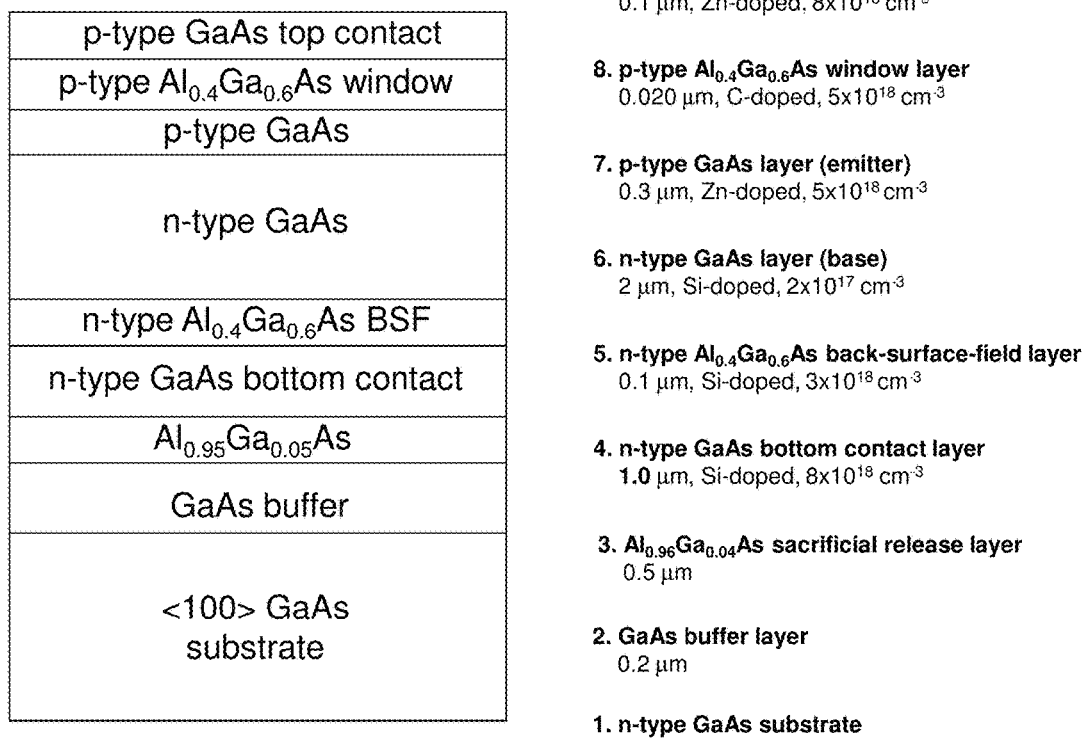
FIG. 14D illustrates an example of a mother wafer from which printable p-on-n GaAs solar cells may be produced by photolithography and etching layers 9 through 4 and selectively removing layer 3 by a wet chemical etch.

FIG. 14D illustrates an example of a mother wafer from which printable p-on-n GaAs solar cells may be produced by photolithography and etching layers 9 through 4 and selectively removing layer 3 by a wet chemical etch.

FIG. 14E illustrates provides another example of a mother wafer from which printable n-on-p GaAs solar cells may be produced by photolithography and etching layers 9 through 4 and selectively removing layer 3 by a wet chemical etch.

Figure 15:
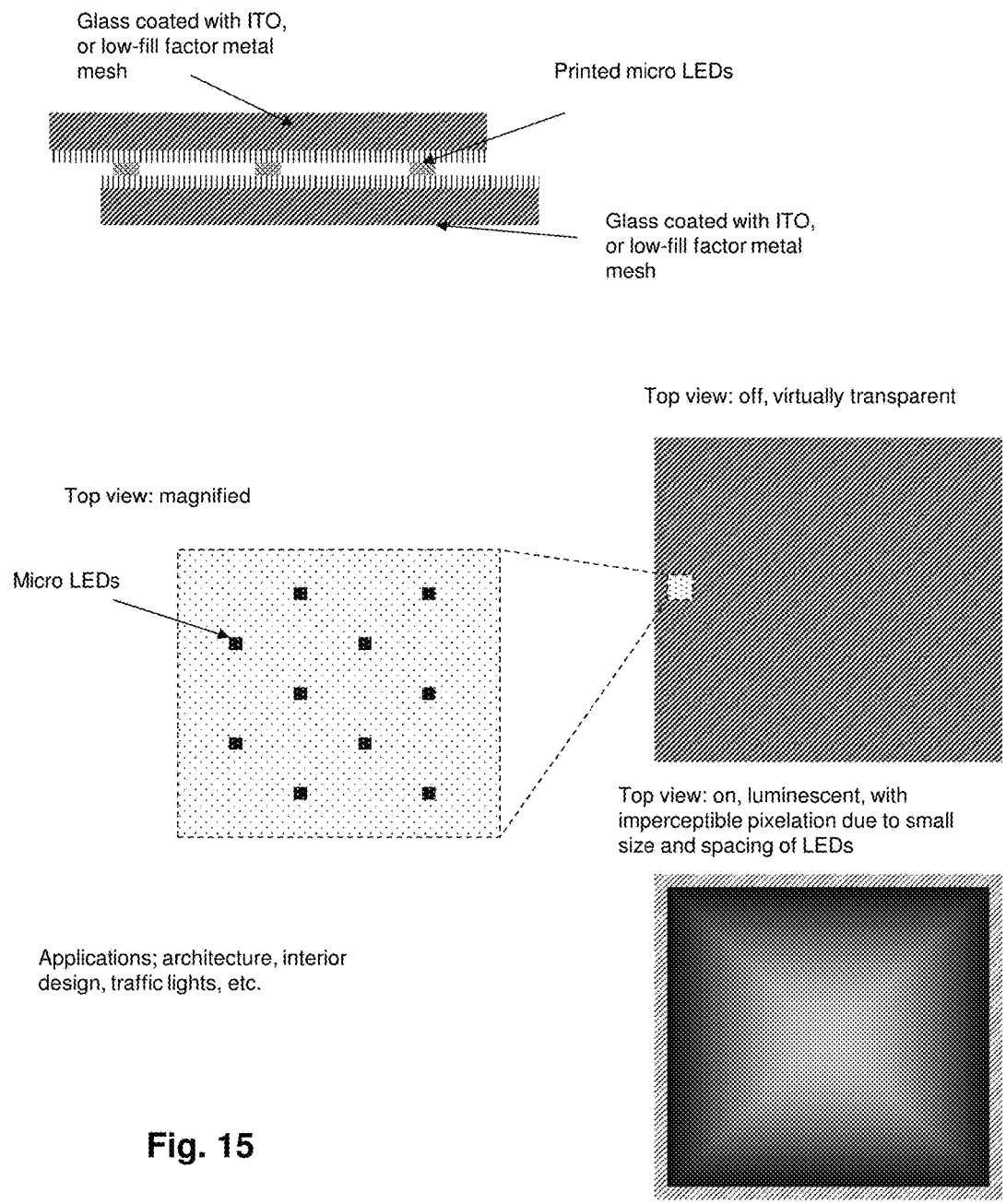
FIG. 15 provides schematic diagrams illustrating the imperceptible pixilation/high degree of transparency from low fill-factor, micro-sized (<~100 micron footprint) LEDs. As shown in the top panel of this figure, the optical system comprises: (i) a first glass coated ITO or a low-fill factor metal mesh layer; (ii) printed micro LEDS structures; and (iii) a second glass coated ITO or a low-fill factor metal mesh layer. Top views are provided corresponding to the off state and the on state. A magnification of the top view is also provided showing the positioning of micro LED structures.

FIG. 15 provides schematic diagrams illustrating the imperceptible pixilation/high degree of transparency from low fill-factor, micro-sized (<~100 micron footprint) LEDs. As shown in the top panel of this figure, the optical system comprises: (i) a first glass coated ITO or a low-fill factor metal mesh layer; (ii) printed micro LEDS structures; and (iii) a second glass coated ITO or a low-fill factor metal mesh layer. Top views are provided corresponding to the off state and the on state. A magnification of the top view is also provided showing the positioning of micro LED structures.

Figure 16:
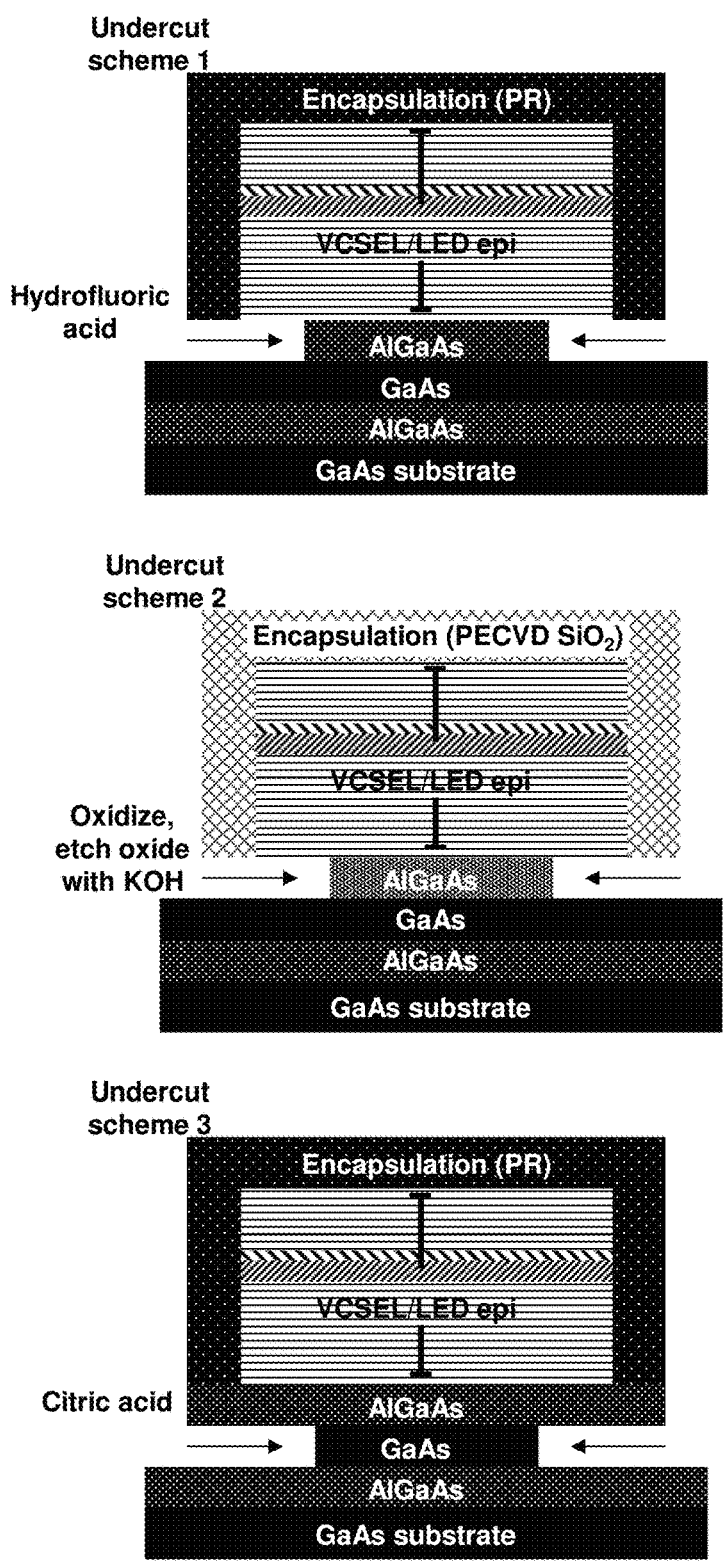
FIG. 16 provides schemes for the release of printable light-emitting inorganic semiconductor micro-elements: micro-LEDs or VCSELs. Scheme 1 describes the release of such elements by encapsulating them in a polymer, e.g. photoresist, and releasing them from the wafer on which they were grown by selectively etching an $Al_xGa_{1-x}As$ (x>about 70%) sacrificial layer using hydrofluoric acid. Scheme 2 describes release by encapsulating them in a conformal dielectric (e.g. silicon nitride) and releasing them from the wafer by selectively oxidizing the AlGaAs and etching the oxidized material using aqueous potassium hydroxide. Scheme 3 describes release by encapsulating them with a polymer, e.g. photoresist, followed by selective etching of a buried GaAs sacrificial layer using an aqueous mixture of citric acid and hydrogen peroxide. In scheme 3, the AlGaAs protects the underside of the light emitting element from the citric acid-based etchant.

FIG. 16 provides schemes for the release of printable light-emitting inorganic semiconductor micro-elements: micro-LEDs or VCSELs. Scheme 1 describes the release of such elements by encapsulating them in a polymer, e.g. photoresist, and releasing them from the wafer on which they were grown by selectively etching an $Al_xGa_{1-x}As$ (x>about 70%) sacrificial layer using hydrofluoric acid. Scheme 2 describes release by encapsulating them in a conformal dielectric (e.g. silicon nitride) and releasing them from the wafer by selectively oxidizing the AlGaAs and etching the oxidized material using aqueous potassium hydroxide. Scheme 3 describes release by encapsulating them with a polymer, e.g. photoresist, followed by selective etching of a buried GaAs sacrificial layer using an aqueous mixture of citric acid and hydrogen peroxide. In Scheme 3, the AlGaAs protects the underside of the light emitting element from the citric acid-based etchant.

Figure 17A:
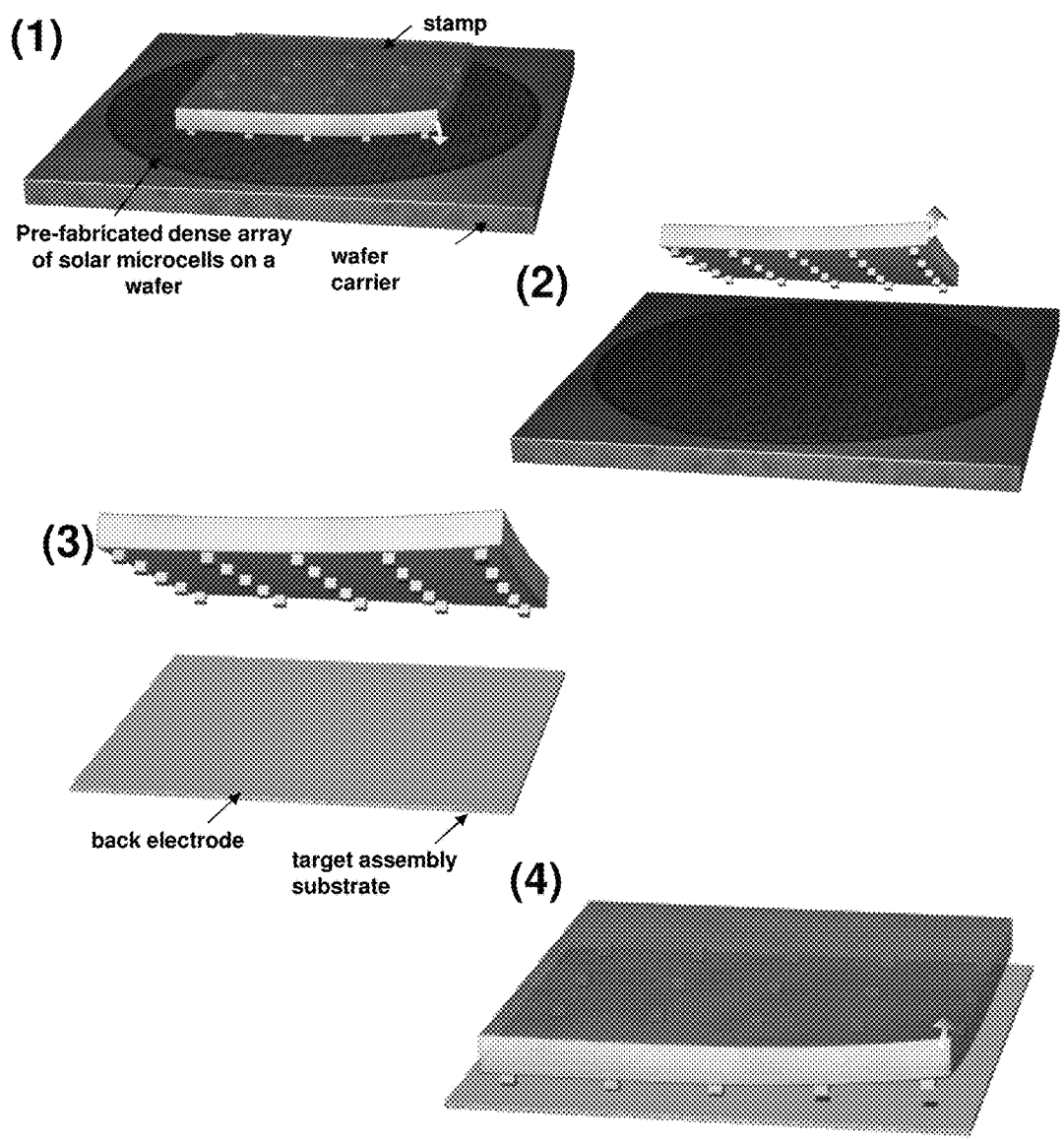
FIG. 17A provides a schematic process flow diagram illustrating fabrication of integrated solar cell/collector arrays by printing solar cells.
Figure 17B:
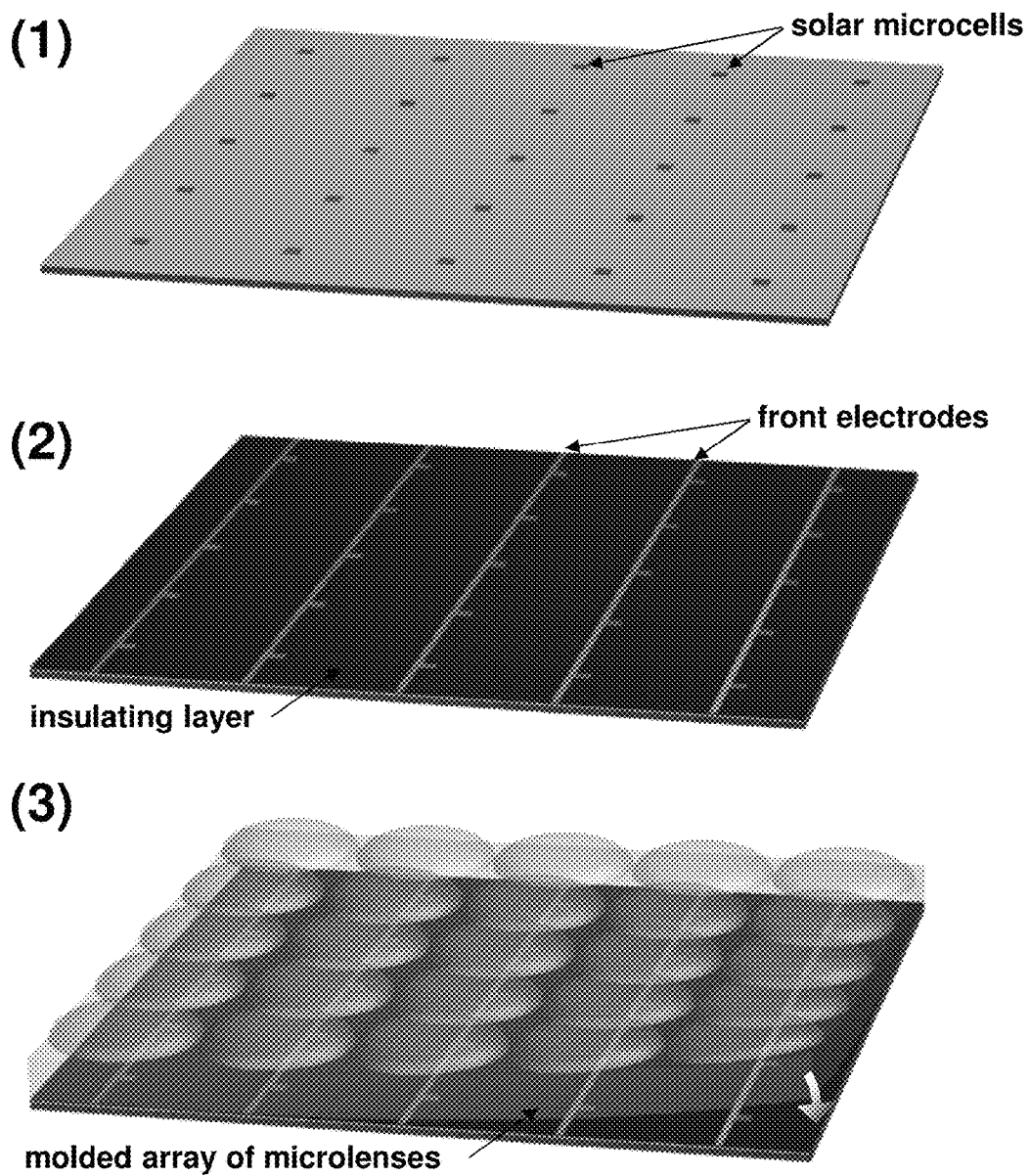
FIG. 17B provides a schematic process flow diagram illustrating fabrication of integrated solar cell/collector arrays via interconnection of registry of an optical array.
Figure 17C:
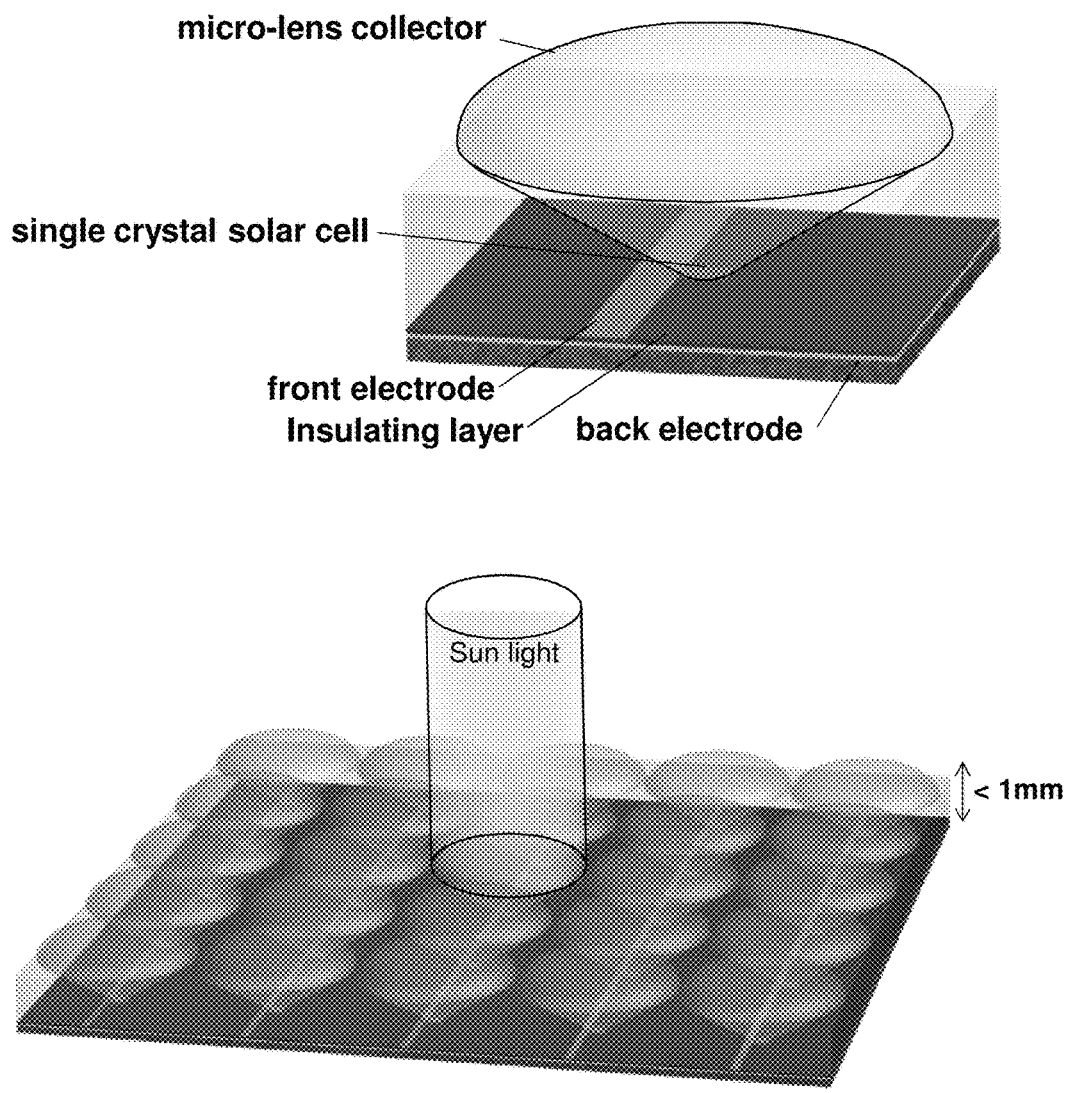
FIG. 17C provides a schematic process flow diagram illustrating the operation of the integrated solar cell/collector arrays.

FIG. 17A provides a schematic process flow diagram illustrating fabrication of integrated solar cell/collector arrays by printing solar cells. As shown in this figure solar microcells are fabricated in a dense array on a wafer. A stamp is brought into contact with the dense solar cell array and used to transfer the solar cells from the wafer to a target assembly substrate. As shown in FIG. 17A, the solar microcells in the array are transferred onto the back electrode of the target assembly substrate via contact printing. FIG. 17B provides a schematic process flow diagram illustrating fabrication of integrated solar cell/collector arrays via interconnection of registry of an optical array. As shown in this figure solar microcells are printed on a target substrate. The substrate is further processed to provide front electrode and an insulating layer. Next, a molded micro array of microlenses is integrated into the optical system such that each lens in the array is individually addressed to at least one solar microcell. FIG. 17C provides a schematic process flow diagram illustrating the operation of the integrated solar cell/collector arrays. In this embodiment, each microlens collector/concentrator is individually addressed and optically aligned with a single crystal solar cell, as shown in the top panel of FIG. 17C. Also shown in this figure are the front electrode, insulating layer and back electrode. The bottom panel of FIG. 17C schematically shows interaction of sun light with the optical system.

FIG. 18A provides a schematic diagram (not to scale) showing operation of the integrated collecting/concentrating optics (lens) and solar-cell arrays of an optical system of the present invention. The collection and focusing of incident light is provided by the ray diagrams provided in this figure, which show light incident to the optical concentrator is focused on the active area of a printed microsolar cell addressed to the optical concentrator. A gold layer provides a bonding layer to affix the microsolar cell to the device substrate. FIG. 18B shows an expanded view of a microsolar cell of the present invention assembled via printing. The solar cell is a multilayer structure comprising an antireflection layer, top contact, p-n junction and a bottom aluminum layer.

Figure 19:
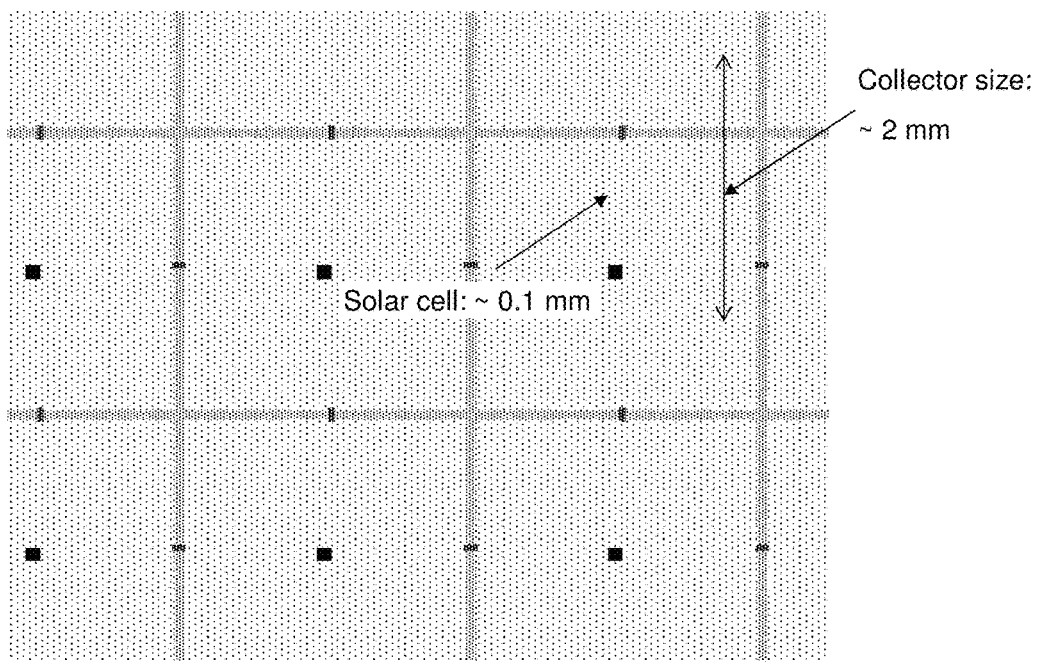
FIG. 19 provide a schematic diagram illustration of light harvesting via reduction of semiconductor materials costs in a sheet-like form factor. The collector size is approximately 2 mm, the solar cell size is approximately 0.1 mm, and the area multiplication (ratio of collector area and solar cell area) is approximately 400. As demonstrated by the calculation show in this figures 1 $ft^2$ of processed semiconductor wafer results in approximately 400 $ft^2$ of light-harvesting area. This calculation demonstrates the methods and optical systems of the present invention provide a high efficiency and low cost fabrication strategy for high performance photovoltaic devices and systems.

FIG. 19 provides a schematic diagram illustrating design and fabrication strategies of the present invention for light harvesting via reduction of semiconductor materials costs in a sheet-like form factor. The collector size is approximately 2 mm, the solar cell size is approximately 0.1 mm, and the area multiplication (ratio of collector area and solar cell area) is approximately 400. As demonstrated by the calculation show in this figure 1 ft$^2$ of processed semiconductor wafer results in approximately 400 ft$^2$ of light-harvesting area. This calculation demonstrates that the methods and optical systems of the present invention provide a high efficiency and low cost fabrication strategy for high performance photovoltaic devices and systems.

Figure 20:
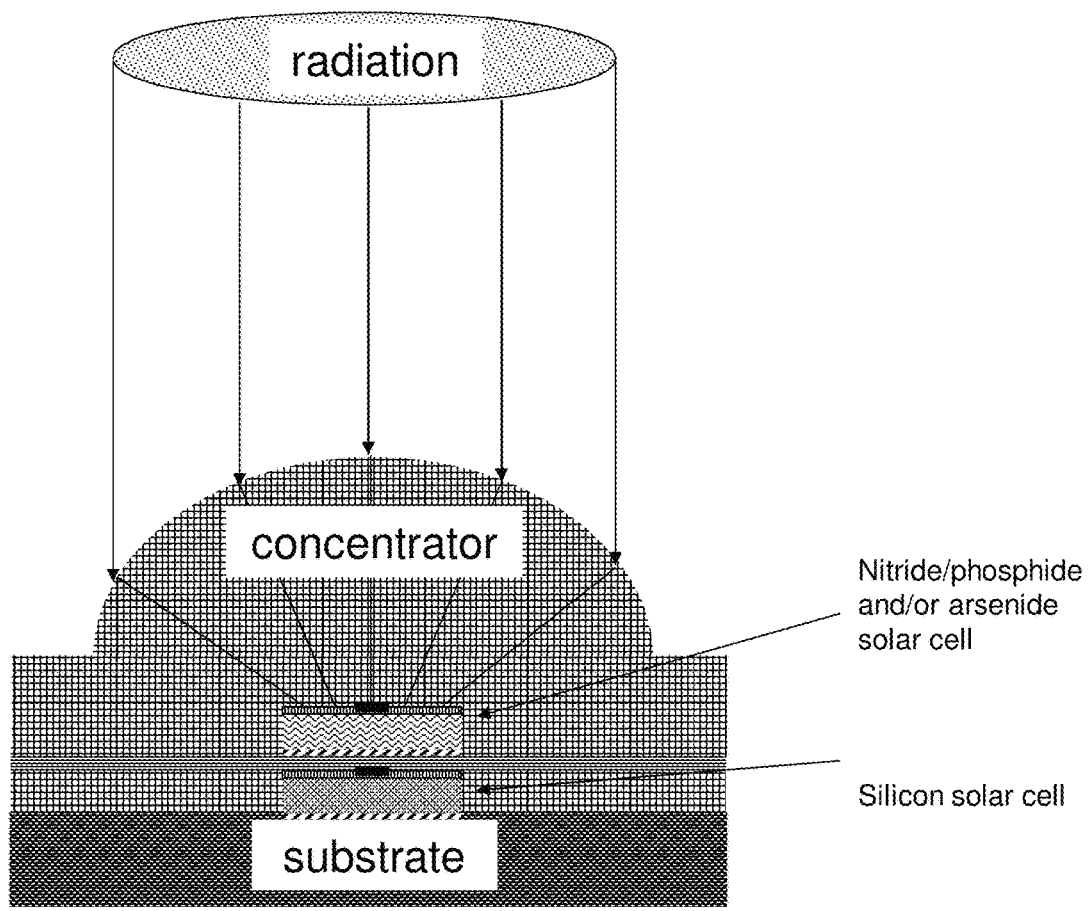
FIG. 20 provides a schematic diagram of a collecting optic and heterogenously composed solar cell of a solar cell array (sympevolent/diventegration) of the present invention. As shown in this figure, collecting optics are provided in optical communication with a nitride/phosphide and/or arsenide solar cell and silicon solar cell assembled on the device substrate via contact printing.

FIG. 20 provides a schematic diagram of a collecting/concentrating optic and heterogenously composed solar cell of a solar cell array (sympevolent/diventegration) of the present invention. As shown in this figure, collecting optics are provided in optical communication with a nitride/phosophide and/or arsenide solar cell and silicon solar cell assembled on the device substrate via contact printing. FIG. 20 also provides ray diagram of the incident light showing collection and focus functionality of a concentrator and individually addressed solar cells. Single crystal multilayer solar cells (i.e. third generation solar cells) are typically grown by MOCVD and are constrained by the necessity of crystal lattice mismatch between layers. In our system different absorbing layers can have arbitrary lattices and the materials selected for optimal spectrum absorption for each layer.

Figure 21:
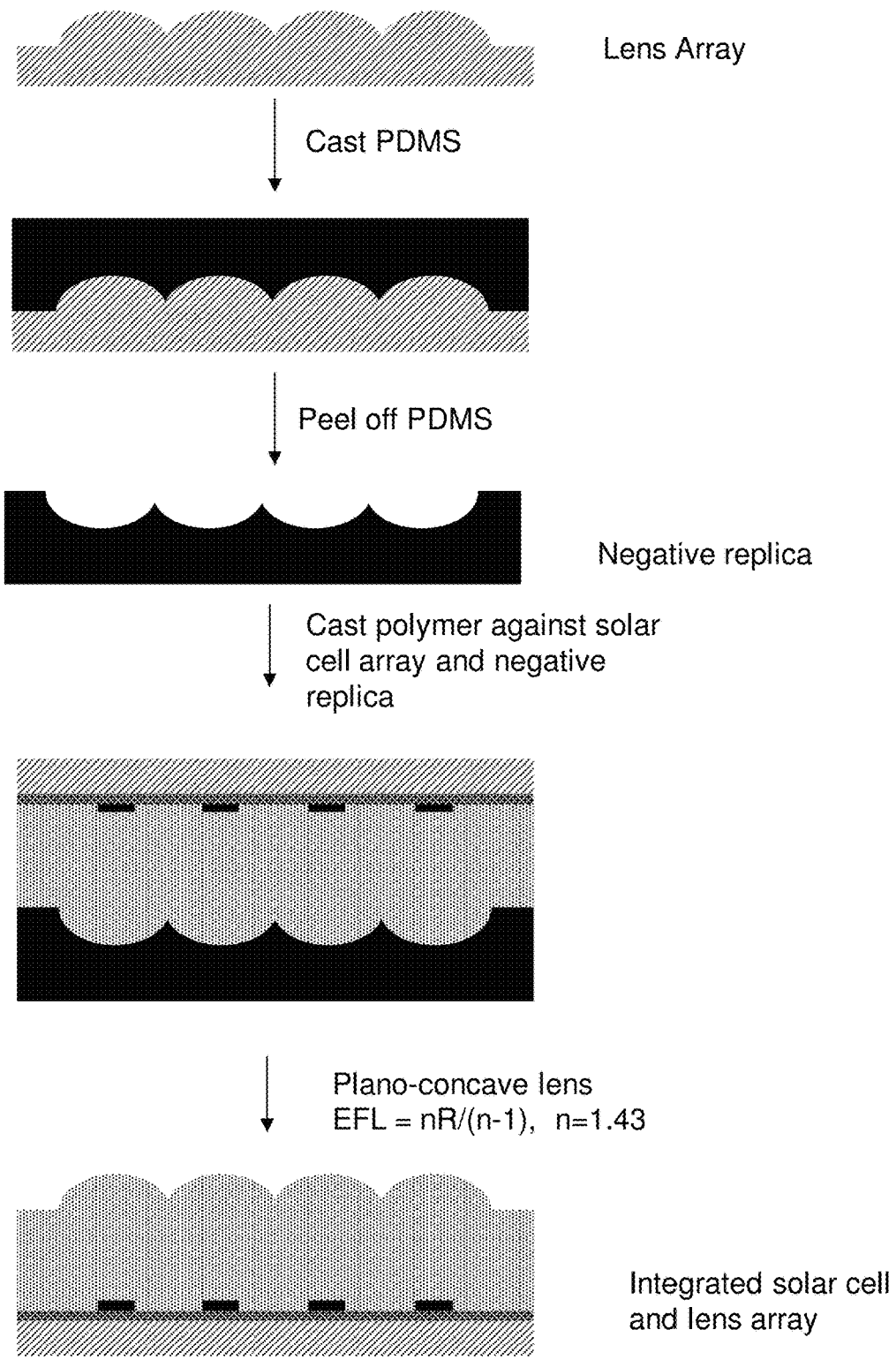
FIG. 21 provides a schematic process flow diagram for fabrication of an integrated solar cell and lens array using a combination of replica molding methods and contact printing. As shown in this figure a master lens array is used to generate a negative replica mold, for example via replica molding or imprinting techniques. Next, the molded PDMS layer is used to generate a plano-concave polymer lens array by casting the polymer against the negative replica.

FIG. 21 provides a schematic process flow diagram for fabrication of an integrated solar cell and lens array using a combination of replica molding methods and contact printing. As shown in this figure a master lens array is used to generate a negative replica mold, for example via replica molding or imprinting techniques. Next, the molded PDMS layer is used to generate a plano-concave polymer lens array by casting the polymer against the negative replica. As shown in FIG. 21, solar cells printed onto a device substrate are provided in optical communication with the lens array so as to generate an optical system of the present invention.

Figure 22:
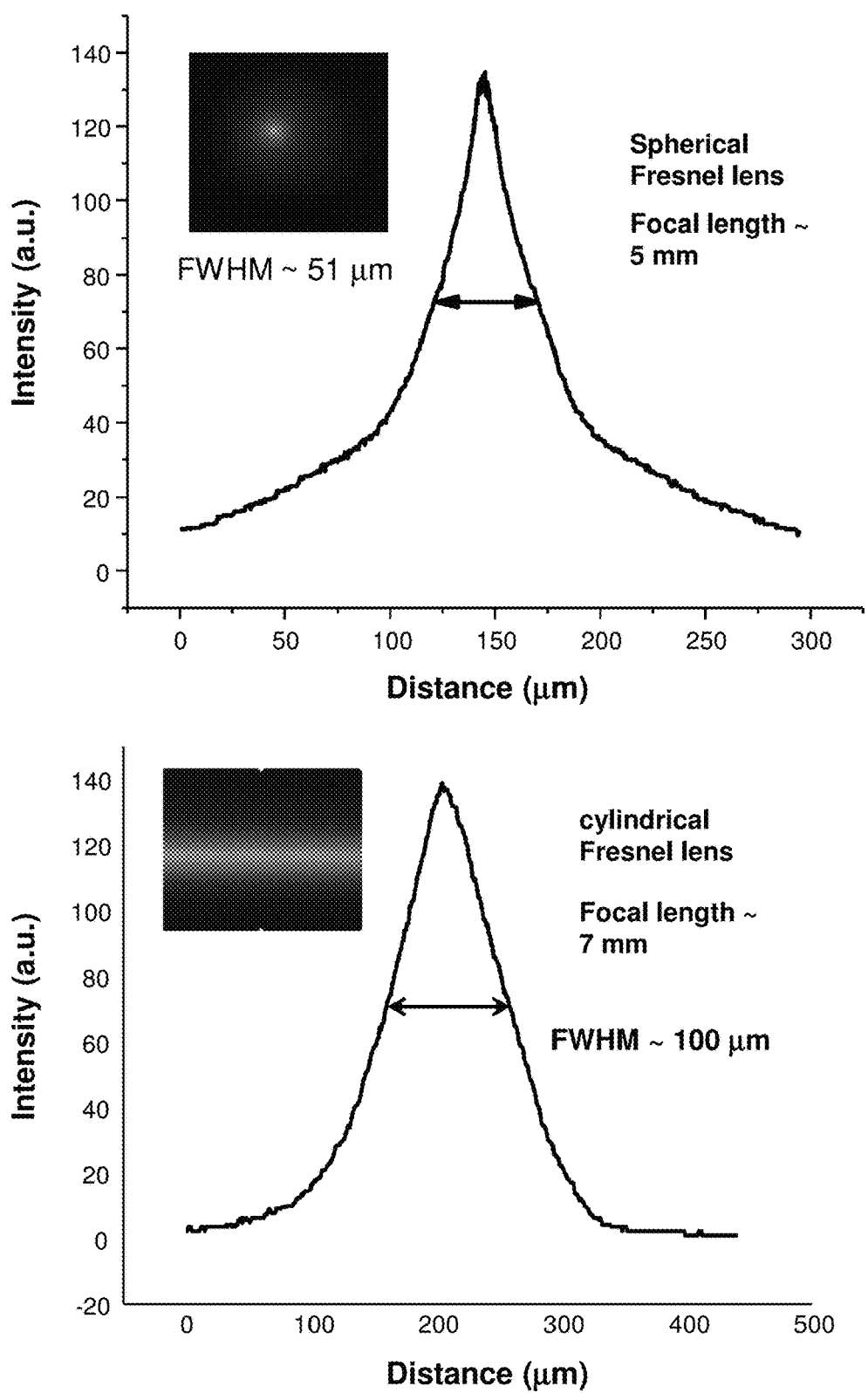
FIG. 22 demonstrates the ability of Fresnel lenses, a type of concentrating/collecting optic, to focus light to a small area for use in light harvesting systems described by the present invention. Fresnel lens arrays can be used as optical concentrators due to its advantageous features such as thin form factor and light weight compared with conventional lenses. The figure shows a focal area measurement for spherical and cylindrical Fresnel lenses.

FIG. 22 demonstrates the ability of Fresnel lenses, a type of concentrating/collecting optic, to focus light to a small area for use in light harvesting systems described by the present invention. Fresnel lens arrays can be used as optical concentrators due to their advantageous features such as thin form factor and light weight compared with conventional lenses. FIG. 22 shows a focal area measurement for spherical and cylindrical Fresnel lenses.

Figure 23:
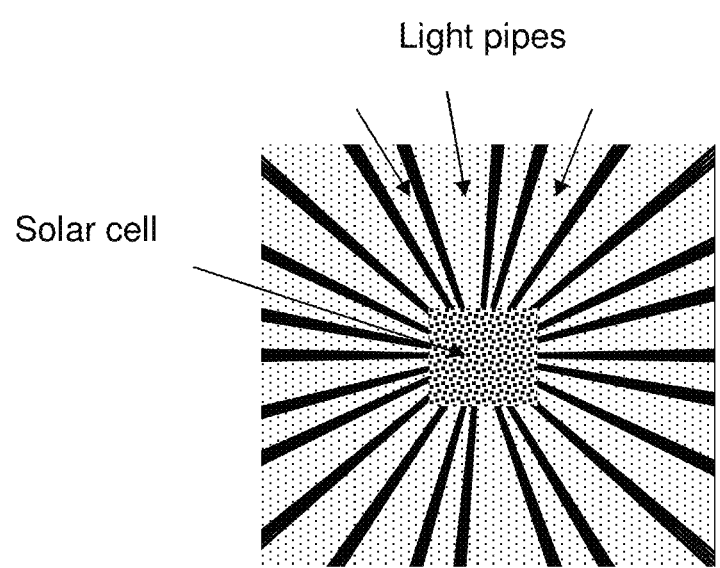
FIG. 23 provides a schematic diagram illustrating an optical system of the present invention wherein horizontal light pipes and/or waveguides are provided for light harvesting. This optical system uses transparent, structured media of appropriate index of refraction to capture normally- or obliquely-incident light and guide it in the plane of the substrate to a solar cell or solar cell array.

FIG. 23 provides a schematic diagram illustrating an optical system of the present invention wherein horizontal light pipes and/or waveguides are provided for light harvesting. This optical system uses transparent, structured media of appropriate index of refraction to capture normally- or obliguely-incident light and guide it in the plane of the substrate to a solar cell or solar cell array. As shown in this figure a plurality of waveguide structures, such as light pipes, are in optical communication and individually addressed a solar cell such that the light collected by each waveguide is directed to the solar cell.

Figure 24:
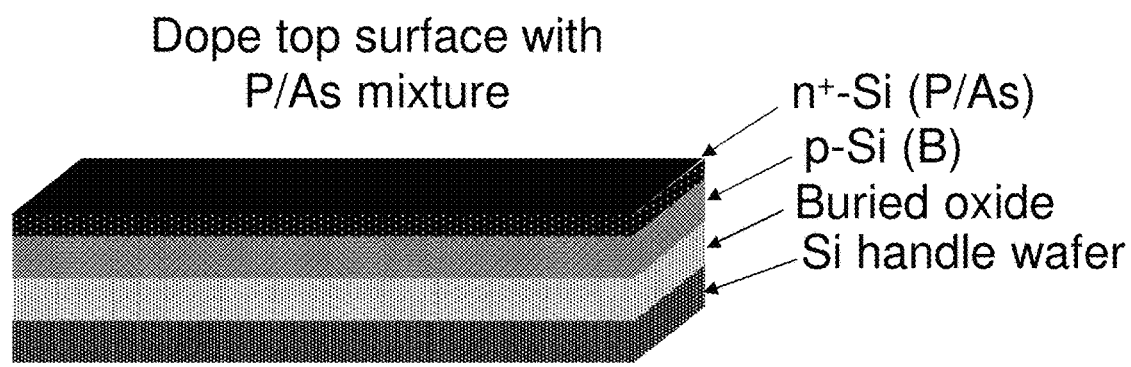
FIG. 24 provides a schematic showing an exemplary printable silicon solar cell fabricated using a silicon on insulator SOI wafer. The solar cell comprises a doped top surface with a P/As mixture and is supported by a buried oxide layer of the SOI wafer.

FIG. 24 provides a schematic showing an exemplary printable silicon solar cell fabricated using a silicon on insulator SOI wafer. The solar cell comprises a doped top surface with a P/As mixture and is supported by a buried oxide layer of the SOI wafer. FIG. 24 shows the solar cell multilayer structure comprising a n$^+$-Si (P/As) layer and p-Si(B) layer. In an embodiment, the silicon solar cell is assembled into a photovoltaic system via a method comprising the steps of: (i) patterning the surface of the SOI wafer, for example using ICP-RIE, so as to define the physical dimensions of one or more printable solar cell structures; (ii) releasing printable solar cell structures, for example via HF undercut etch processing wherein the buried oxide layer is selectively etched thereby releasing the printable solar cell structures; (iii) retrieving the silicon printable structures, for example using an elastomeric (e.g., PDMS) stamp which is contacted with the released printable solar cell structures and pulled away from the SOI substrate, thereby transferring the printable solar cell structures from the substrate to the elastomeric stamp; (iv) depositing back metallization of the printable solar cell structures, for example using CVD, PVD or thermal deposition methods; (v) transferring printable silicon structures having back metallization from the elastomeric stamp to a metallized device substrate via contact printing, optionally in combination with a cold-welding bond step; (vi) annealing the solar cell structures printed onto the device substrate to activate Al-doped p+ region; (vii) casting an insulating/planarization layer on the printed solar cell structures; (viii) depositing top electrical contacts onto the printed solar cells, for example using a combination of photolithography and evaporation processing; (iv) depositing a $Si_3N_4$ antireflecting coating on the solar cell array and (v) integrating the concentrator optics, such as a lens array, to the top of the micro-solar cell array.

Figure 25:
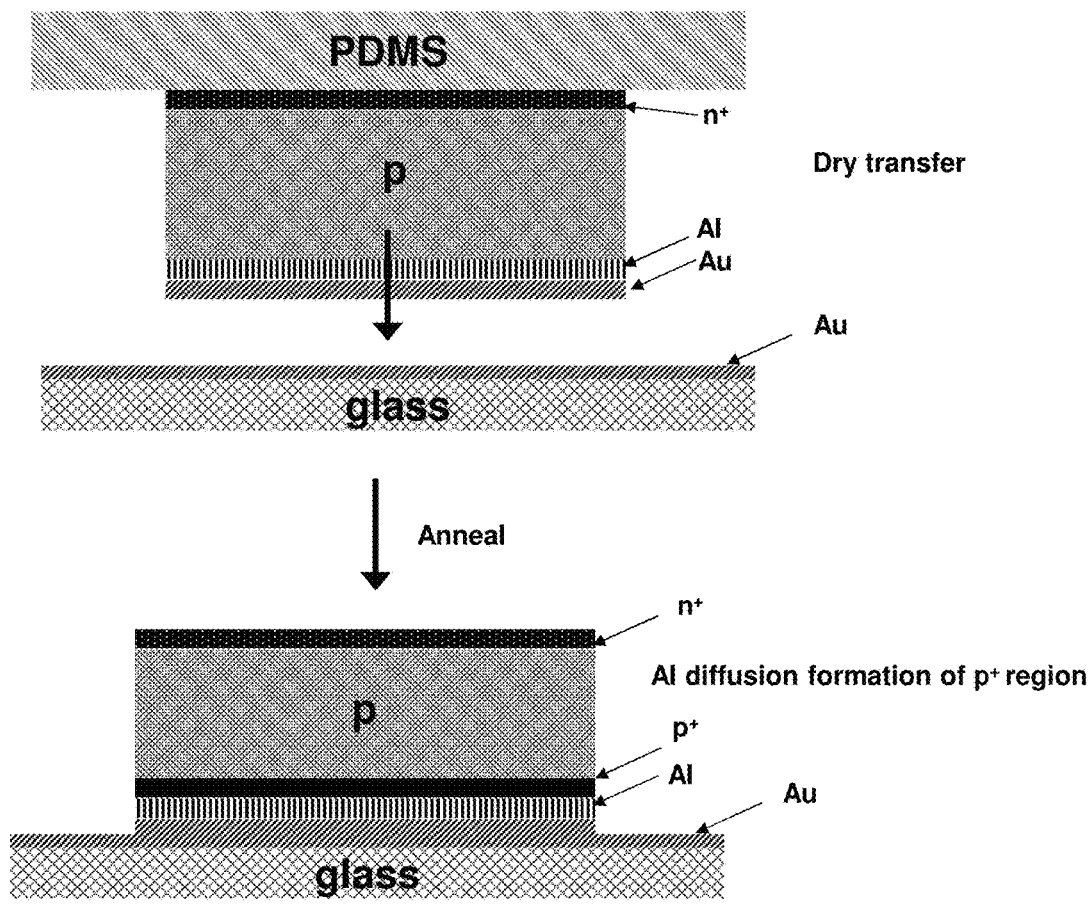
FIG. 25 provides a schematic process flow diagram illustrating a method of transferring a printable solar cell to substrate using contact printing and subsequent cold welding processing to affix the solar cell to a device substrate.

FIG. 25 provides a schematic process flow diagram illustrating a method of transferring a printable solar cell to substrate using contact printing and subsequent cold welding processing to affix the solar cell to a device substrate. As shown in the figure, the solar cell is contacted with an elastomeric stamp (e.g. PDMS stamp). A thin gold layer is provided to the external aluminum layer of the printable solar cell. The surface of the solar cell having the thin gold layer is contacted with a metallized receiving surface of the device substrate. The elastomeric stamp is subsequently moved away from the substrate resulting in transfer of the printable solar cell to the device substrate. Finally the transferred solar cell is annealed to activate the aluminum doped p$^+$ region.

Figure 26:
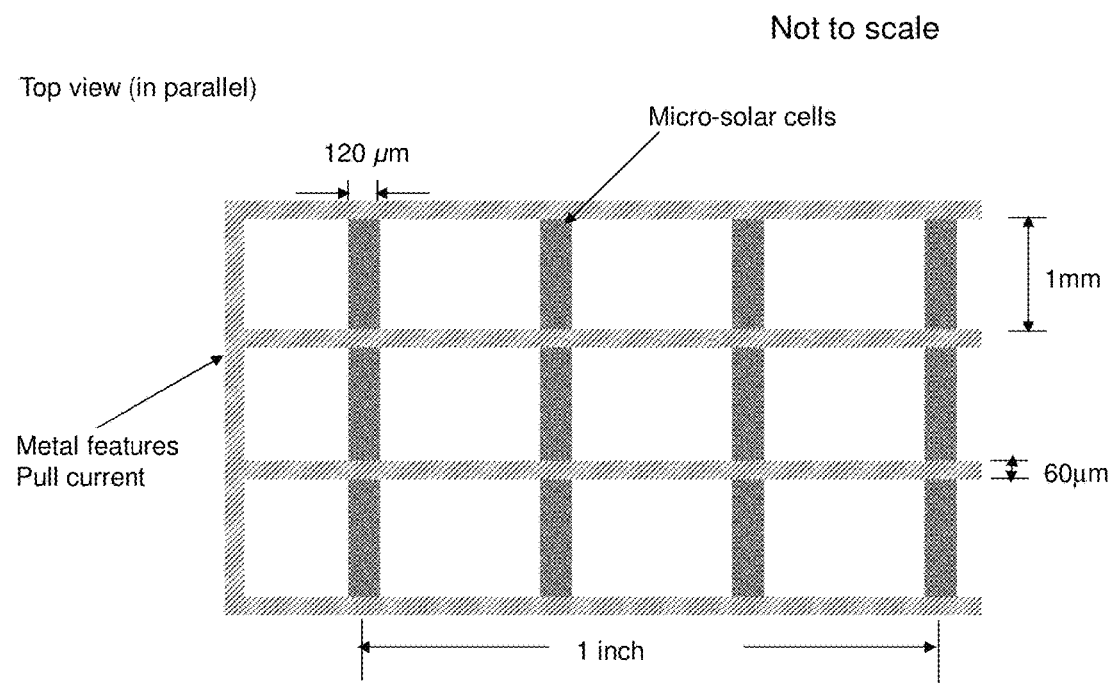
FIG. 26 provides a schematic diagram (not to scale) showing a top view (in parallel) of an exemplary configuration for top contacts to solar arrays of the present invention. Microsolar cells (shown in gray) having widths of approximately 120 microns and lengths of approximately 1 millimeter are provided in an array format on a device substrate. Metal features are provided having widths of 60 microns and length on the order of 1 inch. The metal features provide the top contacts of a solar cell device array of the present invention. This figures shows a flexible strip light made of blue LEDs and a thin kapton substrate with a bending radius equal to 0.85 cm.

FIG. 26 provides a schematic diagram (not to scale) showing a top view (in parallel) of an exemplary configuration for top contacts to solar arrays of the present invention. Microsolar cells (shown in gray) having widths of approximately 100 microns and lengths of approximately 1 millimeter are provided in an array format on a device substrate. Metal features are provided having widths of about 60 microns and lengths on the order of 1 inch. The metal features provide the top contacts of a solar cell device array of the present invention.

Figure 27:
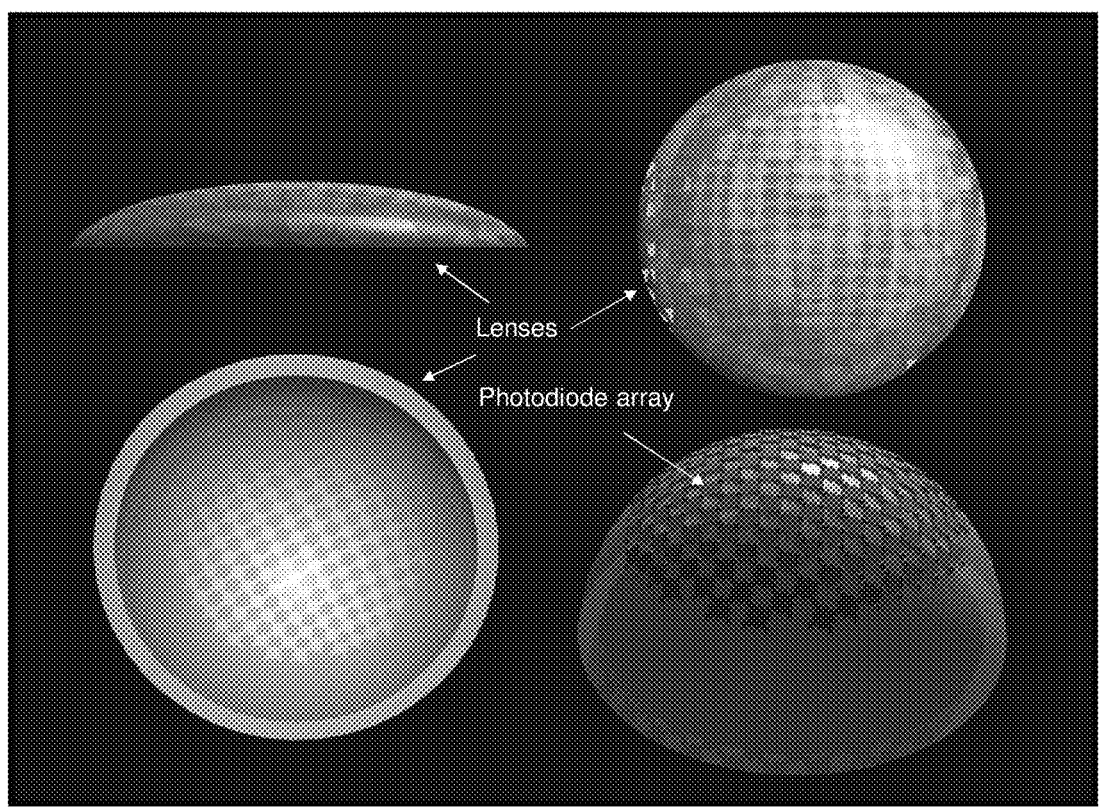
FIG. 27 provides a schematic diagram of an "artificial eye" sensor of the current invention. The sensor comprises inorganic photodiode arrays distributed on a lens having spherical curvature. Various lens shapes and angles are shown in FIG. 27
Figure 28:
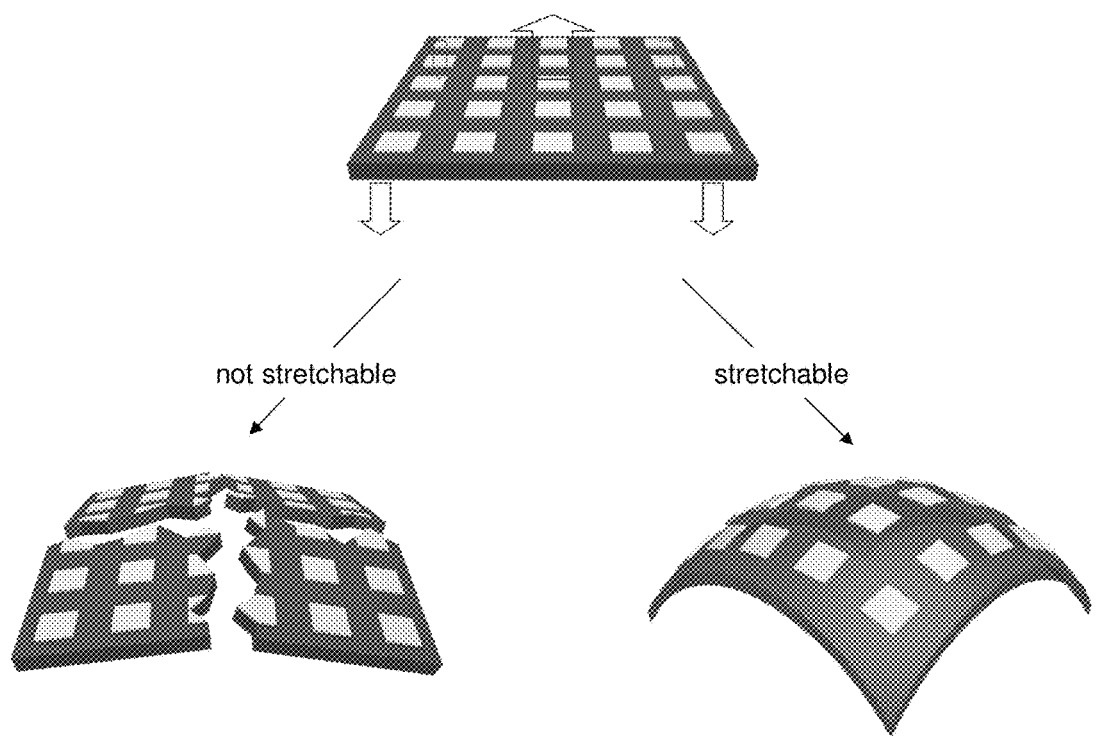
FIG. 28 provides a schematic diagram illustrating wrapping a planar sheet around a spherical surface demonstrating the necessity of stretchability in an exemplary "artificial eye" sensor.

FIG. 27 provides a schematic diagram of an "artificial eye" sensor of the current invention. The sensor comprises an inorganic photodiode array distributed on a lens having spherical curvature. Various lens shapes and angles are shown in FIG. 27. FIG. 28 provides a schematic diagram illustrating the process of wrapping a planar sheet around a spherical surface demonstrating the necessity of stretchability in an exemplary "artificial eye" sensor. As shown in FIG. 28, conformal positioning of the planar sheet on a spherical receiving surface requires some degree of stretchability to avoid failure.

Example 1. Ultra Thin Flexible Solar (UTFS) Devices and Methods

Photovoltaic (PV) energy conversion is the direct conversion of sunlight into electricity using a semiconductor device structure. The most common technology in the PV industry is based on single crystalline and polycrystalline silicon technology. Presently, silicon PV technology has high materials costs, due to the relatively inefficient use of the bulk silicon material. In conventional methods, bulk crystalline silicon is sawn into wafers, which are then processed into solar cells and soldered together to form the final module. Typical multicrystalline efficiencies are on the order of 15%; high-performance, single-crystal silicon has been produced with 20% efficiency. For this type of solar cell, 57% of the cost is in materials, and of that total material cost 42% comes from the crystalline Si. In addition, these modules are rigid and heavy.

There is currently interest in thin-film PV technologies, since these systems have the potential for lower cost (due to less active material usage), and also have the ability to be deposited onto polymer substrates for low weight and flexibility. Presently, investigation is ongoing in thin film materials such as amorphous silicon, cadmium telluride (CdTe) and copper indium gallium diselenide (CIGS). CIGS-based PV cells have demonstrated cell efficiencies of 19.2%, the highest of any polycrystalline thin film material. These cells are small, laboratory-scale devices; to date, the highest large-area flexible module efficiencies are on the order of 10%. Cheaper thin film semiconductors enable material cost savings, but induce higher processing costs as the cells need to be fabricated/processed on large area substrates. Also, only low/moderate temperature processes can be used on the final assembly substrate Ideally, one would like to combine the single crystalline technologies, which have a high efficiency and large industrial knowledge base, with the low-cost, lightweight and flexible nature of the thin-film technologies. The present Ultra Thin Flexible Solar (UTFS) technology provides the means of achieving a lightweight, flexible solar module with both high efficiency and lower materials costs. Since we start with a pure silicon substrate, it enables the use of high precision and high-temperature wafer processing to fabricate state-of-the-art performance solar cells.

The present invention provides Ultra Thin Flexible Solar (UTFS) Devices generated via a novel fabrication platform combining:
1. An ultra-thin (less than 20 microns thickness) crystalline silicon solar cell, grown and etched on a single-crystal silicon wafer. The size of this cell is much less (e.g., two orders of magnitude) than those used in previous silicon-transfer processes, for example the solar cells have lengths and width that are on the order of 100 microns in some embodiments;
2. An innovative microstamping process which removes the silicon solar cell from the mother wafer and transfers it to a flexible polymer substrate; and
3. Automated interconnect of the transferred cells to form the final module, if required.

Methods and systems of the present invention utilize a microstamping contact printing process that avoids certain problems associated with past silicon transfer technologies; namely, the cracking and defects formed by attempting to transfer relatively large pieces of silicon. The present microstamping contact printing process also reduces the overall module assembly cost (compared to conventional die pick-and-place techniques) as thousands of micro-cells can be transfer-printed in parallel.

The solar cell devices and fabrication methods of the present invention have several advantages including its applicable to a wide variety of high quality crystalline semiconductors including but not limited to single crystalline silicon and other higher-efficiency materials, such as Gallium Arsenide (GaAs). In addition, combination of an ultra-thin solar cell and a polymer substrate provides devices and systems having low weight and good mechanical flexibility. Polypropylene is a polymer useful for this aspect of the present systems and methods.

Figure 29:
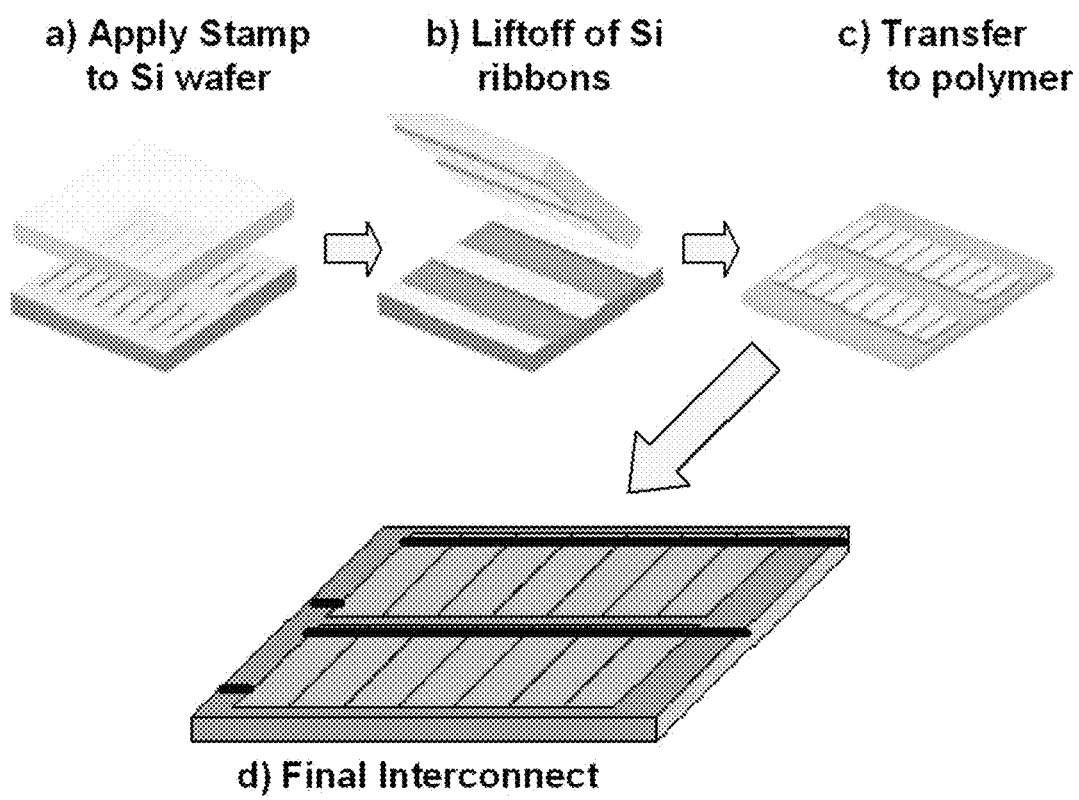
FIG. 29 provide a schematic processes flow diagram showing a method for making a microsolar cell array of the present invention.

FIG. 29 provides a schematic of a process flow diagram showing a method for making a microsolar cell array of the present invention. As shown in FIG. 29, a Si wafer is processed so as to generate a plurality of silicon-based microsolar cell ribbons. The silicon-based microsolar cell ribbons are released from the substrate. The released ribbons are lifted off and transferred to a polymer device substrate via contact printing using an elastomeric transfer device. Ribbons of silicon are assembled into a photovoltaic device array via subsequent processing including the step of providing device interconnects to the microsolar cells, and optionally light collection and concentrating optics such as a lens array.

Figure 30:
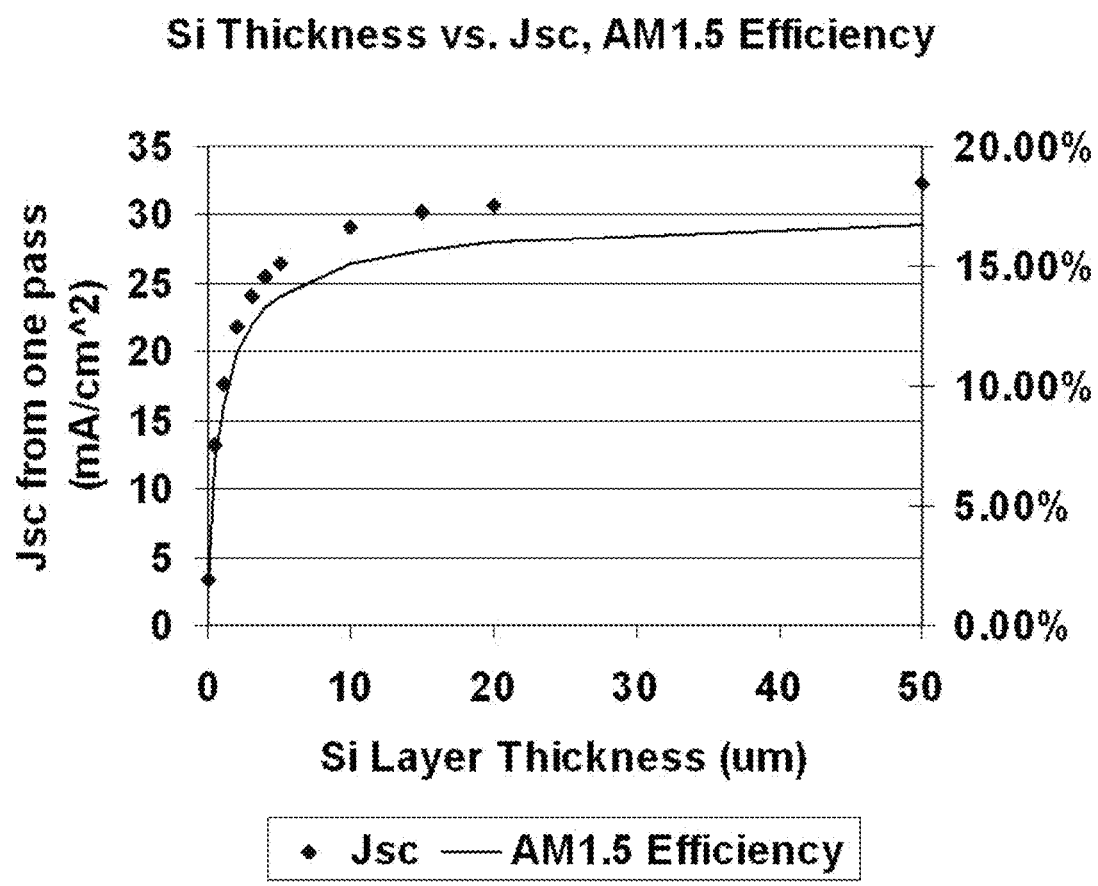
FIG. 30. Estimated Short Circuit Current ($J_{SC}$) and AM1.5 Efficiency as a function of Silicon Thickness.

As shown in FIG. 29, thin (~10 μm) silicon solar cells are transferred to polymer substrates and interconnected to form a module in a manner that retains flexibility. Selection of the thickness of the silicon component of the silicon solar cell is an important parameter in the present invention. In an embodiment, for example, the thin silicon component is thick enough to achieve a desired efficiency of ~15%. The primary impact of thickness on the cell performance is on the collected current; with a thinner cell, less photons are absorbed and hence less current is generated. FIG. 30, provides a plot of Si Layer thickness verses short circuit current ($J_{SC}$) as calculated for a simulated Si cell exposed to the AM1.5 standard spectrum used for terrestrial-based solar cells. For these calculations, we assume that the light makes three total passes through the Si layer (Once initially, once after reflection off of the back, and again after subsequent reflection off of the front side), and that the quantum efficiency of the cell is relatively high (90%).

From the results of the calculation, a silicon thickness on the order of 10-15 microns would be required in some embodiments of the present invention to achieve the desired AM1.5 efficiency of 15%. It should be noted that this relatively thick absorber layer is due to the fact that silicon is an indirect-bandgap material. A similar solar cell using a direct-bandgap material, such as gallium arsenide, can be thinner.

Figure 31:
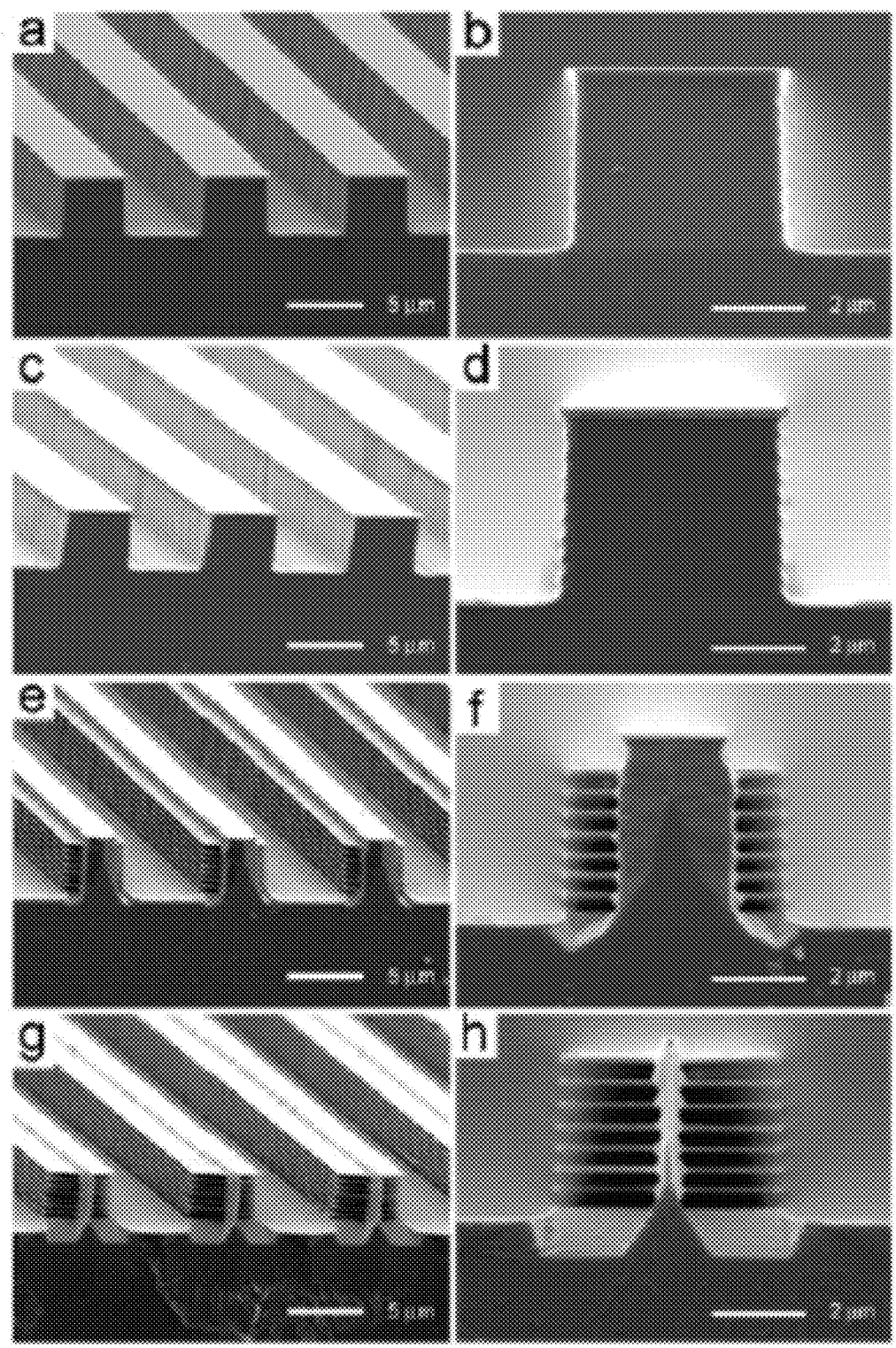
FIG. 31. Scanning Electron Micrographs Showing Sequential Formation of Si Multilayer Ribbon Stacks.

Multilayer stacks of printable silicon ribbons can be formed by using a combination of RIE and wet etching. FIG. 31 provides scanning electron micrographs showing sequential formation of Si multilayer ribbon stacks useful in some embodiments of the present invention. These are high-quality, dimensionally-uniform ribbons. By appropriate processing into p-n diodes, these can be converted into silicon solar cells.

Previous silicon transfer techniques typically glue the liftoff layer to a glass carrier, and also transfer relatively large areas of silicon (~5 cm$^2$). One of the major issues with these transfer techniques are cracks and defects formed in the Si layer.

By transferring smaller pieces of Si, we avoid cracking the transferred Si layer. We also use an innovative 'stamping' process using a poly-dimethylsiloxane (PDMS) material to grip and transfer the silicon to a polymer substrate.

A polymer such PET or PEN is useful for the substrate in terrestrial applications. For space-based applications, a space-rated polyamide such as Kapton can be used as a substrate material. Kapton is mechanically suitable for space applications, although it is known to degrade in low earth orbit due to the presence of atomic oxygen (AO).

Figure 32:
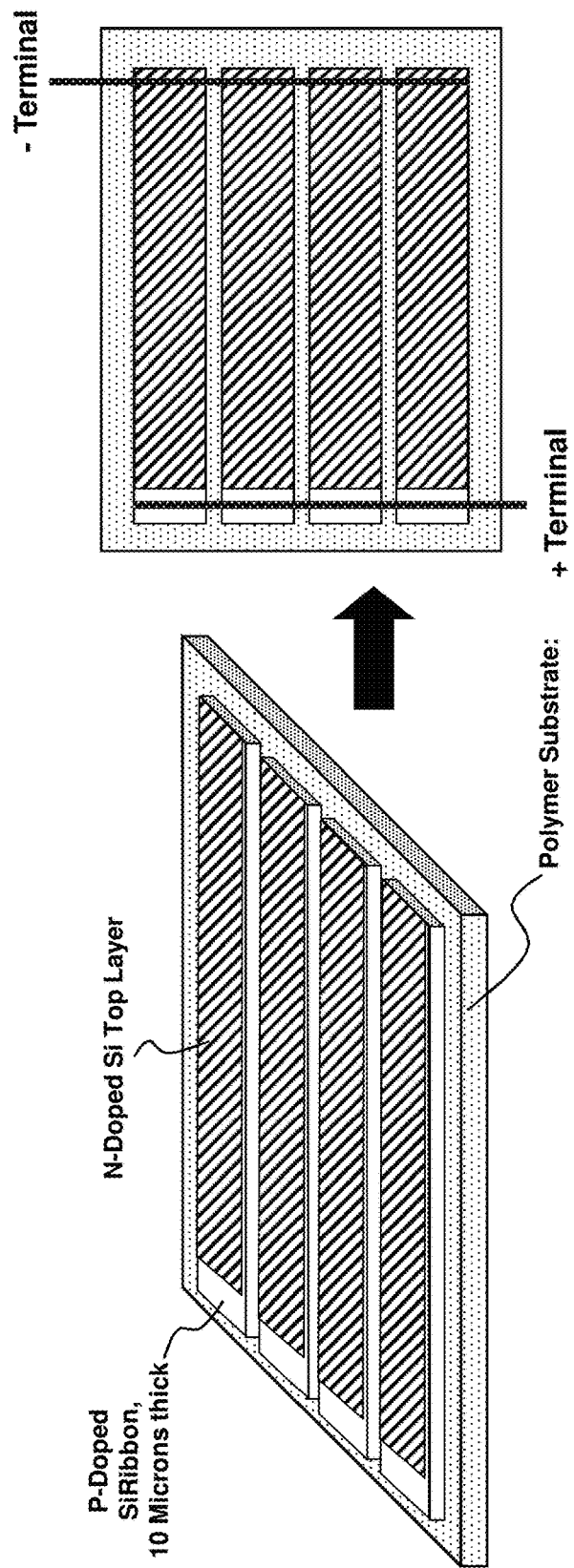
FIG. 32 provides a schematic diagram of a connection scheme where the Si ribbons comprising p-type silicon with a thin n-type layer on top to form the emitter. Left side shows the as-transferred Si Ribbons, right shows the connection (direct-write or screen-printing). Only four Si Ribbons are shown for clarity.

After transfer of the Si ribbons to the polymer substrate, they are electrically interconnected to form the final solar cell. In some embodiments, individual Si ribbons are connected in a series connection. FIG. 32 provides a schematic diagram of a connection scheme where the Si ribbons comprise p-type silicon with a thin n-type layer on top to form the emitter. After transfer, connection lines comprising conducting ink are printed onto the ribbons, either via a direct-write process or via screen-printing. The bottom panel shows the as-transferred Si Ribbons and the top panel shows the connection (direct-write or screen-printing). Only four Si Ribbons are shown for clarity.

Figure 33:
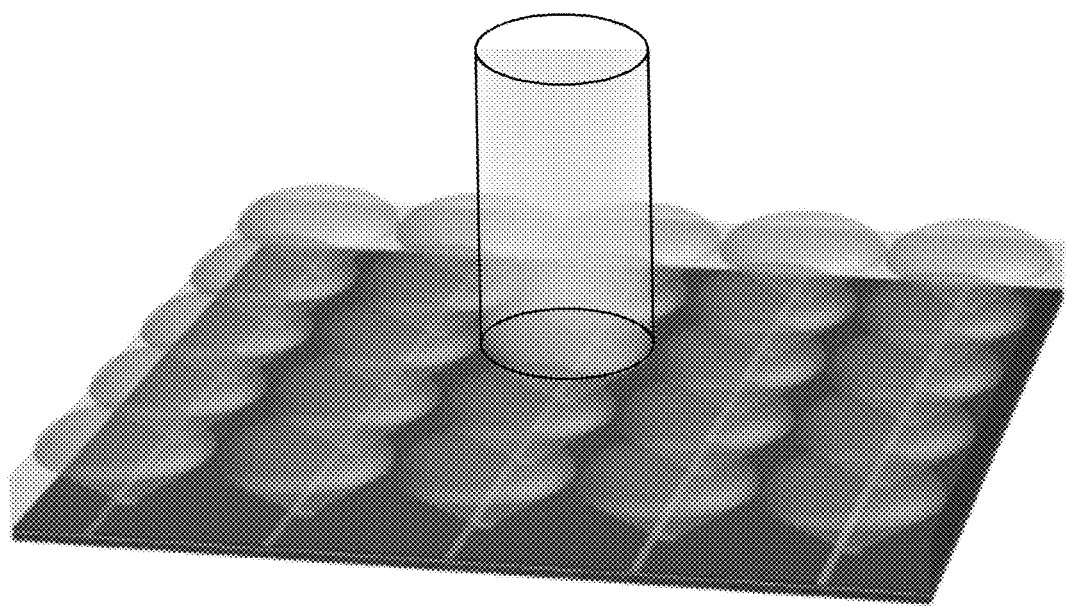
FIG. 33 provides a schematic of a solar cell array of the present invention using PDMS for concentrating solar illumination.

One of the attractions of the present technology is that it is applicable to other absorber materials; for example, the same microstamping process has been used to transfer gallium arsenide. The use of these materials has been demonstrated in concentrator solar modules. FIG. 33 provides a schematic of a solar cell array of the present invention using a PDMS concentrator array for concentrating solar illumination.

Bulk crystalline silicon is selling for over $50 per kilogram. Presently, silicon plants are coming online to meet the needs of both the PV and microelectronic industries. It is anticipated that even if bulk Si costs fall back to pre-2001 values of $20/kg, as capacity catches up with demand, overall costs will remain high. As mentioned previously, present-day Si PV is formed by sawing a crystalline ingot into wafers, then processing the wafers into cells, and then soldering the cells together to form the final module. The present industry trend is towards thinner cells, since Si thicknesses beyond ~50 microns (see FIG. 30) do not absorb any more light. Currently, the thinnest Si PV cells are on the order of 250 microns thick (about ¼ mm). Handling such thin wafers in the 'normal' PV cell processing and integration is a challenge.

Conventional wire-sawing techniques result in approximately 60% waste; that is, 60% of the original silicon ingot winds up as dust. For a 20% efficient module formed out of 250-micron-thick wafers, the silicon materials costs are estimated at $0.40/Watt. Considering that the ultimate goal of the PV industry is to achieve $1/Watt, the materials costs for such a module are significant.

For the present UTFS technology, the semiconductor materials costs is much lower. Even assuming a waste of 50%, with a 15% module with 15-micron thick silicon the materials costs are estimated at ~$0.02/Watt. This cost savings is primarily due to the better utilization of the silicon; in effect, we are 'spreading' the silicon over a greater area than in convention methods and devices.

The printing process involves the liftoff of the device element from the mother substrate onto the stamp, followed by the delivery of these elements from the surface of the stamp to the target substrate. By appropriate design of the undercut etch and liftoff of these elements from their mother substrate, it is possible to perform the liftoff step with high yields. The transfer is accomplished either by stronger van der Waals bonding between the element and the target substrate than between the element and the stamp or by the use of strong adhesive layers on the target substrate. In both cases, the area of contact between the element and the coated or uncoated surface of the target substrate must be sufficiently high to enable efficient transfer. In most case, the dominant requirement is for the bottom surfaces of the elements and the top surfaces of the target substrate to be sufficiently smooth to enable large contact areas. This requirement can be satisfied for a wide range of systems of interest. The systems considered in this example are extremely well situated to meet these flatness requirements, since they involve elements with polished back surface and target substrates that will consist of polished semiconductor wafers.

Figure 34:
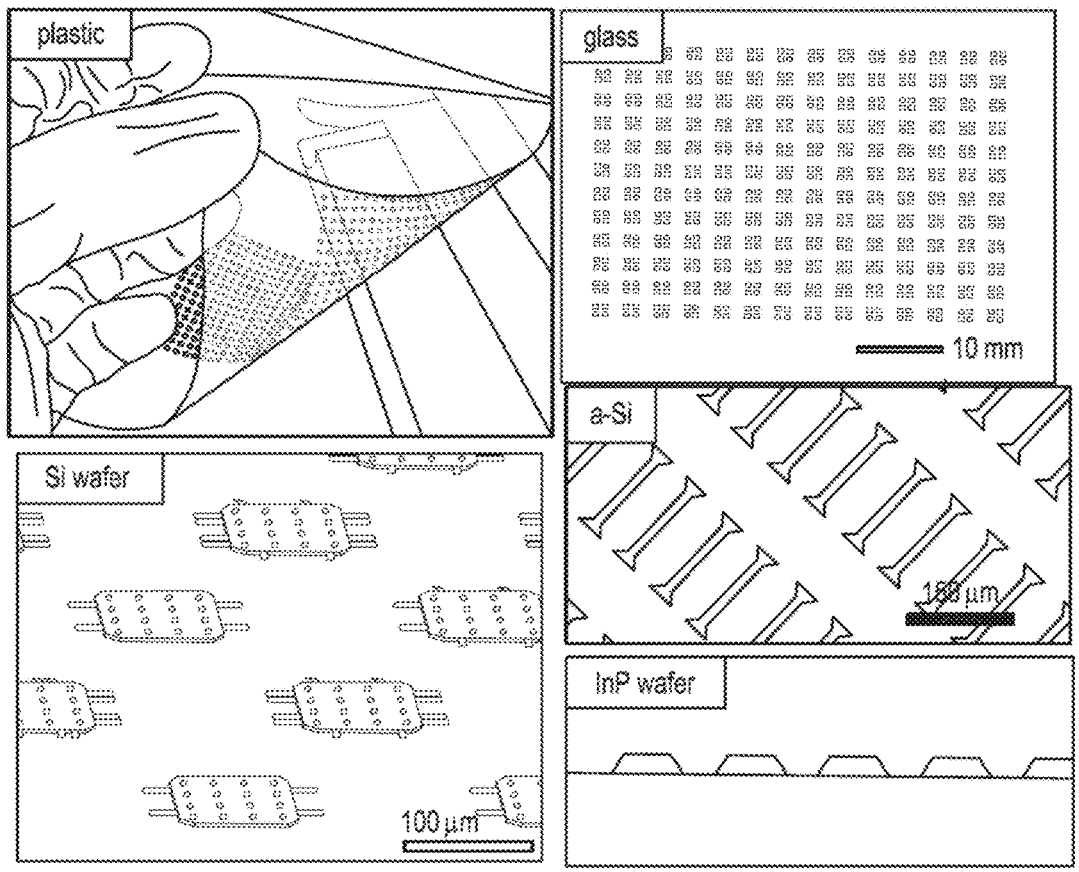
FIG. 34. provides images showing results of printing single crystal silicon onto plastic, glass, Si wafers, InP wafers and thin film a-Si. The microstamping process of the present invention is compatible with a wide range of substrates.

FIG. 34 provides images showing results of printing single crystal silicon onto plastic, glass, Si wafers, InP wafers and thin film a-Si. The microstamping process of the present invention is compatible with a wide range of substrates.

In an embodiment, the stamps used to pick-up and transfer the 'chiplets' are typically made by casting and curing a ~1 cm thick piece of rubber against a "master" substrate. The patterns present on the surface of the "master" can be replicated with extremely high fidelity (down to the nanometer scale) when low modulus silicone such as poly-dimethylsiloxane (PDMS) are used to fabricate the stamps. However, single layer stamps made out of this soft material can easily be deformed during the printing process. As a result, coarse placement accuracy is sometimes realized with these soft stamps. The present invention includes, however, use of composite stamps that provide excellent placement accuracy and pattern fidelity. U.S. patent application Ser. No. 11/115,954, for "Composite Patterning Devices for Soft Lithography", issued as U.S. Pat. No. 7,195,733, describes composite stamps designs and methods useful in the present invention and is hereby incorporated by reference in its entirety.

A low modulus material, such as PDMS, is used for the first layer to allow conformal (i.e. with no air void) contact with the top surface of the semiconductor device components. Additional thin layers (such as plastic films or glass fibers) having a high in-plane modulus is used to prevent in-plane mechanical deformations during the transfer. By using such composite stamp designs, in-plane distortions (as observed under a high magnification microscope) lower than 5 microns over a ~16×16 cm$^2$ area are achievable in soft lithography printing techniques.

In an embodiment, the printing systems comprise: (1) stamps with designs optimized for efficient transfer and for minimal distortions in the placement of the printed elements, (2) physical mounting jigs for these stamps and translation stages for moving the substrate and the stamp with submicron precision, (3) load cells interfaced to the stamps for force feedback control of contact during the 'inking' and 'printing' steps, and (4) vision systems that allow multilevel registration. In some embodiments, printing systems useful in the present invention can handle target device substrates with sizes up to 300×400 mm and donor wafers with diameters up to 4 inches. The registration is accomplished with a long working distance microscope and CCD camera that allows alignment marks on the surfaces of transparent stamps to be registered to alignment marks on the donor wafers and the target substrates. The accuracy with which the stamps can be positioned and aligned is ~0.5 μm. The registration accuracy, when implemented with new types of distortion-free composite stamps, is also in this range.

Example 2. Conformable Thin Film LED Lighting Systems

The present invention provides printing based techniques that provide a means to integrate inorganic light emitting diodes with thin flexible substrates. This approach, as implemented with automated high precision printer systems, is useful for fabricating light-weight and mechanically conformable interior lighting elements for automotive and other applications, in a manner that is compatible with low cost manufacturing.

The present methods and systems involve fabrication of conformable ILED-based thin film lighting devices followed by application to surfaces using adhesive bonding. Methods may also optionally include processing involving incorporation of encapsulation and planarizing materials, coatings and layers to enhance mechanical properties of the system. The sizes of the thin film structures, the numbers and spacings of the ILEDs and other aspects determine the device designs for specific application.

Figure 35:
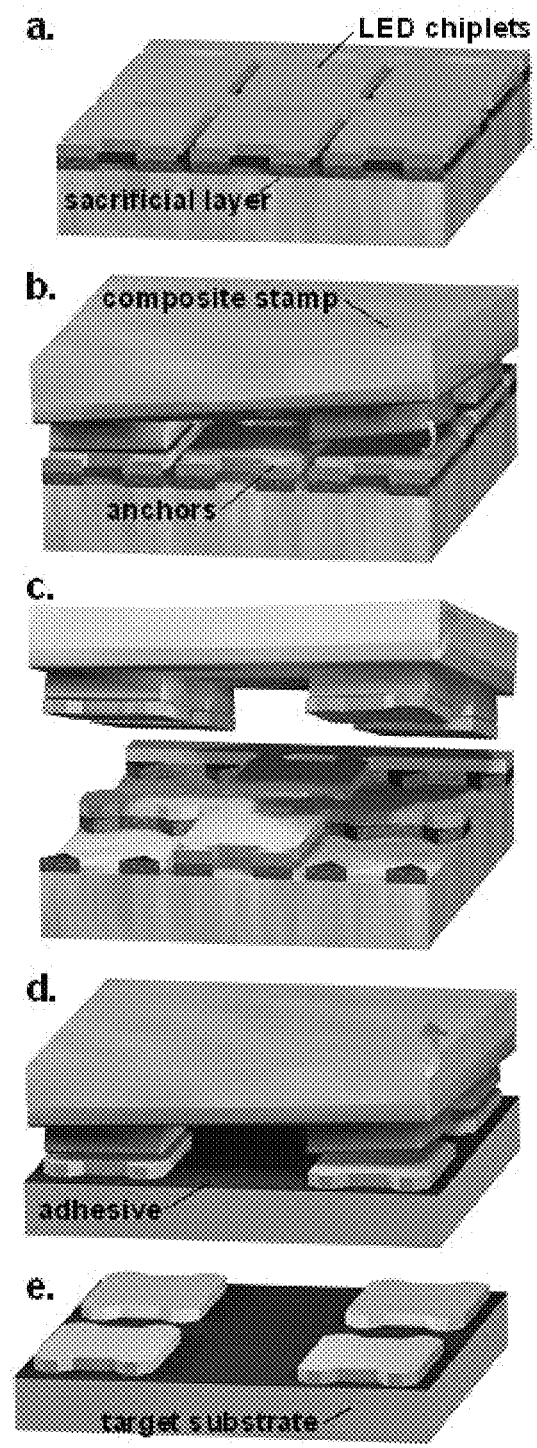
FIG. 35 shows a schematic illustration of an exemplary process of the present invention, as applied to the printing of printable inorganic semiconductor-based LEDs.

Transfer printing of micro/nanoscale semiconductor devices from source wafers to wide ranging classes of target substrates, including thin plastic sheets, is used in the present invention to fabricate conformable LED lighting systems. FIG. 35 shows a schematic illustration of an exemplary process of the present invention, as applied to the printing of printable inorganic semiconductor-based LEDs. The transfer of the ink to, and from, an elastomeric stamp is affected by kinetically modulating the adhesion energy at the stamp-'ink' and 'ink'-substrate surfaces. In the case of FIG. 35, printable inorganic semiconductor-based LEDs play the role of the 'ink'. This type of process is capable of manipulating semiconductor materials or devices with lateral dimensions between 100 nm and hundreds of microns, and with thicknesses between 20 nm and hundreds of microns. Electronic and optoelectronic systems of various types have been demonstrated with this approach, on substrates ranging from rigid glass, polymer and semiconductor wafers to thin flexible sheets of plastic. The printing itself is performed with a fully automated printer that provides both force and feedback control of the transfer process, together with microscope based vision systems for alignment. FIG. 36 provides an image and a schematic illustration of a printer useful in the present methods of fabricating conformable ILED-based thin film lighting systems.

Figure 37:
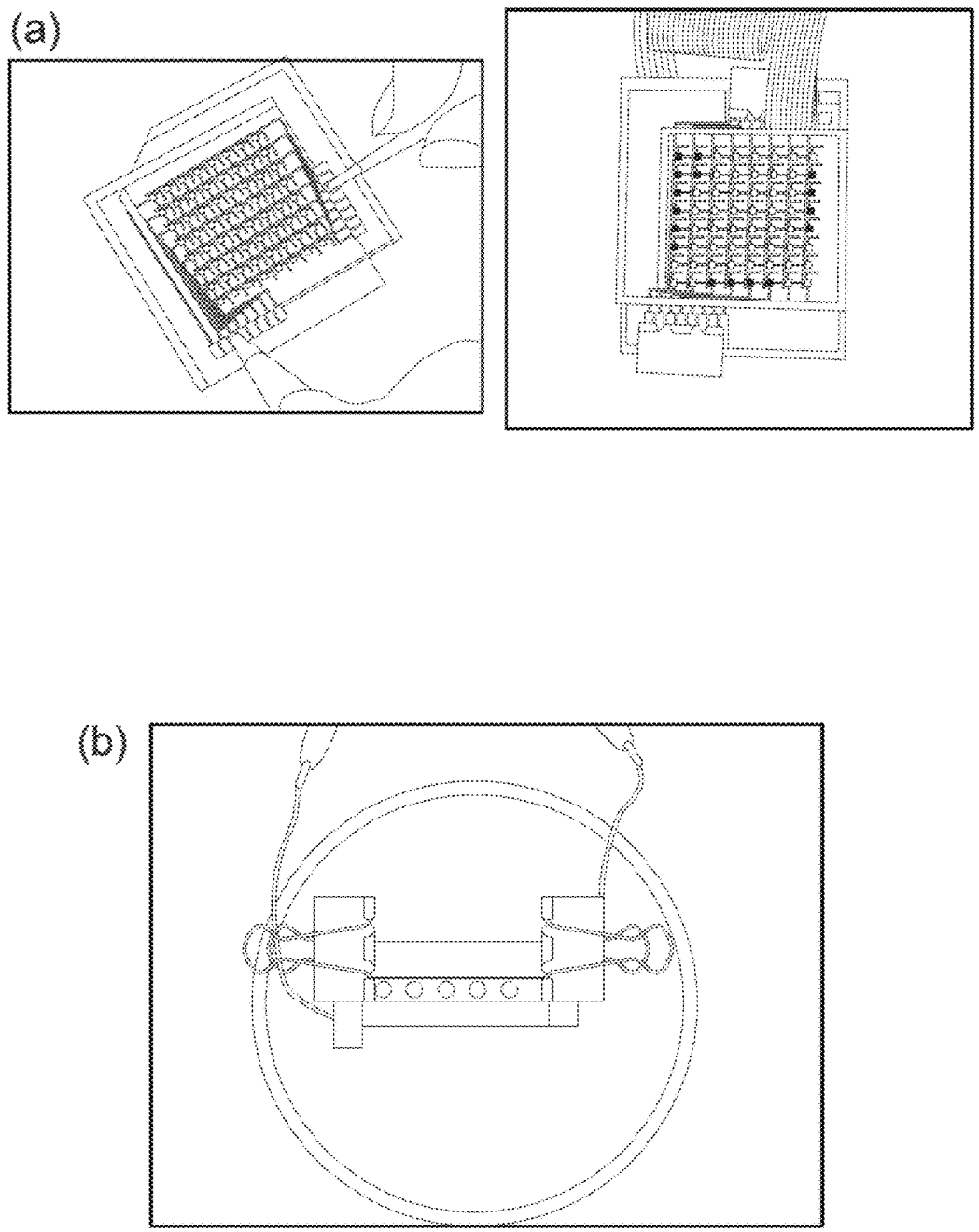
FIG. 37 provides images of square (part a) and linear (part b) lighting devices that comprise passively addressed blue inorganic LEDs assembled on plastic substrates via contact printing. The device in part (b) represents a conformal ILED-based thin film lighting device of the present invention.
Figure 38:
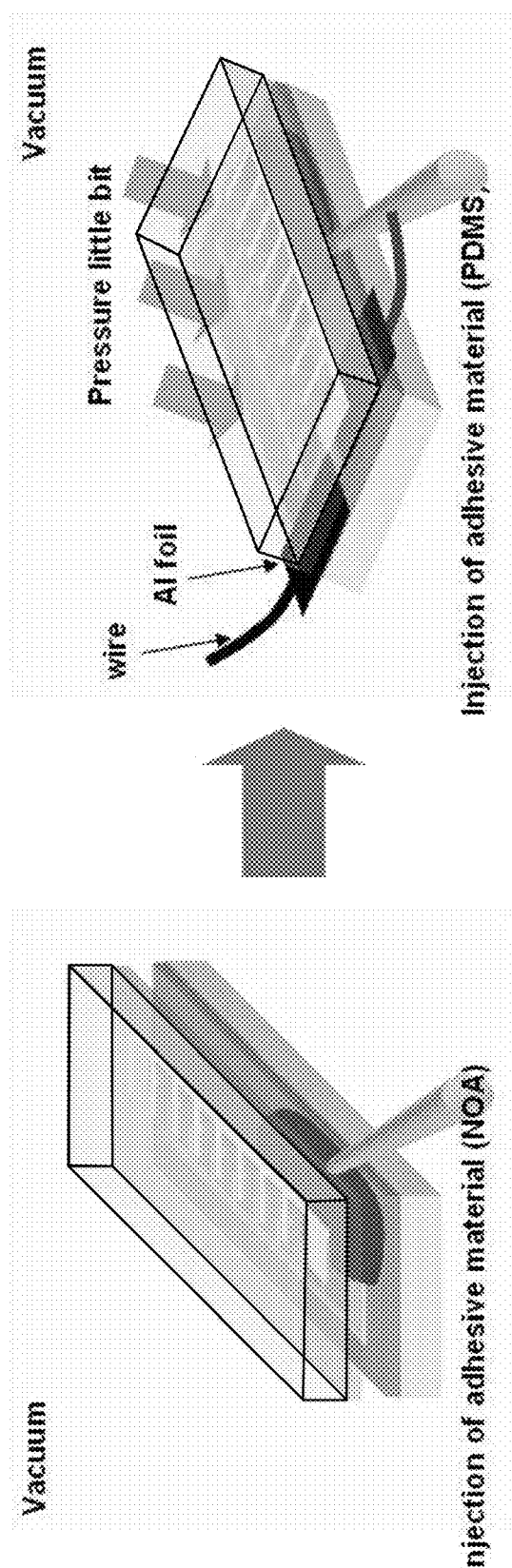
FIG. 38 provides a schematic process flow diagram of a method of fabricating a conformable LED lighting system of the present invention.

Using such an approach, a small passive matrix 8×8 lighting pad has been assembled with blue inorganic LEDs assembled on a polycarbonate substrate with prepatterned metallic interconnects. FIG. 37 provides images of square (part a) and linear (part b) lighting devices that comprise passively addressed blue inorganic LEDs assembled on plastic substrates via contact printing. The device in part (b) represents a demonstration of a thin film lighting device comprising a conformable ILED-based lighting system of the present invention. A small version of a blue ILED-based thin film lighting device is also shown in FIG. 37.

In some embodiments, conformable LED lighting systems of the present invention have utility for lighting applications for automobiles and other vehicles. In some embodiments, for example, the present invention provides reliable and low cost ILED-based thin film lighting devices that can be integrated in a conformal way with the relevant surfaces of an automobile or other vehicle.

Figure 39:
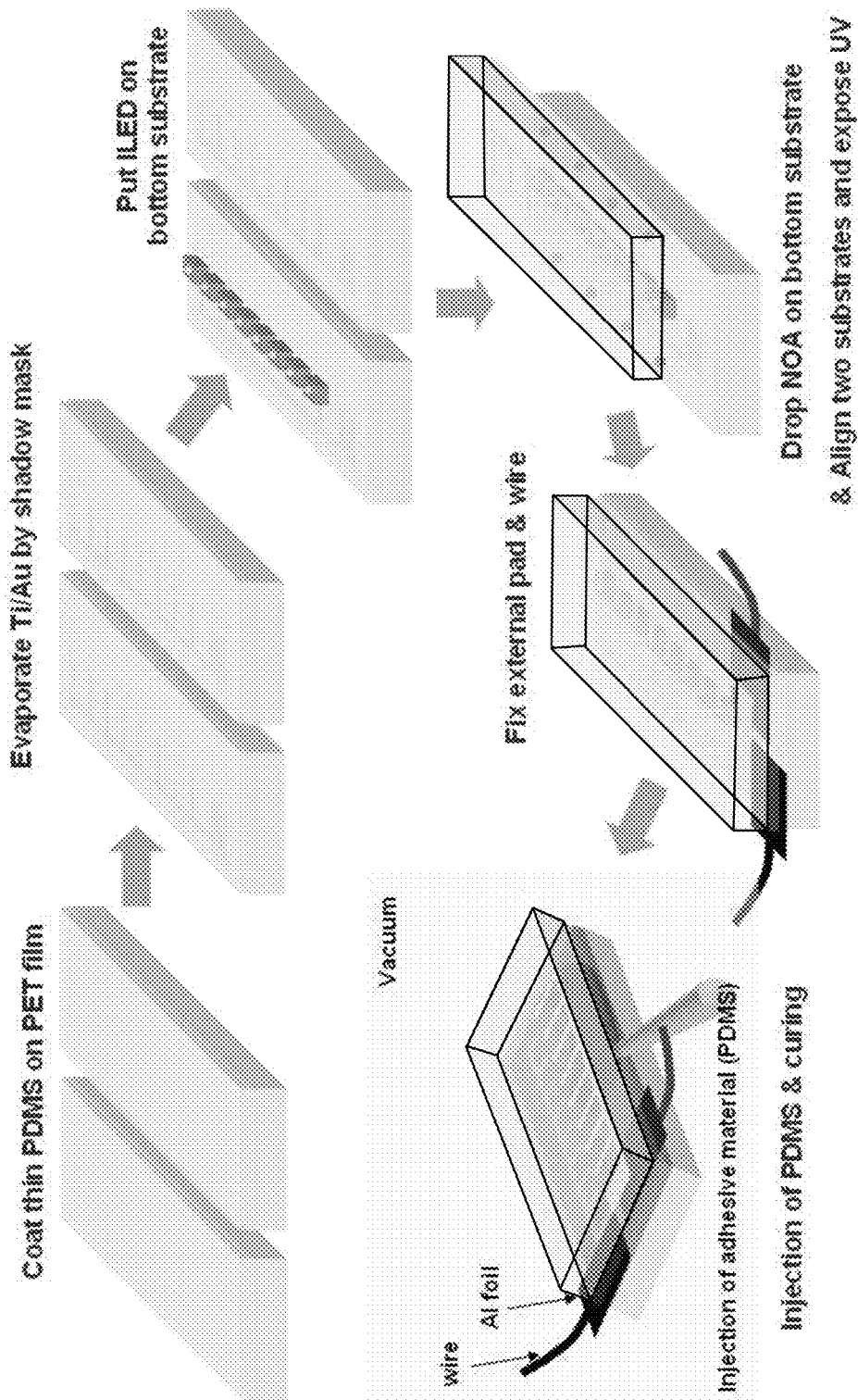
FIG. 39 provides a process flow diagram for fabricating an ILED light device of the present invention comprising a flexible strip.

FIG. 39 provides a schematic process flow diagram of a method of fabricating a conformable LED lighting system of the present invention. As shown in FIG. 39, an adhesive material is (NOA) is used to fix ILED and top/bottom substrate before injection of PDMS. In some embodiments, external power lines are installed before injection of PDMS to prevent contamination of the external pad region, as shown in FIG. 39. In some embodiments, sample is installed with tilted angle in a vacuum chamber to remove air in injected PDMS, as shown in FIG. 39. In some embodiments, pressure is applied between two substrates to keep a contact between the ILEDs and electrodes, as shown in FIG. 39. Injection of a PDMS encapsulating layer is useful for improving the bending characteristics of the device (particularly in slow bending motion) and injection of PDMS achieves a stable contact property.

FIG. 39 provides a process flow diagram for fabricating a ILED light device of the present invention comprising a flexible strip. As shown in this figure, a thin PDMS layer is provided on a PET film. Electrodes are defined and deposited via evaporation of Ti/Au and shadow masking technique. Printable ILED device elements are transferred and assembled onto the substrate via contact printing. As shown in FIG. 39, an adhesive (e.g., NOA) is provided to the bottom substrate, and the top substrate is bonded to the device. The external pad and wire is fixed and a PDMS adhesive is inject and cured, optionally under vacuum conditions, so as to encapsulate/planarize the ILED structures.

Figure 40:
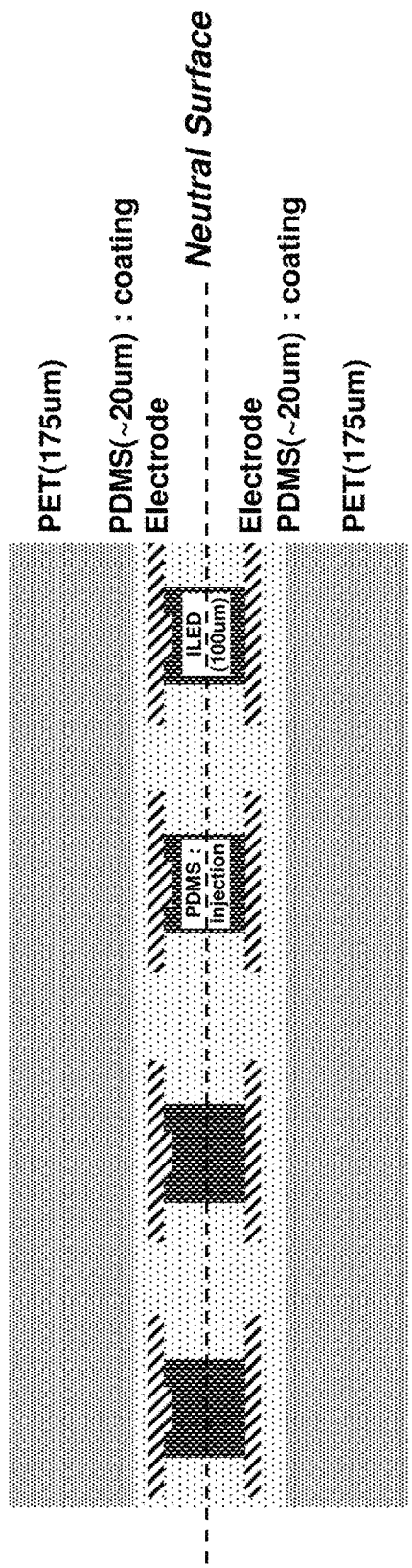
FIG. 40 provides a cross sectional view of a conformal ILED lighting system of the present invention comprising top and bottom PET substrates (approximately 175 microns thick), ILEDS structures (approximately 100 microns thick), electrodes and a PDMS encapsulating coating.

FIG. 40 provides a cross sectional view of a conformal ILED lighting system of the present invention comprising top and bottom PET substrates (approximately 175 microns thick), ILEDS structures (approximately 100 microns thick), electrodes and a PDMS encapsulating coating or layer (approximately 20-40 microns thick).

Figure 41:
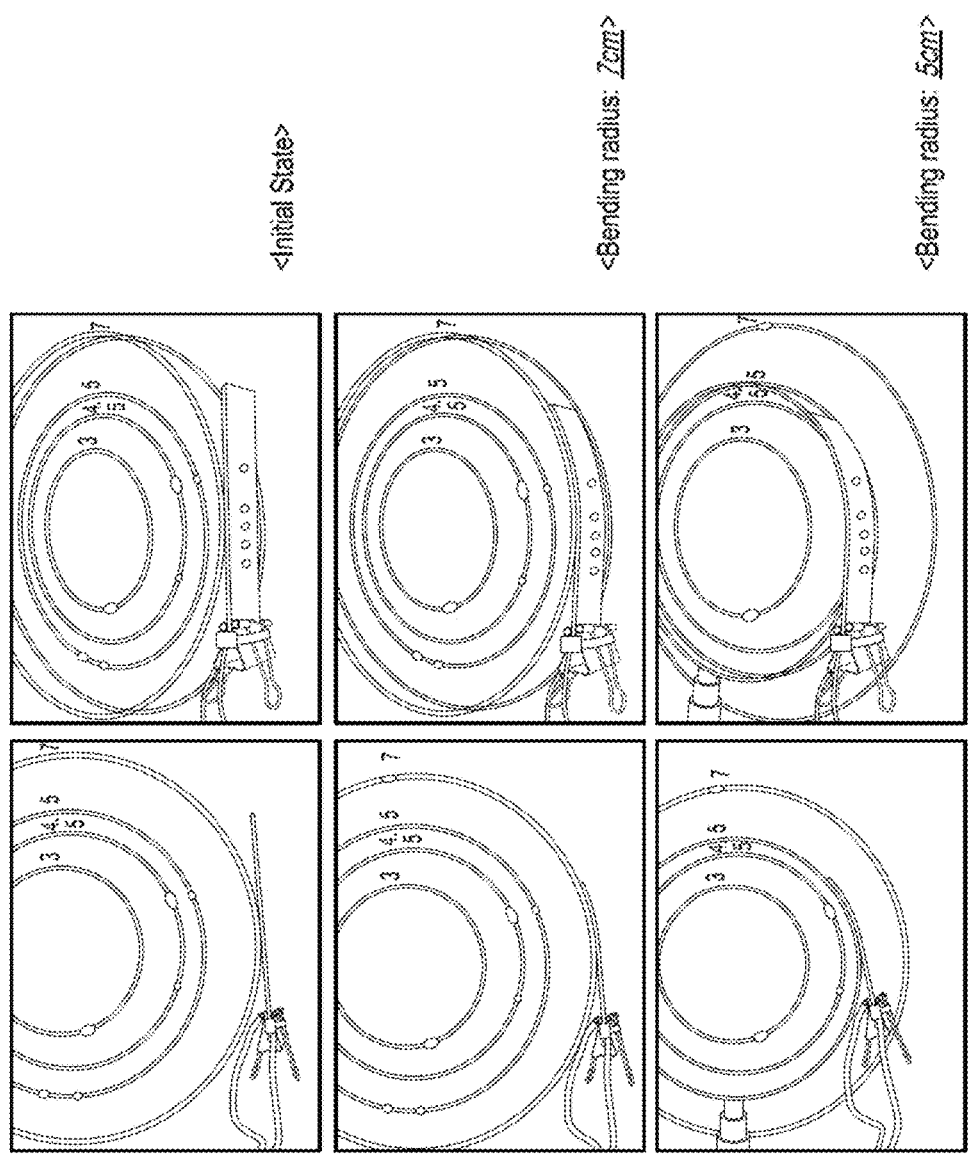
FIG. 41 provides images of ILED lighting systems of the present invention in an unbent state, a first bent state with a bending radius of 7 cm, a second bent state with a bending radius of 5 cm, third bent state with a bending radius of 4.5 cm, a fourth bent state with a bending radius of 3 cm and in a state upon release of the bending stress. The images in FIG. 42 confirm that conformal ILED lighting systems of the present invention provide useful optical properties in bent configurations.

FIG. 41 provides images of ILED lighting systems of the present invention in an unbent state, a first bent state with a bending radius of 7 cm, a second bent state with a bending radius of 5 cm, third bent state with a bending radius of 4.5 cm, a fourth bent state with a bending radius of 3 cm and in a state upon release of the bending stress. The images in FIG. 41 confirm that conformal ILED lighting systems of the present invention provide useful optical properties in bent configurations.

Figure 42:
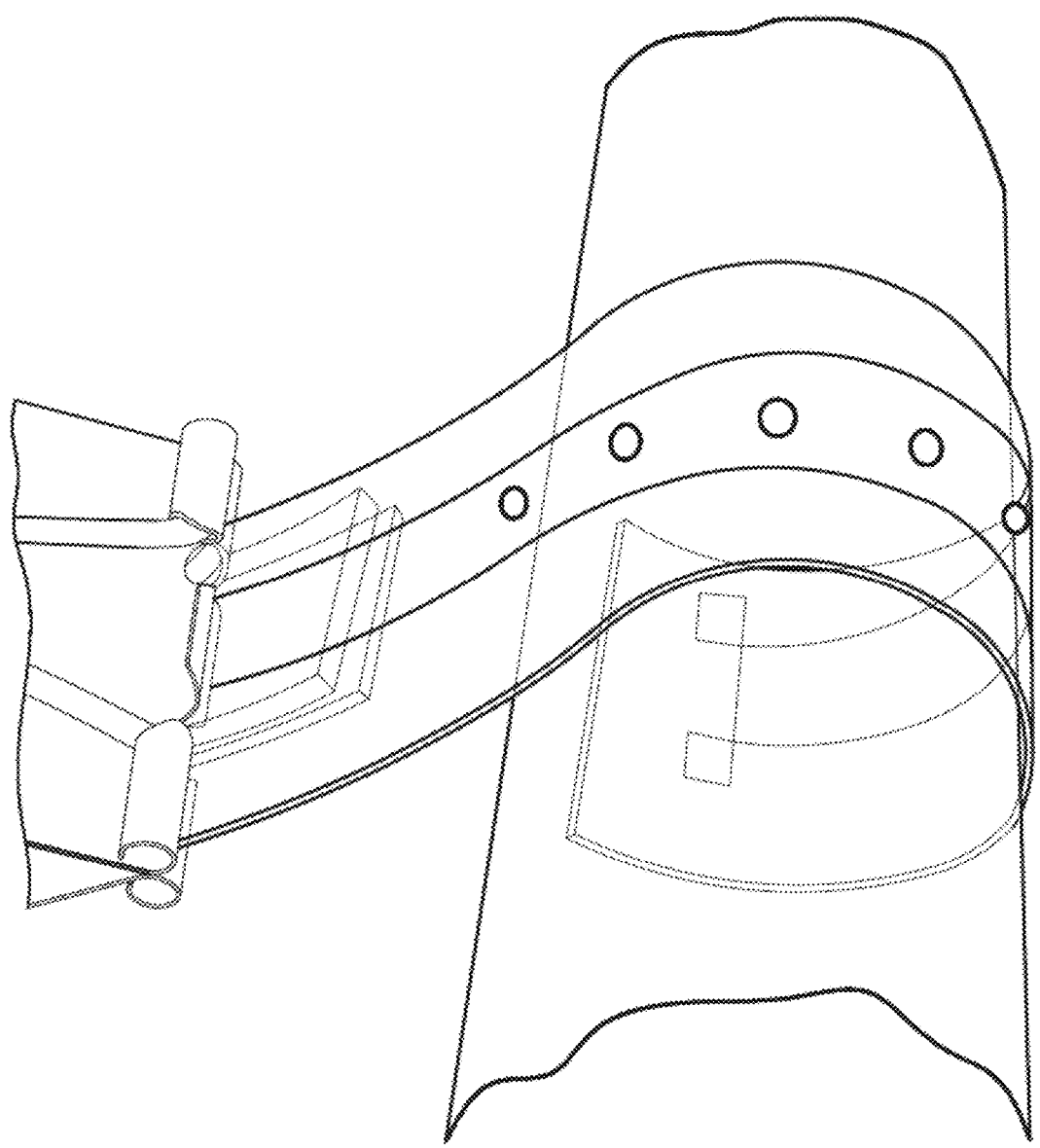
FIG. 42 provides an image of a flexible strip light made of blue LEDs and thin kapton substrates with bending radius equal to 0.85 cm.

FIG. 42 provides an image of a flexible strip light made of blue LEDs and thin kapton substrates with bending radius equal to 0.85 cm.

TABLE 1

Summary of Experimental Conditions for Testing the Mechanical Properties of Conformal ILED Sensors.

| # | Substrate PDMS | Substrate PET | Electrode | Electroplating | Operating Check 1 | Injection | Operating Check 2 | Bending Radius (Max.) | Operating Check 3 | Note |
|---|---|---|---|---|---|---|---|---|---|---|
| 1 | O | O | Ti/Au(5/300 nm) | X | 50% | O | 50% | 3 cm | 50% | Improve |
| 2 | O | O | Ti/Au(5/300 nm) | X | 90% | O | 90% | 3 cm | 80% | |
| 3 | O | O | Ti/Au(5/300 nm) | X | 70% | O | 70% | 3 cm | 70% | |
| 4 | O | O | Al/Ti/Au(700/5/50 nm) | X | 50% | — | — | — | — | |
| 5 | X | O | Al/Ti/Au(500/5/100 nm) | O | 80% | O | 80% | 3 cm | 80% | Improve |
| 6 | X | O | Ti/Au(5/300 nm) | X | 60% | O | 60% | 3 cm | 50% | However, working problem after repeatable test |
| 7 | O | O | Ti/Au(5/300 nm) | O | X | X | X | X | X | Delamination of electrode from substrate for electroplating |

In results of experiment, we observe that operation of the present conformable ILED-based lighting systems is improved in cases of thicker electrode and PDMS coatings or encapsulating layers on PET. However, it is difficult to fabricate a strip-light with only thicker electrode because alignment of ILED on electrode (by hand) is difficult. In some embodiments, the process uses a by using an aligner to provide more stable and accurate assembly. An optimized system for some embodiments combines thicker electrode, PDMS coating on PET and removing tweezing process by hand.

Figure 43:
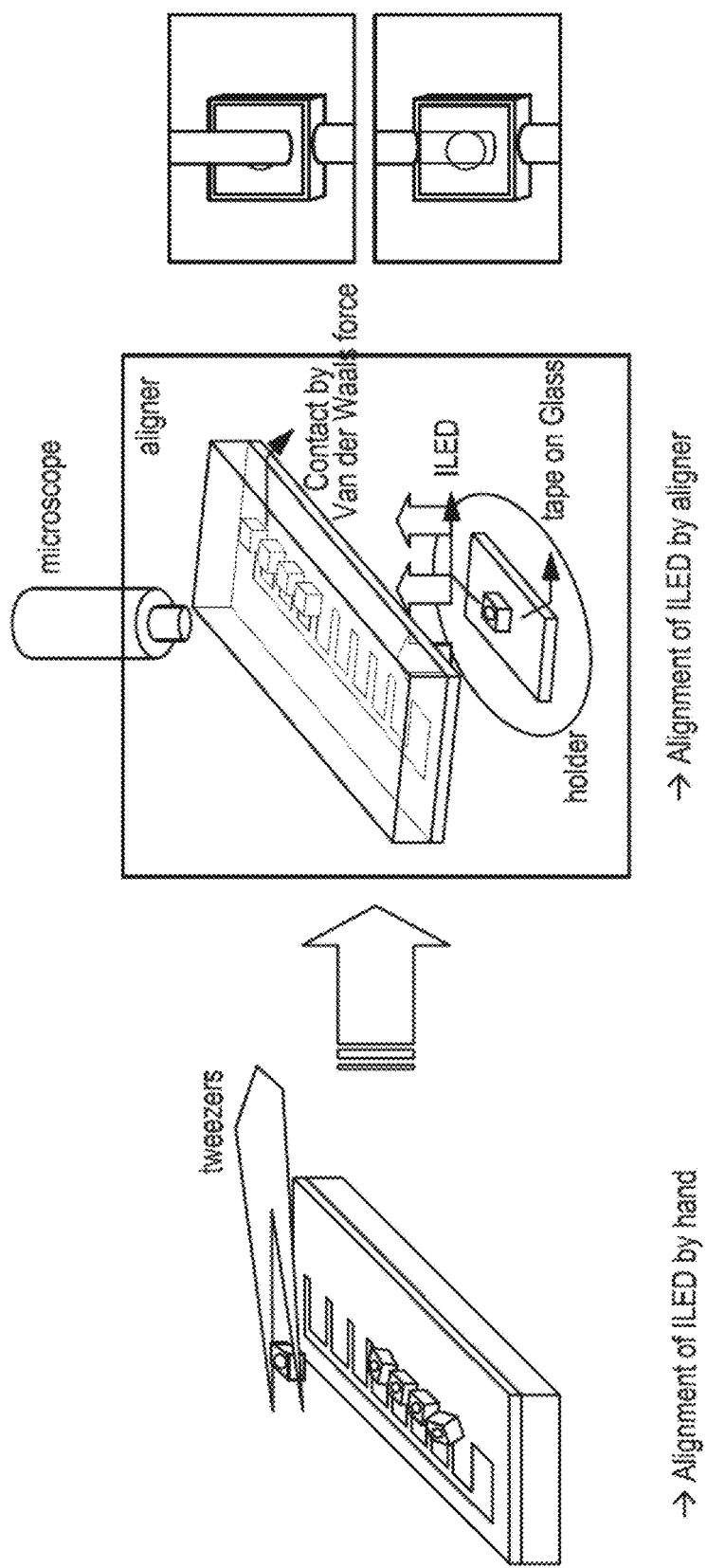
FIG. 43 provides schematics showing two methods for assembling ILED structures on the device substrate.

FIG. 43 provides schematics showing two methods for assembling ILED structures on the device substrate. The lower panel shows an assembly method using alignment by hand and the upper panel show an assembly method using an aligner. When we use an aligner to align ILED on electrode, the number of operating ILED are greatly increased because a damage of electrodes is reduced compared to use tweezers. This method also enhances alignment between the ILED and electrode structures.

Example 3: Printing-Based Assembly of Solar Cells and Solar Cell Arrays

Figure 44:
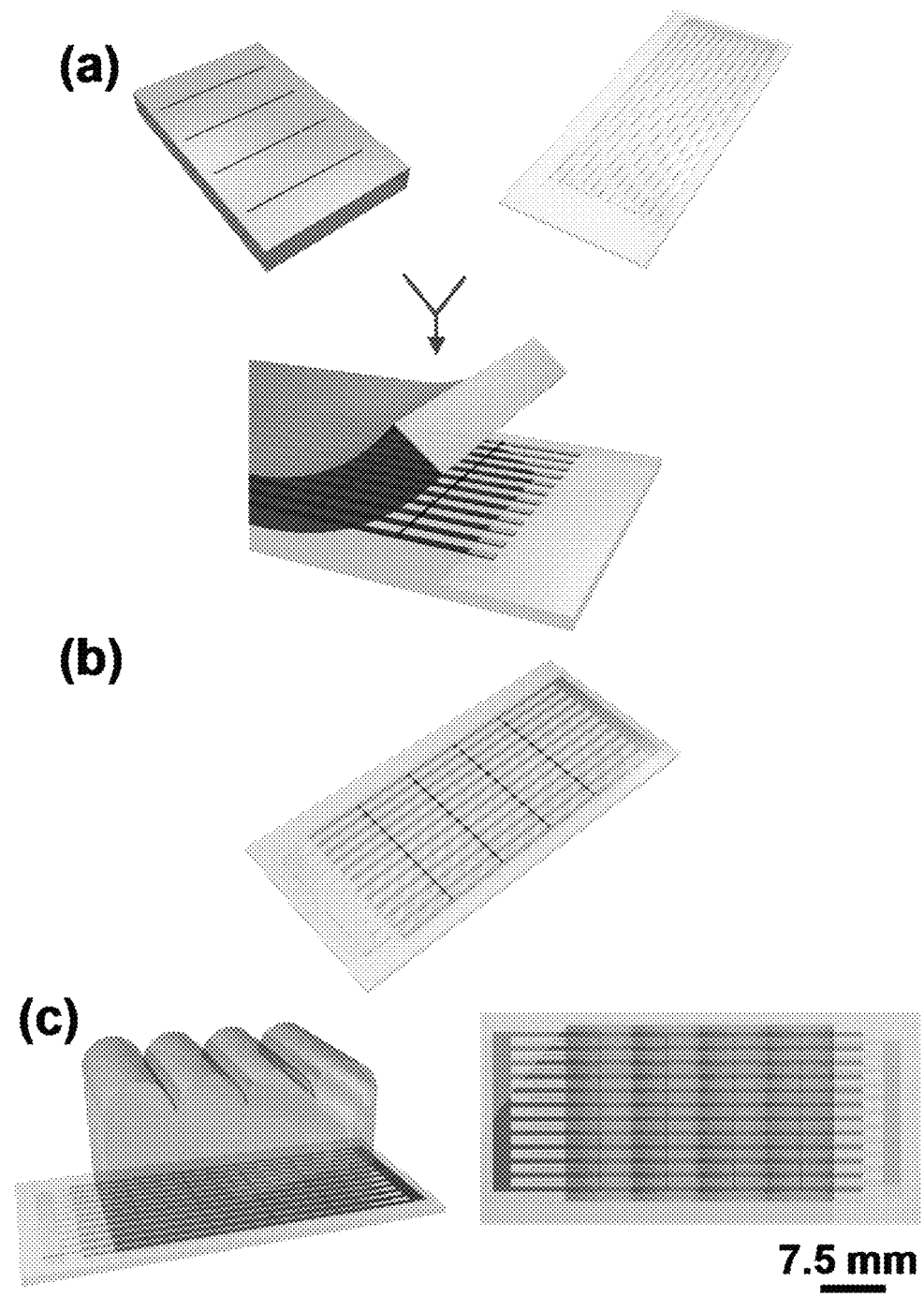
FIG. 44 provides a schematic for the formation of a micro single crystal silicon solar cell with low-level concentrating lens. In the first step (a) the micro structures are transferred from PDMS onto an embedded electrode which serves as the back electrical contact for the device. The silicon is transferred by laminating the PDMS onto the electrode surface and slowly peeling the PDMS back. Next, in step (b), planarization followed by the formation of the top metal contacts is performed. The device is completed by integrating a low concentration cylindrical lens array made from PDMS onto the device (step c). In this final step it can be seen that the device was designed such that the rows of silicon cells align with the focal point of the lens array.

FIG. 44 provides a schematic for the formation of a micro single crystal silicon solar cell with low-level concentrating lens. In the first step (a) the micro structures are transferred from PDMS onto an embedded electrode which serves as the back electrical contact for the device. The silicon is transferred by laminating the PDMS onto the electrode surface and slowly peeling the PDMS back. Next, in step (b), planarization followed by the formation of the top metal contacts is performed. The device is completed by integrating a low concentration cylindrical lens array made from PDMS onto the device (step c). In this final step it can be seen that the device was designed such that the rows of silicon cells align with the focal point of the lens array.

FIG. 45 provides images of a silicon solar cell transferred to a glass substrate. (a) Optical image of a single cell on a glass substrate with both top and bottom electrical contacts. (b) Typical I-V response for a device shown in (a) under AM 1.5.

FIG. 46 provides images of a solar cell array joined to cylindrical collecting optics. (a) Picture of the final fully integrated device with cylindrical lens array. (b) Picture of the same device without the incorporation of the lens array.

FIG. 47 provides a schematic diagram for generating optical concentrator arrays with integrated metal contacts onto mS-Silicon solar cells. The process starts off with retrieval of a metal mesh pattern from a substrate (shown dark blue) via a PDMS molded lens array. In some embodiments, the lens array/mesh pattern is laminated in registry onto an array of silicon solar cells.

FIG. 48 describes the process flow for generating solar cells and integrated concentrating optics.

FIG. 49 provides images of a micro solar cell array printed onto gold bus lines on glass substrates via a thin PDMS adhesive layer.

FIG. 50 provides a schematic illustration of microcells of (a) vertical-type, (b) transverse-type, (c) combination of both types. The processing scheme for producing bulk quantities of single crystal Si micro-ribbons from bulk silicon wafers has been recently developed. The approach begins with a controlled deep reactive ion etching process to create well-defined ribbon structures. Subsequent side-wall passivation either from angled electron beam evaporation deposition of metals or from chemical vapor deposition of $SiO_2/Si_3N_4$ can function as a physical mask for highly anisotropic wet chemical (e.g. KOH) etching. This single-step etching process thus can produce micro-ribbon arrays in printing-ready forms. Both vertical and transverse type pn-junctions are provided by the present invention, which has its own advantages over the other in microcell configurations. Vertical type pn-junctions have been mainly pursued for photovoltaic applications due to its easy processing with bulk wafers and large junction area. On the other hand, transverse type pn-junctions have more choices in terms of transfer methods, usable substrates, and a possibility of back-side illumination (i.e. eliminating shadowing issues due to metal grids), while they may exhibit limited performance on account of their intrinsically small junction area. Another design of the present invention is a combination of vertical and transverse junctions, which may take above-mentioned advantages. All of the junction structures ($n^+$-p-$p^+$) can be readily fabricated by selective doping process, in which thermal diffusion of spin-on-dopant is conducted with PECVD-grown $SiO_2$ doping mask of appropriate thickness and pattern. For vertical type cells, $n^+$-emitter doping is done first before creating microcell patterns, while back p$^+$-doping as back-surface-field (BSF) is accomplished after the microcell patterning process, by a transfer of the patterned microcells onto a substrate covered with dopants and a subsequent thermal diffusion. After this BSF doping step, the microcells can be transferred again to any desired substrate. For transverse type cells, process of selective n$^+$ and p$^+$ doping is more straightforward than vertical cells, simply by using patterned doping masks repetitively. Microcells are created after finishing these doping processes. For the combination type cells, front side doping is obtained in a similar manner with transverse type cells, while back side doping is implemented by following the procedure of BSF formation in vertical type cells.

The present invention also includes ILED displays with matrix structure as well as strip-light without a method using PDMS cassette.

Example 4: Electrical Interconnection Strategies for Printed Optical Systems

The present invention provides methods and systems useful for establishing good electrical connection of semiconductor-based optical systems fabricated by contact printing methods. Processing steps and device geometries of the present invention provide efficient, mechanically robust and highly conductive electrical connection between electronic devices and/or device components assembled via contact printing. The present processing steps and device geometries are compatible with a range of electrical interconnect patterning and processing techniques including photolithographic processing, deposition techniques and/or soft lithographic (e.g., contact printing) patterning.

a. Planarizing Fabrication Strategies and Device Geometries

In an aspect, the present invention provides planarizing processing steps and planar device geometries that minimizes, or completely avoids, degradation of electronic performance of device electrical interconnects arising from step edges of semiconductor elements, such as semiconductor electronic devices and device components, assembled on a device substrate via contact printing. In the context of this description, "planarizing" refers to a process wherein one or more printable semiconductor elements are integrated with a device substrate such that a surface structure is formed having an exposed surface with a substantially planar geometry. Preferably for some applications, the exposed surface having a substantially planar geometry includes one or more individual surfaces of the printed semiconductor element(s) that can be patterned with device electrical interconnect structures, for example using optical lithography and deposition techniques. A planar geometry generally refers to a surface configuration wherein all points on the surface occupy a common plane. In the context of this description, however, a substantially planar geometry includes some deviation from an absolutely planar configuration. In some embodiments, for example, a substantially planar geometry includes deviations in surface position from an absolutely planar configuration of less than 2 microns, preferably for some embodiments deviations in surface position from an absolutely planar configuration of less than 1 micron, and more preferably for some embodiments deviations in surface position from an absolutely planar configuration of less than 500 nanometers.

Planarization in the present invention is achieved by providing materials, layers and/or structures adjacent to printed semiconductor elements such that the step edges of these structures are reduced and/or minimized, thereby allowing for effective patterning and integration of electrical interconnection structures. In an embodiment, for example, the space between adjacent printed semiconductor elements is filled with or otherwise occupying by portions of device substrate itself, other materials, layers or structures provided to the device substrate or a combination of these. Planarizing may be achieved in the present invention using a number of processing methods including embedding one or more printable semiconductor elements into a receiving surface of a device substrate or a planarizing layer provided thereon. Alternatively, planarizing in the present invention may be achieved in the present invention may be achieved by assembling printable semiconductor elements on a receiving surface of a device substrate by contact printing and subsequently providing materials or layers adjacent to the printable semiconductor elements, and in some embodiments between adjacent printed semiconductor elements, so reduce or minimize the step edges of the printed structures.

In an embodiment of this aspect, the present invention provides a method of making a semiconductor-based optical system comprising the steps of: (i) providing a device substrate having a receiving surface; (ii) assembling one or more printable semiconductor elements on the receiving surface of the substrate via contact printing; and (iii) planarizing the printable semiconductor element(s) assembled on the receiving surface, thereby making the semiconductor-based optical system. In an embodiment, the planarizing step generates a substantially planar and/or smooth top surface on the device substrate including the printable semiconductor element(s). In methods useful for device fabrication applications, the substantially planar and/or smooth top surface generates includes exposed surfaces of one or more planarized printable semiconductor elements assembled on the receiving surface. Methods and systems having a planar and/or smooth top surface included exposed surfaces of one or more planarized printable semiconductor elements is beneficial for providing electrical contact to the planarized printable semiconductor elements via additional processing steps, such as lithographic patterning of electrodes/device interconnect structures. In a method of the present invention, the printable semiconductor element comprises a unitary inorganic semiconductor structure. In a method of the present invention, the printable semiconductor element comprises a single crystalline semiconductor material.

Optionally, a method of the present invention further comprises the step of curing, polymerizing or cross linking the planarizing layer having the printable semiconductor element embedded therein, thereby fixing the printable semiconductor element in the planarizing layer. Planarizing layers of the methods and systems of this aspect of the present invention are also useful for mechanical integrating printable semiconductor elements with a device substrate. Optionally, a method of the present invention further comprising the steps of patterning one or more electrodes/electrical interconnects to one or more exposed surfaces of the planarized printable semiconductor element included in the substantially planar and/or smooth top surface. Patterning electrodes and interconnects can be achieved by means known in the art including, but not limited to, optical lithography, deposition techniques (e.g., CVD, PVD, thermal deposition, sputtering deposition, plasma deposition etc.), soft lithography (e.g., contact printing) and combinations of these. Optionally, a method of the present invention comprising the steps: (i) assembling a plurality of printable semiconductor elements on the receiving surface of the substrate via contact printing; and (ii) planarizing the plurality of printable semiconductor elements assembled on the receiving surface.

In an embodiment, the planarizing step generates a substantially planar top surface on the device substrate having the printable semiconductor element(s). Preferably for some application the substantially planar top surface comprises an exposed surface of each of the printed semiconductor elements assembled on the receiving surface. Preferably for some embodiments of this aspect, the planarized semiconductor elements assembled on the receiving surface exhibit step edge features that are less than 2 microns, preferably for some applications less than 1 micron and more preferably for some applications less than 500 nanometers. This aspect of the invention is useful for generating structure that can be effective electrically interconnected, for example using lithographic patterning and thin film deposition methods.

In an embodiment, the planarizing step of this method comprises embedding the printable semiconductor element(s) into the device substrate. Techniques for embedding one or more printable semiconductor elements directly into a device substrate include raising the temperature of a polymer device substrate so as to achieve a physical state (e.g. viscosity) capable of displacement during contact printing. Alternatively, planarizing may be achieved by direct integration of printable semiconductor elements into prepatterned recessed features in the receiving surface of the receiving substrate.

In another embodiment, the planarizing step of this method comprises embedding the printable semiconductor element(s) in a planarizing layer provided on the receiving surface of the device substrate. In the context of this description, a planarizing layer refers to a layer of material supported by the receiving substrate such that printed semiconductor elements can be embedded or implanted into the planarizing layer. In some embodiments, planarizing layers comprise materials, such as low viscosity fluids, that are capable of physical displacement or rearrangement so as to accommodate printed semiconductor elements. Optionally, planarizing layers of the present invention are capable of chemical or physical transformation after receiving printable semiconductor elements to harden, solidify or otherwise change phase or viscosity such that the embedded printed semiconductor elements are held in place. Optionally, the planarizing layer is a prepolymer layer that is polymerized after receiving the printable semiconductor elements. Optionally, the planarizing layer is a polymer layer that is cross linked after receiving the printable semiconductor elements.

The present invention includes methods wherein the planarizing layer is provided to the receiving surface or structure thereon and subsequently contacted with the printable semiconductor element(s). In this embodiment, the planarizing layer receives the printable semiconductor elements assembled on the receiving surface. Alternatively, the present invention includes methods wherein the planarizing layer is provided to the receiving surface after the step of assembling the printable semiconductor element(s) on the receiving surface. In this embodiment, the planarizing layer is provided so as to fill-in or build up regions of the receiving substrate so as to planarize the printed semiconductor elements.

Planarizing layers of the present invention may comprise a range of materials including, but not limited to, polymers, prepolymers, composite materials having a polymer component, gels, adhesives and combinations thereof. For some applications, planarizing layers preferably comprise one or more low viscosity materials capable of physical displacement or rearrangement to accommodate and embed printable semiconductor elements. In an embodiment, for example, a planarizing layer comprises a material having a viscosity selected over the range of 1-1000 centipoise. Planarizing layers for some device fabrication applications have a thickness comparable to the printable semiconductor elements assembled on a receiving surface. In an embodiment, a planarizing layer of the present invention has a thickness selected over the range of 10 nanometers to 10000 microns. In some embodiments, a planarizing layer of the present invention has a thickness similar (e.g., within a factor of 1.5) to that of the printable semiconductor elements assembled on the receiving surface. In an embodiment the thickness of the planarizing layer is selected over the range of 0.0003 mm to 0.3 mm, preferably for some applications selected over the range of 0.002 mm to 0.02 mm The present invention also includes optical systems comprising planarized printable semiconductor elements. In an embodiment, a semiconductor-based optical system of the present invention comprises: (i) a device substrate having a receiving surface; and (i) one more planarized printable semiconductor elements supported by the receiving surface; wherein the device substrate having the one or more printable semiconductor elements has the substantially planar top surface that includes at least a portion of the printable semiconductor elements, wherein the printable semiconductor elements comprise a unitary inorganic semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters. In an embodiment, the printable semiconductor element comprises a semiconductor structure having a length selected from the range of 0.02 millimeters to 30 millimeters, and a width selected from the range of 0.02 millimeters to 30 millimeters, preferably for some applications a length selected from the range of 0.1 millimeters to 1 millimeter, and a width selected from the range of 0.1 millimeters to 1 millimeter, preferably for some applications a length selected from the range of 1 millimeters to 10 millimeters, and a width selected from the range of 1 millimeter to 10 millimeters. In an embodiment, the printable semiconductor element comprises a semiconductor structure having a thickness selected from the range of 0.0003 millimeters to 0.3 millimeters, preferably for some applications a thickness selected from the range of 0.002 millimeters to 0.02 millimeters. In an embodiment, the printable semiconductor element comprises a semiconductor structure having a length selected from the range of 100 nanometers to 1000 microns, a width selected from the range of 100 nanometers to 1000 microns and a thickness selected from the range of 10 nanometers to 1000 microns.

Optionally, the system of the present invention further comprises a planarizing layer provided on the receiving surface of the device substrate, wherein the printable semiconductor elements are embedded in the planarizing layer. In a system of the present invention, the printable semiconductor elements are printable electronic devices or electronic device components, such as LEDs, solar cells, lasers, sensors, transistors, diodes, p-n junctions, integrated circuits, photovoltaic systems or a component of these.

FIGS. 54A and 54B provides schematic diagrams of systems of the present invention comprising planarized printable semiconductor elements. Printable semiconductor elements 5010 are embedded in the device substrate 5000 itself (See FIG. 54A) or alternatively in a planarizing layer

5020 (See FIG. 54B) provided on a receiving surface of device substrate 5000. As shown in these FIGS. 54A and 54B the planarized configuration results in a top exposed surface 5015 having a substantially planar geometry which includes some deviation from an absolute planar configuration. As shown in these figures, top exposed surface 5015 including exposed surfaces of the planarized printable semiconductor elements 5010 in addition to exposed surfaces of substrate 5000 or planarizing layer 5020. FIG. 55 provides a flow diagram illustrating processing steps in methods of the present invention for making semiconductor-based optical systems comprising planarized printable semiconductor elements, such as printable semiconductor-based electronic devices and device components.

A benefit of using planarized device configurations and planarization methods of the present invention is that it allows good electrical contact with planarized printable semiconductor elements to be established in further processing steps, such as lithographic and deposition processing. FIG. 56 provides experimental results characterizing the impact of step edges on establishing electrical contact to and/or between printable semiconductor elements. Experimental result corresponding to printed semiconductor elements comprising silicon bars having step edge dimensions of 290 nm, 700 nm, 1.25 microns and 2.5 microns. Inset of FIG. 56 shows a micrograph and schematic showing the device and electrical contact geometries. As shown in this figure, good conductivity (e.g., resistance less than 10 ohm) is observed for step edge dimensions up to 1.25 microns. For step edge dimensions equal to 2.5 microns, however, a significant decrease in conductivity (e.g., resistance equal to 1.7 ohm) is observed. Planarizing methods of the present invention, therefore, have significant value in minimizing the magnitude of step edges in assembled printable semiconductor elements, thereby accessing planarized device geometries capable of effective implementation of device interconnects and electrodes.

In a system of this aspect, the printable semiconductor element(s) comprises a semiconductor structure having a length selected from the range of 0.02 millimeters to 30 millimeters, and a width selected from the range of 0.02 millimeters to 30 millimeters. In a system of this aspect, the printable semiconductor element(s) comprises a semiconductor structure having at least one longitudinal physical dimension selected from the range of 0.1 millimeters to 1 millimeter. In a system of this aspect, the printable semiconductor element(s) comprises a semiconductor structure having at least one longitudinal physical dimension selected from the range of 1 millimeters to 10 millimeters. In a system of this aspect, the printable semiconductor element(s) comprises a semiconductor structure having at least one cross sectional dimension selected from the range of 0.0003 millimeters to 0.3 millimeters. In a system of this aspect, the printable semiconductor element(s) comprises a semiconductor structure at least one cross sectional dimension selected from the range of 0.002 millimeters to 0.02 millimeters.

The system relates, in an aspect, to a plurality of planarized printable semiconductor elements supported by said receiving surface; wherein said device substrate having said printable semiconductor element has said substantially planar top surface that includes at least a portion of said planarized printable semiconductor elements, wherein each of said printable semiconductor element comprises a semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters.

In an embodiment of this aspect, the system further comprises a planarizing layer provided on said receiving surface of said device substrate, wherein said printable semiconductor element is embedded in said planarizing layer. In an embodiment of this aspect, system further comprises one or more electrodes or electrical interconnects patterned on said substantially planar top surface. In an embodiment of this aspect, said printable semiconductor element is a printable electronic device or electronic device component. In an embodiment of this aspect, the printable semiconductor element is a LED, a solar cell, a laser, a sensor, diode, p-n junction, transistor, integrated circuit or a component thereof. In an embodiment of this aspect, the printable semiconductor element comprises said semiconductor structure integrated with at least one additional structure selected from the group consisting of: another semiconductor structure; a dielectric structure; conductive structure, and an optical structure. In an embodiment of this aspect, the printable semiconductor element comprises said semiconductor structure integrated with at least one electronic device component selected from the group consisting of: an electrode, a dielectric layer, an optical coating, a metal contact pad and a semiconductor channel. In an embodiment of this aspect, the printable semiconductor element has a thickness selected from the range of 100 nanometers to 100 microns.

The present invention includes other strategies for avoid or mitigating the effect of step edges in establishing electrical connection between to and/or between printable semiconductor elements. In some embodiments, for example, the printable semiconductor elements are fabricate such that they have at least one side having a sloping or otherwise gradually tapering edge. The sloping edge provides a gradual change at the edge of the printable semiconductor element, as opposed to an right angle configuration where the change on the edge of the printable semiconductor element is abrupt. In these embodiments, printable semiconductor elements are assembled such that a side having the sloping edge(s) is exposed upon contact with the receiving surface. This geometry allows access to, and subsequent processing on, the exposed side having the sloping edges for integration of electrical interconnects. The present of the sloping edges of the printable semiconductor elements, therefore, reduces the impact of step edges in integrating electrical interconnection structures and electrodes.

b. Electrical Interconnection Using Mesh and Grid Electrodes

The present invention also include device geometries and processing methods wherein an electrically conducting mesh or grid electrode is used to electrically interconnect printable semiconductor elements assembled via contact printing. Mesh and grid electrical interconnection elements and/or electrodes are optionally assembled via contact printing methods on a receiving surface of a device substrate, optical systems or optical component or assembled via contact printing methods on exposed surfaces of printed semiconductor elements, optionally using a conformable transfer device. Advantages of the use of mesh and grid electrodes include that fact that they can be effectively patterned over large areas, thereby, allowing for greater tolerance in the placement accuracy of printable semiconductor elements assembled via contact printing due. This processing and design advantage results in a relaxation of processing constraints and device geometry tolerances involved in contact printing-based assembly of printable semiconductor elements. For example, use of mesh and grid electrodes and device interconnects significantly relaxes design and placement constraints on the alignment and positions of the printable semiconductor elements assembled by contact printing. In addition, use of mesh and grid electrodes allows a large number of printable semiconductor elements to be effectively electrically interconnected in a single (or small number) of processing steps. Further, the thickness and/or fill factor of mesh or grid electrodes can be selected such that they are optically transparent, which allows these components to be implemented in optical systems requiring transmission of electromagnetic radiation through the mesh or grid, such as displays, photovoltaic systems, optical sensing systems and multifunctional optical systems. In some embodiments, the grid or mesh is more than 50% optical transparent at a selected wavelength of electromagnetic radiation.

In an embodiment, methods of the present invention comprise the step of providing an electrically conducting grid or mesh in electrical contact with at least a portion of the printable semiconductor elements assembled on a receiving surface of a device substrate, thereby establishing electrical contact from the mesh to at least a portion of the printable semiconductor elements. In an embodiment, the electrical connection from the grid or mesh to said printable semiconductor elements is established by contact printing. The grid or mesh provides one or more electrodes or electrical interconnection structures in some of the optical systems of the present invention. The step of providing the grid or mesh in electrical contact with at least a portion of the printable semiconductor elements may be carried out via contact printing-based processing, for example using a conformable transfer device such as an elastomeric (e.g., PDMS) stamp. In some embodiments, for example, this processing step comprises the step of transferring the grid or mesh onto the receiving surface of device substrate via contact printing, and subsequently assembling printable semiconductor elements on one or more surfaces of the printed grid or mesh, thereby establishing electrical connection between these device elements. Alternatively, in another method this processing step comprises the step of transferring via contact printing the grid or mesh onto one or more exposed surfaces of printable semiconductor elements previously assembled onto the receiving surface of the device substrate, thereby establishing electrical connection between these device elements.

In another embodiment, the present invention provides a method of making a semiconductor-based optical system comprising the steps of: (i) providing an optical component having an internal surface; (ii) providing a electrically conducting grid or mesh on said internal surface of said optical component; (iii) providing a device substrate having a receiving surface; (iv) assembling a plurality of printable semiconductor elements on said receiving surface of said substrate via contact printing; wherein each of said printable semiconductor elements comprise a semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters; and (v) transferring said optical component having said grid or mesh to said device substrate, wherein said optical component is positioned on top of said semiconductor elements assembled on said on said receiving surface of said substrate, wherein said electrically conducting grid or mesh is provided between said optical component and said semiconductor elements, and wherein said metal grid or mesh is provided in electrical contact with at least a portion of said printable semiconductor elements. In an embodiment, the printable semiconductor element comprises a semiconductor structure having a length selected from the range of 0.02 millimeters to 30 millimeters, and a width selected from the range of 0.02 millimeters to 30 millimeters, preferably for some applications a length selected from the range of 0.1 millimeters to 1 millimeter, and a width selected from the range of 0.1 millimeters to 1 millimeter, preferably for some applications a length selected from the range of 1 millimeters to 10 millimeters, and a width selected from the range of 1 millimeter to 10 millimeters. In an embodiment, the printable semiconductor element comprises a semiconductor structure having a thickness selected from the range of 0.0003 millimeters to 0.3 millimeters, preferably for some applications a thickness selected from the range of 0.002 millimeters to 0.02 millimeters. In an embodiment, the printable semiconductor element comprises a semiconductor structure having a length selected from the range of 100 nanometers to 1000 microns, a width selected from the range of 100 nanometers to 1000 microns and a thickness selected from the range of 10 nanometers to 1000 microns.

Optionally steps (i) and/or (v) in the method recited above is carried out via contact printing methods, for example using a conformable transfer device such as an elastomeric stamp. In an embodiment, the electrically conducting mesh or grid comprises one or more metals. In an embodiment, the electrically conducting mesh or grid comprises one or more semiconductor materials. In a method of the present invention, the printable semiconductor element comprises a unitary inorganic semiconductor structure. In a method of the present invention, the printable semiconductor element comprises a single crystalline semiconductor material.

In some methods, said step of transferring said optical component on top of said semiconductor elements assembled on said on said receiving surface of said substrate comprises printing said optical component on top of said semiconductor elements assembled on said on said receiving surface of said substrate using contact printing. For example, methods of the present invention include the step of assembling the printable semiconductor element said receiving surface via dry transfer contact printing, optionally using a conformable transfer device such as an elastomeric transfer device.

Mesh or grids useful as electrical interconnect structures and/or electrodes may comprise any conductive material including metals and semiconductors (including doped semiconductors). In some embodiments, mesh or grids useful as electrical interconnect structures and/or electrodes may have a thickness selected over the range of 10 nanometers to 10000 microns. Use of thin and/or low fill factor grid or mesh structures is useful for some embodiments, as these structures can be implemented such that they are optically transparent, for example transmitting greater than 10%, 30% 50% or 70% of incident electromagnetic radiation having a selected wavelength. Fill factors of mesh or grid structures for some applications range between 5% and 80%, preferably between 10-50%. In some embodiments, use of mesh or grid structures having a fill factor less than 30% is preferred.

Mesh or grid structures useful for electrical interconnect structures and/or electrodes of the present invention may optionally be a laminated, planarized and/or encapsulated structure. In an embodiment, for example, the mesh or grid structure is bonded to an elastomeric layer, such as a PDMS layer, to facilitate handling, transfer and/or integration, for example using contact printing methods, optionally using a conformable transfer device such as an elastomeric stamp. Useful elastomeric layers for some applications have thicknesses ranging from 1 micron to 1000 microns. Use of an elastomeric layer in some embodiments allows the grid or mesh electrode or interconnect structure to deform and move so as to generate good electrical connect with printed semiconductor elements. In some embodiments, the mesh or grid structure is also coupled to a support, such as glass or polymer substrate. In an embodiment, for example, the mesh or grid structure is mechanically coupled to an elastomeric layer coupled to and a glass or polymer substrate. In some configurations, the elastomer layer is positioned between the mesh or grid structure and the glass or polymer substrate. Use of a support, such as a glass or polymer substrate, facilitates integration of grid or mesh electrode or interconnect structures into optical systems of the present invention.

Use of grid and mesh electrode and/or electrical interconnection structures is beneficial for establishing electrical connection of a range of printable semiconductor elements. Optionally, the printable semiconductor element in these methods is an electronic device or component of an electronic device, such as an LED, a laser, a solar cell, a sensor, a diode, a transistor, and a photodiode. Optionally, the printable semiconductor element in these methods has a thickness selected from the range of 100 nanometers to 100 microns In an embodiment, the present invention provides a semiconductor-based optical system comprising: (i) a device substrate having a receiving surface; (ii) a plurality of printable semiconductor elements supported by said receiving surface; wherein each of said printable semiconductor element comprises a semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters; and (iii) a metal grid or mesh provided in electrical contact with said plurality of printable semiconductor elements supported by said receiving surface. In an embodiment, the printable semiconductor element comprises a semiconductor structure having a length selected from the range of 0.02 millimeters to 30 millimeters, and a width selected from the range of 0.02 millimeters to 30 millimeters, preferably for some applications a length selected from the range of 0.1 millimeters to 1 millimeter, and a width selected from the range of 0.1 millimeters to 1 millimeter, preferably for some applications a length selected from the range of 1 millimeters to 10 millimeters, and a width selected from the range of 1 millimeter to 10 millimeters. In an embodiment, the printable semiconductor element comprises a semiconductor structure having a thickness selected from the range of 0.0003 millimeters to 0.3 millimeters, preferably for some applications a thickness selected from the range of 0.002 millimeters to 0.02 millimeters. In an embodiment, the printable semiconductor element comprises a semiconductor structure having a length selected from the range of 100 nanometers to 1000 microns, a width selected from the range of 100 nanometers to 1000 microns and a thickness selected from the range of 10 nanometers to 1000 microns.

Optionally, the printable semiconductor elements are assembled on said receiving surface by contact printing. Optionally, said metal grid or mesh is a laminated structure. Optionally, the metal grid or mesh is bonded to an elastomeric layer, such as a PDMS layer, and in some embodiments the elastomeric layer is bonded to a glass substrate, wherein said elastomeric layer is positioned between said metal grid or mesh and said glass substrate. Optionally, the metal grid or mesh is provided between said receiving surface and said printable semiconductor elements. Optionally, the metal grid or mesh is provided on one or more external surfaces of the printable semiconductor elements. Optionally metal grid or mesh is optically transparent and/or has a fill factor less than 30%. Optionally, the printable semiconductor element(s) comprise a unitary, inorganic semiconductor structure.

In a system of this aspect, the printable semiconductor element(s) comprises a semiconductor structure having a length selected from the range of 0.02 millimeters to 30 millimeters, and a width selected from the range of 0.02 millimeters to 30 millimeters. In a system of this aspect, the printable semiconductor element(s) comprises a semiconductor structure having at least one longitudinal physical dimension selected from the range of 0.1 millimeters to 1 millimeter. In a system of this aspect, the printable semiconductor element(s) comprise a semiconductor structure having at least one longitudinal physical dimension selected from the range of 1 millimeters to 10 millimeters. In a system of this aspect, the printable semiconductor element(s) comprises a semiconductor structure having at least one cross sectional dimension selected from the range of 0.0003 millimeters to 0.3 millimeters. In a system of this aspect, the printable semiconductor element(s) comprises a semiconductor structure at least one cross sectional dimension selected from the range of 0.002 millimeters to 0.02 millimeters. In a system of this aspect, the printable semiconductor elements are assembled on the receiving surface by contact printing. In a system of this aspect, the grid or mesh comprises one or more metals. In a system of this aspect, the grid or mesh is a laminated structure. In a system of this aspect, the grid or mesh is bonded to an elastomeric layer, and optionally elastomeric layer is bonded to a glass substrate, wherein the elastomeric layer is positioned between the grid or mesh and the glass substrate, and optionally the grid or mesh is provided between the receiving surface and the printable semiconductor elements. In a system of this aspect, the grid or mesh is provided on external surfaces of the printable semiconductor elements. In a system of this aspect, the grid or mesh is more than 50% optically transparent. In a system of this aspect, the grid or mesh has a fill factor less than 30%.

c. Electrode Interconnect Geometries for Printable Semiconductor Elements

The present invention also include electrode interconnect geometries for printable semiconductor elements, such as printable semiconductor devices and device components, that facilitate electrode patterning and electrical interconnection as assembly via contact printing. These interconnect geometries are applicable to a range of printable electronic devices and components thereof, including solar cells, LEDs, transistors, diodes, lasers and sensors.

In an embodiment, a printable semiconductor element of the present invention has a device geometry such that the contact structures, such as contact pads or other electrical interconnection structures, for making electrical connection are provided on a single side of the printable semiconductor element. Preferably for some device fabrication applications, the side of the printable semiconductor element that has the electrical contacts is exposed or otherwise accessible upon the step of assembling the printable semiconductor element on a device substrate, optical system or optical component. This design is particularly attractive for printable semiconductor elements comprising electronic devices require two or more electrical contacts to different components of the device such as a solar cell, LED or transistor. In printable semiconductor devices and device components of this aspect, the device geometry is selected to allow two or more electrical interconnects to be provided on a single side of the printable semiconductor device and device component. In some embodiments, for example, the doping and doped components of a printable semiconductor devices and device components is selected and or spatially arranged to allow electrical interconnects to be provided on a single side of the printable semiconductor device and device component.

Example 5: Contact Printing Based Assembly on Optical Components

An advantage of the contact printing-based processing methods of the present invention is that they are compatible with device assembly and integration directly on a range of optical systems and optical components thereof. This allows for a range of useful structures and device geometries to be efficiently accessed using the present fabrication methods.

In an embodiment of this aspect, the present invention provides a method of making a semiconductor-based optical system comprising the steps of: (i) providing an optical system or optical component having a receiving surface; and (ii) assembling one or more printable semiconductor elements on said receiving surface of said optical system or optical component via contact printing; wherein each of said printable semiconductor element comprises a semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters. In an embodiment, the printable semiconductor element comprises a semiconductor structure having a length selected from the range of 0.02 millimeters to 30 millimeters, and a width selected from the range of 0.02 millimeters to 30 millimeters, preferably for some applications a length selected from the range of 0.1 millimeters to 1 millimeter, and a width selected from the range of 0.1 millimeters to 1 millimeter, preferably for some applications a length selected from the range of 1 millimeters to 10 millimeters, and a width selected from the range of 1 millimeter to 10 millimeters. In an embodiment, the printable semiconductor element comprises a semiconductor structure having a thickness selected from the range of 0.0003 millimeters to 0.3 millimeters, preferably for some applications a thickness selected from the range of 0.002 millimeters to 0.02 millimeters. In an embodiment, the printable semiconductor element comprises a semiconductor structure having a length selected from the range of 100 nanometers to 1000 microns, a width selected from the range of 100 nanometers to 1000 microns and a thickness selected from the range of 10 nanometers to 1000 microns.

In some embodiments, the printable semiconductor elements are assembled on a contoured receiving surface of said optical component, such as the curved surface(s) of a lens, lens array, waveguide or array of waveguides. Alternatively, the printable semiconductor elements are assembled are assembled on a planar receiving surface(s) of said optical component.

The contact printing based fabrication platform of the present methods is highly versatile and, hence compatible with a range of optical components including light collecting optical components, light concentrating optical components, light diffusing optical components, light dispersing optical components, light filtering optical components and arrays thereof. In an embodiment, for example, printable semiconductor elements, such as printable semiconductor based electronic devices and/or device components, are assemble on a receiving surface of an optical systems or component selected from the group consisting of a lens, a lens array, a reflector, an array of reflectors, a waveguide, an array of waveguides, an optical coating, an array of optical coatings, an optical filter, an array of optical filters, a fiber optic element and an array of fiber optic elements. In an embodiment, printable semiconductor elements are assembled on an optical component or system fabricated by replica molding, such as a lens or lens array fabricated by replica molding. In an embodiment, printable semiconductor elements are assembled on a PDMS molded optical structure, such as such as a PDMS molded lens or lens array.

Printing based assembly allows the assembled printable semiconductor elements to accurately and/or precisely spatially aligned and/or individually addressed to features and parts of an optical system or optical component. In an embodiment, for example, contact printing allows each of the components in an array of optical components to be spatially aligned with respect to at least one of said printable semiconductor elements, for example aligned to within 100 microns or preferably to within 10 microns. In an embodiment, for example, contact printing allows each of the components in an array of optical components to be individually addressed to at least one of said printable semiconductor elements.

Direct contact printing onto surfaces of optical systems and components enables fabrication of range of systems including display systems, photovoltaic systems, sensors, and multifunctional optical systems. The type and functionality of the optical system generated will depend at least in part on the type of printable element printed and the type of optical system or component that receives the printable semiconductor elements. In some embodiments, the printable semiconductor element assembled on the surface of optical systems and components are electronic devices or components of electronic devices, such as LEDs, lasers, solar cells, sensors, diodes, transistors, and photodiodes. In some embodiments, the printable semiconductor element assembled on the surface of optical systems and components have thicknesses selected from the range of 100 nanometers to 100 microns.

Use of contact printing in the present invention provides the capable of direct integration of printable semiconductor elements with a range of optical systems. In an embodiment, for example, printable semiconductor elements are assembled on said receiving surface of an optical system or optical component via dry transfer contact printing. Optionally, printable semiconductor elements are assembled on said receiving surface of an optical system or optical component using a conformable transfer device, such as an elastomeric transfer device (e.g., PDMS stamp). In a method of this aspect of the present comprises the steps of: (i) providing said conformable transfer device having a contact surface; (ii) establishing conformal contact between an external surface of said printable semiconductor element and said contact surface of said conformable transfer device, wherein said conformal contact bonds said printable semiconductor element to said contact surface; (iii) contacting said printable semiconductor element bonded to said contact surface and said receiving surface of said optical component; and (iv) separating said printable semiconductor element and said contact surface of said conformable transfer device, thereby assembling said printable semiconductor element on said receiving surface of said optical component.

Example 6: Fabrication of Solar Cell Arrays Via Contact Printing

The present methods provide an effective processing platform for the fabrication of high performance photovoltaic systems including solar cell arrays.

FIG. 57 provides a process flow diagram for making printable semiconductor elements comprising vertical solar cells that can be subsequently assembled and interconnected to fabricate a solar cell array. Steps A-E in FIG. 57 demonstrate various processes and conditions for making printable solar cell ribbons from a Si (111) p-type wafer.

Process step A in FIG. 57 demonstrates processing steps and conditions for the back surface field formation. In this processing step, a 3 inch p-type Si 111 wafer is cleaved into 6 equal parts. Next, the processed wafer is cleaned using Ace/IPA and Piranha clean. Boron (B219) SOD is spun on and the wafer. The wafer with boron is annealed at 250° C. The boron is driven in, for example, at 1150° C. for 45 mins. Any glass residue is removed. These processing steps result a junction that is about 1.5 mm thick.

Process steps B and C in FIG. 57 demonstrate processing steps and conditions for ribbon formation. A 300 nm PECVD oxide is use to make the resist pattern. The PR is patterned to define the ribbon spatial dimensions and wet etch exposed oxide with BOE. Then, ICP-DRIE ~25-30 mm is used to generate deep trenches (12 min etch time) into the exposed silicon. Exemplary ribbon dimensions and trench dimensions are shown in FIG. 57. The processed wafer is cleaned in RCA 1 and KOH refining for about 4 mins to remove some of the sidewall roughness. Next, PECVD 100 nm $SiO_2$ and 600 nm $Si_3N_4$ is deposited everywhere. Angled evaporation 60 degree stage) of Ti/Au 3/50 nm is used in this processing step. The wafer is exposed to RIE etching of the exposed oxide and nitride layers. Wet etching using KOH is next used to undercut the ribbons, for example, using a ~35% KOH solution. The metal mask layers are subsequently removed. The oxide and nitride layers are maintained for subsequent doping processing.

Process steps D and E in FIG. 57 demonstrate processing steps and conditions for emitter formation. In an embodiment, a n-type dopant, such as P509, is spin coated onto the fully undercut ribbon chip. The n-type dopant (e.g., P509) is driven, for example, at 950° C. for 15 mins. This creates a Junction that is about 500 nm thick. Next, the layers are removed and transfer printed onto receiving substrates with meshes or NOA.

FIG. 58 provides SEM images of microsolar cells of different thicknesses fabricated from bulk wafers. (Top to bottom: 8 microns, 16 microns, 22 microns thick).

FIG. 59 provides a plot showing IV characteristics of an individual solar cell device fabricated using the present processing platform. This example device shows efficiency of 9%. The inset to FIG. 59 shows the Si solar cells with a vertical geometry printed onto a bottom bus electrode.

FIG. 60 shows processing for generating top contacts for the vertical solar cells and related electronic performance data. First, the vertical solar cells are printed onto a Au or Cu mesh structure as shown in panels A and B. Next, a second Au mesh is printed (laminated) on top of the cells and serves as the top contact. Panel C shows a plot of the IV curve of printed contacts, modules fabricated in this way show total efficiency of 6%. The Inset in panel C shows the top and bottom printed mesh electrodes onto the silicon solar cells.

FIG. 61 provides a schematic showing a solar cell layout of transverse type solar cells to be patterned on a <111>p-type Si wafer and capable of subsequent assembly and integration via contact printing. The physical dimensions of solar cell ribbons, bridge elements, trenches and a mother wafer are provided in FIG. 61. After the patterning of cell layout via photolithography and dry etching process, doping process is conducted. FIG. 62 provides a schematic showing the doping scheme wherein boron (P+) and phosphorous (n+) doped regions are patterned on the external surface of the patterned semiconductor ribbons. The top boron doping is for making top p+ contact while the top phosphorous doping for making pn junctions. The sidewall doping strategy is implemented purposefully to increase a junction area and to prevent possible short-circuit formation during the metallization step. The bottom p+ doping is done for creating back-surface-field (BSF) after undercut of bottom surface with KOH etching process.

FIG. 63 provides an overview schematic showing the process flow for cell patterning and doping steps. As shown in FIG. 63, first the solar cell patterns are formed on the wafer using photolithography and dry etching. Next, spatially localized boron doping is carried out for window formation and diffusion. Next, spatially localized phosphor doping is carried out for window formation and diffusion. Next the patterned solar cells are undercut employing top and side wall passivation and KOH etching. Finally, bottom boron doping is carried out.

FIG. 64 provides a schematic diagram showing processing steps for patterning solar cell ribbons illustrating photolithography and STS deep RIE etching process steps. As shown in this figure, the first step in the process flow is to make cell patterns through photolithography and deep reactive ion etching (Bosch process) on bulk <111> Si wafer. As an etching mask, PECVD $SiO_2$ and positive photoresist are used. In the dry etching, $SF_6$ and $O_2$ are used for etching and $C_4H_8$ for passivation. As a result of alternating etching and passivation processes in Bosch process, the etched structure has sidewall ripples, which are smoothen out subsequently with KOH. Also shown in FIG. 64 are micrographs of process wafer after removal of photoresist and $SiO_2$ masking layers. FIG. 65 shows results from KOH refining processing of the sidewalls of the patterned ribbons. To remove the sidewall ripples, a short time KOH refining process is conducted. During the process, the top surface is protected with PECVD $SiO_2$.

FIG. 66 provides a schematic diagram for boron doping processing. After the KOH refining step, boron doping for formation of top p+ contact is conducted. PECVD $SiO_2$ (900 nm) is deposited as a doping mask layer and a doping window is created by photolithography and BOE wet etching. As a doping agent, either spin-on-dopant or solid state doping source can be used. The diffusion process is conducted at 1000-1150° C. under nitrogen (solid state source) or nitrogen/oxygen (75/25, spin-on-dopant) atmosphere. Also shown in FIG. 66 is a micrograph of the masked ribbon structures having a doping window for localized boron doping. Also shown in FIG. 66 is a plot of current versus voltage indicating a 400 ohm resistance.

FIG. 67 provides a schematic diagram for phosphorous doping processing. Phosphorous doping is followed after the boron doping in order to create a shallow junction (100-300 nm). In a similar way to boron doping process, phosphorous doping window is made with PECVD $SiO_2$ deposition, photolithography, and BOE wet-etching process. As a doping source, spin-on-dopant is used and applied by spin-coating. The diffusion is conducted at 950 C under $N_2/O_2$ (75/25) atmosphere. Also shown in FIG. 67 is a micrograph of the masked ribbon structures for localized phosphorous doping. Also shown in FIG. 67 is a plot of current versus voltage indicating a 80 ohm resistance.

FIG. 68 provides a schematic diagram showing sidewall passivation processing. After top doping processes are finished, PECVD $Si_3N_4$ is deposited as a protecting layer in KOH undercut process. To make an etching window where KOH etching starts, first, Cr and Au are deposited with a 60° angle from the sample surface, in order to make metal protecting layers on top and sidewalls except the bottom surface. The metal cover surface is protected from subsequent dry etch processing, and thus functions as a passivation layer for the KOH wet-etching step. The thickness of the cells can be readily controlled by adjusting metal deposition angle. Secondly, RIE with CHF3/O2 and SF6 will expose Si at the bottom surface, where KOH etching can be initiated. FIG. 69 provides a schematic diagram showing processing for the formation of a KOH etching window.

FIG. 70 provides micrographs showing KOH etching processing and bottom boron doping processing. As shown in this figure, the bottom surface is etched with KOH at 90 C for 30 min, which results in print-ready cell structure capable of assembly via contact printing, for example using an elastomeric conformable transfer device. After the KOH etching, only the bottom Si surface is exposed and the Si3N4 protecting layer can be still used as a barrier for boron doping. Boron doping is conducted at 1000 C for 10 min subsequently.

After the bottom boron doping, passivation layers and remaining dopants are cleaned out with HF, Piranha, and BOE. Before the PDMS pick-up, PECVD SiO2 can be deposited as a top-surface passivation from NOA contamination. FIG. 71 provides images showing transfer of the solar cell ribbons from the source wafer using a PDMS transfer device.

FIG. 72 provides a schematic diagram illustrating contact printing and planarization processing steps. Also shown in FIG. 72 are images of print assembled solar cells. After microcells are picked up by PDMS stamp, they are printed onto receiving substrates such as glass, PET, or Kapton using NOA as an adhesive. This printing technique by itself also completes the planarization of cells, which are important to make metal interconnections. First, NOA61 is coated onto a UVO treated substrate, then microcells on PDMS are placed on top of the NOA. Due to the weight of the stamp and cells, the microcells are fully embedded in the NOA except the top surface where PDMS stamp is covered. After the partial curing under UV light, the PDMS stamp can be retrieved and the microcells are embedded and form a planar surface for following metallization steps.

FIG. 73 provides an imaging showing the results of metallization processing. FIG. 74 provides a schematic diagram of the metallization process showing an Al metal layer, $SiO_2$ dielectric layer, Cr/Au layer, solar cell, planarizing layer and device substrate. As shown in FIG. 73, to form metal interconnects, metals are deposited on the entire cell surface and selective areas are etched back with metal etchant using a photoresist or NOA as a etching protecting layer. After the metallization is implemented, those metal lines are isolated and encapsulated with $SiO_2$ and Al is deposited over the surface to form a reflective layer. In this way, we can essentially eliminate the metal shadowing, which normally happens with conventional cell geometry. Anti-reflection coating can be further added either the bottom surface of the substrate or at the bottom of the cells before the transfer. With this cell configuration and printing strategy, we can also use the roughness of the bottom cell surface from KOH etching step as a surface texturization.

Example 7: Physical Dimensions of Printable Semiconductor Elements

The methods and systems of the present invention are capable of implementation with printable semiconductor elements, including printable semiconductor based devices and device components, having a wide range of physical dimensions and shapes. The versatility of the present invention with respect to the physical dimensions and shapes of printable semiconductor elements assembled via contact printing enables a wide range of device fabrication applications and accesses a wide range of electronic, optical, opto-electronic device configurations and layouts.

FIGS. 75A and 75B provide schematic diagrams exemplifying the expressions "lateral dimensions" and "cross sectional dimensions" as used in the present description. FIG. 75A provides a top plan view of printable semiconductor elements comprising 4 semiconductor ribbons 6005. In the context of this description the expression "lateral dimension" is exemplified by the length 6000 and width 6010 of the semiconductor ribbons 6005. FIG. 75B provides a cross sectional view of the printable semiconductor elements comprising 4 semiconductor ribbons 6005. In the context of this description the expression "cross sectional dimension" is exemplified by the thickness 6015 of the semiconductor ribbons 6005.

In some embodiments, one or more of the lateral dimensions, such as lengths and widths, of the printable semiconductor elements, including printable semiconductor based devices and device components, are selected over the range of 0.1 mm to 10 mm. One or more of the lateral dimensions are selected over the range of 0.1 mm to 1 mm for some applications, and selected over the range of 1 mm to 10 mm for some applications. Use of printable semiconductor elements having these lateral dimensions include, but are not limited to, membrane solar cells and photovoltaic systems thereof.

In some embodiments, one or more of the lateral dimensions, such as lengths and widths, of the printable semiconductor elements, including printable semiconductor based devices and device components, are selected over the range of 0.02 mm to 30 mm. Use of printable semiconductor elements having these lateral dimensions include, but are not limited to, optoelectronic semiconductor elements and systems thereof.

In some embodiments, one or more of the lateral dimensions, such as lengths and widths, of the printable semiconductor elements, including printable semiconductor based devices and device components, are selected over the range of 0.0001 mm to 1000 mm. One or more of the lateral dimensions, such as lengths and widths, are preferably selected over the range of 0.0001 mm to 300 mm for some applications In some embodiments, one or more of the cross sectional dimensions, such as thicknesses, of the printable semiconductor elements, including printable semiconductor based devices and device components, are selected over the range of 0.002 mm to 0.02 mm. One or more of the cross sectional dimensions, such as thicknesses, of the printable semiconductor elements, including printable semiconductor based devices and device components, are selected over the range of 0.0003 mm to 0.3 mm for some applications. One or more of the cross sectional dimensions, such as thicknesses, of the printable semiconductor elements, including printable semiconductor based devices and device components are selected over the range of 0.00001 mm to 3 mm for some applications.

In an optical system of the present invention, the printable semiconductor element comprises a semiconductor structure having a length selected from the range of 0.02 millimeters to 30 millimeters, and a width selected from the range of 0.02 millimeters to 30 millimeters. In an optical system of the present invention, the printable semiconductor element comprises a semiconductor structure having a length selected from the range of 0.1 millimeters to 1 millimeter, and a width selected from the range of 0.1 millimeters to 1 millimeter. In an optical system of the present invention, the printable semiconductor element comprises a semiconductor structure having a length selected from the range of 1 millimeters to 10 millimeters, and a width selected from the range of 1 millimeter to 10 millimeters. In an optical system of the present invention, the printable semiconductor element comprises a semiconductor structure having a thickness selected from the range of 0.0003 millimeters to 0.3 millimeters. In an optical system of the present invention, the printable semiconductor element comprises a semiconductor structure having a thickness selected from the range of 0.002 millimeters to 0.02 millimeters. In an optical system of the present invention, the printable semiconductor element has at least one longitudinal physical dimension less than or equal to 200 microns. In an optical system of the present invention, the printable semiconductor element has at least one cross-sectional physical dimension selected over the range of 10 nanometers to 10 microns.

The present invention includes optical system comprising a plurality of printable semiconductor elements, such as printable electronic devices or device components, assembled via contact printing. In embodiment present invention, for example, the optical system further comprises a plurality of printable semiconductor elements on said receiving surface of said substrate via contact printing; wherein each of said printable semiconductor elements comprises a semiconductor structure having a length selected from the range of 0.0001 millimeters to 1000 millimeters, a width selected from the range of 0.0001 millimeters to 1000 millimeters and a thickness selected from the range of 0.00001 millimeters to 3 millimeters.

Example 8: Printable GaAs/InGaAlP Red LEDs Printed on PET Substrates

FIG. 76 shows an array of printable GaAs/InGaAlP red LEDs printed on PET substrates. To form the device, PET substrates are coated with a thin (1-2 micron) layer of PDMS, the PDMS is cured thermally, and an array of sparse gold meshes is printed onto the substrate via contact printing. 1 mm×1 mm×~0.3 mm LEDs are then contact printed onto the mesh electrodes. After printing the LEDs, a thin PDMS substrate housing another array of meshes is laminated against the substrate to form electrical contact to the top of the LEDs and allow operation at ~5 V (top left and right). The thin PDMS substrate also serves as mechanical encapsulation of the LED array

STATEMENTS REGARDING INCORPORATION BY REFERENCE AND VARIATIONS

U.S. patent application Ser. Nos. 11/115,954, 11/145,574, 11/145,542, 60/863,248, 11/465,317, 11/423,287, 11/423,192, and 11/421,654 are hereby incorporated by reference to the extent not inconsistent with the present description.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A lighting system, comprising:
   a substrate having a receiving surface with a planarizing layer;
   two or more electrodes disposed on the receiving surface;
   a plurality of inorganic crystalline semiconductor light-emitting elements printed on the receiving surface, wherein each light-emitting element is aligned with and electrically connected to at least two of the two or more electrodes, and wherein the light emitting elements have at least a length or width physical dimension less than 200 µm;
   wherein the inorganic crystalline semiconductor light-emitting elements are only partially embedded in the planarizing layer.

2. The lighting system of claim 1, wherein the substrate has a thickness equal to or less than 175 microns.

3. The lighting system of claim 1, wherein the substrate is polyethylene terephthalate (PET).

4. The lighting system of claim 1, wherein the substrate is a bottom substrate and the lighting system further comprises a top substrate adhered to one or more of: the bottom substrate, the two or more electrodes, or the light-emitting elements.

5. The lighting system of claim 4, wherein the top substrate has a thickness equal to or less than 175 microns.

6. The lighting system of claim 4, wherein the planarizing layer is disposed between the top and bottom substrates.

7. The lighting system of claim 6, wherein the planarizing layer has a thickness less than or equal to 20 microns and greater than or equal to 2 microns.

8. The lighting system of claim 4, wherein the top substrate is PET.

9. The lighting system of claim 1, wherein the lighting system has a bending radius equal to or less than 7, 5, 4.5, 3, or 0.85 centimeters.

10. The lighting system of claim 1, wherein the electrodes are multi-layer electrodes.

11. The lighting system of claim 1, wherein the electrodes have a thickness less than or equal to 10000 µm and greater than or equal to 10 nm.

12. The lighting system of claim 1, wherein the light-emitting elements are inorganic light-emitting diodes.

13. The lighting system of claim 1, wherein the light-emitting elements are printable light emitting diodes or lasers.

14. A method of making a lighting system, comprising:
   providing a substrate having a receiving surface with a planarization layer and two or more electrodes disposed on the receiving surface;
   providing a plurality of printable inorganic crystalline semiconductor light-emitting elements on an inorganic semiconductor source wafer;
   dry transfer contact printing the plurality of printable inorganic crystalline semiconductor light-emitting elements from the source wafer to the receiving surface of the substrate, wherein each light emitting element is aligned with the two or more electrodes and each light emitting element is only partially embedded in the planarizing layer; and
   electrically connecting each printed light-emitting element to the two or more electrodes.

15. The method of claim 14, wherein the substrate is a bottom substrate, the method further comprising the step of adhering a top substrate to one or more of: the bottom substrate, the electrodes, or the light-emitting elements.

16. The method of claim 15, further comprising injecting the planarization layer between the top and bottom substrates.

17. The method of claim 16, further comprising curing the planarization layer.

18. The method of claim 17, further comprising curing the encapsulation layer under low pressure or vacuum conditions.

19. The lighting system of claim 1, wherein the substrate is flexible, bendable, shapeable, conformable and/or stretchable.

20. The lighting system of claim 1, wherein at least a portion of a bridge element connects to each of the crystalline semiconductor light-emitting elements.

21. A lighting system, comprising:
   a substrate having a receiving surface with a planarizing layer;
   two or more electrodes disposed on the receiving surface;
   a plurality of inorganic crystalline semiconductor light-emitting elements printed on the receiving surface, wherein each light-emitting element is aligned with and electrically connected to at least two of the two or more electrodes, and wherein the light emitting elements have at least a length or width physical dimension less than 200 µm;
   wherein the substrate is flexible, bendable, shapeable, conformable and/or stretchable.

22. A lighting system, comprising:
   a substrate having a receiving surface with a planarizing layer;
   two or more electrodes disposed on the receiving surface;
   a plurality of inorganic crystalline semiconductor light-emitting elements printed on the receiving surface, wherein each light-emitting element is aligned with and electrically connected to at least two of the two or more electrodes, and wherein the light emitting elements have at least a length or width physical dimension less than 200 µm;
   wherein at least a portion of a bridge element connects to each of the crystalline semiconductor light-emitting elements.

* * * * *